(12) United States Patent
Byers et al.

(10) Patent No.: US 12,745,636 B2
(45) Date of Patent: Sep. 22, 2026

(54) LIQUID COOLED COMPACT POWER SYSTEMS

(71) Applicant: Marel Power Solutions, Inc., Plymouth, MI (US)

(72) Inventors: Ian Byers, Northville, MI (US); Gary Miller, Caseville, MI (US); Stuart Wooters, Franklin, MI (US); Michael Grimes, Saline, MI (US); Martin Baker, Ann Arbor, MI (US)

(73) Assignee: Marel Power Solutions, Plymouth, MI (US)

( * ) Notice: Subject to any disclaimer, the term of this patent is extended or adjusted under 35 U.S.C. 154(b) by 328 days.

(21) Appl. No.: 18/413,704

(22) Filed: Jan. 16, 2024

(65) Prior Publication Data

US 2024/0203826 A1 Jun. 20, 2024

Related U.S. Application Data

(63) Continuation-in-part of application No. 17/932,366, filed on Sep. 15, 2022, which is a continuation-in-part (Continued)

(51) Int. Cl.

| | |
|---|---|
| ***H02M 7/5395*** | (2006.01) |
| ***H10W 40/47*** | (2026.01) |
| ***H10W 90/00*** | (2026.01) |

(52) U.S. Cl.

CPC .......... *H10W 40/47* (2026.01); *H10W 90/00* (2026.01); *H10W 90/811* (2026.01); *H02M 7/5395* (2013.01)

(58) Field of Classification Search

CPC ...... H02K 11/33; H02M 3/1563; H02M 7/00; H02M 7/20; H02M 7/003;

(Continued)

(56) References Cited

U.S. PATENT DOCUMENTS

| | | | | |
|---|---|---|---|---|
| 5,214,564 A * | 5/1993 | Metzler | H01G 2/08 361/677 |
| 2007/0076355 A1 * | 4/2007 | Oohama | H02M 7/003 361/676 |

(Continued)

*Primary Examiner* — Crystal L Hammond
*Assistant Examiner* — Nusrat Quddus
(74) *Attorney, Agent, or Firm* — Campbell Stephenson LLP

(57) ABSTRACT

An apparatus with a device having a metal structure, a metal element, a metal pedestal, and a transistor. Each of the metal structure, the metal element, and the metal pedestal may include first and second surfaces, which are substantially flat and opposite facing. The transistor may include first and second terminals, which may include first and second surfaces, respectively, that are substantially flat and opposite facing. The first surface of the metal pedestal may be electrically connected to the second surface of the metal element. The first and second surfaces of the first and second terminals, respectively, may be electrically connected to the first and second surfaces, respectively, of the metal structure and the metal pedestal, respectively. The second surface of the metal structure can be electrically and thermally connected to a bus bar.

20 Claims, 102 Drawing Sheets

Related U.S. Application Data of application No. 17/191,805, filed on Mar. 4, 2021, now Pat. No. 11,967,899.

(60) Provisional application No. 63/479,920, filed on Jan. 13, 2023, provisional application No. 63/312,580, filed on Feb. 22, 2022, provisional application No. 63/291,778, filed on Dec. 20, 2021, provisional application No. 63/291,091, filed on Dec. 17, 2021, provisional application No. 63/244,282, filed on Sep. 15, 2021, provisional application No. 63/136,406, filed on Jan. 12, 2021, provisional application No. 63/044,763, filed on Jun. 26, 2020, provisional application No. 63/028,883, filed on May 22, 2020.

(58) Field of Classification Search
CPC .. H02M 7/538466; H02M 1/32; H02M 1/327; H01L 21/50; H01L 23/02; H01L 23/31; H01L 23/423; H01L 23/495; H02B 1/20; H05K 7/20; H05K 7/1432; H05K 7/209
See application file for complete search history.

(56) References Cited

U.S. PATENT DOCUMENTS

2020/0006197 A1* 1/2020 Hart ...................... H10W 40/30
2020/0126890 A1* 4/2020 Singh .................... H10W 40/47
2022/0354014 A1* 11/2022 Feurtado .............. H05K 7/1432

* cited by examiner

100
Wa
Wb
Wc

DH3
TH3
DH2
TH2
DH1
TH1
gH3
gH2
gH1
N1
N2
N3
DL3
TL3
DL2
TL2
DL1
TL1
gL3
gL2
gL1
VgH1
VgH2
VgH3
VgL1
VgL2
VgL3
H101
H102
H103
L101
L102
L103
PWM-H1
PWM-H2
PWM-H3
PWM-L1
PWM-L2
PWM-L3
110
V+
Vdc
V-

164
162
150

La
Lb
Lc
N1
N2
N3
TH1
TH2
TH3
DH1
DH2
DH3
TL1
TL2
TL3
DL1
DL2
DL3
gH1
gH2
gH3
gL1
gL2
gL3
VgH1
VgH2
VgH3
VgL1
VgL2
VgL3
H101
H102
H103
L101
L102
L103
PWM-H1
PWM-H2
PWM-H3
PWM-L1
PWM-L2
PWM-L3
160
V+
Vrdc
V-

247g
hp
248q
288ds 247g
248q
ldc
wdc
344
288ds
288g1
288g2
288dc 247g
wp
248q
lds
wds
230
lp
288dc
288g2
288g1
288ds 247s
hp
248s
288ds 247s
248s
288ds
288g
288dc 247s
248s
wp
wds
lds
230
lp
288dc
288g
288ds 245
hp
249
288ds 245
249
ldc
wdc
344
288ds
288dc 245
249
wp
wds
lds
230
288dc
288ds
lp 376B
247dB
230
360
304dB
MOSFETs
d1
d2
d3
d4
s1
s2
s3
s4
248dB
288g
372
344

376A
247dA
230
360
304dA
304
IGBT
c
g
e
cathode
D
anode
248dA
288g
372
344

376P
247qP
230
360
304qP
d2
g4
s2
d1
g3
s1
c2
g2
e2
c1
g1
e1
372
344
248qP
288g1
288g2

376O
247dO
230
360
304dO
IGBTs
c1
g1
e1
c2
g2
e2
c3
g3
e3
c4
g4
e4
372
344
248dO
288g

Top View
Connector-Lead 288ds
Connector-Lead 288g
360
362
364
365
366-1
366-2
366-3
366-4
367
384
395
T1
T2
T3
T4
Side View
230
288ds Top View
Connector-Lead 288ds
Connector-Lead 288g
367
365
360
362
364
384
383-1
383-2
371-1
371-2
366-1
366-2
366-3
366-4
T1
T2
T3
T4
Side View
Connector-Lead 288g
288ds
230
1110
371-2
366-4
366-3

Top View
Connector-Lead 288ds
Connector-Lead 288g-1
367-1
Connector-Lead 288g-2
367-2
360
365-1
365-2
362
1107
1108
384
T1
T2
T3
T4
359-1
359-2
366-1
366-2
366-3
366-4
Side View
Connector-Lead 288g-2
367-2
288ds
359-2
366-3
366-4
230

Top View
Connector-Lead 288g-2
367-2
Connector-Lead 288dc
372
365-2
1108
1107
384
364-2
T5
T6
T7
T8
366-5
366-6
366-7
366-8
375
Side View
344

250
Top View
Side View
262
264
280
282
272
278
284
286

Top View
250-2
250-4
250-1
250-3
1112
1112
1113
377e-1
377e-2

420r
442
420u
441
420q
442

420t
441

420p
442
420s
441

407
407
407
420a-1
420a 441
441
441
420a-2
420a 407
407
420a-3
420a

460rT
Bulk DC Link Capacitor 403T-2
MCU
462rT
484
461rT
465c
ϕc
PMIC
I_Sense
PMIC
V_Sense
306
306
V_Sense
288gH
288gL
420a
417T
412T
V+
V-
c
360
Switch 304dH
247dH
247dL
Switch 304dL
230
372
344
405Ta-2
405Tb-2
418Tc

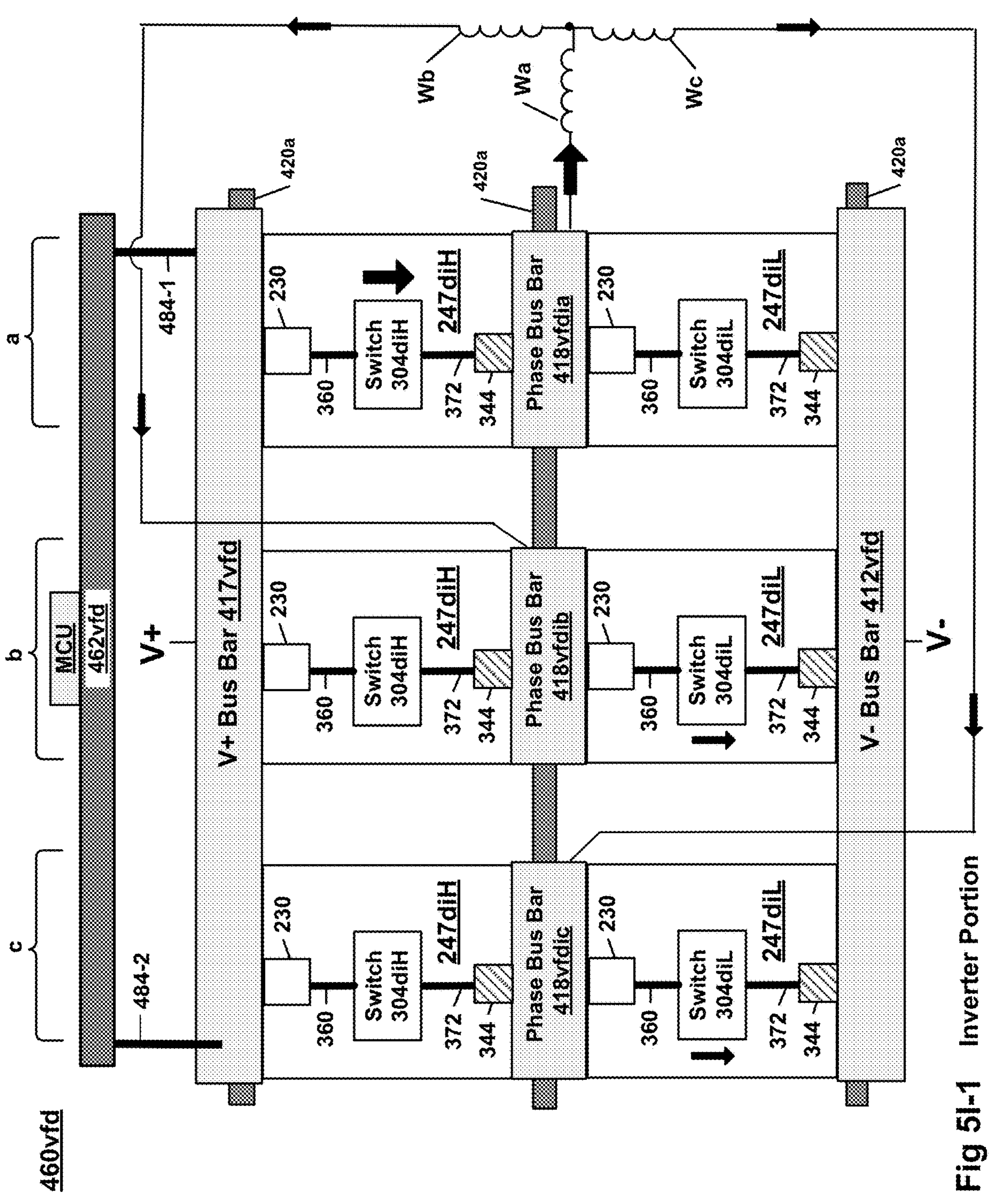
Fig 5I-1 Inverter Portion

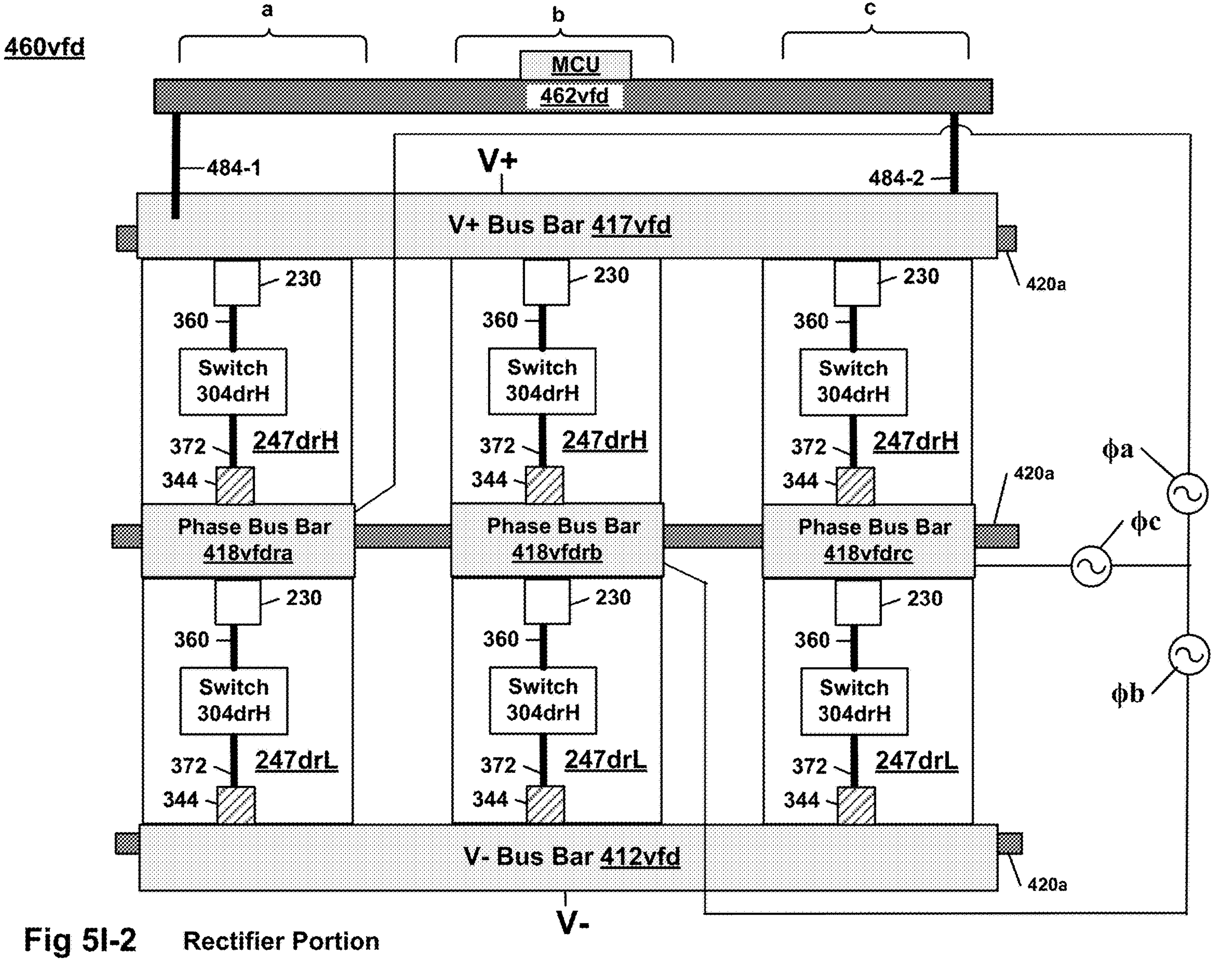
Fig 5I-2 Rectifier Portion

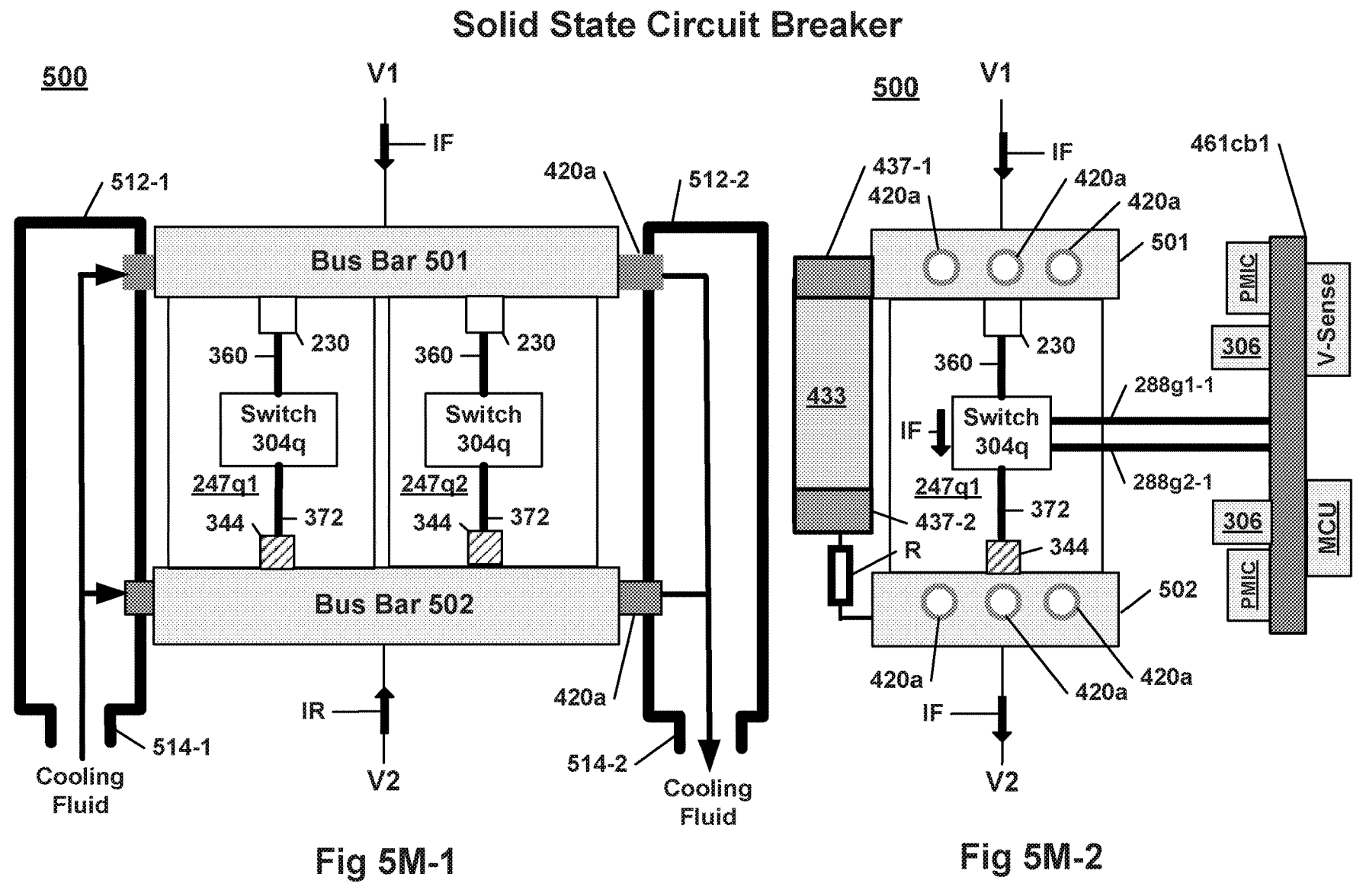

Solid State Circuit Breaker

512-1
514-1
Cooling Fluid
Bus Bar 501
Bus Bar 502
V1
IF
V2
IR
230
360
Switch 304q
247q1
372
344
247q2
420a
512-2
514-2
Cooling Fluid

Fig 5M-2

461cb1
V-Sense
MCU
PMIC
306
288g1-1
288g2-1
501
502
420a
V1
IF
V2
230
360
Switch 304q
372
344
247q1
437-1
437-2
R
433

Solid State Circuit Breaker
510
V1
IF
Bus Bar 501
420a
230
360
Switch 304d
IR
247d1
247d2
372
344
Heat Sink 506
247d3
247d4
Bus Bar 502
V2
501
502
506
461cb2
V-Sense
288g-1
288g-2
306
PMIC
MCU
437-1
433e
437-2

Side View

End View

Side View

End View

LIQUID COOLED COMPACT POWER SYSTEMS

RELATED APPLICATIONS

This application is a continuation-in-part of U.S. patent application Ser. No. 17/932,366, filed Sep. 15, 2022, which claims priority to U.S. patent application Ser. No. 17/191,805, filed Mar. 4, 2021, which in turn claims priority to Provisional US Patent Application Nos.: 63/028,883, filed May 22, 2020; 63/044,763, filed Jun. 26, 2020, and; 63/136,406, filed Jan. 12, 2021. Prior U.S. patent application Ser. No. 17/932,366 also claims priority to Provisional US Patent Application Nos.: 63/244,282, filed Sep. 15, 2021; 63/291,091, filed Dec. 17, 2021; 63/291,778, filed Dec. 20, 2021, and; 63/312,580, filed Feb. 22, 2022. This application also claims priority under USC Section 119(e) to Provisional U.S. Patent Application No. 63/479,920, filed Jan. 13, 2023. All foregoing patent applications in their entirety are incorporated herein by reference.

BACKGROUND

Power systems employ power semiconductors including power transistors and power diodes. Power converters are examples of power systems. Power converters convert electrical power. An "inverter" is one type of power converter. Inverters convert direct current (DC) power into alternating current (AC) power. A "rectifier" is another type of power converter. Rectifiers convert AC power into DC power. DC/DC converters (e.g., buck, boost, or buck/boost converters) convert DC power of one voltage level into DC power of another voltage level. AC/AC converters (e.g., variable frequency drives, matrix converters, etc.) convert AC power in one form into AC power in another form. Some AC/AC converters, which may include a DC link electrically connected between a rectifier and an inverter, convert AC power of one frequency into AC power of another frequency.

BRIEF DESCRIPTION OF THE DRAWINGS

The present technology may be better understood, and its numerous objects, features, and advantages made apparent to those skilled in the art by referencing the accompanying drawings.

FIGS. 2B-1, 2B-2, and 2B-3 are top, bottom, and side views, respectively, of an example packaged switch.

FIGS. 2C-1, 2C-2, and 2C-3 are top, bottom, and side views, respectively, of an example packaged switch.

FIGS. 2D-1, 2D-2, and 2D-3 are top, bottom, and side views, respectively, of an example packaged switch.

FIGS. 2E-1, 2E-2, and 2E-3 are top, bottom, and side views, respectively, of an example packaged diode.

FIG. 4A-1 shows top and side views of an example die substrate.

FIG. 4A-2 shows top and side views of an example die substrate with example transistors.

FIG. 4A-3 shows top and side views of an example die substrate with example transistors and pedestals.

FIG. 4A-4 shows top and side views of an example die clip.

FIG. 4A-5 shows top and side views of an example switch module.

FIG. 4A-6 shows top and side views of an example die substrate with example transistors and pedestals.

FIG. 4A-7 shows top and side views of an example switch module.

FIG. 4A-8 shows top and side views of an example die substrate with example transistors and pedestals.

FIG. 4A-9 shows top and side views of an example switch module.

FIG. 4B-1 shows top and side views of an example die substrate with example transistors.

FIG. 4B-2 shows top and side views of an example die substrate with example transistors and pedestals.

FIG. 4B-3 shows top and side views of an example switch module.

FIG. 4B-4 shows top and side views of an example die substrate with example transistors and pedestals.

FIG. 4B-5 shows top and side views of an example switch module.

FIG. 4C-1 shows top and side views of an example die clip with example transistors.

FIG. 4C-2 shows top and side views of an example switch module.

FIG. 4D-1 shows top and side views of an example die clip with example transistors and pedestals.

FIG. 4D-2 shows top and side views of an example paddle.

FIG. 4D-3 shows top and side views of an example switch module.

FIG. 4E-1 shows top and side views of an example die substrate with example transistors.

FIG. 4E-2 shows top and side views of an example die clip with example transistors.

FIG. 4E-3 shows top and side views of an example switch module.

FIG. 4F-1 shows top and side views of an example die substrate with example transistors.

FIG. 4F-2 shows top and side views of an example die substrate with example transistors and pedestals.

FIG. 4F-3 shows top and side views of an example switch module.

FIG. 4G-1 shows top and side views of an example transistor.

FIG. 4G-2 shows top and side views of an example transistor with example signal frames.

FIG. 4G-3 shows top and side views of an example transistor with example signal frames and pedestals.

FIG. 4G-4 shows a side view of the structure shown in FIG. 4G-3.

FIG. 4G-5 shows a cross sectional view of the structure shown in FIG. 4G-3.

FIG. 4G-6 shows top and side views of an example die substrate with an example transistor.

FIG. 4G-7 shows top and side views of an example switch module.

FIG. 4G-8 shows a top view of example transistors with example signal frames and pedestals.

FIG. 4G-9 shows a top view of an example die substrate with example transistors.

FIG. 4G-10 shows a side view of an example die substrate with example transistors.

FIG. 4G-11 shows a side view of an example switch module.

FIG. 4G-12 shows a top view of an example switch module.

FIG. 5A-1 is a front view of an example converter without tubes.

FIG. 5A-2 is a side view of an example converter without tubes.

FIG. 5A-3 shows cross-sectional views of example tubes.

FIG. 5A-4 shows cross-sectional views of example tubes.

FIG. 5A-5 shows cross-sectional views of example tubes.

FIG. 5A-6 shows cross-sectional views of example tubes.

FIG. 5A-7 shows cross-sectional views of example tubes.

FIG. 5A-8 shows cross-sectional views of example tubes.

FIG. 5A-9 shows cross-sectional views of example tubes.

FIG. 5A-10 shows a side view of an example tube.

FIG. 5A-11 shows a side view of an example tube.

FIG. 5A-12 shows a side view of an example tube.

FIG. 5A-13 shows a side view of an example tube.

FIG. 5A-14 shows a side view of an example tube.

FIG. 5A-15 shows a side view of an example tube.

FIG. 5A-16 shows cross-sectionals views of an example tube insert and example tubes.

FIG. 5A-17 shows cross-sectionals views of an example tube insert and example tubes.

FIG. 5A-18 is a front view of an example converter.

FIG. 5A-19 is a side view of an example converter.

FIG. 5A-20 is a side view of an example converter.

FIG. 5A-21 is a side view of an example converter.

FIG. 5A-22 is a side view of an example converter.

FIG. 5A-23 is a side view of an example converter.

FIG. 5A-24 is a side view of an example converter.

FIG. 5A-25 is a front view of an example converter.

FIG. 5A-26 is a front view of an example converter.

FIG. 5A-27 is a side view of an example converter.

FIG. 5B-1 is a front view of an example converter.

FIG. 5B-2 is a side view of an example converter.

FIG. 5D-1 is a front view of an example converter.

FIG. 5D-2 is a back view of an example converter.

FIG. 5D-3 is a side view of an example converter.

FIG. 5E-1 is a front view of an example converter.

FIG. 5E-2 is a side view of an example converter.

FIG. 5E-3 is a side view of an example converter.

FIG. 5F-1 is a front view of an example converter.

FIG. 5F-2 is a side view of an example converter.

FIG. 5F-3 is a side view of an example converter.

FIG. 5G-1 is a front view of an example converter.

FIG. 5G-2 is a side view of an example converter.

FIG. 5I-1 is a front view of an example converter.

FIG. 5I-2 is a back view of an example converter.

FIG. 5I-3 is a side view of an example converter.

FIG. 5M-1 is a front view of an example solid state circuit breaker.

FIG. 5M-2 is a side view of an example solid state circuit breaker.

FIG. 5N-1 is a front view of an example solid state circuit breaker.

FIG. 5N-2 is a side view of an example solid state circuit breaker.

FIG. 5O-1 is a front view of an example converter.

FIG. 5O-2 is a side view of an example converter.

FIG. 5O-3 is a side view of an example converter.

FIG. 5P-1 is a front view of an example converter.

FIG. 5P-2 is a side view of an example converter.

FIG. 5P-3 is a front view of example connected bus bars.

FIG. 5P-4 is a side view of example connected bus bars.

FIG. 5P-5 is a front view of an example bus.

FIG. 5P-6 is a side view of an example bus bar.

The use of the same reference symbols in different figures indicates identical items. A reference symbol without a letter and/or number after it generally refers to any or all the elements bearing that reference symbol. For example, reference symbol "204" refers to 204, 204L, 204H, 204L-1, etc., and reference symbol "204L" refers to 204L, 204L-1, etc.

DETAILED DESCRIPTION

Power systems include power converters, solid-state circuit breakers (SSCBs), etc. Power converters include inverters, rectifiers, DC/DC converters, variable frequency drives, etc. An SSCB is a device that can switch an electrical circuit on or off. SSCBs may be employed, for example, in an electrical path between a voltage source such as a battery and a power converter such as an inverter. The present disclosure will be described primarily with respect to converters and SSCBs. The present disclosure may also find application in other power systems.

Inverters and rectifiers of this disclosure may be bidirectional. Bidirectional inverters can convert DC power into AC power while operating in the forward direction and convert AC power into DC power while operating in reverse direction. Bidirectional rectifiers can convert AC power into DC power while operating in the forward direction and convert DC power into AC power while operating in reverse direction.

Inverters and rectifiers vary in design. For example, inverters and rectifiers may have one or more phases. Each phase may include one or more legs or half-bridges, each of which may include a "high-side switch" electrically connected to a "low-side switch." Switches conduct current between their current terminals when turned on (i.e., activated).

Figure 1A:
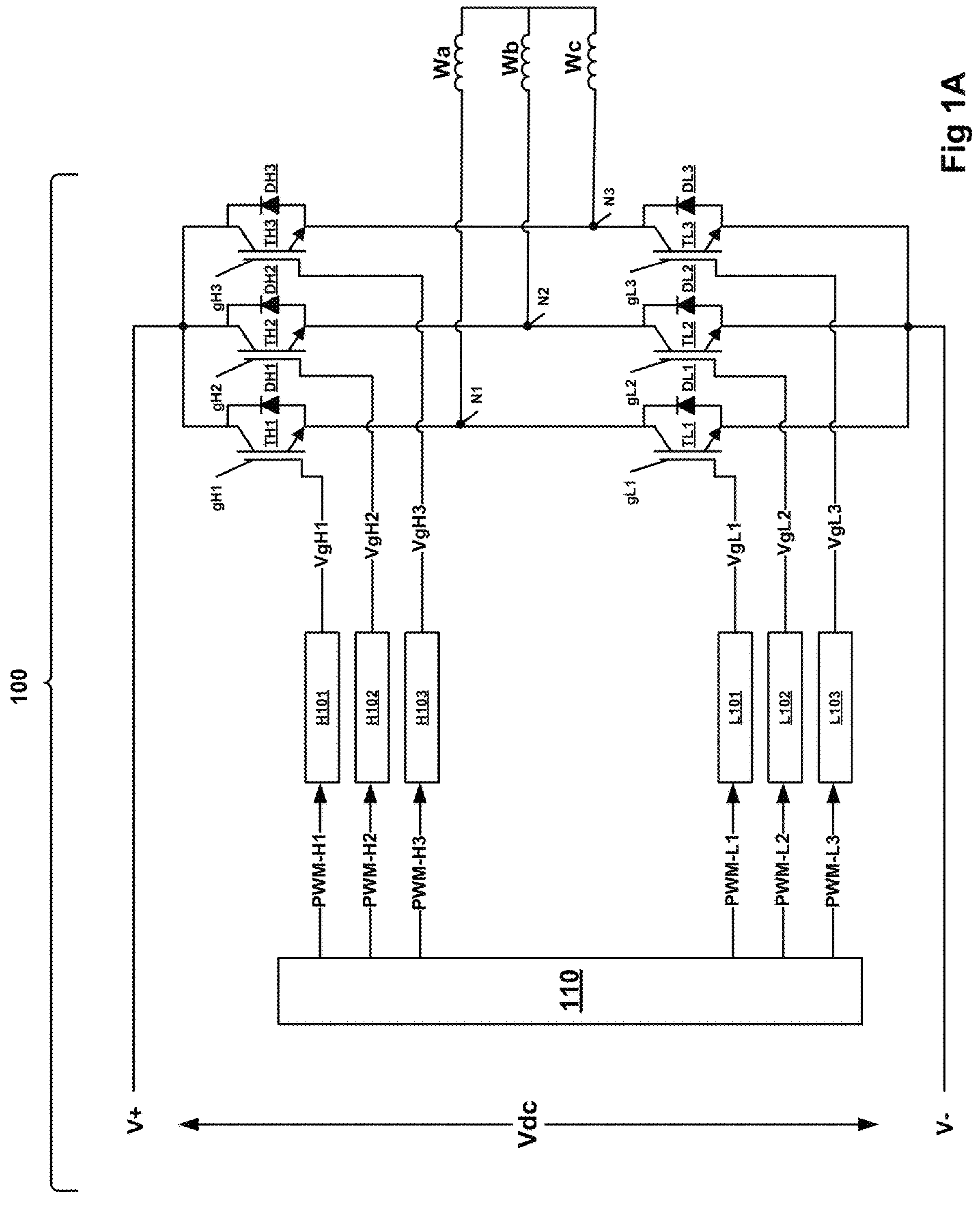
FIG. 1A illustrates relevant components of an example three-phase inverter.

FIG. 1A illustrates relevant components of a three-phase inverter 100 for converting DC power from a battery into three-phase AC power for an electric motor. Each phase includes a high-side switch connected to a low-side switch.

Each high-side switch includes a high-side transistor THx connected in parallel with a high-side diode DHx, and each low-side switch includes a low side transistor TLx connected in parallel with a low-side diode DLx. In FIG. 1A, each transistor T is an insulated gate bipolar transistor (IGBT).

High-side transistors TH1-TH3 are connected in series with low-side transistors TL1-TL3, respectively, via nodes N1-N3, respectively, which in turn are connected to respective terminals of inductive elements Wa-Wc. For purposes of explanation only, inductive elements Wa-Wc take form in stator windings of a synchronous or asynchronous electric motor of an electric vehicle (EV).

The collector terminals of TH1-TH3 and the cathode terminals of DH1-DH3 are connected to each other and to a V+ input terminal, while the emitter terminals of TL1-TL3 and the anode terminals of diodes DL1-DL3 are connected to each other and to a V− input terminal. DC voltage Vdc is provided between the V+ and V− input terminals by a battery or other DC power source.

High-side transistors TH1-TH3 and low-side transistors TL1-TL3 are controlled by microcontroller 110 through gate drivers H101-H103 and L101-L103, respectively. A driver is a device that accepts a low-power input signal from a device (e.g., a microcontroller) and produces a corresponding high-power output signal that is needed to activate a transistor.

Control of the transistors T is relatively simple. High-side gate drivers H101-H103 and low-side gate drivers L101-L103 receive driver control signals (e.g., pulse width modulation signals PWM-H1-PWM-H3 and PWM-L1-PWM-L3) from microcontroller 110. High-side gate drivers H101-H103 activate high-side transistors TH1-TH3, respectively, by asserting high-power, gate control signals VgH1-VgH3, respectively, when PWM-H1-PWM-H3 signals, respectively, are asserted. Low-side gate drivers L101-L103 activate low-side transistors TL1-TL3, respectively, by asserting high-power, gate control signals VgL1-VgL3, respectively, when PWM-L1-PWM-L3 signals, respectively, are asserted. Each of the transistors TH1-TH3 and TL1-TL3 conducts current to or from a connected stator winding W when activated.

Figure 1B:
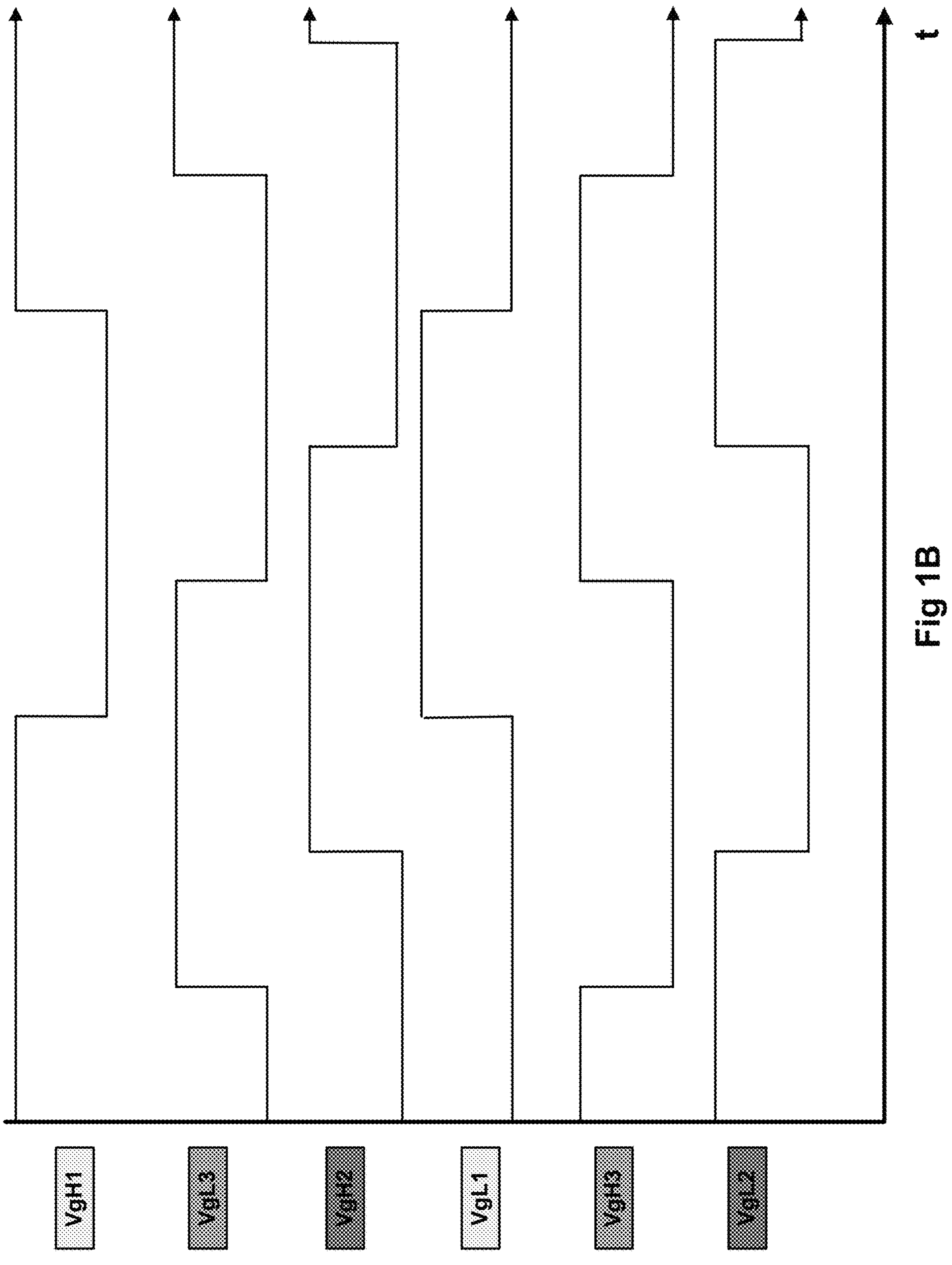
FIG. 1B is a timing diagram that shows example gate control signals.

Through coordinated activation of transistors TH1-TH3 and TL1-TL3, the direction of electrical current flow in stator windings may be controlled so that current can travel into or out of a winding. FIG. 1B illustrates an example timing diagram for gate control signals VgH1-VgH3 and VgL1-VgL3. This timing diagram is provided only to facilitate a basic understanding of inverter control. In practice, more complicated timing patterns are typically used to control inverters.

Microcontroller 110 controls high-side transistors TH1-TH3 and low-side transistors TL1-TL3 via PWM-H1-PWM-H3 and PWM-L1-PWM-L3 signals, respectively. Microcontrollers, such as microcontroller 110, and other similar data processing devices may include a central processing unit (CPU), memory that stores instructions executable by the CPU, and peripherals such as timers, input/output (I/O) ports, etc. Microcontroller 110 generates the PWM-H1-PWM-H3 and PWM-L1-PWM-L3 signals based on CPU executable instructions stored in memory. Gate drivers H101-H103 generate the VgH1-VgH3 signals based on the PWM-H1-PWM-H3 signals, and gate drivers L101-L103 generate the VgL1-VgL3 signals based on the PWM-L1-PWM-L3 signals. Microcontroller 110 can adjust the duty cycle and/or period of the pulse width modulation (PWM) signals in accordance with instructions stored in memory.

Figure 1C:
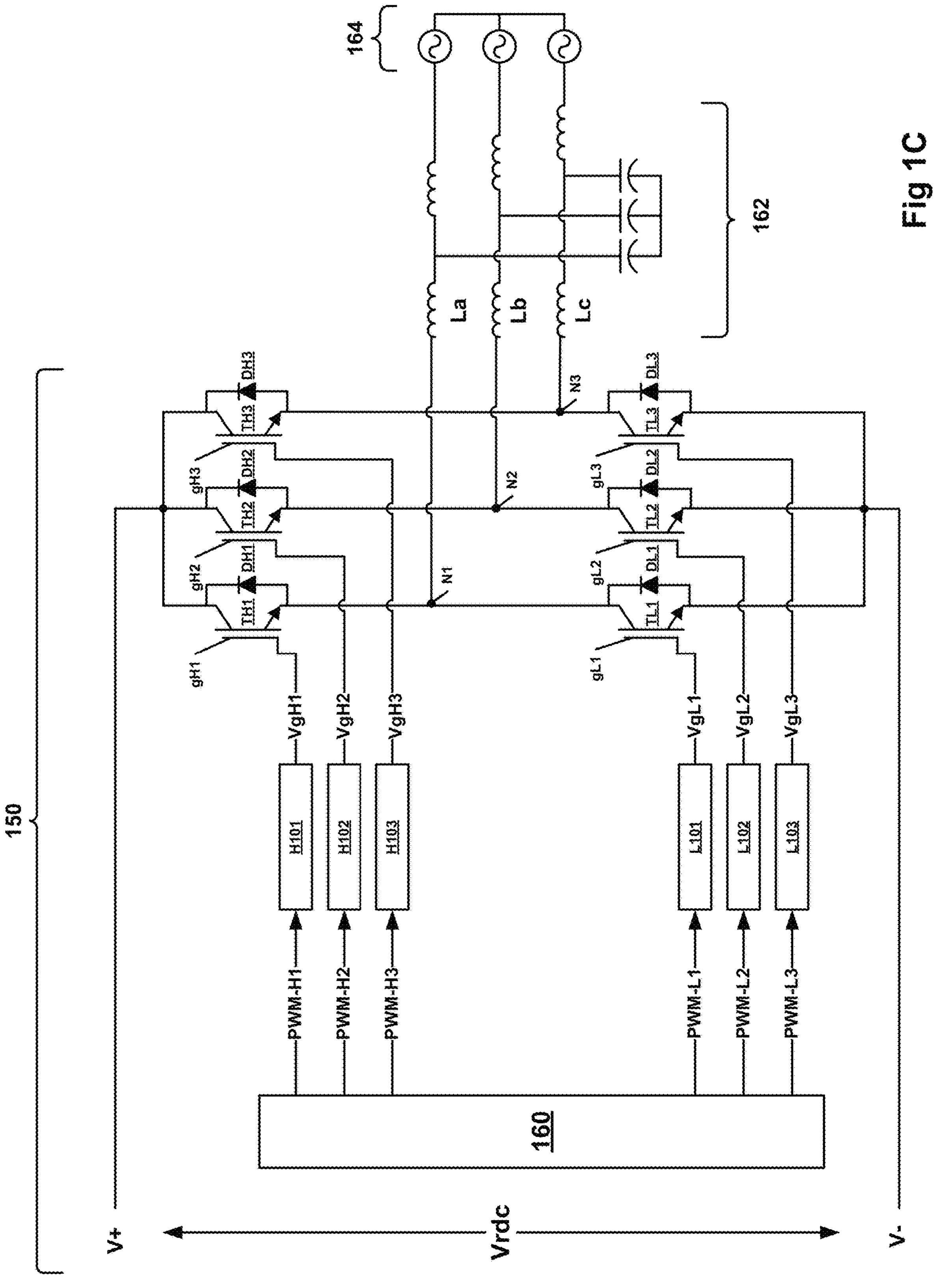
FIG. 1C illustrates relevant components of an example three-phase rectifier.

FIG. 1C illustrates relevant components of a three-phase rectifier 150 that could be used for converting three-phase AC power from a power distribution grid into DC power for charging an EV battery. Inverter 100 and rectifier 150 are similar. Like inverter 100, each phase of rectifier 150 includes a high-side switch connected to a low-side switch. Each high-side switch includes transistor THx connected in parallel with diode DHx, and each low-side switch includes transistor TLx connected in parallel with diode DLx. High-side transistors TH1-TH3 are connected in series with low-side transistors TL1-TL3, respectively, via nodes N1-N3, respectively, which in turn are connected to respective terminals of inductive elements La-Lc, respectively. For purposes of explanation only, inductive elements La-Lc take form in inductors of an LCL filter 162, which in turn is coupled to a three-phase AC power source 164.

The collector terminals of TH1-TH3 and the cathode terminals of DH1-DH3 are connected to each other, and to a V+ output terminal, while the emitter terminals of TL1-TL3 and the anode terminals of diodes DL1-DL3 are connected to each other, and to a V− output terminal.

High-side transistors TH1-TH3 and low-side transistors TL1-TL3 are controlled by rectifier controller 160 via gate drivers H101-H103 and L101-L103, respectively. Through coordinated activation of high-side and low-side IGBTs, rectifier 150 provides a rectified DC voltage Vrdc at output terminals V+ and V−, which in turn may be connected to an isolated DC/DC converter or other device that may employ one or more aspects of the present disclosure. Although not shown, a filter may be connected between the output terminals V+ and V− to smooth Vrdc before it is provided to another device such as an isolated DC/DC converter.

While inverter 100 and rectifier 150 are similar, at least one difference exists. Rectifier 150 includes controller 160, which may include a phase-lock loop (PLL) and other components for synchronizing the control of high-side transistors TH1-TH3 and low-side transistors TL1-TL-3 to the frequency (e.g., 60 Hertz) of the three-phase AC input power provided by source 164. Controller 160 may also include a CPU and a memory that stores CPU executable instructions that may be different from the CPU executable instructions stored in memory of microcontroller 110 of inverter 100. Like microcontroller 110, controller 160 generates PWM-H1-PWM-H3 and PWM-L1-PWM-L3 signals. Gate drivers H101-H103 generate the VgH1-VgH3 signals based on the PWM-H1-PWM-H3 signals, and gate drivers L101-L103 generate the VgL1-VgL3 signals based on the PWM-L1-PWM-L3 signals. Controller 160 can adjust the duty cycle and/or period of the PWM signals.

EVs, DC fast chargers, industrial machines (e.g., industrial pumps, fans, compressors, etc.), electric vertical take-off and landing (eVTOL) aircraft, etc., employ power converters that are large and heavy. A need exists for smaller and lighter power converters with high power density (i.e., power/volume). For example, the October 2017 "Electrical and Electronics Technical Team (EETT) Roadmap" published in part by the US Department of Energy, sets 100 kW/L as the 2025 power density target for EV inverters. The 2017 EETT Roadmap states, "To meet the 2025 EETT R&D target, the power density must be increased by more than 800 percent compared to 2015 EETT R&D technical targets, and 450 percent compared to current on-road technology."

"Power modules" are disclosed. Power modules may include "switch modules" and "diode modules." "Packaged power modules" are disclosed. Packaged power modules may include packaged switch modules and packaged diode modules. Power converters may employ packaged switches and/or packaged diodes.

A switch module may include a "power stack" that includes a "switch," which may be electrically and thermally connected (e.g., sintered, soldered, etc.) to and sandwiched between a "die substrate" and a "die clip." A switch may be bidirectional, or capable of controlling current in the forward and reverse directions. A switch may include one, two or more power transistors (hereinafter "transistors"). Transistors in a switch may be connected in parallel, anti-parallel, or back-to-back. A switch may also include one or more power diodes (hereinafter "diodes") that are connected in parallel with one or more transistors. Depending on its configuration, a switch may transmit 10, 20, 50, 100, 200, 400 amperes (A) or more of current when activated or turned on. Switch modules may include one or more additional components such as transistor control terminal drivers (hereinafter "drivers" such as gate drivers or base drivers), resistors, capacitors, current sensors, temperature sensors, voltage sensors, voltage regulators, etc.

A diode module may include a power stack that includes one or more diodes that may be electrically and thermally connected (e.g., sintered, soldered, etc.) to and sandwiched between a die substrate and a die clip. Multiple diodes may be connected in parallel. Diode modules may also include one or more additional components such as resistors, capacitors, current sensors, temperature sensors, voltage sensors, etc.

Die substrates and die clips are electrically and thermally conductive elements. Die substrates and die clips may have die substrate terminals and die clip terminals, respectively. Electrical current can transmit along a linear path between a die substrate terminal and a die clip terminal that includes an activated switch or diode. Heat generated at a switch or diode and electrical current conducted by the switch or diode, can simultaneously transmit through a die substrate terminal and/or a die clip terminal. Die substrate terminals and die clip terminals may be thermally and electrically connected to bus bars, heat sinks, or bus bars that also act as heat sinks.

Packaged switch modules (hereinafter also referred to as packaged switches) may contain one or more switch modules. Packaged switch modules may be used in converters, SSCBs, etc. A packaged switch module with just one switch module is called a "packaged switch." A packaged switch module with two switch modules is called a "packaged half bridge." Switches may or may not be electrically connected inside a packaged half bridge.

Packaged diode modules (hereinafter also referred to as packaged diodes) may contain one or more diode modules. Packaged diode modules may be used in converters or other power systems.

Compact power converters (hereinafter also referred to as power converters) including inverters are disclosed. Power converters may employ packaged switches and/or packaged diodes. The power converters of this disclosure may have several advantages over prior power converters. For example, the power density of one or more of disclosed inverters can meet or exceed the power density target of 100 kW/L as set forth in the 2017 EETT Roadmap mentioned above. Current density may also be an important advantage of the disclosed power converters. For example, an inverter of the present disclosure may be able to transmit the same amount of continuous current using fewer transistors than prior art inverters that are larger in volume. Power converters of this discloser may employ heat sink or bus bars with embedded tubes that carry a cooling fluid, which in turn can extract heat from transistors and/or diodes that are electrically and thermally connected to the bus bars.

The present disclosure will be described primarily with reference to inverters and rectifiers, it being understood the one or more aspects of the present disclosure can find application in other power converters such as DC/DC converters, matrix converters, AC/AC converters, etc., and other power systems such as SSBCs, etc.

Packaged Switches and Packaged Diodes

Packaged switches and packaged diodes may be cuboid in shape with six sides: top, bottom, front, back, left, and right. Some packaged switches may conform to aspects of an industry standard package such as the TO-247 package.

FIGS. 2A-1, 2A-2, and 2A-3 are top, bottom, and side views, respectively, of an example packaged switch 247*p*. FIGS. 2B-1, 2B-2 and 2B-3 are top, bottom, and side views, respectively, of an example packaged switch 247*q*. FIGS. 2C-1, 2C-2 and 2C-3 are top, bottom, and side views, respectively, of an example packaged switch 247*s*. FIGS. 2D-1, 2D-2 and 2D-3 are top, bottom, and side views, respectively, of an example packaged switch 247*d*. Packaged switches 247*s* and 247*d* are examples that may conform to one or more aspects of the TO-247 package standard. FIGS. 2E-1, 2E-2, and 2E-3 are top, bottom, and side views, respectively, of an example packaged diode 245.

Cases

Packaged switches and packaged diodes may have cases. FIGS. 2A-1-2A-3 show example case 248*p*. FIGS. 2B-1-2B-3 show example case 248*q*. FIGS. 2C-1-2C-3 show example case 248*s*. FIGS. 2D-1-2D-3 show example case 248*d*. FIGS. 2E-1-2E-3 show example case 249.

Cases may isolate, protect and/or support switch module components or diode module components such as power stacks. Cases may be made of glass, plastic, ceramic, etc. For explanation only, cases are presumed to be made of plastic such as a mold compound like epoxy resin. Modern mold compounds have evolved into complex formulations that contain as many as 20 distinct raw materials. Fillers such as alumina may be added to increase a mold compound's thermal conductivity, which may help to cool switch module components and diode module components including transistors and diodes. Cases may be formed around switch modules and diode modules using any one of many different types of packaging techniques including transfer molding.

Packaged switches and packaged diodes can be small. For example, the length lp, width wp, and height hp of packaged diode 245, packaged switch 247*q*, packaged switch 247*s*, and/or packaged switch 247*d*, without connector-leads 288, may measure around 21 mm, 16 mm, and 5 mm, respectively, it being understood the size (e.g., 21 mm×16 mm×5 mm) and shape (e.g., cuboid) of these packaged switches and packaged diodes can vary and should not be limited to that shown or described in this disclosure. The length lp, width wp, and height hp of packaged switch 247*p*, without connector-leads 288, may measure around 21 mm, 16 mm, and 12 mm, respectively, it being understood the size (e.g., 21 mm×16 mm×12 mm) and shape (e.g., cuboid) of packaged switch 247*p* can vary and should not be limited to that shown or described in this disclosure. For example, the example lengths, widths and/or heights of packaged switch 247*p*, 247*q*, 247*s*, or 247*d* above could double depending on the nature of the internal components such as the power stacks or contained therein.

The size and shape of a packaged switch may depend on one or more factors such as the number and/or types of transistors in the packaged switch. For example, a packaged switch 247*d* with six metal-oxide semiconductor field-effect transistors (MOSFETs) connected in parallel may be longer and/or wider than a packaged switch 247*d* with four MOSFETs connected in parallel. Or a packaged switch 247*q* with two MOSFETs connected in parallel may be thinner than a packaged switch 247*q* with two MOSFETs connected back-to-back. Some transistors such as IGBTs may be wider and/or longer than others such as MOSFETs. Packaged switch 247*d* with four IGBTs connected in parallel may be longer and/or wider a packaged switch 247*d* with four MOSFETs connected in parallel.

External surfaces of the cases may be substantially flat. "Substantially" may be used to describe a feature such as flatness. The term "substantially" means the feature has a variation that is within an acceptable tolerance. For example, a substantially flat surface means a surface with a variation in flatness that is within an acceptable tolerance such as 10.0 μm.

Switch Modules and Diode Modules

Connecting Elements

Switch modules and diode modules may include metal traces, bond-wires, straps, leads, tabs, signal frames, etc., or other metal connecting elements that can be used to create an electrical path between two or more devices. Electrical connecting elements may be used to transmit signals. Signals may include voltage signals and current signals.

Traces may have flat surfaces and may be formed on rigid printed circuit boards (PCBs), flexible PCBs, direct bond copper (DBC) substrates, etc. Bond-wires have a small diameter (e.g., 10 μm or less, and up to several hundred micrometers). Straps, leads, tabs, and signal frames may be thicker than traces and bond-wires and rated to conduct substantially more current.

Straps, leads, bond-wires, signal frames, etc., may be attached, joined, connected, bonded, etc., together or to traces, die clips, die substrates, paddles, control terminal pads, etc. Components may be attached, joined, connected, bonded, etc., through an electrically conductive attachment, bond, connection, or joint material such as solder or silver sintering paste. Components may be attached, joined, connected, bonded, etc., through a dielectric or electrically insulating attachment, connection, bond, or joint material. When a strap, lead or other connecting element is attached, joined, connected, bonded, etc., to a device (e.g., a die substrate) through a dielectric material, the device is electrically insulated from the strap, lead, or other connecting element.

Leads may be cylindrical-shaped "pins," or leads can have a square or rectangle shaped cross-section. For purposes of explanation only, straps, signal frames, tabs, and leads have square or rectangular cross-sections. Straps, tabs, signal frames, and leads may be formed (e.g., cut, sawed, diced, stamped, etc.) from thin sheets of electrically conductive material such as metal.

Switch modules or diode modules may include DBC substrates. For example, a DBC substrate may be thermally attached (e.g., soldered) to a flat surface of a die substrate or die clip. A DBC substrate may be composed of a ceramic tile (commonly alumina) with a sheet of copper bonded to both sides by a high-temperature oxidation process (the copper and substrate may be heated to a carefully controlled temperature in an atmosphere of nitrogen containing about 30 ppm of oxygen; under these conditions, a copper-oxygen eutectic forms that bonds successfully both to copper and the oxides used as substrates). The top copper layer may be pre-formed prior to firing or chemically etched using PCB technology to form traces, while the bottom copper layer, which may be thermally attached to a flat surface of a die substrate or die clip, is usually kept plain. DBC substrates may have thermal advantages over rigid PCBs when employed in switch modules or diode modules. For example, more heat from a device (e.g., a gate driver) may be dissipated through a DBC substrate upon which the device is mounted.

Switch modules or diode modules may include PCBs. For example, a PCB may be attached to a flat surface of a die substrate or a die clip. PCBs have flat conductive traces that may be etched from one or more thin sheet layers of metal laminated onto and/or between sheet layers of a non-conductive substrate. Metal vias extending through non-conductive substrate layers can electrically connect traces at different levels. Example packaged diode 245, packaged switch 247*p*, packaged switch 247*q*, packaged switch 247*s*, and packaged switch 247*d* do not include a PCB or DBC substrate.

Connecting elements (e.g., traces, bond-wires, signal frames, etc.) may carry signals (e.g., gate control signals, temperature sensor output signals, current terminal voltage levels, etc.) between leads and components (e.g., transistors, temperature sensors, etc.) internal to packaged switches and packaged diodes. Connecting elements may carry signals between components internal to packaged switches and packaged diodes. A bond-wire may carry signals between a transistor control terminal and a strap or DBC substrate in a packaged switch. Traces of PCBs or DCB substrates can carry signals (e.g., PWM signals, gate control signals, temperature sensor signals, etc.), voltages (e.g., DC supply voltages), etc. Traces of a PCB or DCB substrate may carry signals in electrical paths between components (e.g., a temperature sensor) internal to switch module or diode module, and components (e.g., a microcontroller) external to the switch or diode module. Traces of flexible PCBs may be used in converters to facilitate communication between a data processing device such as an MCU and other components such as drivers, voltage sensors, current sensors, etc., as will be more fully described below.

Packaged diodes or packaged switches may include one or more "connector-leads." The ends of some connector-leads may be electrically connected to die substrates, paddles, die clips, etc., which in turn may be electrically connected to transistor or diode current terminals. Ends of some connector-leads may be electrically connected to traces, straps, signal frames, etc., which in turn may be electrically connected to transistor control terminals. Packaged switches may include connector-leads with ends that may be electrically connected to straps through bond-wires, and the straps may be connected to die clips, paddles, or die substrates through a material that electrically insulates the straps from the die clips, paddles or die substrates.

Connector-leads can extend laterally from cases. The connector-leads of a packaged switch or packaged diode can mate with a "connector" that is external to the packaged switch or packaged diode. A connector may be attached to an external PCB (e.g., a driver PCB or a control PCB more fully described below) upon which microcontrollers, drivers, voltage regulators, and/or other components may be mounted. Connector-leads may carry signals between components of a switch module or diode module, and components on the external PCB.

Figures 1, 2, 2A, 3:
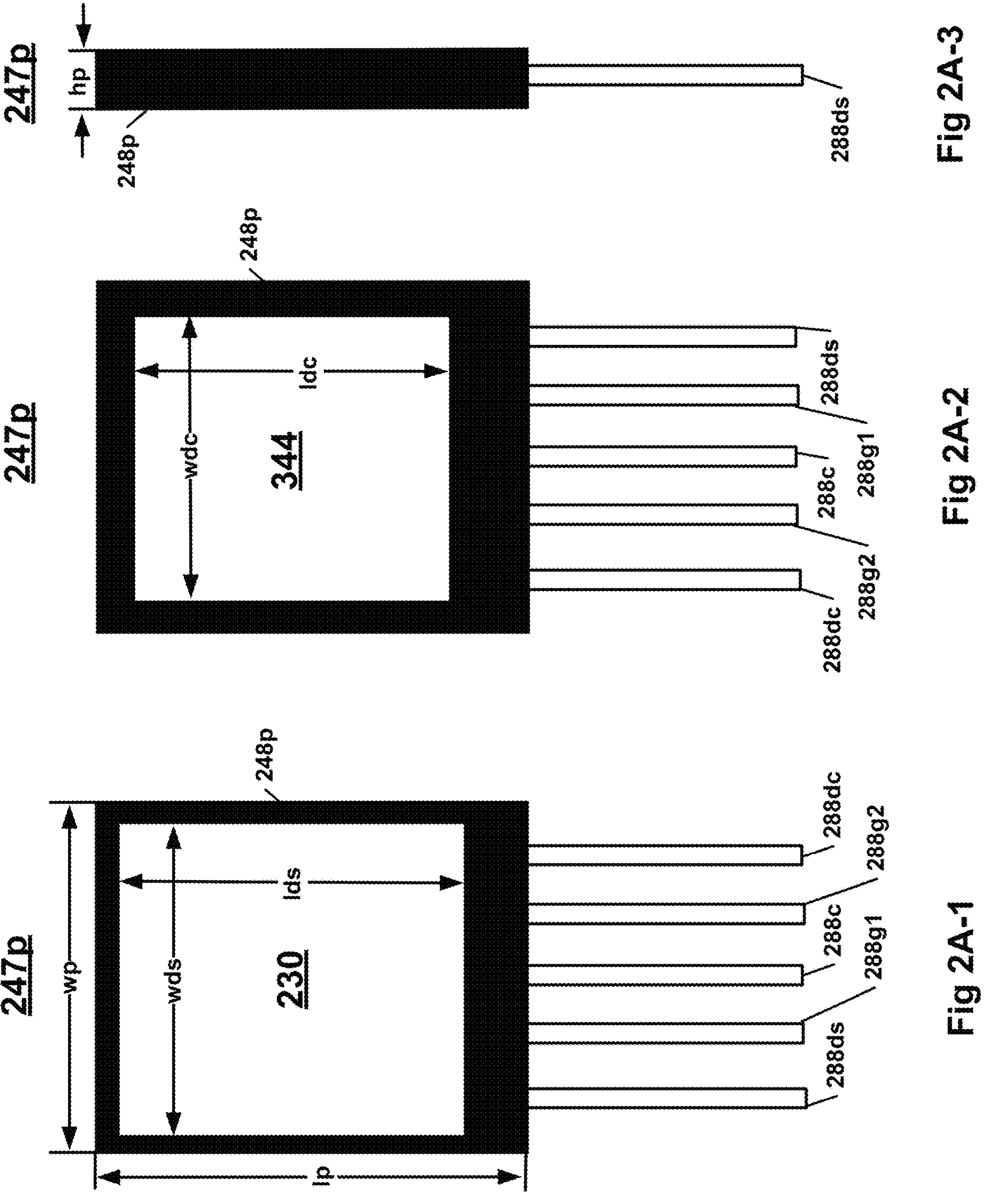
FIGS. 2A-1, 2A-2, and 2A-3 are top, bottom, and side views, respectively, of an example packaged switch.
Figures 1, 2, 2B, 3:
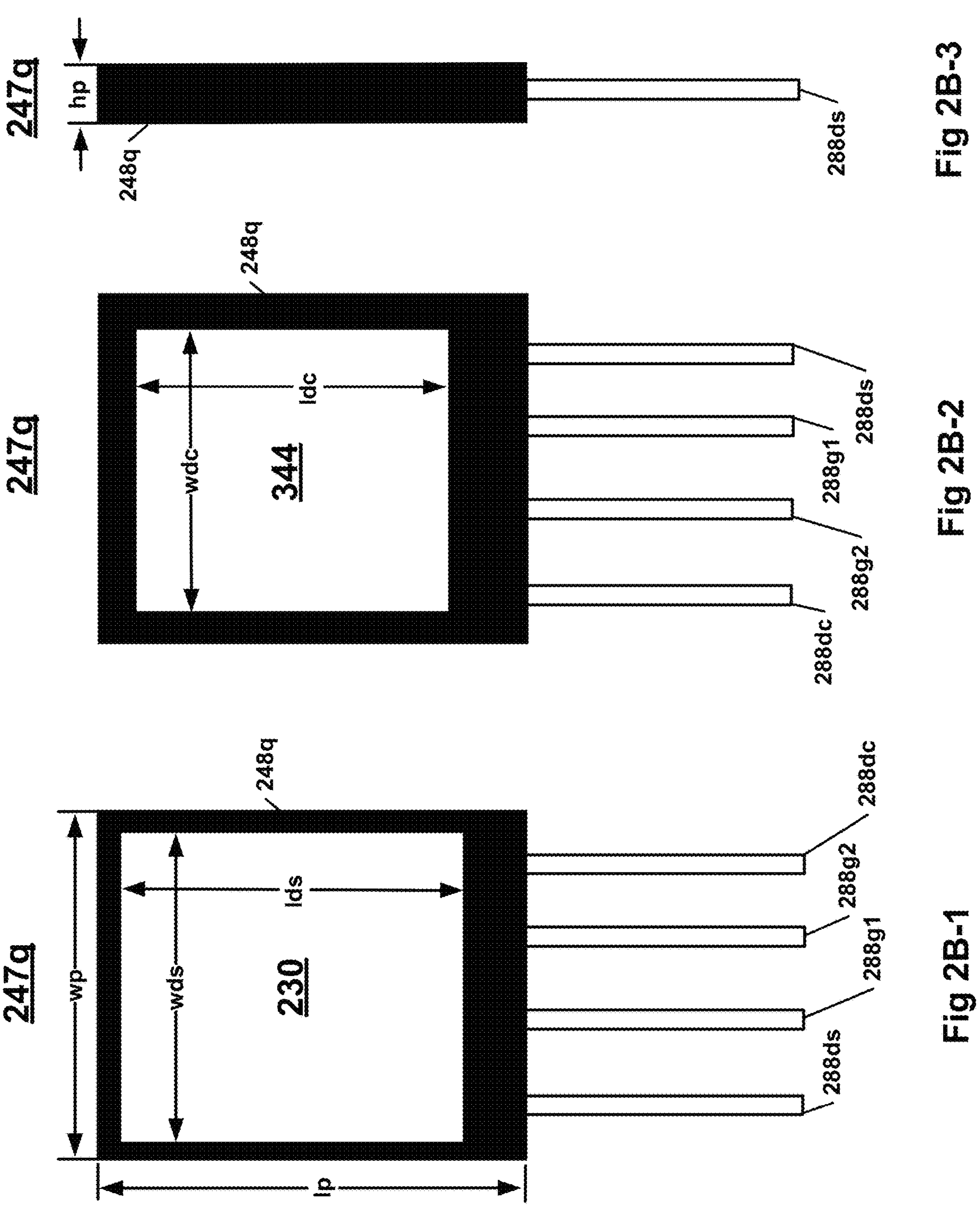
Figures 1, 2, 2C, 3:
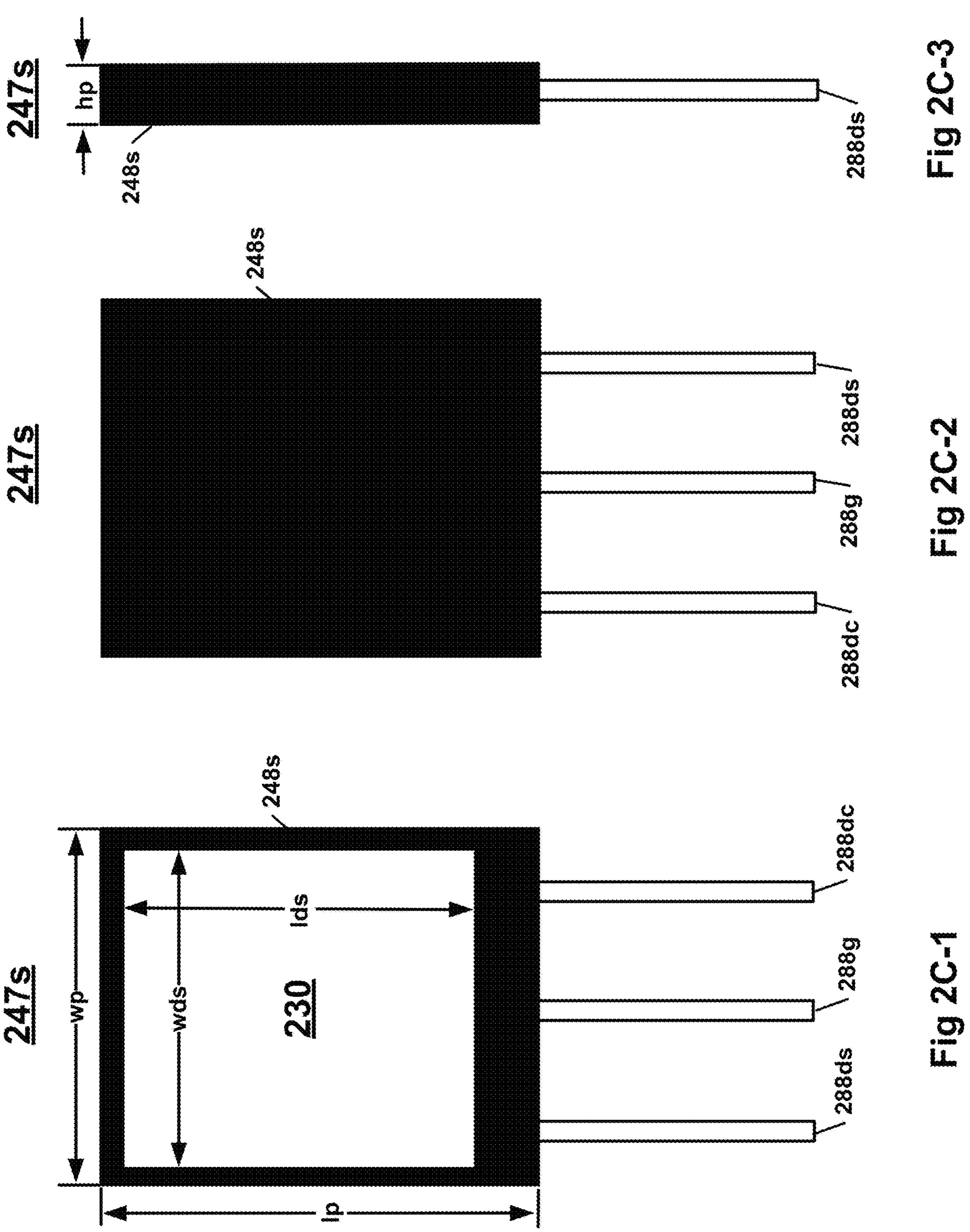
Figures 1, 2, 2D, 3:
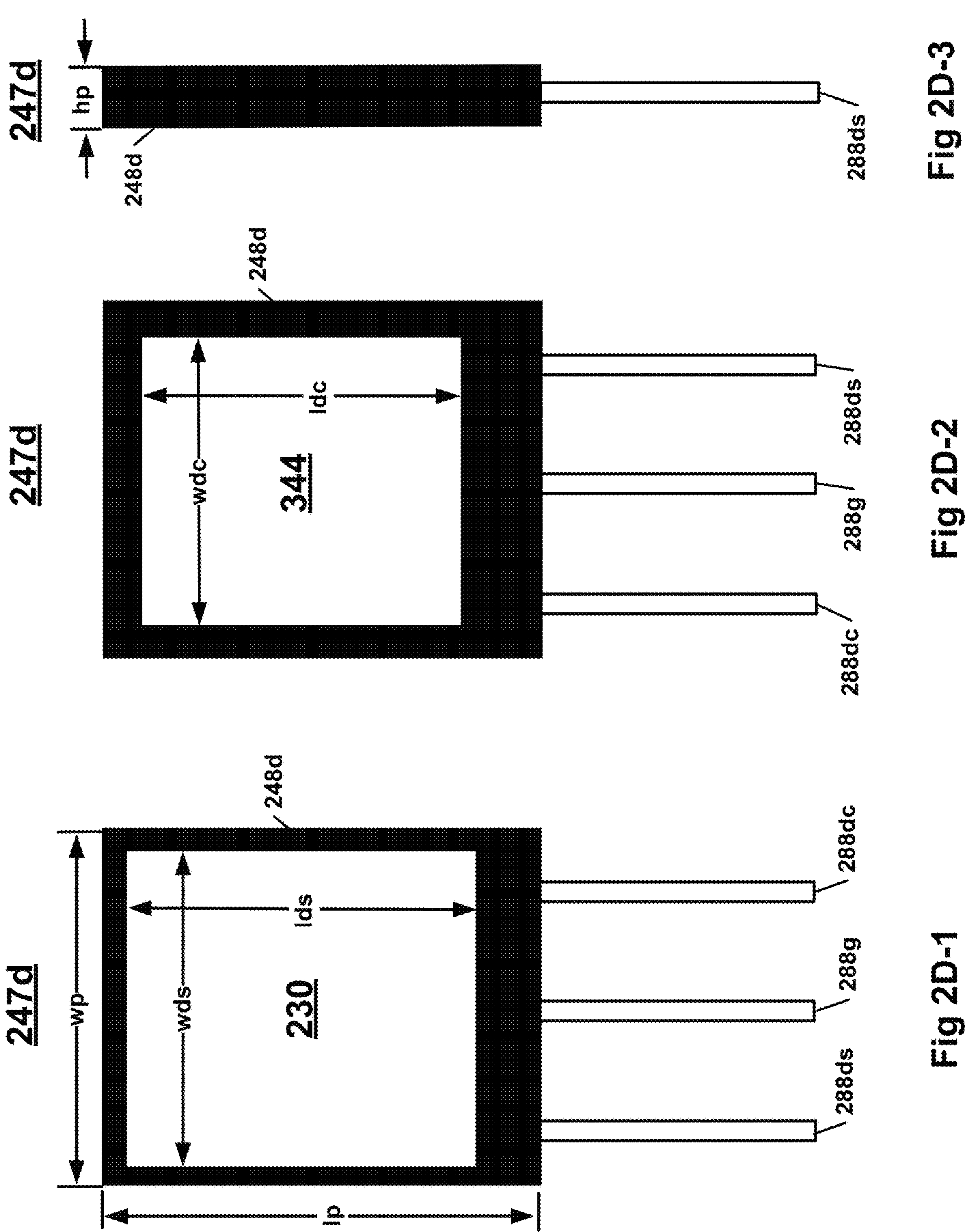
Figures 1, 2, 2E, 3:
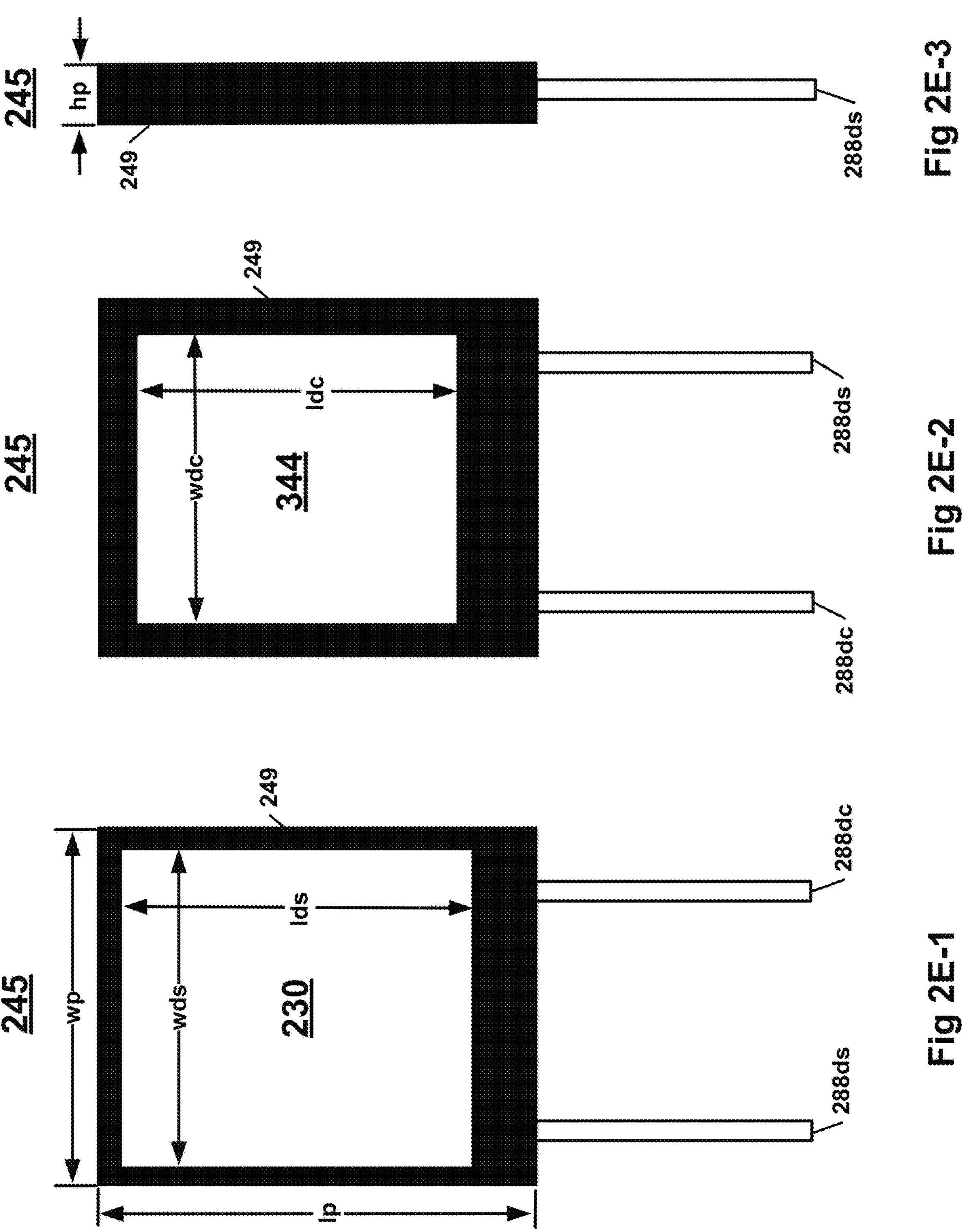

FIG. 2A shows connector-leads 288*g*1, 288*g*2, 288*c*, 288*dc*, and 288*ds*. FIG. 2B shows connector-leads 288*g*1,

288_g_2, 288_dc_, and 288_ds_. FIGS. 2C and 2D show connector-leads 288_g_, 288_dc_, and 288_ds_. FIG. 2E show connector-leads 288_ds_ and 288_dc_.

Although not shown in FIGS. 2A-1 and 2B-1 connector-lead 288_g_1 may be electrically connected to one or more first control terminals (e.g., gate terminals) of one or more first transistors internal to packaged switches 247_p_ or 247_q_, and connector-lead 288_g_2 may be electrically connected to one or more second control terminals (e.g., gate terminals) of one or more second transistors internal to packaged switches 247_p_ or 247_q_. In some instances, connector-leads 288_g_1 and 288_g_2 may be connected to respective control terminals of one transistor (e.g., a bidirectional bipolar junction transistor) in packaged switch 247_q_. Although not shown in FIGS. 2C-1 and 2D-1 connector-lead 288_g_ may be electrically connected to one or more control terminals (e.g., gate terminals) of one or more transistors internal to packaged switches 247_s_ and 247_d_. Connector-leads 228_ds_ and 228_dc_ may be electrically connected to a die substrate and die clip, respectively. Connector-lead 288_c_ may be electrically connected to a paddle, which is more fully described below.

Power Stacks

A power stack may include a switch or diode, which may be electrically and thermally connected to and positioned between a die substrate and a die clip. Die substrates and die clips may be formed from an electrically and thermally conductive material (e.g., metal) as will be more fully described below.

Die substrates and die clips may include die substrate terminals and die clip terminals, respectively. Packaged switches and packaged diodes of FIGS. 2A-1-2E-3 show example die substrate terminals 230 and die clip terminals 344.

Die substrate terminal 230 may have a width wds around 13.5 mm, and a length lds around 16.5 mm. Die clip terminal 344 may have a width wdc around 13.0 mm, and a length ldc around 16.0 mm. The lengths and widths of a die substrate terminal 230 and a die clip terminal 344 may depend on the number and/or type of transistors in the switch positioned between them. For example, a packaged switch 247_q_ with six metal-oxide semiconductor field-effect transistors (MOSFETs) connected in parallel may have die substrate and die clip terminals 230 and 344, respectively, that are wider and/or longer than die clip terminals 230 and 344, respectively, in a packaged switch 247_q_ with only four MOSFETs connected in parallel. A packaged switch 247_d_ with two IGBTs connected in parallel may have die clip terminals 230 and 344, respectively, that are wider and/or longer than die clip terminals 230 and 344, respectively, in a packaged switch 247_d_ with only two MOSFETs connected in parallel.

The lengths and widths of a die substrate terminal 230 and a die clip terminal 344 in diode package 245 may depend on the number and/or type of diodes between them. A packaged diode 245 with four diodes connected in parallel may have die clip terminals 230 and 344, respectively, that are wider and/or longer than die clip terminals 230 and 344, respectively, in a packaged diode 245 with only two diodes connected in parallel.

Connector-leads 288_ds_ and 288_dc_ in FIGS. 2A-1-2E-3 may be electrically connected to die substrate terminal 230 and die clip terminal 344, respectively. Connector-leads 288_ds_ and 288_dc_ can carry substantial current (e.g., 1, 5, 10, 25, 50, 100 amperes (A) or more). For ease of illustration connector-leads 288 in FIGS. 2A-3, 2B-3, 2C-3, 2D-3, and 2E-3 are shown as being contained in a common plane. Connector-leads 288 need not be contained in a common plane.

Switch modules may include power stacks, each of which may include a switch that is thermally and electrically connected to and positioned between a die substrate and a die clip. The die substrate may be directly connected (e.g., sintered) to the switch, or indirectly connected to the switch through one or more electrically and thermally conductive components such as pedestals (more fully described below). Likewise, the die clip may be directly connected (e.g., sintered) to the switch, or indirectly connected to the switch through one or more electrically and thermally conductive components such as pedestals.

Two items can be directly or indirectly connected, attached, bonded, or joined together. Two items (e.g., a transistor and a die substrate, or a bus bar and a die substrate terminal) that are thermally and electrically connected, attached, bonded, or joined together, either directly or indirectly, can concurrently conduct substantial electrical current (e.g., 1, 5, 10, 50, 100, 200, 400 A or more) and substantial heat (e.g., 1, 2, 5, 10, 20, 40, 80, 100, 200, 400, 800, 1200, 1400 Watts or more) between them. Two items thermally and electrically connected, attached, bonded, or joined can concurrently conduct substantial electrical current and substantial heat between them through a direct connection, attachment, bond, or joint (e.g., a silver sintered connection, attachment, bond, or joint). Two items thermally and electrically connected, attached, bonded, or joined indirectly together can concurrently conduct substantial electrical current and substantial heat between them through one or more intervening items such as a pedestal. Respective surface areas of two items can be directly connected, attached, bonded, or joined together by pressing the surface areas together using a mechanical structure such as a clamp, screw, etc.

A thermal and/or electrical connection may be more than just a point-to-point connection. Two items that are thermally and/or electrically connected, bonded, attached, bonded, or joined may have respective surface areas (e.g., 1, 5, 10, 20, 50, 100, 200, 400 $mm^2$ or more) that are directly connected, attached, bonded, or joined together through a layer of connection, attachment, bond or joint material; in other words, flat-surface to flat-surface connection. A thermal and/or electrical connection, attachment, bond, or joint directly connecting, attaching, bonding, or joining two items may substantially fill all the space directly between respective surface areas of the two items that face each other.

Diode modules may include power stacks, each of which may include at least one diode electrically and thermally connected to and positioned between a die substrate and a die clip. A diode may be directly connected (e.g., sintered) to a die substrate, or indirectly connected to the die substrate through one or more electrically and thermally conductive components such as pedestals. A diode may be directly connected (e.g., sintered) to a die clip, or indirectly connected to the die clip through one or more electrically and thermally conductive components such as pedestals.

Sintering may be a process of forming a connection, joint, bond, or attachment by the application of heat and/or pressure without melting a sintering material to the point of liquefaction. Before a pair of items such as a die substrate and a transistor are sintered, a thin layer of sintering material (e.g., silver, alloy of silver, etc.) may be applied to one or both surfaces of the items to be sintered. During the sintering process the atoms in the sintering material diffuse across boundaries of the items to be sintered, fusing them together and effectively creating one solid item. The sintering temperature need not reach the melting point of the sintering material, nor does the sintering process need to reach the melting point of the items (e.g., a die substrate and transistor) to be sintered together. Sintering, unlike soldering, should not create bubbles or other voids that can adversely affect thermal and electrical conductivity between the items. While other methods of attaching items can be employed, sintering may be preferred since it may create a mechanically stronger bond, especially when compared to soldering. A strong bond is particularly important when it is subjected to stress (e.g., thermal and/or mechanical stress) of extreme environments. For example, a bond can be subjected to severe mechanical stress caused by road vibrations of moving electric vehicles, and a bond can be subjected to severe thermal stress caused by temperature cycling. Moreover, since the melting point of the sintering material is higher than the temperature used in soldering, brazing, epoxy bonding, sintering, or other processes used in the construction of a packaged switch, diode, or converter, those processes should not disturb the sintered connection.

The die clip and die substrate of a power stack may be substantially identical, or they may be substantially different in size, shape and/or composition. Die substrates can vary in size, shape, and composition between different versions of power stacks. Likewise, die clips can vary in size, shape, and/or composition between different versions of power stacks.

A switch may include one or more semi-controllable and/or fully controllable transistors (e.g., insulated-gate bipolar transistor (IGBT), reverse-blocking IGBT (RB-IGBT), non-punch through IGBT (NPT-IGBT), metal-oxide field effect transistor (MOSFET), silicon-controlled rectifier (SCR), thyristor, symmetrical gate turn off thyristor (GTO thyristor), bidirectional thyristor (BT), bidirectional triode thyristor or TRIAC, bidirectional control thyristor (BCT), bipolar junction transistor (BJT), bidirectional BJT (BBJT (aka BTran)), etc.). A switch may also include one or more diodes (e.g., normal diode, zener diode, etc.) connected in parallel or anti parallel with one or more transistors. Transistors and/or diodes may be made from any one of many different types of semiconductor materials such as Si, SiC, GaN, GaO, cubic boron arsenide, etc.

A transistor may have two current terminals (e.g., collector and emitter terminals in an IGBT or BJT, source and drain terminals in a MOSFET, cathode and anode terminals in a thyristor, collector/emitter terminals in a BBJT, cathode/anode terminals in a BT, etc.) between which current can flow when the transistor is activated or turned-on. A diode may have two current terminals (e.g., a cathode terminal and an anode terminal). A current terminal may include one or more pads, each of which may have a substantially flat surface. The first current terminal(s) (e.g., drain terminal(s), collector(s), cathode(s), etc.) of a switch may be electrically and thermally connected to a die substrate terminal, such as die substrate terminal 230 shown in FIGS. 1A-2E, through the body of the die substrate. The second current terminal(s) (e.g., source(s), emitter(s), anode(s), etc.) may be electrically and thermally connected to a die clip terminal, such as die clip terminal 344 shown in FIGS. 1A-2E, through the body of the die clip.

Transistors include control terminals (e.g., gate terminal in a MOSFET or IGBT, base terminal in a BJT or BBJT, etc.). Transistors are controlled (activated or deactivated) by signals received at their control terminals. Some transistors may be purely unidirectional or capable of controlling electrical current flow from the first terminal to the second current terminal when activated, and capable of blocking current in the reverse direction (i.e., from the second current terminal to the first current terminal) when deactivated. Some transistors (e.g., MOSFETs) are quasi-unidirectional or capable of controlling electrical current flow from the first terminal to the second current terminal when activated but incapable of controlling electrical current flow in the reverse direction when deactivated. Transistors may be bidirectional or capable of controlling electrical current flow in both directions between their first and second current terminals when activated, and capable of blocking current flow in both directions between their first and second current terminals when deactivated. A BBJT is an example of bidirectional transistor.

As noted, a current terminal may include one or more pads, each of which may have a substantially flat surface. A low resistance path may exist between a current terminal pad and a die substrate terminal 230. A low resistance path may exist between a current terminal pad and a die clip terminal 344. A low resistance path between a current terminal pad and a die substrate terminal 230 or die clip terminal 344 may have a thermal resistance of 0.3, 0.2, 0.1, 0.05, 0.03, 0.02° C./Watt or lower, and electrical resistance of 16, 12, 10, 8, 6, 5, 4, 3 ohms or less. No dielectric should exist in a low resistance path between a current terminal pad and a die substrate terminal 230 or die clip terminal 344. A low resistance path may include one or more connections, attachments, joints, or bonds (e.g., one or more sintered connections, attachments, joints, or bonds) between a current terminal pad and a die substrate or a die clip. A low resistance path may further include a pedestal or other metallic component between a current terminal pad and a die substrate or a die clip. A low resistance path may mean the cross-sectional area of the path, which cross-sectional area is parallel to the surface of the current terminal pad, does not substantially decrease from the current terminal pad to a die substrate terminal 230 or a die clip terminal 344. The cross-sectional area of some low resistance paths, which cross-sectional area is parallel to the surface of the current terminal pad, may increase from the current terminal pad to a die substrate terminal 230 or a die clip terminal 344, which enables better heat spreading from the current terminal pad to the die substrate terminal 230 or the die clip terminal 344. Substantial heat (e.g., 1, 2, 5, 10, 20, 50, 100, 200, 300, 750 Watts or more) and current (e.g., 1, 5, 10, 50, 100, 200, 400 A or more) can concurrently flow from a current terminal pad to a die substrate terminal 230 or a die clip terminal 344 through a low resistance path. Ideally, a cross-sectional area of a low resistance path between a current terminal pad and a die substrate terminal 230 or die clip terminal 344 should not decrease as electrical current and heat conducts from the current terminal pad to the die substrate terminal 230 or die clip terminal 344. Ideally, a low resistance path between a current terminal pad and a die substrate terminal 230 or die clip terminal 344 should have a cross-sectional area that is not less than the surface area of the current terminal pad.

Transistors in a switch may be connected in parallel (i.e., first current terminals are electrically connected, and second current terminals are electrically connected). Transistors in a switch may be connected back-to-back (e.g., two transistors connected in series but with their first current terminals connected or their second current terminals connected). Transistors in a switch may be connected in anti-parallel (e.g., two transistors connected in parallel but with the first and second current terminals of the first transistor connected to the second and first current terminals, respectively, of the second transistor). Switches may be bidirectional or capable of controlling the flow of current in both directions. A switch may be bidirectional if it contains quasi unidirectional transistors such as MOSFETs, which are connected back-to-back. A switch may be bidirectional if it contains purely unidirectional transistors such as BJTs or IGBTs including NPT-IGBTs or RB-IGBTs, which are connected in anti-parallel. A switch may be bidirectional if it contains only one bidirectional transistor such as BBJT or several bidirectional transistors connected in parallel.

A switch may be a hybrid or a mix of different types of transistors connected in parallel, back-to-back, or in anti-parallel. For example, a hybrid switch may include one or more MOSFETs and one or more IGBTs connected in parallel (i.e., drains and collectors are electrically connected, and sources and emitters are electrically connected). Other hybrid switches are contemplated.

Different types of drivers may be needed to control different types of transistors. Some gate drivers that can activate and deactivate an IGBT cannot activate and deactivate a MOSFET, and vice versa. However, other drivers are capable of concurrently controlling different types of transistors. For example, some gate drivers can independently generate separate signals for controlling the gates of a MOSFET and an IGBT in a switch. Independently controlled signals can be turned on at different times. For example, independently controlled signals for respective transistors can be asserted at different times.

Multiple transistors in a switch may be connected in parallel and controlled by a common signal received at their control terminals. Parallel connected transistors in a switch may be controlled by respective, independent control signals received at their control terminals. Groups of parallel connected transistors in a switch may be controlled by respective, independent control signals. All or fewer than all (e.g., one, two, or more, but less than all) parallel connected transistors in the switch may be activated at the same time when controlled by respective, independent control signals.

A pair of transistors in a switch may be connected in anti-parallel, or two groups of parallel connected transistors in a switch may be connected in anti-parallel. The pair of anti-parallel transistors may be controlled by respective, independent signals, or the two groups of parallel connected transistors that are connected in anti-parallel may be controlled by respective, independent control signals. Only one in the pair of anti-parallel connected transistors should be activated at a time, and only one of the two groups of parallel connected transistors that are connected in anti-parallel should be activated at a time.

A pair of transistors in a switch may be connected back-to-back, or two groups of parallel connected transistors in a switch may be connected back-to-back. The pair of back-to-back connected transistors may be controlled by respective, independent signals, or the two groups of parallel connected transistors that are connected back-to-back may be controlled by respective, independent control signals. Only one of in the pair of back-to-back connected transistors in a switch should be activated at a time, and only one of two groups of parallel connected transistors that are connected back-to-back should be activated at a time.

Transistors or diodes may be vertically structured semiconductors devices or dies. A vertically structured transistor may have a trench-like structure with a first current terminal (e.g., a drain terminal, collector terminal, collector/emitter terminal, etc.) on or near a first surface (e.g., bottom surface) of the die, and a second current terminal (e.g., a source terminal, emitter terminal, collector/emitter terminal, etc.) on or near an oppositely facing second surface (e.g., top surface) of the die. A vertically structured transistor may also have a control terminal (e.g., base terminal or gate terminal) on or near the top surface of the die. Some transistors such as BBJTs or BCTs may have a second control terminal on or near the bottom surface of its die. The cathode terminal and the anode terminal of vertically structured diode may be on or near oppositely facing top and bottom surfaces, respectively.

A current terminal may include one or more electrically and thermally conductive (e.g., metallic) contact pads (hereinafter pads), each of which may be in electrical or ohmic contact with an underlying doped semiconductor region (e.g., a source, a drain, an emitter, a collector, an emitter/collector, an anode, a cathode, etc.). A control terminal may include one or more pads. A control terminal pad may or may not be in ohmic contact with an underlying doped semiconductor region (e.g., a gate, a base, etc.). In IGBTs and MOSFETs a dielectric layer may electrically isolate a gate terminal pad from an underlying gate. A BJT or BBJT base terminal pad may be in electrical or ohmic contact with an underlying base.

Current terminal and control terminal pads may be formed on the same side or surface of a transistor. The current terminal pad(s) in a transistor may have flat surface areas that are larger than those of the transistor's control terminal pad(s). Current terminals pads may have flat surfaces that may be exposed and configured for connection (e.g., sintered connection) directly to corresponding flat surfaces of die clips, die substrates, paddles, pedestals, etc. Current terminal pads may have a surface area with a size that enables heat transfer to thermally and electrically connected (e.g., sintered) die clips, paddles, pedestals, etc., and the larger the surface area the more heat can be transferred. First current terminal pad surfaces (e.g., drain and collector terminal pad surfaces of MOSFETs and IGBTs (or BJTs), respectively) may have a flat surface area of 1, 2, 3, 4, 5, 6, 8, 10, 15, 20 $mm^2$ or more. Second current terminal pad surfaces (e.g., source and emitter terminal pad surfaces of MOSFETs and IGBTs (or BJTs), respectively) may have a flat surface area of 1, 2, 3, 4, 6, 8, 10, 15 $mm^2$ or more. Exposed flat surfaces of current terminal pads on a side of a transistor may be contained in a common plane.

Exposed flat surfaces of control terminal pads in a transistor (e.g., a BBJT more fully described below) may be contained in a common plane. Control terminal pads may also have flat surfaces that may be connected (e.g., wire bonded, soldered, sintered, etc.) to bond-wires, signal frames, etc.

Flat surfaces of control terminal and current terminal pads in a transistor may be in the same plane. Surfaces of current terminal pad(s) in a transistor may be contained in a plane that is elevated from and parallel to a plane that contains the surfaces of control terminal pad(s). The current terminal pad(s) in a transistor may be manufactured with a height that is greater than the height of the control terminal pad(s) so that a flat surface of a die substrate or die clip may be directly connected (e.g., sintered) to flat surfaces of the current terminal pad(s) while avoiding contact with the control terminal pad(s). An etched layer of photoresist may be formed on a wafer that exposes current terminal (e.g., source terminals) pad(s) while covering control terminal (gate terminal) pad(s). Metal could then be deposited to increase the height of the current terminal pad(s). Thereafter the photoresist layer may be removed to leave exposed surface(s) of the current terminal pad(s) contained in a common plane that is higher than the common plane that contains the surface(s) of the control terminal pad(s). The added height given to the current terminal pad(s) may be viewed as "pedestals."

Flat surfaces of terminal pads on top and bottom sides of a transistor or a diode may face opposite directions. In general, an outward pointing vector normal to the average elevation of first surface of a pair of oppositely facing surfaces, may point an opposite direction with respect to an outward pointing vector normal to the average elevation of the second surface of the pair of oppositely facing surfaces.

Figure 2F:
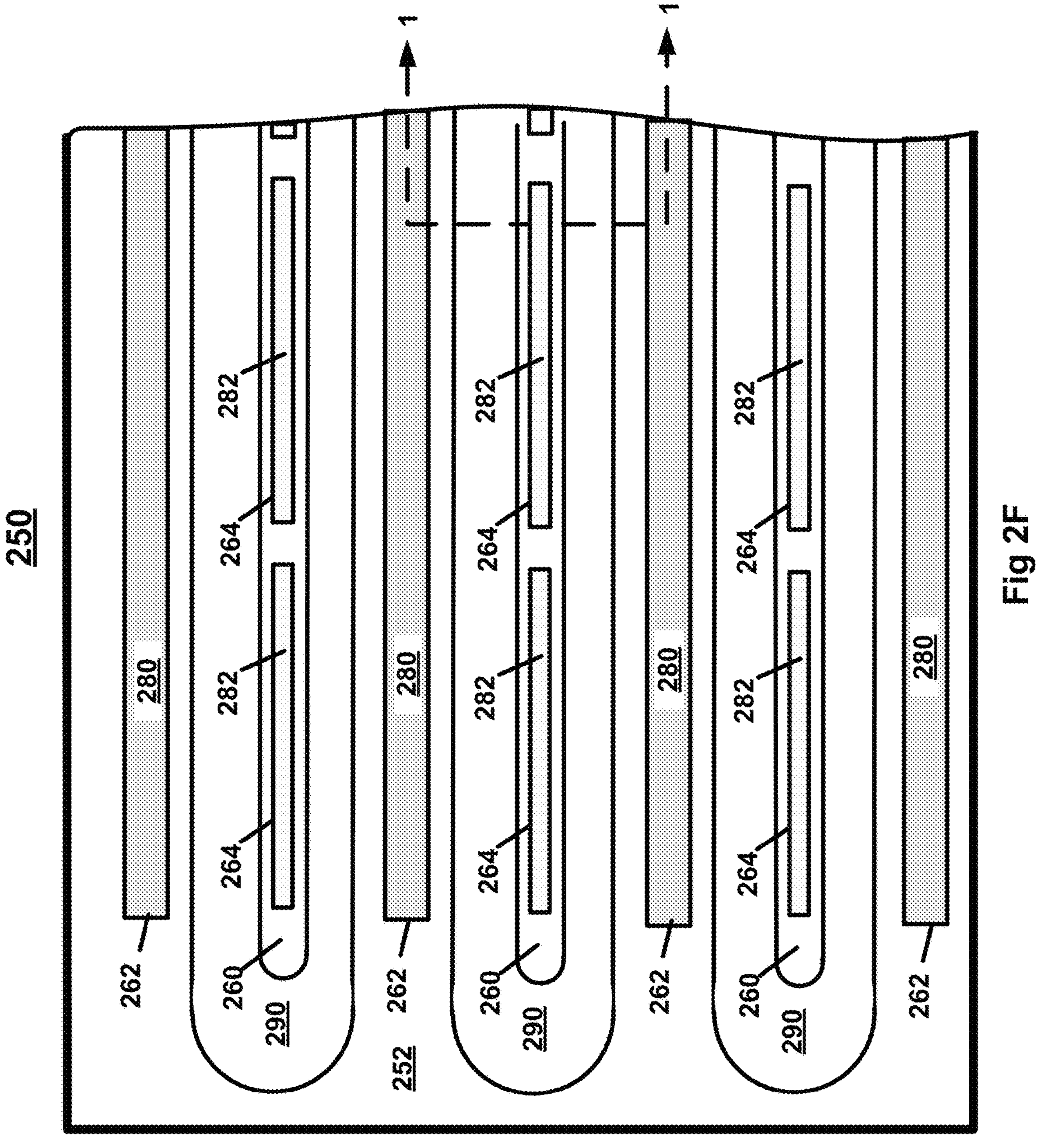
FIG. 2F is a top view showing a portion of an example transistor.
Figure 2G:
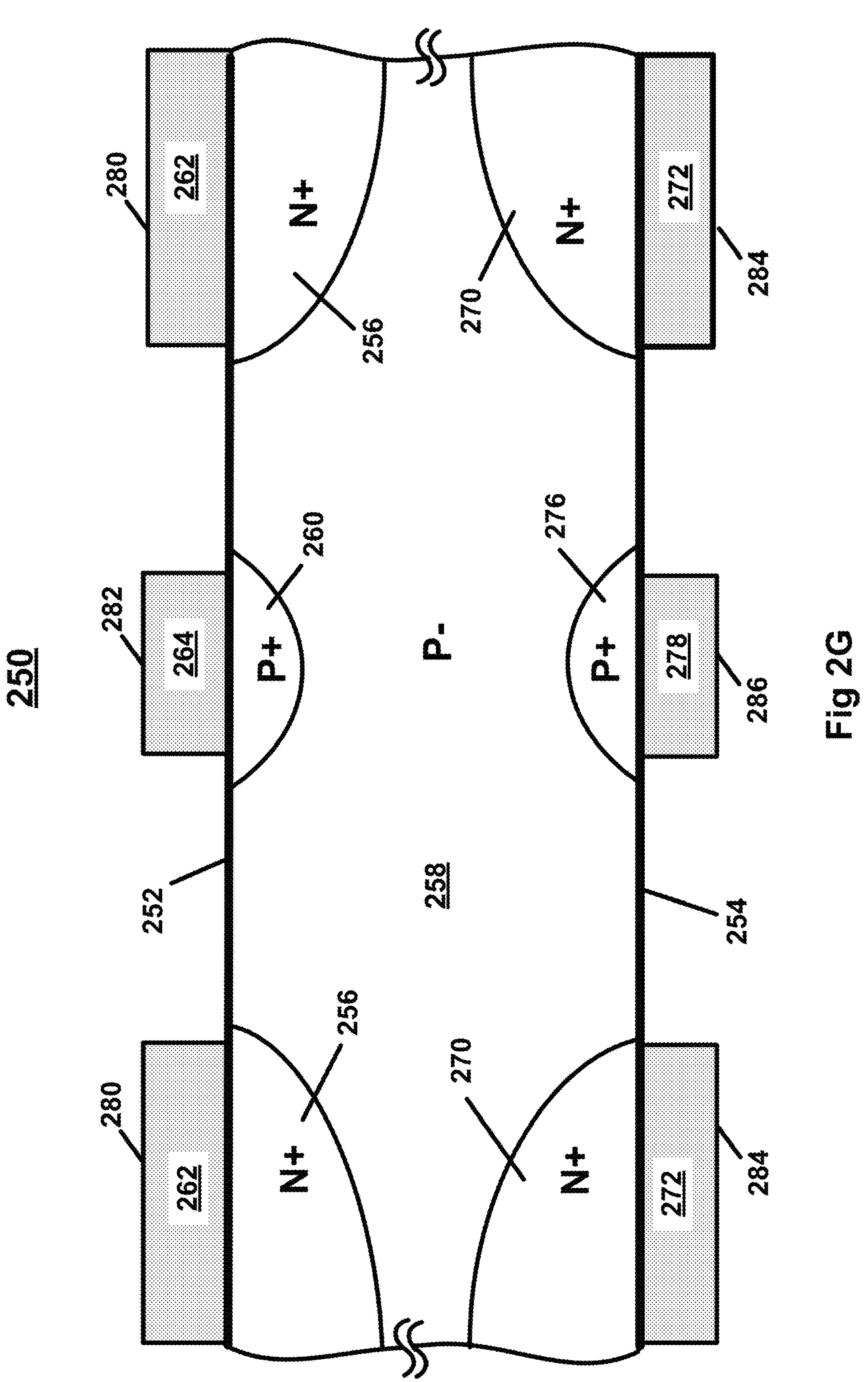
FIG. 2G is a side-view showing a portion of an example transistor.

FIG. 2F shows a partial top or overhead-view of an example, vertically structured BBJT 250. FIG. 2G shows a partial cross-sectional, side-view of BBJT 250 taken along line 1-1 in FIG. 2F. Example current and control terminal pads are shown in FIGS. 2G and 2F. With respect to FIG. 2F, BBJT includes a first (e.g., top) substantially flat surface 252 and an oppositely facing second (e.g., bottom) and substantially flat surface 254.

FIG. 2G shows collector/emitter regions 256 on one side that may form a junction with a drift or bulk substrate 258, and collector/emitter terminal pads 262 that are electrically connected to respective collector/emitters regions 256. Collector/emitter terminal pads 262 define exposed flat surfaces 280. FIG. 2G shows a base region 260 disposed between the collector/emitter regions 256, and a base terminal pad 264 that is electrically connected to base region 260. Base terminal pad 264 defines a flat surface 282. Surfaces 280 and 282 are contained in a common plane, it being understood surfaces 280 may be contained in a plane that is higher or lower than the plane that contains surface 282. FIG. 2G shows collector/emitter regions 270 on the opposite side that may form a junction with bulk substrate 258, and collector/emitter terminal pads 272 that electrically couple to respective collector/emitter regions 270. Collector/emitter terminal pads 272 define flat surfaces 284. FIG. 2G shows base region 276, and a base terminal pad 278 that is electrically coupled to the base region 276. Base terminal pad 278 defines a flat surface 286. Surfaces 284 and 286 are contained in a common plane, it being understood surfaces 284 may be contained in a plane that is higher or lower than the plane that contains surface 286. Although not shown in FIG. 2G, BBJTs may include several collector/emitter regions and several base regions on both sides. In FIG. 2G, only two collector/emitter terminal pads are shown, and only one base terminal pad is shown on each side; however, two or more collector/emitter terminal pads may be implemented BBJTs on each side, and two or more base terminal pads may be implemented in BBJTs on each side. Terminal pads may be formed by depositing a metallic material through windows in an insulation material (not shown) covering a side of a transistor such as a BBJT.

The example BBJT 250 is an NPN structure, which means the collector/emitter regions 256 and 270 are N-type, the bases regions 260 and 276 are P-type, and the bulk substrate 258 is P-type. Note that PNP-type BBJTs are also contemplated; however, so as not to unduly lengthen the discussion a PNP-type BBJT is not specifically shown.

With continuing reference to FIG. 2F, collector/emitter region 256 defines several internal regions 290 that are not doped. Defined within each example internal region 290 is base region 260.

A switch can transmit high levels of current (e.g., 1, 5, 10, 50, 100, 200, 400 A or more) between a die clip and a die substrate without failure depending on the size (e.g., current terminal width and length), type (e.g., MOSFET), semiconductor material (e.g., GaN), and number of activated transistors connected in parallel. A transistor can transmit high levels of current (e.g., 1, 5, 10, 50, 100, 200, 400 A or more) between its current terminals at high switching speeds (e.g., up to 100 kHz or more for Si IGBTs, up to 500 kHz or more for SiC MOSFETS, up to 1.0 GHz or more for GaN MOSFETs, etc.). When thermally connected to and cooled by heat sinks or bus bars that also act as heat sinks, transistors may be able to transmit more current at higher switching speeds without breaking, delaminating, or degrading. Likewise, when thermally connected to and cooled by heat sinks or bus bars that also act as heat sinks, diodes may be able to transmit more current without breaking.

A switch may be electrically and thermally connected to and sandwiched between die substrates and die clips. The first current terminal (e.g., collector terminal, drain terminal, etc.) pad(s) and the second current terminal (e.g., emitter terminal, source terminal, etc.) pad(s) of a transistor in a switch may be directly or indirectly connected to a die substrate and a die clip, respectively, or vice versa. The flat surface(s) of the first current terminal pad(s) and the flat surface(s) of the second current terminal pad(s) of a transistor in a switch may be indirectly connected to flat surfaces of a die substrate and a die clip, respectively, or vice versa. The flat surface(s) of the first current terminal pad(s) of a transistor may be directly connected to a flat surface of a die substrate while the flat surface(s) of the second current terminal pad(s) may be indirectly connected to a flat surface of a die clip, or vice versa. The flat surface(s) of the first current terminal pad(s) of a transistor may be directly connected to a flat surface of a die clip and the flat surface(s) of the second current terminal pad(s) may be directly connected to a flat surface of a die substrate, or vice versa. A direct connection may include only sintering or other type of bonding material between a current terminal pad surface and a surface of a die substrate or a die clip. A current terminal pad can be indirectly connected to a die clip or die substrate through an electrically and thermally conductive pedestal with flat end surface that is sintered to a flat surface of the current terminal pad.

A switch may include multiple transistors, each of which may be electrically and thermally connected to and sandwiched between a die clip and a die substrate. Flat surfaces of first current terminal pads and flat surfaces of second current terminal pads of parallel connected transistors in a switch may be directly or indirectly connected to flat surfaces of a die substrate and a die clip, respectively, or vice versa. The flat surface(s) of the first current terminal (e.g., collector) pad(s) of a first transistor (e.g., a first RB-IGBT) in a switch and the flat surface(s) of the second current terminal (e.g., emitter) pad(s) of a second transistor (e.g., a second RB-IGBT) in the switch may be directly or indirectly connected to a flat surface of a die substrate, while the flat surface(s) of the second current terminal (e.g., emitter) pad(s) of the first transistor and the flat surface(s) of the first current terminal (e.g., collector) pad(s) of the second transistor may be directly or indirectly connected to a flat surface of a die clip, or vice versa. Flat surfaces of first current terminal (e.g., drain) pads of first and second transistors in a switch may be directly or indirectly connected to flat surfaces of a die substrate and a die clip, respectively, while second current terminal (e.g., source) pads of the first and second transistors may be indirectly connected to each other.

The control terminal (e.g., gate terminal, base terminal, etc.) pad(s) of one or more transistors in a switch may be controlled by a voltage signal or a current signal from a driver, or control terminals of respective transistors or respective groups of transistors in a switch may be controlled by respective voltage signals or current signals from respective drivers. Different types of transistors may need different types of drivers for effective control. A driver may be configured to separately control different types of transistors. Control terminals of a BBJT may be controlled by the separate signals from a driver, or by separate control signals from respective drivers.

Control terminal pad(s) may be positioned on only one side of some transistors (e.g., MOSFETs and IGBTs), or control terminal pads on opposite facing sides of other transistors (e.g., BBJTs). The control terminal pad(s) may be positioned adjacent to current terminal (e.g., source terminal or emitter terminal) pad(s) in some transistors (e.g., MOSFETs or IGBTs), or control terminal pads may be interspersed between current terminal (e.g., collector/emitter terminal) pads in other transistors (e.g., BBJTs).

A transistor control signal may be carried from a driver to a control terminal pad in an electrical path that includes a lead, trace, strap, bond-wire, signal frame, etc., or a serially connected combination of two or more thereof. A bond-wire may be wire-bonded to a control terminal pad in some switch modules. A signal frame may be soldered to one or more control terminal pads in some switch modules.

One or more pedestals in a power stack may be electrically and thermally connected to and positioned between a transistor and a die clip, paddle, bridge or die substrate. The pedestals can be configured to provide space for bond-wire(s) beneath the die clip, paddle or die substrate. In some power stacks, one or more pedestals are electrically and thermally connected to and positioned between a transistor and a die clip, and one or more pedestals are electrically and thermally connected between the transistor and a paddle or die substrate. Pedestals can be configured so that liquid mold compound (e.g., liquid resin) can flow around them during transfer mold packaging of switch modules or diode modules to create packages in which the mold compound (e.g., resin) electrically isolates exposed surfaces of die clips and die substrate that face each other. The mold compound may also cover exposed bond wires, straps, signal frames, current terminal pads, and/or control terminal pads.

One or more diodes may be electrically and thermally connected to and sandwiched between die substrates and die clips. The flat surface of a first current terminal (e.g., anode terminal) pad and the flat surface of a second current terminal (e.g., cathode terminal) pad(s) of a diode may be directly or indirectly connected to a die substrate and a die clip, respectively, or vice versa. Like switches, a diode current terminal pad can be indirectly connected to a die substrate or die clip through a pedestal that is sintered to the pad, and direct connections may include only sintering or other type of bonding material between current terminal pads and die substrates or die clips. Since diodes lack control terminals, there is no need to accommodate bond-wires. A first current terminal pad and a second current terminal pad of a diode may be directly connected (e.g., sintered) to respective flat surfaces of a die clip and a die substrate.

A die clip can transmit substantial current into or out of a packaged switch or packaged diode through its die clip terminal while concurrently transmitting substantial heat out of the packaged switch or packaged diode through its die clip terminal. A die substrate can transmit substantial current into or out of a packaged switch or packaged diode through its die substrate terminal while concurrently transmitting substantial heat out of the packaged switch or packaged diode through its die substrate terminal.

A pedestal can transmit substantial current into or out of a current terminal pad to which it is electrically and thermally attached (e.g., sintered) while concurrently transmitting substantial heat out of the current terminal pad to which it is electrically and thermally attached. A flat end surface of a pedestal can be connected (e.g., sintered) directly to a flat surface of only one current terminal pad, or a flat end surface of a pedestal can be connected (e.g., sintered) directly to surfaces of multiple current terminal pads in a transistor or diode. Pedestals in a switch module or diode module may be identical in structure. Some switch modules may not employ pedestals; opposite facing current terminal pad surfaces in a transistor or diode may be directly connected (e.g., sintered) to respective surfaces of a die clip and die substrate. Likewise, some packaged diodes may not employ pedestals; opposite facing current terminal pad surfaces may be directly connected (e.g., sintered) to respective surfaces of a die clip and die substrate.

Power stacks may include additional electrically and thermally conductive components such as bridges and paddles more fully described below. Pedestals and other components (e.g., bridges) may provide a low resistance electrical and thermal path between current terminal pads and die clips or die substrates. The flat end surfaces of pedestals may be directly attached (e.g., sintered) to flat surfaces of current terminal pads, while the opposite facing flat end surfaces of the pedestals may be directly attached (e.g., sintered) to the flat surface(s) of a die clip, paddle or die substrate. Or the oppositely facing flat end surfaces of pedestals may be indirectly attached to the flat surface(s) of a die substrate, paddle or die clip through one or more intermediate components such as bridges, also more fully described below. In other versions the oppositely facing end surfaces of a pedestal may be directly attached to current terminal (e.g., source) pads of a pair of transistors that are connected back-to-back.

Die substrates, die clips, pedestals, paddles, and bridges may be formed using different methods. Die substrates, die clips, pedestals, paddles, and bridges may be 3-D printed. Die substrates, die clips, paddles, pedestals, and bridges may be extruded. Die substrates, die clips, paddles, pedestals, and bridges may be formed through a sintering process in which a solid mass is formed by applying pressure and heat to a sintering powder in a mold without melting it to the point of liquefaction. Die substrates, die clips, pedestals, paddles, and bridges may be formed from a thin sheet of highly conductive material. A layer of sintering enhancement material (e.g., silver or silver alloy) may be formed (e.g., electroplated) on the surface(s) of die substrates, die clips, paddles, pedestals, or bridges, before or after die substrates, die clips, paddles, pedestals, or bridges are formed. Barrel plating may be used to form the thin layer of sintering material on the surface of die substrates, die clips, paddles, pedestals, etc. A barrel plating process involves placing the items (e.g., pedestals) in a barrel-shaped cage that is manufactured from nonconductive material. The cage is then submerged into a tank containing the appropriate chemical solution, while a slow tumbling action is used to commence the plating action. Die substrates, pedestals, die clips, bridges, paddles, etc., should lack a dielectric element.

Die clips, die substrates, paddles, pedestals, bridges, etc., may be formed (e.g., machined, cut, stamped, sawed, diced, etc.) from a thin (e.g., 0.1 mm-3.0 mm) sheet of one or more metal layers. The term metal includes a pure metal (e.g., copper, iron, aluminum, gold, silver, molybdenum, etc.) or a metal composite. A metal composite is made by combining two or more distinct materials, at least one of which is a pure metal.

A thin (e.g., 3.0, 2.0, 1.0, 0.5, 0.3, 0.2, 0.1 mm or less) sheet from which die substrates, die clips, paddles, pedestals, or bridges are formed (e.g., machined, cut, stamped, sawed, diced, etc.), may be layered. Two or more layers in a layered sheet may be substantially uniform in thickness. Each layer in a layered sheet may be a metal, or each layer in a layered sheet may be a metal composite. One or more layers in a layered sheet may be metal, while one or more layers in the layered sheet may be a metal composite.

For purposes of explanation only, the present disclosure presumes die substrates, die clips, paddles, pedestals, and bridges are formed from sheets of highly conductive materials. For purposes of explanation only, a die substrate, die clip, paddle, pedestal, and bridge that is directly connected (e.g., sintered) to current terminal pad surface of a transistor or diode is presumed to be formed from a layered sheet unless otherwise noted.

Figure 2H:
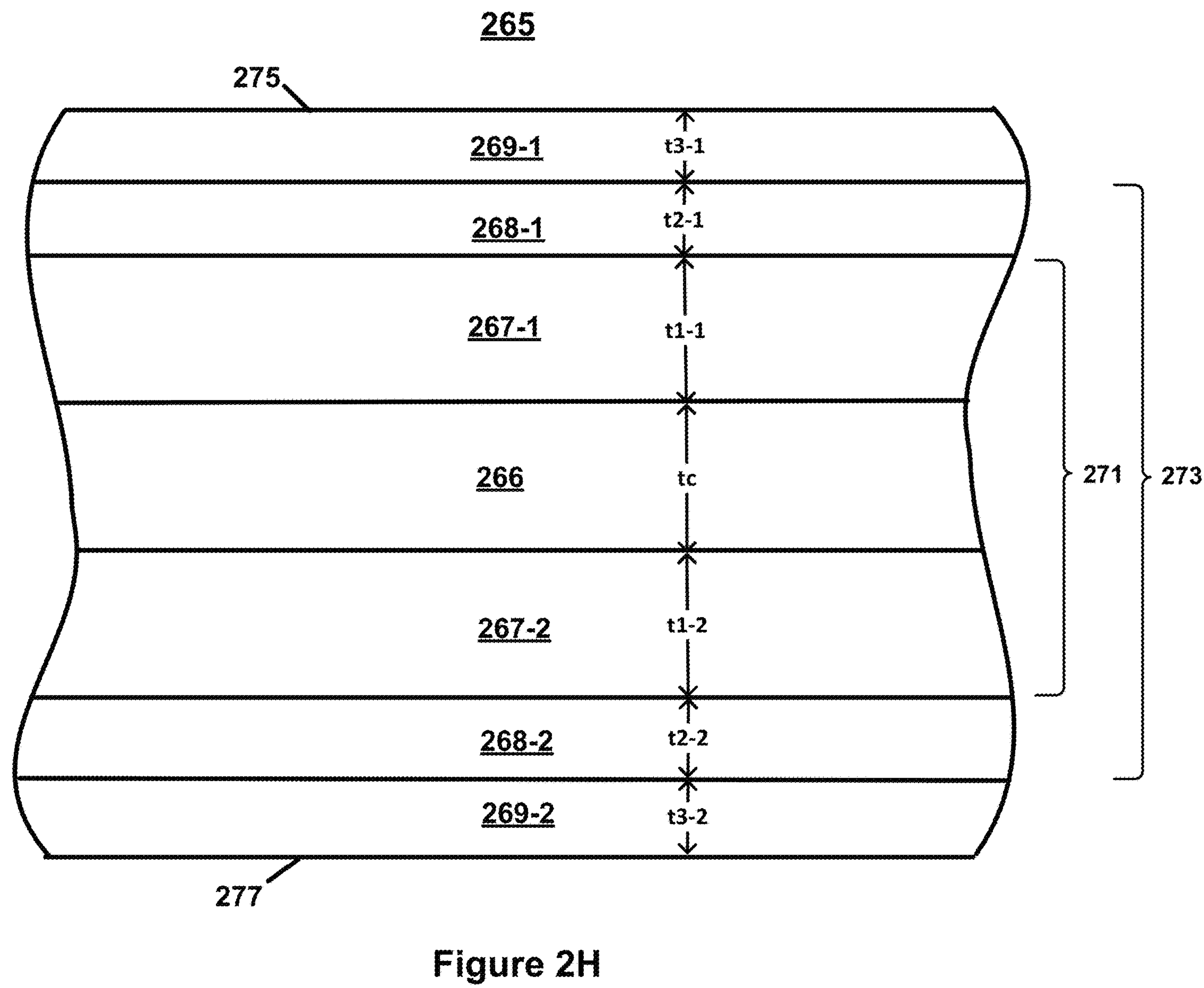
FIG. 2H is a side-view showing a portion of an example layered sheet.

FIG. 2H shows a side view of a portion of an example layered sheet 265 from which pedestals, paddles, bridges, die clips, die substrates or other components can be formed. Layered sheet 265 may be 0.5-1.16 mm between first and second oppositely facing flat surfaces 275 and 277. Section 271 consists of a central layer 266 of metal (e.g., molybdenum, which may be well suited for use with die substrates or pedestals to be attached to low CTE (e.g., SiC) based devices such as MOSFETs or diodes) or metal composite (copper/diamond, copper/molybdenum, copper/tungsten, etc.) between layers 267 of metal (e.g., copper) or metal composite. It should be noted that layer 266 can be a material other than molybdenum. Section 271 may be sandwiched between metal (e.g., nickel) or metal composite layers 268 as shown. A nickel layer 268 may prevent migration of copper to a silver layer 269. Layers 268 may be formed (e.g., electroplated) on layers 267. Section 273 may be sandwiched between layers of sintering enhancement material (e.g., sliver) 269 as shown. Layers 269 may be formed (e.g., electroplated) on layers 268. For purposes of explanation only, layers 268 and 269 are formed before pedestals, paddles, bridges, die clips, die substrates or other components are formed from sheet. In other versions, one or both of layers 268 and 269 can be added to pedestals, paddles, bridges, die clips, die substrates or other components after they are formed from a sheet with only layers 266 and 267.

Layer 266 may have a thickness tc that is substantially equal to the thickness t1 of layers 267. For example, tc and t1 may both be 0.30-0.35 mm. Layer 266 may have a thickness tc greater than or less than the thickness t1 of layers 267. For example, layer 266 may be two times or four times thicker than layer 267, or layer 266 may be one half or less as thick as layer 267. Layers 268 and 269 may be substantially equal in thickness. For example, each of t2 and t3 may be 0.005-0.015 mm.

Properties such as thickness tc and t1 and composition of flat layers 266 and 267 may vary. Layers 267 may have higher thermal conductivity and provide more efficient heat spreading qualities when compared to layer 266. Central layer 266 may have a coefficient of thermal expansion (CTE) that is lower than the CTE of layers 267. As more fully noted below, CTE may be a factor in the mechanical integrity of a connection between a bridge, pedestal end, die substrate, paddle, die clip surface, etc., and a transistor or diode.

The flat surface of current terminal pad may be electrically and thermally connected (e.g., sintered) directly to the flat surface (i.e., 275 or 277) of a bridge, pedestal end, die substrate, paddle, die clip surface, etc., formed from sheet 265. A sintered connection may be formed using, for example, a silver or copper sintering paste, film or preform. Components with different CTEs may expand and contract at different rates with a change in temperature. The composition and/or thickness of layers 266 and 277 may be selected so that the CTE of a die substrate, die clip, pedestal, paddle, bridge, etc., is close to or substantially equal to the CTE of the transistor or diode to which the die substrate, die clip, pedestal, paddle, bridge, etc., is connected (e.g., sintered). Close CTEs may reduce the chance, for example, a MOSFET drain terminal pad detaches or delaminates from the surface of a die substrate due to mechanical stress or strain caused by differences in expansion or contraction rates between the die substrate and the MOSFET when the temperature of the MOSFET cycles between hot and cold. The composition and/or thicknesses of layers 266 and 267 of a bridge, pedestal end, die substrate, paddle, die clip surface, etc., may be chosen based on one or more factors such as the type of transistor or diode to which it is attached. For example, a molybdenum or molybdenum/copper layer 266 between copper layers 267 of a die substrate may give it a CTE that is close or substantially equal in value to the CTE of a SiC MOSFET to which the die substrate is silver sinter attached.

Die substrates, die clips, bridges, or paddles may be formed with integrated pedestals. A bridge with integrated pedestals (hereinafter "integrated bridge") may be formed (machined, cut, stamped, sawed, diced, etc.) from a sheet of metal or metal composite, or from a layered sheet like that shown in FIG. 2H.

A die substrate may have only one terminal exposed through the case of a packaged switch or packaged diode through which heat and current may be transmitted. The die substrate terminal may have a flat surface for mechanical, electrical, and thermal mating with a flat surface of, for example, a bus bar. The surface of the die substrate terminal may be entirely flat.

A die clip may have only one terminal exposed through the case of the packaged switch or packaged diode through which heat and current may be transmitted. A die clip terminal may have a flat surface for mechanical, electrical, and thermal mating with a flat surface of, for example, a bus bar. The surface of the die clip terminal may be entirely flat.

Die substrate terminals or die clip terminals may have surfaces that are entirely flat and substantially flush or coplanar with case surfaces of the packaged switches or packaged diodes in which they are contained. In other versions, the die substrate terminals or die clip terminals may have surfaces that are entirely flat and substantially parallel to and recessed below the case surfaces, or they may be parallel to and protrude above the case surfaces. Some die clip terminals may not be exposed through the case of a packaged switch (e.g., packaged switch 247*s*).

FIGS. 2A-1-2E-2 show example die substrate terminals 230 and example die clip terminals 344. FIGS. 2C-1-2C-3 show an example packaged switch 247*s* in which its die clip terminal is not exposed through case 248*s*. FIGS. 2A-1-2E-2 show die substrate terminals 230 and die clip terminals 344 with rectangular-shaped, and entirely flat surfaces that are parallel to and slightly above, parallel to and slightly below, or substantially flush with flat case surfaces of packaged switch 247 and packaged diode 245, even though terminals 230 and 344 may appear to be flush with the case surfaces.

The size and shape of die substrate terminals or die clip terminals should not be limited to that shown in the figures. In other words, the die substrate terminals and die clip terminals may take different forms, shapes, and sizes. A die clip terminal or a die substrate terminal may include one or more recesses that can mate with similarly shaped extensions of an external device (e.g., a phase bus bar, a V+ bus bar, a V− bus bar, etc., all of which are more fully described below) to facilitate electrical, thermal and/or mechanical connection therebetween. Or a die clip terminal or a die substrate terminal may include one or more extensions that can mate with similarly shaped recesses of an external device (e.g., a phase bus bar, a V+ bus bar, a V− bus bar, etc.) to facilitate electrical, thermal and/or mechanical connection therebetween.

Current can enter a packaged switch or packaged diode through a die substrate terminal, and then exit through a die clip terminal, or current can flow through a packaged switch or packaged diode in the reverse direction. To illustrate, current can enter packaged switch **247*d* through die substrate terminal 230 of a die substrate, flow through the die substrate, a switch, a die clip in that order, and then exit packaged switch 247*d* via die clip terminal 344, or current (e.g., free-wheeling diode current) can flow in the reverse direction. Current can enter packaged diode 245 through die substrate terminal 230 of a die substrate, flow through the die substrate, a diode, a die clip in that order, and then exit packaged diode 245 via die clip terminal 344**, or current (e.g., reverse recovery current) can flow in the reverse direction.

Die substrates and die clips can transmit substantial current to or from their connected switches or diodes while concurrently transmitting substantial heat away from their connected switches or diodes. Terminals of die substrates and die clips can transmit substantial current into or out of packaged switches or packaged diodes while concurrently transmitting substantial heat out of packaged switches or packaged diodes. For example, die substrate terminal 230 in FIG. 2A-1, 2B-1, 2C-1, 2D-1, or 2E-1 may be flat and can have a width wds around 14.5 mm and a length lds around 17.5 mm, and may be electrically connected to a flat surface of a bus bar. A die substrate can transmit 50, 100, 200, 400 A or more of current between its connected switch or diode(s) and a bus bar via its die substrate terminal 230. Die clip terminal 344 in FIG. 2A-2, 2B-2, 2D-2, or 2E-2 can have a width wdc around 14.0 mm and a length ldc around 17.0 mm and may be thermally and electrically connected to a flat surface of bus bar. The die clip can transmit 50, 100, 200, 400 A or more of current between its connected switch or diode(s) and the bus bar via its die clip terminal 344. Connector-leads **288*ds* or 288*dc* in FIGS. 2A-1-2E-3** can transmit 10, 40, 80, 100, 200 A or more into or out of a packaged switch or packaged diode.

Transistors in a switch may get hot due to conduction and switching losses, especially when they conduct high current at high switching speeds. Diodes can also get hot while conducting current. A die substrate, depending on its dimensions, can conduct large amounts of transistor or diode generated heat out of a packaged switch or packaged diode through its die substrate terminal. For example, die substrate terminal 230 in FIG. 2A-1, 2B-1, 2C-1, 2D-1, or 2E-1 can have a width around 14.5 mm and a length around 17.5 mm. The flat surface of die substrate terminal 230 may be electrically and thermally connected to a flat surface of heat sink or a bus bar that may also act as a heat sink. Die substrate terminal 230 can transmit anywhere between zero and 750 Watts or more of heat out of packaged switch **247*p*, 247*q*, 247*s*, or 247*d*, or packaged diode 245. In other words, die substrate terminal 230** can transmit 10, 20, 50, 100, 200, 300, 750 Watts or more of heat. A die substrate may be thick (e.g., 0.5, 0.8, 1.0, 2.0, 4.0, 8.0 mm or more when measured between oppositely facing surfaces), and the thicker it is, the more thermal capacitance it provides, which may be important for absorbing a sudden increase in heat from by an attached switch or diode.

Like die substrates, a die clip can conduct large amounts of transistor or diode generated heat out of a packaged switch or packaged diode through its die clip terminal. For example, die clip terminal 344 in FIG. 2A-2, 2B-2, 2D-2, or 2E-2 can have a width around 14.0 mm and a length around 17.0 mm, and may be electrically and thermally connected to a flat surface of a heat sink or bus bar that may also act as a heat sink. Die clip terminal 344 can transmit anywhere between zero and 750 Watts or more of heat out of packaged switch **247*p*, 247*q***, *p* **247*d* or packaged diode 245. In other words, die substrate clip 344** can transmit 10, 20, 50, 100, 200, 300, 750 Watts or more of heat. A die clip may be thick (e.g., 0.5, 0.8, 1.0, 2.0, 4.0, 8.0 mm or more when measured between oppositely facing surfaces), and the thicker it is, the more thermal capacitance it provides, which may be important for absorbing a sudden increase in heat from by an attached switch or diode.

Although not shown in FIGS. 2A-1-2E-3, packaged switch **247*p*, 247*q*, 247*d*, 247*s* or packaged diode 245 may include one or more pedestals. Pedestals may have different sizes, shapes, and compositions. For purposes of explanation only, each pedestal or integrated bridge is formed from a layered sheet like that shown in FIG. 2H with layer 266**, which may be a metal other than molybdenum if the pedestal or integrated bridge is to be attached (e.g., sintered) directly to a device (e.g., transistor) that is not SiC based (e.g., GaN based MOSFET). Each pedestal may have opposite facing first and second substantially flat (e.g., within a tolerance of 0.01 mm) end surfaces. The first and second end surfaces may be entirely flat. Multiple pedestals in a power stack may be substantially identical in size, shape, and composition. Groups of one or more pedestals in a power stack may be substantially different in size, shape, and composition.

Pedestals may be uniform in cross-section between the opposite facing first and second flat end surfaces. Or pedestals may have a non-uniform cross-section between the opposite facing first and second flat end surfaces. For example, the cross-sectional width near the first flat end surface, which may be directly connected (e.g., sintered) to a flat surface of a current terminal pad, may be less than the cross-sectional width near the second flat end surface.

First flat end surfaces of pedestals may be thermally and electrically connected (e.g., sintered) directly to flat surfaces of respective current terminal pads in a transistor of a power stack, and the second flat end surfaces of the pedestals may be thermally and electrically connected (e.g., sintered) directly to the flat surface(s) of a die substrate or a die clip on the side facing opposite the side that contains the die substrate terminal 230 or die clip terminal 344. Or the second flat end surfaces of the pedestals may be thermally and electrically connected (e.g., sintered) directly to the flat surface(s) of a bridge, which in turn includes an oppositely facing flat surface that may be thermally and electrically connected (e.g., sintered) directly to the flat surface(s) of the die substrate or die clip on the side facing opposite the side that contains the die clip terminal 344 or die substrate terminal 230.

The first flat end surface of a single pedestal may be thermally and electrically connected (e.g., sintered) directly to flat surfaces of current terminal pads in a transistor of a power stack, and the second flat end surface of the pedestal may be thermally and electrically connected (e.g., sintered) directly to the flat surface of a die substrate or a die clip on the side facing opposite the side that contains the die substrate terminal 230 or die clip terminal 344. Or the second flat end surface of the single pedestal may be thermally and electrically connected (e.g., sintered) directly to a flat surface of a bridge, which in turn includes an oppositely facing flat surface that may be thermally and electrically connected (e.g., sintered) directly to a flat surface of the die substrate or die clip on its side facing opposite the side that contains the die clip terminal 344 or die substrate terminal 230.

One or more first transistors may be electrically connected back-to-back with the one or more second transistors, respectively, in a power stack. First flat end surfaces of pedestals may be electrically and thermally connected (e.g., sintered) to respective flat current terminal (e.g., source) pads in first transistors, respectively, while the second flat end surfaces of the pedestals may be electrically and thermally connected (e.g., sintered) directly to respective flat current terminal (e.g., source) pads of second transistors in the power stack. Or first flat end surfaces of pedestals may be electrically and thermally connected (e.g., sintered) directly to respective pairs of flat current terminal (e.g., source) pads in first transistors while the second flat end surfaces of the pedestals may be electrically and thermally connected (e.g., sintered) directly to respective pairs of flat current terminal (e.g., source) pads of the second transistors in the power stack.

Pedestals may be integrally formed with and extending from a surface of die substrate or die clip on the side oppositely facing the side that contains the die substrate terminal 230 or die clip terminal 344, respectively, or the pedestals may be integrally formed with and extending from a flat surface of a bridge on the side oppositely facing a side that is connected (e.g., sintered) to a die substrate or die clip. In this alternative version the first flat end surfaces of the pedestals may be electrically and thermally connected (e.g., sintered) directly to respective flat surfaces or respective pairs of current terminals pads in one or more transistors of a power stack.

The first flat end surface of a pedestal may have a shape that is substantially equal to the shape of the flat surface of the current terminal pad to which it is connected. The first end of a pedestal may have a flat surface area configured for connection to flat surfaces of a pair of adjacent current terminal pads in a transistor. Flat surfaces of current terminal pads may be connected to first flat surfaces of pedestals, paddles, die clips, die substrates, etc., using any one of many different attachment technologies (e.g., sintering, soldering, transient liquid phase bonding, conductive adhesion process, etc.). Second oppositely facing flat end surfaces of pedestals may be connected to flat surfaces of paddles, die clips, die substrates, etc., using any one of many different attachment technologies (e.g., sintering, soldering, transient liquid phase bonding, conductive adhesion process, etc.).

Bond-wires have been used in the past to transmit large current (1 A or more) in power converters. The connections in FIGS. 1A and 1C of N1 to TL1, N2 to TL2, and N3 to TL3, and V+ to TH1, TH2, and TH3, may take form in one or more bond-wires (not shown) wire bonded to current terminal pads of the IGBTs. These bond-wires are prone to failure during temperature cycling. For example, bond-wires or the bond-wire connections often crack or fracture during temperature cycling. Bond-wire lift off may also occur. The failure may be attributed to relatively high current density and low thermal capacity in the bond-wires themselves or in the connections between the bond-wires and current terminal pads. In contrast current density is lower and thermal capacity higher in pedestals, which have larger cross-section when compared to bond-wires. Current density may also be lower in the connection (e.g., sintered connection) between a flat surface of current terminal pad and a flat surface of a connected pedestal. Failures like those associated with bond-wires described above are less likely to occur when end surfaces of pedestals are connected (e.g., sintered) to current terminal pad surfaces. Pedestals provide additional advantages over bond-wires, such as lower parasitic parameters (e.g., inductance, resistance, and capacitance). The parasitic inductance in the electrical path, including the pedestal(s), between a die substrate terminal and a die clip terminal in a packaged switch may be 0.15 nH or less. Lower parasitic inductance can improve operational aspects of packaged switches.

A pair of components may be directly or indirectly connected, attached, bonded, or joined together. A pair of components can be directly connected, attached, bonded, or joined together by soldering, sintering, brazing, gluing, etc. The material used for soldering, sintering, brazing, gluing, etc., the pair of components together may be electrically and/or thermally conductive. A pair of components can be directly connected, attached, bonded, or joined together by pressing (i.e., "press-fitting") surfaces of the components against each other using mechanical structures such as clamps and bolts. Thus, a pair of components can be directly connected, attached, bonded, or joined together without material (e.g., solder, sintering material, conductive adhesive, thermal interface material (TIM), electrically insulating glue, etc.) between the pair of components. A pair of components can be indirectly connected, attached, bonded, or joined together through one or more additional components (e.g., die substrate, die clip, pedestal, transistor, wire, ribbon, lead, trace, etc.).

Example Packaged Switches 247

With continued reference to FIGS. 2A-1-2A-3, 2B-1-2B-3, 2D-1-2D-3, FIGS. 3A-3L, 3O and 3P illustrate example packaged switches 247*p*, 247*q*, or 247*d* when seen from the side. Cases (e.g., case 248) are transparent in FIGS. 3A-3L, 3O and 3P to enable a better understanding of packaged switch components, their interaction, and their relative positions. Further, connector-leads 288*ds* and 288*dc* are not shown to enable a better understanding.

Example packaged switches 247 shown in FIGS. 3A-3L, 3O and 3P include switch modules 376A-376L, 3760, and 376P respectively, each of which includes a power stack, which in turn includes a switch 304 that is electrically and thermally connected between die substrate 360 and die clip 372, all of which are shown symbolically. Die substrate terminals 230 and die clip terminals 344 are also shown symbolically. FIG. 3K also includes a symbolically shown paddle 361. Although not shown in 3K, paddle 361 may include oppositely facing flat surfaces to which flat ends of respective pedestals may be directly connected (e.g., sintered).

The surfaces of die substrate terminals 230 and die clip terminals 344 may be entirely flat and flush with respective surfaces of cases 248. Or surfaces of die substrate terminals 230 and die clip terminals 344 may be entirely flat and recessed below or protruding above the surfaces of cases 248. Switch module components, including die substrates 360 and die clips 372 may vary in size, shape, composition, etc., between packaged switches 247 of FIGS. 3A-3L, 3O and 3P.

Although not shown in FIGS. 3A-3L, 3O and 3P each power stack may include one or more pedestals, each of which may have opposite facing first and second end surfaces that are entirely flat. The first flat end surface of a pedestal may be directly connected (e.g., sintered, soldered, transient liquid phase bonded, conductive adhesion process, etc.) to one or more current terminal pads in a transistor of a switch 304, and the second flat end surface of the pedestal may be directly connected (e.g., sintered, soldered, transient liquid phase bonded, conductive adhesion process, etc.) to the flat surface of die substrate 360 or die clip 372 on the side facing opposite the side that contains die substrate terminal 230 or die clip terminal 344. Or the second flat end surface of the pedestal may be directly connected to the flat surface of a bridge, which in turn includes an oppositely facing flat surface that may be directly connected (e.g., sintered, soldered, transient liquid phase bonded, conductive adhesion process, etc.) to the flat surface of die substrate 360 or die clip 372 on the side facing opposite the side that contains the die clip terminal 344 or die substrate terminal 230. Or the second flat end surface of the pedestal may be directly connected to one or more current terminals of another transistor. Pedestals may be integrally formed with and extending from a flat surface of a bridge, which in turn includes an oppositely facing flat surface that may be directly connected to the flat surface of die substrate 360 or die clip 372 on the side facing opposite the side that contains the die clip terminal 344 or die substrate terminal 230.

Figures 3A, 3B:
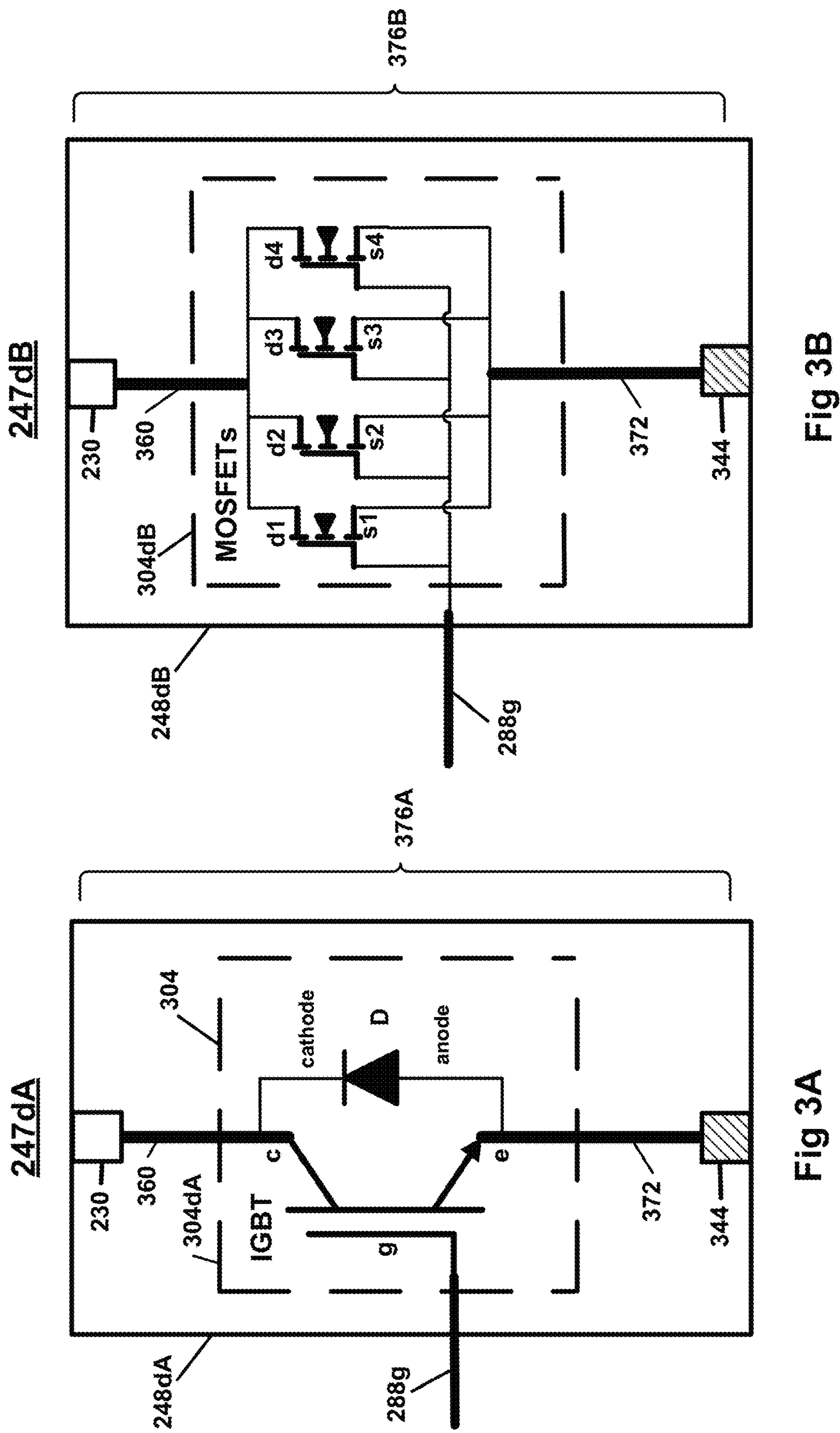
FIG. 3A shows an example packaged switch.
FIG. 3B shows an example packaged switch.
Figures 3C, 3D:
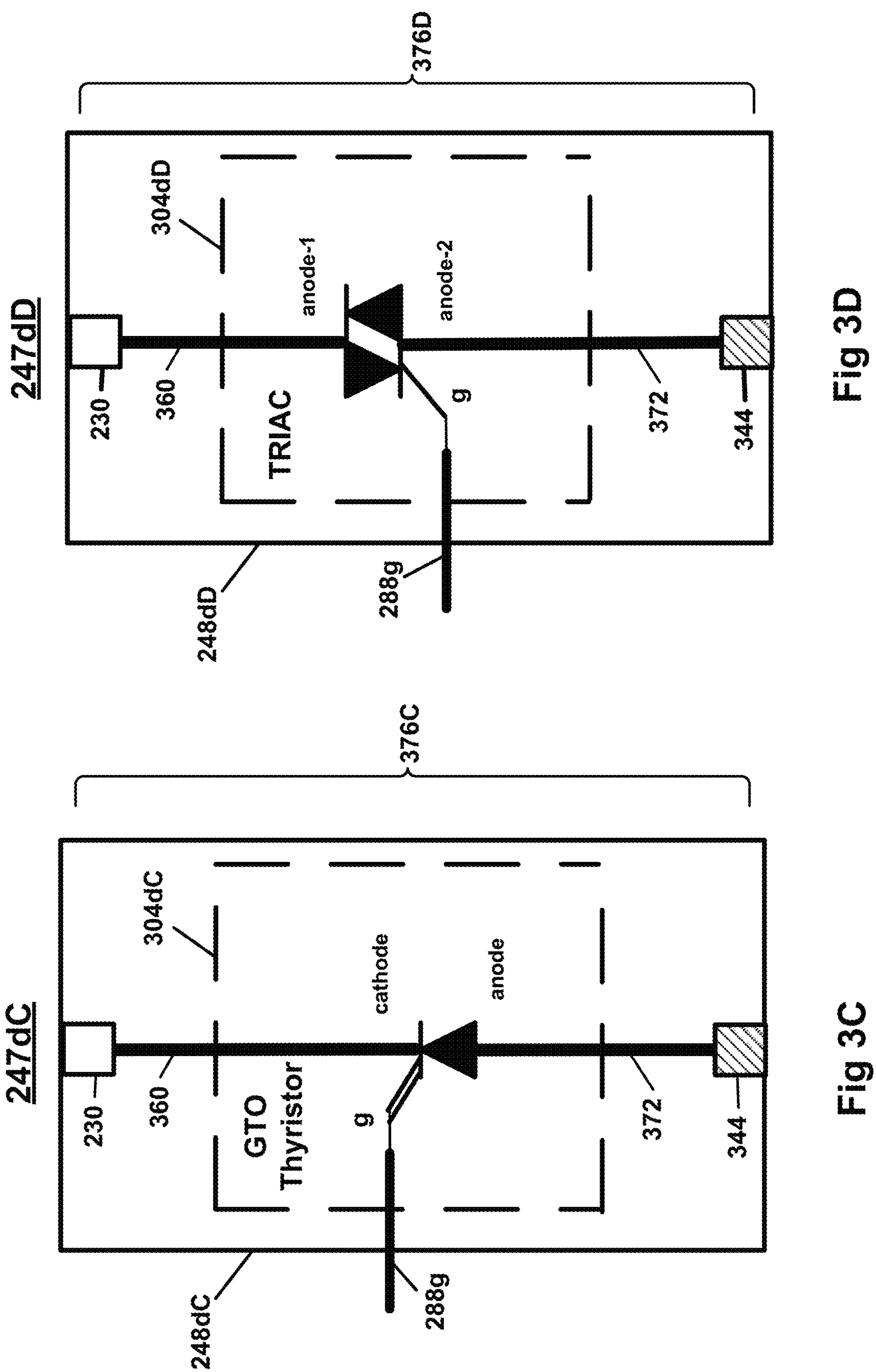
FIG. 3C shows an example packaged switch.
FIG. 3D shows an example packaged switch.
Figures 3E, 3F:
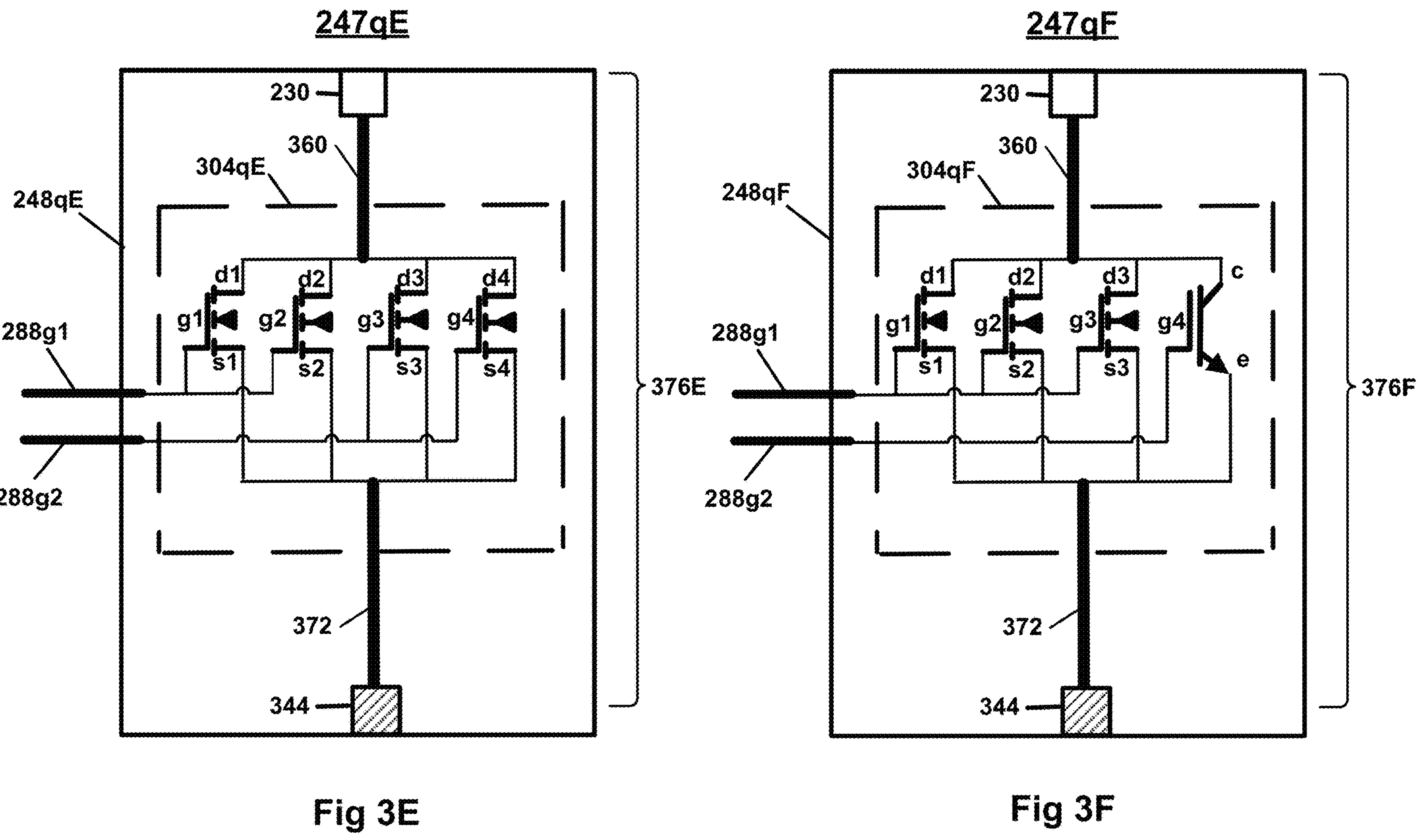
FIG. 3E shows an example packaged switch.
FIG. 3F shows an example packaged switch.
Figures 3G, 3H:
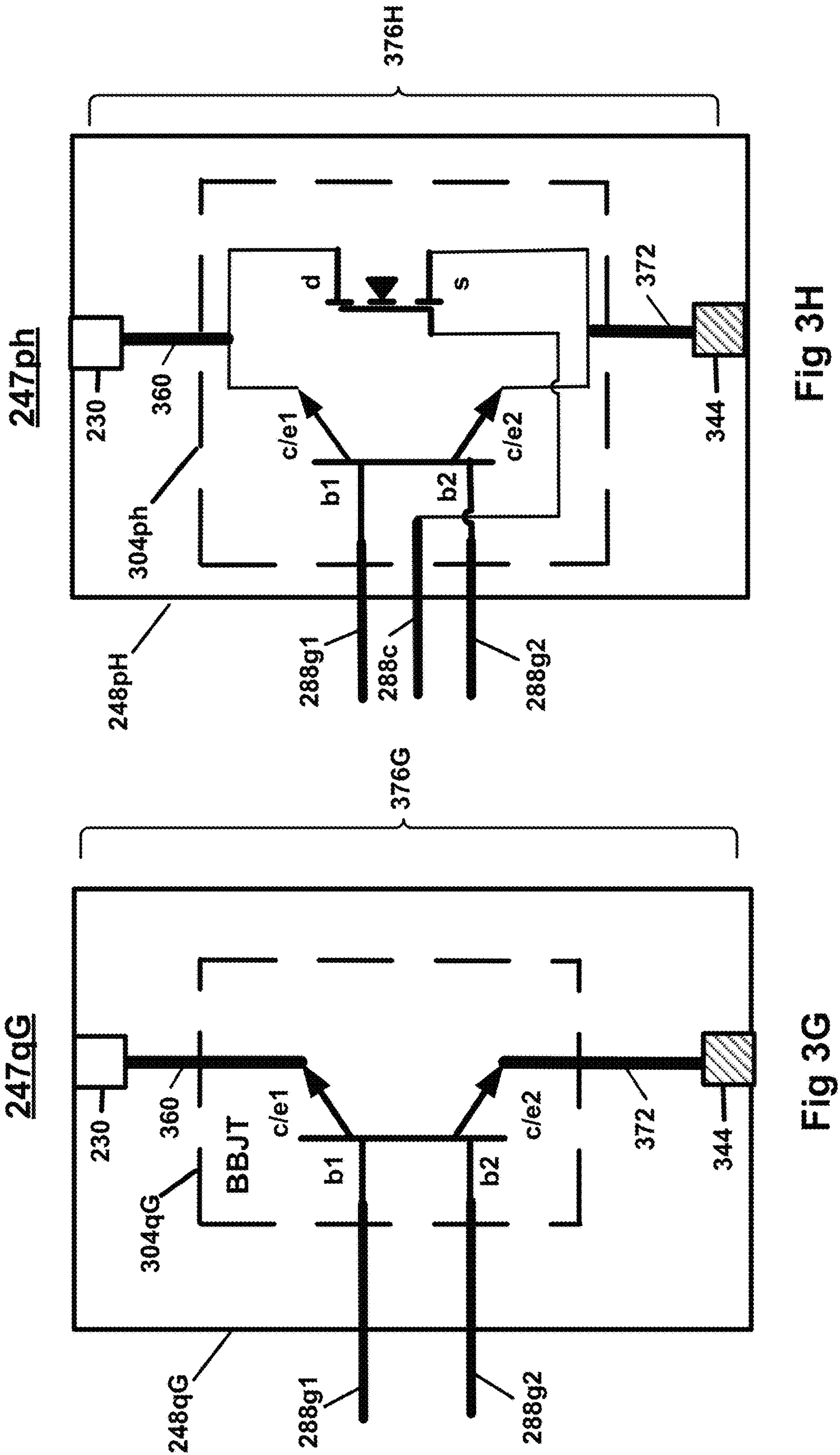
FIG. 3G shows an example packaged switch.
FIG. 3H shows an example packaged switch.
Figure 3I:
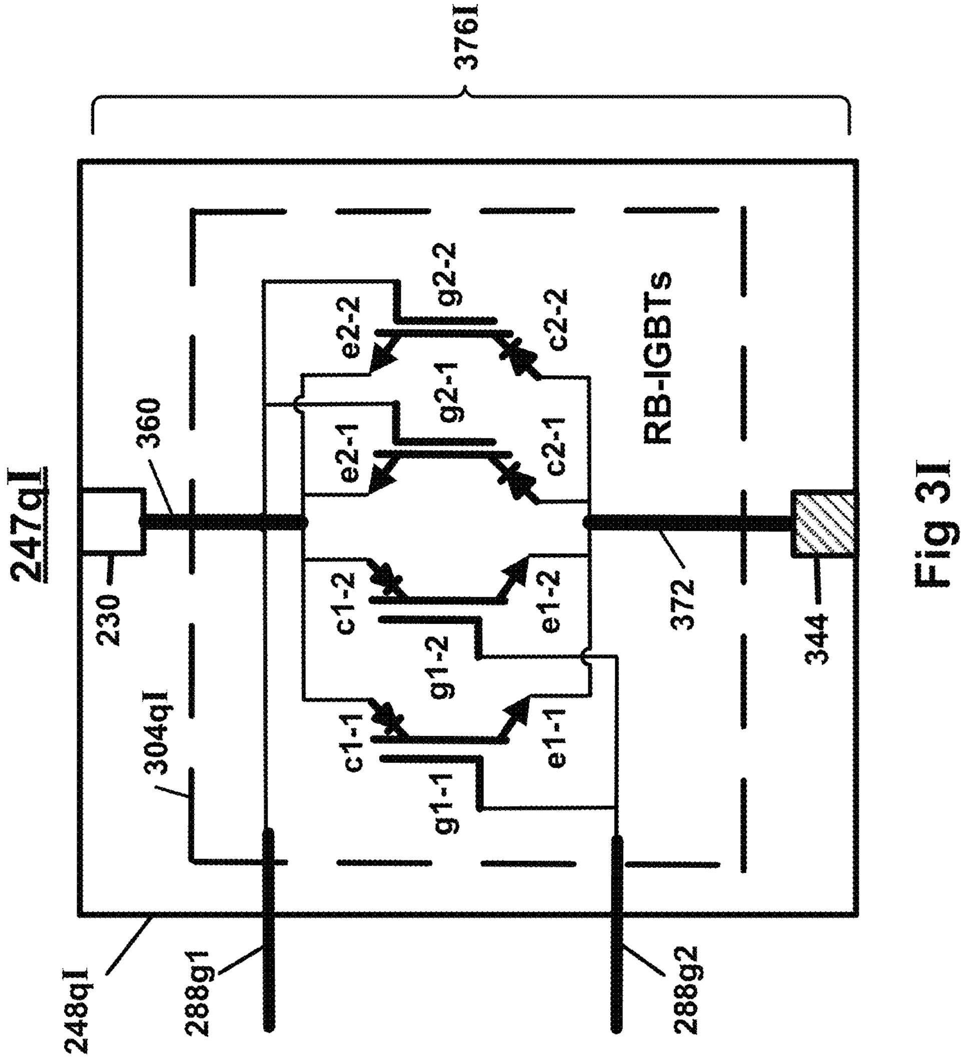
FIG. 3I shows an example packaged switch.
Figure 3J:
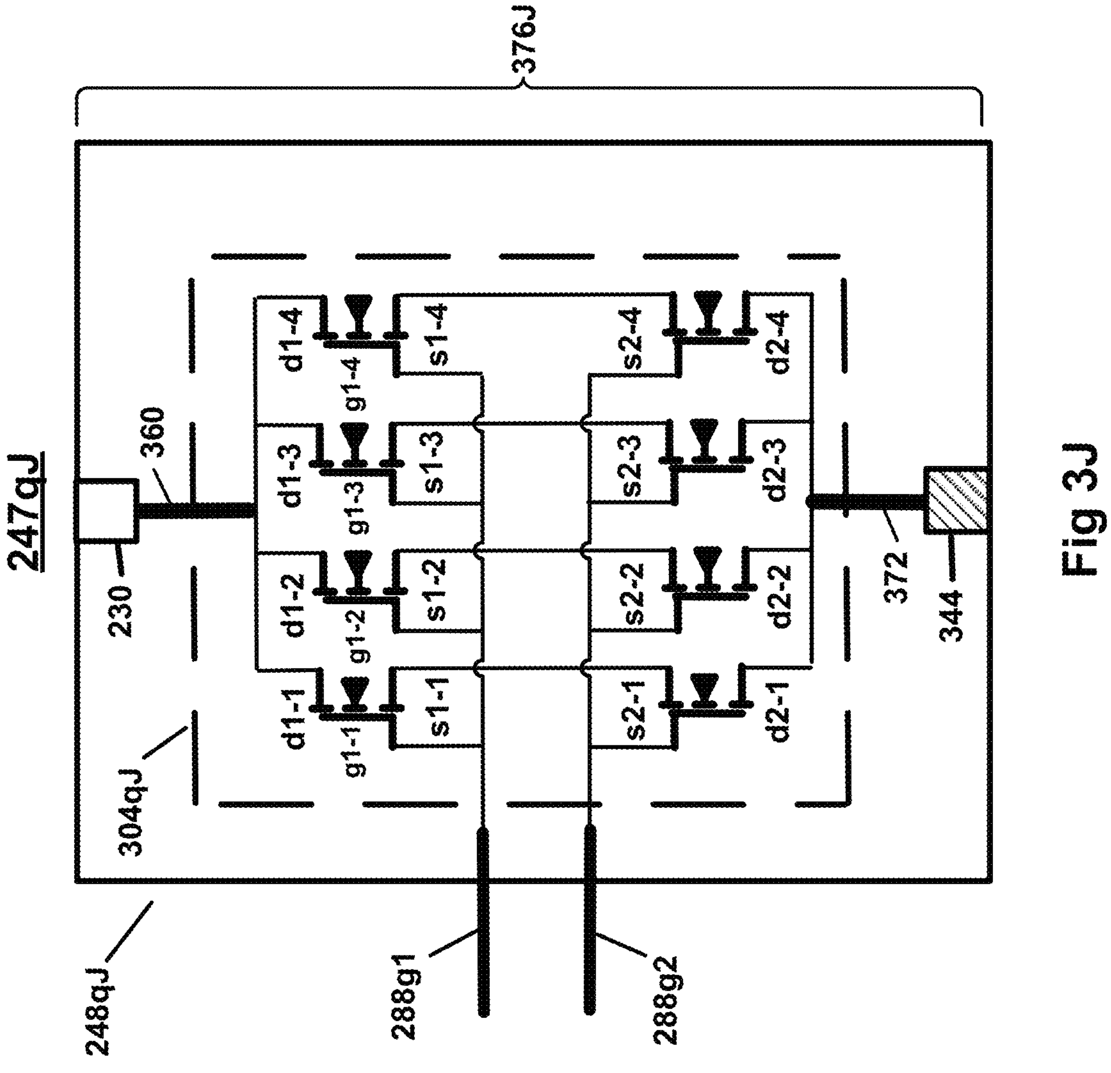
FIG. 3J shows an example packaged switch.
Figure 3K:
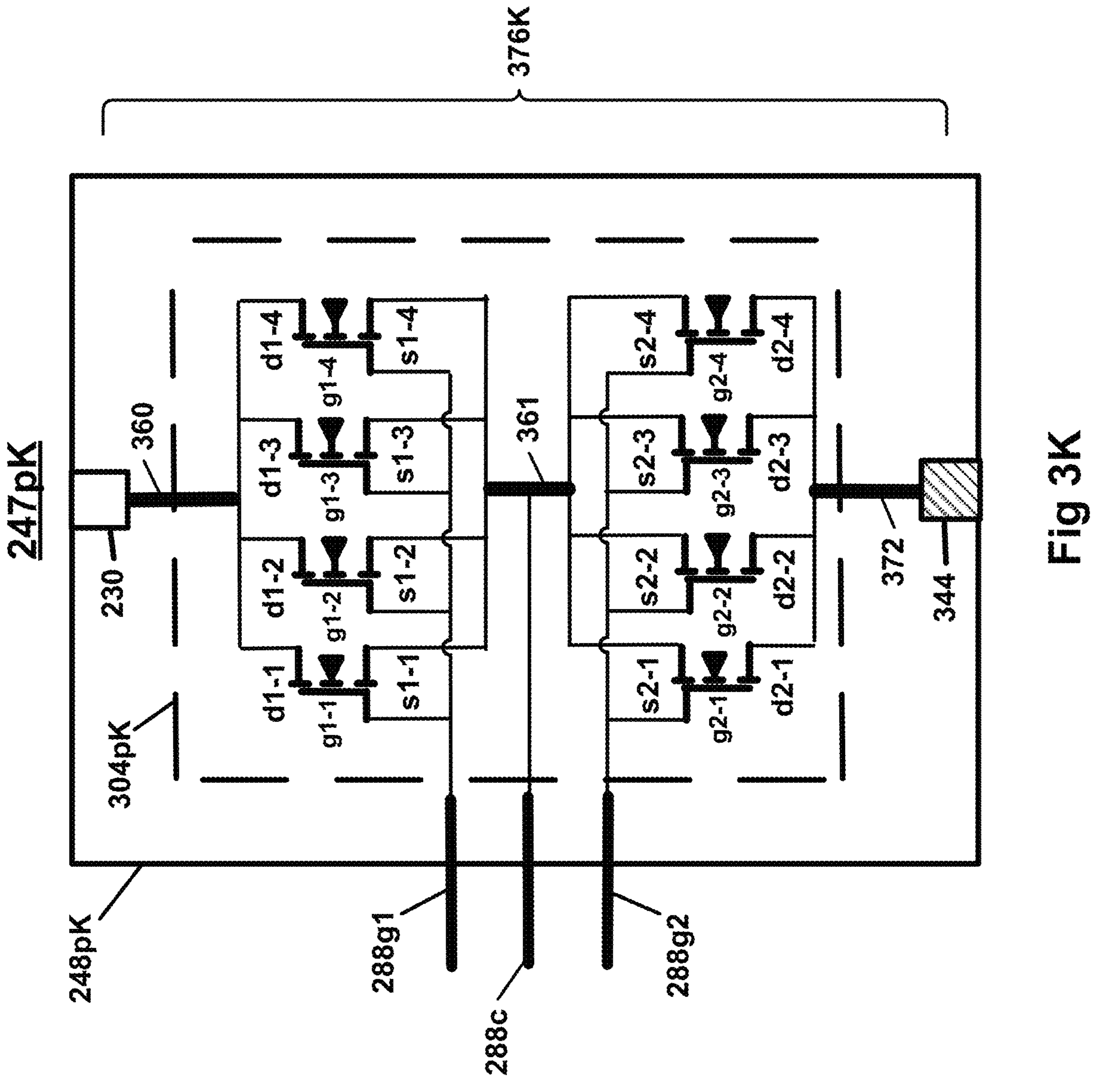
FIG. 3K shows an example packaged switch.
Figure 3L:
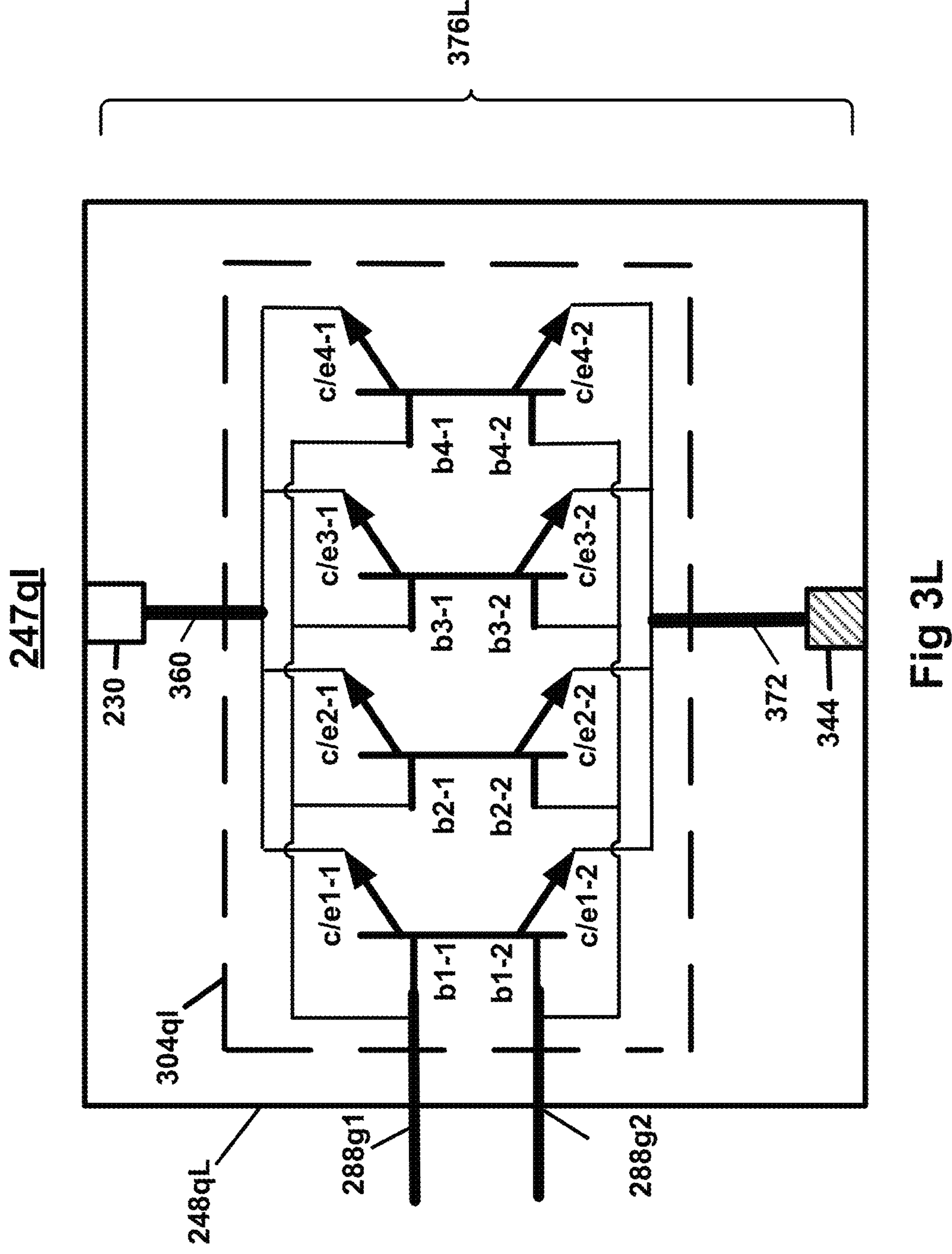
FIG. 3L shows an example packaged switch.
Figures 3M, 3N:
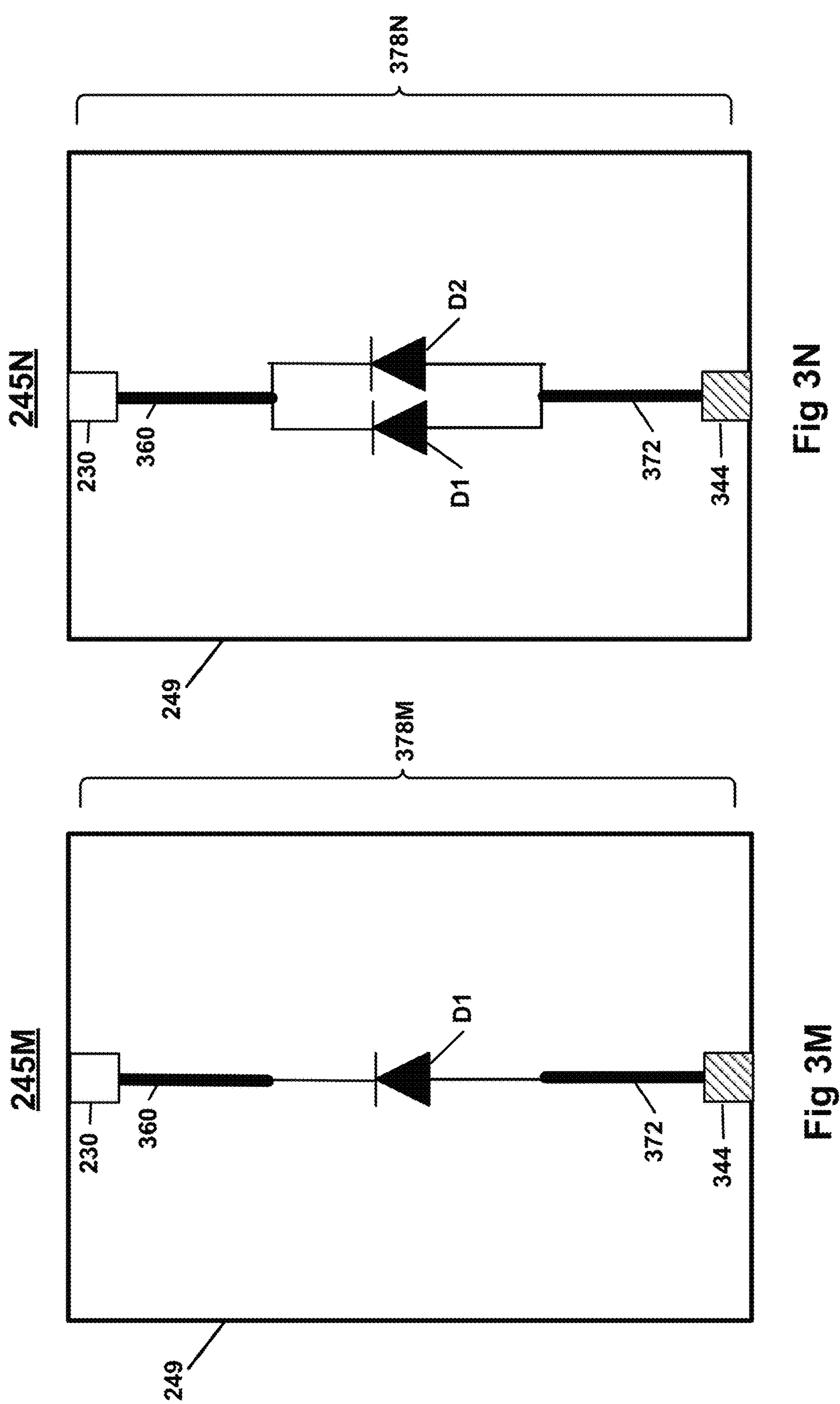
FIG. 3M shows an example packaged diode.
FIG. 3N shows an example packaged diode.
Figures 3O, 3P:
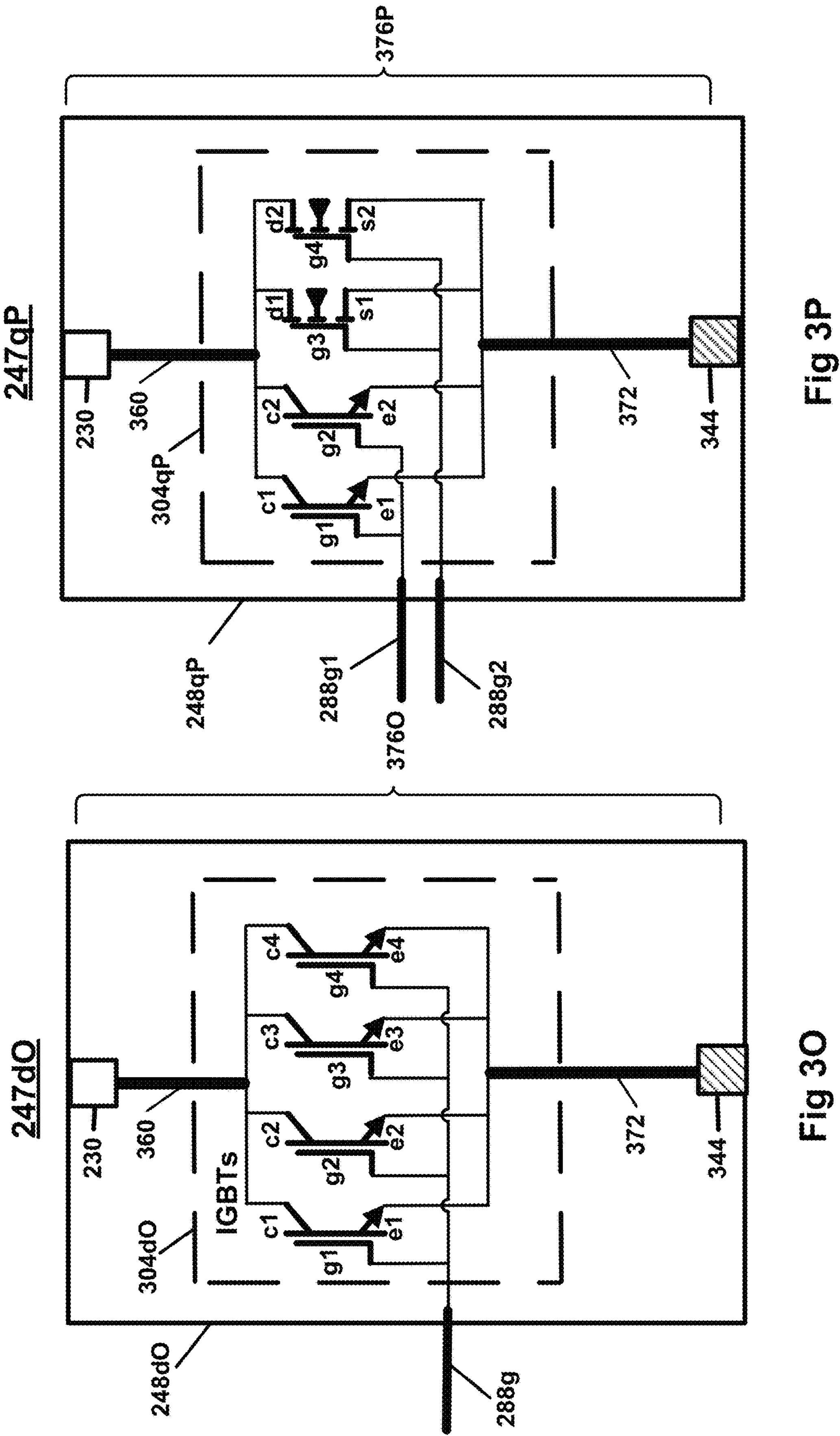
FIG. 3O shows an example packaged switch.
FIG. 3P shows an example packaged switch.

FIGS. 3A-3P show relative positioning of components. Die substrate 360, switch 304, and die clip 372 may be stacked as shown. In one sense, stacking first and second components means the first and second components are contained in first and second planes, respectively, which are separated, but parallel to each other. The first component in the first plane may be directly above the second component in the second plane, or the first component may be laterally offset in the first plane so that the second component is not directly beneath the first component. Electrical current can be transmitted between die clip terminal 344 and die substrate terminal 230 via an activated switch 304.

Switch modules 376 may include connector-leads 288*g*, 288*ds*, 288*c*, and 288*dc*, but for ease of illustration connector-leads 288*dc* and 288*ds* are not shown in FIGS. 3A-3P. Connector-lead 288*g* may be electrically connected to the control terminal pad(s) of each transistor in switch 304 of FIGS. 3A-3D, and 3O. Connector-lead 288*g*1 may be electrically connected to the control terminal pad(s) of one or more first transistors in switch 304 of FIGS. 3E-3L, and 3P. Connector-lead 288*g*2 may be electrically connected to the control terminal pad(s) of one or more second transistors in switch 304 of Figures E-L, and 3P. The one or more first transistors are the same as the one or more second transistors in FIGS. 3G and 3L.

Die substrate 360 and die clip 372 may conduct large current (e.g., 1, 5, 10, 50, 100, 200, 400 A or more) into or out of packaged switches 247*q*, 247*d*, and 247*p* via die substrate terminal 230 and die clip terminal 344, respectively. Switch 304 may get hot. Die substrate 360 and die clip 372 can conduct substantial switch heat out of packaged switch 247 via die substrate terminal 230 and die clip terminal 344, respectively, while die substrate terminal 230 and die clip terminal 344 concurrently conduct large current.

FIG. 3A is an example of a packaged switch 247*d*A. In FIG. 3A switch 304*d*A includes an IGBT electrically connected in parallel with a diode D. Each collector terminal in an IGBT and each cathode terminal in a diode may have one or more conductive pads with entirely flat surfaces that can be electrically and thermally connected (e.g., sintered) directly to a flat surface of, for example, a die substrate. For purposes of explanation only, each collector terminal in an IGBT and each cathode terminal in a diode has only one conductive pad unless otherwise noted. Each emitter terminal in an IGBT may have multiple conductive pads with entirely flat surfaces that can be electrically and thermally connected (e.g., sintered) directly to flat surfaces of respective pedestals or the flat surface of one pedestal. Each anode terminal in a diode may have a pad with an entirely flat surface that can be electrically and thermally connected (e.g., sintered) directly to a flat surface of a pedestal. In other versions the flat surfaces of the emitter terminal and anode terminal pads may be directly connected (e.g., sintered) directly to a flat surface of a die clip.

The flat surfaces of pads in collector terminal c and cathode terminal in FIG. 3A may be directly connected (e.g., sintered) to a flat surface of die substrate 360, and the flat surfaces of pads in emitter terminal e and anode terminal may be directly connected (e.g., sintered) to first flat end surfaces of pedestals. The second flat surfaces at the opposite ends of the pedestals (i.e., the second flat end surfaces) may be connected (e.g., sintered) directly to a flat surface of die clip 372. Pad surface connections (e.g., sintered connections) enable thermal and electrical transmission.

Connector-lead 288*g* may be electrically connected to the gate terminal g of the IGBT. Although not shown in FIG. 3A, switch module 376A may include a strap that is attached to the same surface of die substrate 360 to which the pads of collector terminal c and cathode terminal are connected. The strap may be electrically isolated from die substrate 360. One or more bond-wires may electrically connect the strap to the pad(s) of the gate terminal g. For purposes of explanation only, each IGBT in this disclosure is presumed to have only one gate terminal pad unless otherwise noted. Connector-lead 288*g* may be electrically connected to the strap. An end portion of connector-lead 288*g* may be directly connected (e.g., soldered) to the strap. Or one or more bond-wires may electrically connect the strap to the end portion of the connector-lead 288*g*.

FIG. 3B is an example of a packaged switch 247*d*B. In FIG. 3B switch 304*d*B includes four n-channel MOSFETs connected in parallel. Each drain terminal in a MOSFET may have one or more conductive pads with entirely flat surfaces that can be electrically and thermally connected (e.g., sintered) directly to a flat surface of, for example, a die substrate. For purposes of explanation only, each drain terminal in this disclosure is presumed to have only one conductive pad unless otherwise noted. Each source terminal in a MOSFET may have multiple conductive pads with entirely flat surfaces that can be electrically and thermally connected (e.g., sintered) directly to, for example, flat surfaces of respective pedestals or the flat surface of one pedestal. In other versions the flat surfaces of the source terminal pads may be directly connected (e.g., sintered) to a flat surface of a die clip.

In FIG. 3B the flat surfaces of pads in drain terminals d1-d4 may be directly connected (e.g., sintered) to a flat surface of die substrate 360, and the flat surfaces of pads in source terminals s1-s4 may be directly connected (e.g., sintered) to first flat end surfaces of respective pedestals. The second flat surfaces at the opposite ends of the pedestals (i.e., the second flat end surfaces) may be electrically and thermally connected (e.g., sintered) directly to a flat surface of die clip 372. Connector-lead 288*g* may be electrically connected to the gate terminals of each MOSFET. For purposes of explanation only, each MOSFET in this disclosure is presumed to have only one gate terminal pad unless otherwise noted. Although not shown in FIG. 3B, switch module 376B may include a strap that is attached to the same surface of die substrate 360 to which the pads of the drain terminals d1-d4 are connected. The strap may be electrically isolated from die substrate 360. One or more bond-wires may electrically connect the strap to the pads of the gate terminals in each of the MOSFETs. Connector-lead 288*g* may be electrically connected to the strap. An end portion of connector-lead 288*g* may be directly connected (e.g., soldered) to the strap. Or one or more bond-wires may electrically connect to the strap to an end portion of the connector-lead 288*g*.

In FIG. 3C switch 304*d*C includes a symmetrical GTO thyristor. A symmetrical GTO thyristor's cathode terminal may have one or more conductive pads with entirely flat surfaces that can be electrically and thermally connected (e.g., sintered) directly to a flat surface of, for example, a die substrate. For purposes of explanation only, the cathode terminal of a symmetrical GTO thyristor in this disclosure is presumed to have only one conductive pad unless otherwise noted. A symmetrical GTO thyristor's anode terminal may include one or more conductive pads with entirely flat surfaces that can be electrically and thermally connected (e.g., sintered) directly to a flat surface of a single pedestal. In other versions the flat surface(s) of the anode terminal pad(s) may be directly connected (e.g., sintered) to a flat surface of a die clip.

The flat surface of the pad in the cathode terminal of FIG. 3C may be directly connected (e.g., sintered) directly to a flat surface of die substrate 360, and the flat surface(s) of the anode terminal pad(s) may be directly connected (e.g., sintered) directly to the first flat end surface of a pedestal. The second flat surface at the opposite ends of the pedestal may be electrically and thermally connected (e.g., sintered) directly to a flat surface of die clip 372.

For purposes of explanation only, each symmetrical GTO thyristor in this disclosure is presumed to have only one gate terminal pad unless otherwise noted. Connector-lead 288*g* may be electrically connected to the gate terminal of the GTO thyristor. Although not shown in FIG. 3C, switch module 376C may include a strap that is attached to the same surface of die substrate 360 to which the pad of the cathode terminal is connected. The strap may be electrically isolated from die substrate 360. One or more bond-wires may electrically connect the strap to the pad of the gate terminal of the symmetrical GTO thyristor. Connector-lead 288*g* may be electrically connected to the strap. An end portion of connector-lead 288*g* may be directly connected (e.g., soldered) to the strap. Or one or more bond-wires may electrically connect to the strap to an end portion of the connector-lead 288*g*.

In FIG. 3D switch 304*d*D includes a TRIAC. A TRIAC's first current terminal anode-1 may have one or more conductive pads with entirely flat surfaces that can be electrically and thermally connected (e.g., sintered) directly to a flat surface of, for example, a die substrate. For purposes of explanation only, each first current terminal anode-1 is presumed to have only one conductive pad in this disclosure unless otherwise noted. A TRIAC's second current terminal anode-2 may include one or more conductive pads with entirely flat surfaces that can be electrically and thermally connected (e.g., sintered) directly to the flat surface of a single pedestal. In one version, the flat surfaces of the anode-2 pads may be electrically and thermally connected (e.g., sintered) directly to a flat surface of a die clip.

The flat surface of the pad of anode-1 in FIG. 3D may be directly connected (e.g., sintered) to a flat surface of die substrate 360, and the flat surface(s) of anode-2 may be directly connected (e.g., sintered) to the first flat end surface of a pedestal. The flat surface at the opposite ends of the pedestal may be electrically and thermally connected (e.g., sintered) directly to a flat surface of die clip 372.

For purposes of explanation only, each TRIAC in this disclosure is presumed to have only one gate terminal pad unless otherwise noted. Connector-lead 288*g* may be electrically connected to the gate terminal pad of the TRIAC. Although not shown in FIG. 3D, switch module 376D may include a strap that is attached to the same surface of die substrate 360 to which the pad of anode-1 is/are connected. The strap may be electrically isolated from die substrate 360. One or more bond-wires may electrically connect the strap to the pad of the gate terminal of the TRIAC. Connector-lead 288*g* may be electrically connected to the strap. An end portion of connector-lead 288*g* may be directly connected (e.g., soldered) to the strap. Or one or more bond-wires may electrically connect to the strap to an end portion of the connector-lead 288*g*.

FIG. 3E illustrates an example of a packaged switch 247*q*E. Switch 304*q*E includes four n-channel MOSFETs connected in parallel. The flat surfaces of pads in drain terminals d1-d4 may be directly connected (e.g., sintered) to a flat surface of die substrate 360, and the flat surfaces of pads in source terminals s1-s4 may be directly connected (e.g., sintered) to first flat end surfaces of pedestals. The flat surfaces at the opposite ends of the pedestals (i.e., the second flat end surfaces) may be electrically and thermally connected (e.g., sintered) directly to a flat surface of die clip 372. Connector-lead 288*g*1 may be electrically connected to the gate terminals of a first pair of MOSFETs as shown, while connector-lead 288*g*2 may be electrically connected to the gate terminals of the other pair of MOSFETs. Although not shown in FIG. 3E, switch module 376E may include first and second separate straps that are attached to the same surface of die substrate 360 to which the pads of drain terminals d1-d4 are connected. The straps may be electrically isolated from die substrate 360. One or more bond-wires may electrically connect the first strap to the pads of the gate terminals in the first pair MOSFETs as shown, while one or more bond-wires may electrically connect the second strap to the pads of the gate terminals in the other pair MOSFETs. Connector-lead 288*g*1 may be electrically connected to the first strap, and connector-lead 288*g*2 may be electrically connected to the second strap. An end portion of connector-lead 288*g*1 may be directly connected (e.g., soldered) to the first strap, and an end portion of connector-lead 288*g*2 may be directly connected (e.g., soldered) to the second strap. Or one or more bond-wires may electrically connect to the first strap to an end portion of connector-lead 288*g*1, and one or more bond-wires may electrically connect to the second strap to an end portion of connector-lead 288*g*2.

FIG. 3F illustrates an example of a packaged switch 247*q*F. Switch 304*q*F includes three MOSFETs connected in parallel with an IGBT. The flat surfaces of pads in collector terminal c and drain terminals d may be directly connected (e.g., sintered) to a flat surface of die substrate 360, and the flat surfaces of pads in emitter terminal e and source terminals s may be directly connected (e.g., sintered) to first flat end surfaces of pedestals. The flat surfaces at the opposite ends of the pedestals (i.e., the second flat end surfaces) may be electrically and thermally connected (e.g., sintered) directly to a flat surface of die clip 372. Connector-lead 288*g*1 may be electrically connected to the gate terminals g of the MOSFETs, while connector-lead 288*g*2 may be electrically connected to the gate terminal g of the IGBT. Although not shown in FIG. 3F, switch module 376F may include first and second separate straps that are attached to the same surface of die substrate 360 to which the pads of drain terminals d and collector terminal c are connected. The straps may be electrically isolated from die substrate 360. One or more bond-wires may electrically connect the first strap to the pad of the gate terminal in the IGBT as shown, while one or more bond-wires may electrically connect the second strap to the pads of the gate terminals g in the MOSFETs. Connector-lead 288*g*1 may be electrically connected to the first strap, and connector-lead 288*g*2 may be electrically connected to the second strap. An end portion of connector-lead 288*g*1 may be directly connected (e.g., soldered) to the first strap, and an end portion of connector-lead 288*g*2 may be directly connected (e.g., soldered) to the second strap. Or one or more bond-wires may electrically connect to the first strap to an end portion of connector-lead 288*g*1, and one or more bond-wires may electrically connect to the second strap to an end portion of connector-lead 288*g*2.

FIG. 3G illustrates an example packaged switch 247*q*G, which includes a BBJT. Each of a BBJT's current terminals c/e may have multiple conductive pads with entirely flat surfaces that can be electrically and thermally connected (e.g., sintered) directly to flat surfaces of respective pedestals. The flat surfaces of pads in the first current terminal c/e1 may be directly connected (e.g., sintered) to respective first flat surfaces of first pedestals, and the opposite facing second flat surfaces of the first pedestals can be electrically and thermally connected (e.g., sintered) directly to a flat surface of die substrate 360. The flat surfaces of pads in the second current terminal c/e2 may be directly connected (e.g., sintered) to first flat end surfaces of respective second pedestals. The flat surfaces at the opposite ends of the second pedestals may be electrically and thermally connected (e.g., sintered) directly to a flat surface of die clip 372.

Connector-lead 288*g*1 may be electrically connected to base terminal b1 of the BBJT, while connector-lead 288*g*2 may be electrically connected to base terminal b2. For purposes of explanation only, each base terminal b in a BBJT of this disclosure is presumed to have multiple base terminal pads unless otherwise noted. The base terminal pads on each of the BBJT side may be arranged in groups, with each group having several linearly positioned base terminal pads with exposed flat surfaces. For purposes of explanation only, no dielectric or other material exists between base terminal pads in a group of linearly positioned base terminal pads. Although not shown in FIG. 3G, switch module 376G may include a first signal frame with a surface that is electrically connected (e.g., soldered) to surfaces of pads of base terminal b1, and a second signal frame with a flat surface that is electrically connected (e.g., soldered) to surfaces of pads of base terminal b2. The signal frames may be electrically isolated from each other. Connector-lead 288*g*1 may be electrically connected to the first signal frame, and connector-lead 288*g*2 may be electrically connected to the second signal frame. An end portion of connector-lead 288*g*1 may be directly connected (e.g., soldered) to the first signal frame, and an end portion of connector-lead 288*g*2 may be directly connected (e.g., soldered) to the second signal frame. Or one or more bond-wires may electrically connect to the first signal frame to an end portion of connector-lead 288*g*1, and one or more bond-wires may electrically connect to the second signal frame to an end portion of connector-lead 288*g*2.

FIG. 3H illustrates an example of a packaged switch 247*ph*. Switch 304*ph* includes a MOSFET connected in parallel with a BBJT. In an alternative version of packaged switch 247*ph*, two or more MOSFETs may be electrically connected in parallel with a BBJT, the combination of which may be connected between die substrate 360 and die clip 372.

Flat surfaces of pads in the first current terminal c/e1 in FIG. 3H may be directly connected (e.g., sintered) to first flat surfaces of respective first pedestals, and the opposite facing second flat surfaces of the first pedestals can be electrically and thermally connected (e.g., sintered) directly to a flat surface of die substrate 360. Flat surfaces of pads in the second current terminal c/e2 may be directly connected (e.g., sintered) to first flat end surfaces of respective second pedestals. The flat surfaces at the opposite ends of the second pedestals may be electrically and thermally connected (e.g., sintered) directly to a flat surface of die clip 372. Connector-lead 288*g*1 may be electrically connected to base terminal b1 of the BBJT, while connector-lead 288*g*2 may be electrically connected to base terminal b2. Although not shown in FIG. 3H, switch module 376H may include a first signal frame with a surface that is electrically connected (e.g., soldered) to surfaces of pads of base terminal b1, and a second signal frame with a flat surface that is electrically connected (e.g., soldered) to surfaces of pads of base terminal b2. The signal frames may be electrically isolated from each other. Connector-lead 288*g*1 may be electrically connected to the first signal frame, and connector-lead 288*g*2 may be electrically connected to the second signal frame. An end portion of connector-lead 288*g*1 may be directly connected (e.g., soldered) to the first signal frame, and an end portion of connector-lead 288*g*2 may be directly connected (e.g., soldered) to the second signal frame. Or one or more bond-wires may electrically connect to the first signal frame to an end portion of connector-lead 288*g*1, and one or more bond-wires may electrically connect to the second signal frame to an end portion of connector-lead 288*g*2.

In FIG. 3H the flat surface of the pad in drain terminal d may be directly connected (e.g., sintered) to a flat surface of die substrate 360, and the flat surfaces of pads in source terminal s may be directly connected (e.g., sintered) to first flat end surface of a pedestal. The flat surface at the opposite end of the pedestals (i.e., the second flat end surface) may be electrically and thermally connected (e.g., sintered) directly to a flat surface of die clip 372. Connector-lead 288*c* may be electrically connected to the gate terminal pad of the MOSFET. Although not shown in FIG. 3H, switch module 376H may include a strap that is attached to the same surface of die substrate 360 to which the pad of the drain terminal d is connected. The strap may be electrically isolated from die substrate 360. One or more bond-wires may electrically connect the strap to the pad of the gate terminal. Connector-lead 288*c* may be electrically connected to the strap. An end portion of connector-lead 288*c* may be directly connected (e.g., soldered) to the strap. Or one or more bond-wires may electrically connect to the strap to an end portion of the connector-lead 288*c*.

FIG. 3I illustrates an example of a packaged switch 247*q*I, which may be bidirectional. Switch 304*q*I includes first and second groups of RB-IGBTs connected in anti-parallel. Each group of RB-IGBTs includes two RB-IGBTs connected in parallel. In an alternative version, the RB-IGBTs may be replaced by NPT-IGBTs or BJTs. Each of the RB-IGBTs' collector terminals c1 of the first group and each of the RB-IGBTs' collector terminals c2 of the second group may have one conductive pad with a surface that is entirely flat. Each of the RB-IGBTs' emitter terminals e1 of the first group and each of the RB-IGBTs' emitter terminals e2 of the second group may have conductive pads with surfaces that are entirely flat. The flat surfaces of the pads in the collector terminals c1-1 and c1-2 may be directly connected (e.g., sintered) to a flat surface of die substrate 360, and the surfaces of the pads in the collector terminals c2-1 and c2-2 may be directly connected (e.g., sintered) to a flat surface of die clip 372. The flat surfaces of the pads in each emitter terminal e may be directly connected (e.g., sintered) to the first flat end surface of a pedestal. The flat surfaces at the opposite ends of the pedestals connected to the pads of emitter terminal e2-1 and e2-2 may be electrically and thermally connected (e.g., sintered) directly to a flat surface of die substrate 360, while the flat surfaces at the opposite ends of the pedestals connected to the pads of emitter terminals e1-1 and e1-2 may be electrically and thermally connected (e.g., sintered) directly to a flat surface of die clip 372. Connector-lead 288*g*1 may be electrically connected to gate terminals g2, while connector-lead 288*g*2 may be electrically connected to gate terminals g1. Although not shown in FIG. 3I, switch module 376I may include a first strap that is attached to the same surface of die substrate 360 to which the pads of collector terminals c1 and emitter terminals e2 are connected, and a second strap that is attached to the same surface of die clip 372 to which the pads of collector terminals c2 and emitter terminals e1 are connected. The first and straps may be electrically isolated from die substrate 360 and die clip 372, respectively. One or more bond-wires may electrically connect the first strap to the pads of gate terminals g2, while one or more bond-wires may electrically connect the second strap to the pads of gate terminal g1. Connector-lead 288*g*1 may be electrically connected to the first strap, and connector-lead 288*g*2 may be electrically connected to the second strap. An end portion of connector-lead 288*g*1 may be directly connected (e.g., soldered) to the first strap, and an end portion of connector-lead 288*g*2 may be directly connected (e.g., soldered) to the second strap. Or one or more bond-wires may electrically connect to the first strap to an end portion of connector-lead 288*g*1, and one or more bond-wires may electrically connect to the second strap to an end portion of connector-lead 288*g*2.

FIG. 3J illustrates an example of a packaged switch 247*q*J, which may be bidirectional. In FIG. 3J switch 304*q*J includes first and second groups of MOSFETs connected back-to-back. Each group includes four MOSFETs. Each of the MOSFETs' source terminals s may have conductive pads that are entirely flat. Each of the MOSFETs' drain terminals d may have a conductive pad that is entirely flat. The flat surfaces of the pads in the drain terminals d1 and d2 may be directly connected (e.g., sintered) to flat surfaces of die substrate 360 and die clip 372, respectively. The flat surfaces of the pads in source terminals s1 may be directly connected (e.g., sintered) to the first flat end surfaces of respective pedestals. The flat surfaces at the opposite ends of the pedestals may be electrically and thermally connected (e.g., sintered) directly to flat surfaces of pads in respective source terminals s2. Connector-lead 288*g*1 may be electrically connected to gate terminals g1, while connector-lead 288*g*2 may be electrically connected to gate terminals g2. Although not shown in FIG. 3J, switch module 376J may include first and second separate straps that are attached to die substrate 360 and die clip 372, respectively. The first strap may be attached to the same surface of die substrate 360 to which the pads of drain terminals d1 are connected, and the second strap may be attached to the same surface of die clip 372 to which the pads of drain terminals d2 are connected. The first and second straps may be electrically isolated from each other and from die substrate 360 and die clip 372. One or more bond-wires may electrically connect the first strap to the pads of the gate terminals g1, while one or more bond-wires may electrically connect the second strap to the pads of the second gate terminals g2. Connector-lead 288*g*1 may be electrically connected to the first strap, and connector-lead 288*g*2 may be electrically connected to the second strap. An end portion of connector-lead 288*g*1 may be directly connected (e.g., soldered) to the first strap, and an end portion of connector-lead 288*g*2 may be directly connected (e.g., soldered) to the second strap. Or one or more bond-wires may electrically connect to the first strap to an end portion of connector-lead 288*g*1, and one or more bond-wires may electrically connect to the second strap to an end portion of connector-lead 288*g*2.

FIG. 3K illustrates an example of a packaged switch 247*p*K, which may be bidirectional. Packaged switch 247*p*K in FIG. 3K includes components of the packaged switch 247*q*J in FIG. 3J in addition to a paddle 361 and connector-lead 288*c*. Paddle 361 is shown symbolically. Although not shown, paddle 361 has oppositely facing first and second flat surfaces. In FIG. 3K switch 304K includes first and second groups of MOSFETs connected back-to-back. Each group includes four MOSFETs connected in parallel. Each of the MOSFETs' source terminals s may have conductive pads that are entirely flat. Each of the MOSFETs' drain terminals d may have a conductive pad that is entirely flat. The flat surfaces of the pads in the drain terminals d1 and d2 may be directly connected (e.g., sintered) to flat surfaces of die substrate 360 and die clip 372, respectively. The flat surfaces of the pads in source terminals s1 may be directly connected (e.g., sintered) to the first flat end surfaces of respective first pedestals. The flat surfaces at the opposite ends of the first pedestals may be electrically and thermally connected (e.g., sintered) directly to the first flat surface of paddle 361. The flat surfaces of the pads in source terminals s2 may be directly connected (e.g., sintered) to the first flat end surfaces of respective second pedestals. The flat surfaces at the opposite ends of the second pedestals may be electrically and thermally connected (e.g., sintered) directly to the second flat surface of paddle 361. Connector-lead 288*g*1 may be electrically connected to gate terminals g1, while connector-lead 288*g*2 may be electrically connected to gate terminals g2. Although not shown in FIG. 3K, switch module 376K may include first and second separate straps that are attached to die substrate 360 and die clip 372, respectively. The first strap may be attached to the same surface of die substrate 360 to which the pads of drain terminals d1 are connected, and the second strap may be attached to the same surface of die clip 372 to which the pads of drain terminals d2 are connected. The first and second straps may be electrically isolated from each other and from die substrate 360 and die clip 372. One or more bond-wires may electrically connect the first strap to the pads of the gate terminals g1, while one or more bond-wires may electrically connect the second strap to the pads of the second gate terminals g2. Connector-lead 288*g*1 may be electrically connected to the first strap, and connector-lead 288*g*2 may be electrically connected to the second strap. An end portion of connector-lead 288*g*1 may be directly connected (e.g., welded) to the first strap, and an end portion of connector-lead 288*g*2 may be directly connected (e.g., welded) to the second strap. Or one or more bond-wires may electrically connect to the first strap to an end portion of connector-lead 288*g*1, and one or more bond-wires may electrically connect to the second strap to an end portion of connector-lead 288*g*2. Connector-lead 288*c* is electrically connected to paddle 361.

FIG. 3L illustrates a packaged switch 247*q*1, which may be bidirectional. FIG. 3L shows a switch 304*q*1 that has four BBJTs connected in parallel. The flat surfaces of pads in the first current terminal c/e1 of each BBJT may be directly connected (e.g., sintered) to first flat surfaces of respective first pedestals, and the opposite facing second flat surfaces of the first pedestals in each BBJT can be electrically and thermally connected (e.g., sintered) directly to a flat surface of die substrate 360. The flat surfaces of pads in the second current terminal c/e2 may be directly connected (e.g., sintered) to first flat end surfaces of respective second pedestals. The flat surfaces at the opposite ends of the second pedestals may be electrically and thermally connected (e.g., sintered) directly to a flat surface of die clip 372.

Connector-lead 288*g*1 may be electrically connected to base terminal b1 of each BBJT, while connector-lead 288*g*2 may be electrically connected to base terminal b2 of each BBJT. Although not shown in FIG. 3L, switch module 376L may include a first signal frame with a surface that is electrically connected (e.g., welded) to surfaces of pads of base terminal b1 in each BBJT, and a second signal frame with a flat surface that is electrically connected (e.g., welded) to surfaces of pads of base terminal b2 in each BBJT. The signal frames may be electrically isolated from each other. Connector-lead 288*g*1 may be electrically connected to the first signal frame, and connector-lead 288*g*2 may be electrically connected to the second signal frame. An end portion of connector-lead 288*g*1 may be directly connected (e.g., welded) to the first signal frame, and an end portion of connector-lead 288*g*2 may be directly connected (e.g., welded) to the second signal frame. Or one or more bond-wires may electrically connect to the first signal frame to an end portion of connector-lead 288*g*1, and one or more bond-wires may electrically connect to the second signal frame to an end portion of connector-lead 288*g*2.

FIG. 3O is an example of a packaged switch 247*d*O. In FIG. 3O switch 304*d*O includes four IGBTs connected in parallel. Each collector terminal in an IGBT may have one or more conductive pads with entirely flat surfaces that can be electrically and thermally connected (e.g., sintered) directly to a flat surface of, for example, a die substrate. For purposes of explanation only, each collector terminal in this disclosure is presumed to have only one conductive pad unless otherwise noted. Each emitter terminal in an IGBT may have multiple conductive pads with entirely flat surfaces that can be electrically and thermally connected (e.g., sintered) directly to, for example, flat surfaces of respective pedestals or the flat surface of one pedestal. In other versions the flat surfaces of the emitter terminal pads may be directly connected (e.g., sintered) to a flat surface of a die clip.

In FIG. 3O the flat surfaces of pads in collector terminals c1-c4 may be directly connected (e.g., sintered) to a flat surface of die substrate 360, and the flat surfaces of pads in emitter terminals e1-e4 may be directly connected (e.g., sintered) to first flat end surfaces of pedestals. The second flat end surfaces at the opposite ends of the pedestals (i.e., the second flat end surfaces) may be electrically and thermally connected (e.g., sintered) directly to a flat surface of die clip 372. Connector-lead 288*g* may be electrically connected to the gate terminals of each IGBT. For purposes of explanation only, each IGBT in this disclosure is presumed to have only one gate terminal pad unless otherwise noted. Although not shown in FIG. 3O, switch module 376O may include a strap that is attached to the same surface of die substrate 360 to which the pads of the collector terminals c1-c4 are connected. The strap may be electrically isolated from die substrate 360. One or more bond-wires may electrically connect the strap to the pads of the gate terminals in each of the IGBTs. Connector-lead 288*g* may be electrically connected to the strap. An end portion of connector-lead 288*g* may be directly connected (e.g., welded) to the strap. Or one or more bond-wires may electrically connect to the strap to an end portion of the connector-lead 288*g*.

FIG. 3P illustrates an example of a packaged switch 247*q*P. Switch 304*q*P includes two MOSFETs connected in parallel with two IGBTs. The flat surfaces of pads in collector terminals c and drain terminals d may be directly connected (e.g., sintered) to a flat surface of die substrate 360, and the flat surfaces of pads in emitter terminals e and source terminals s may be directly connected (e.g., sintered) to first flat end surfaces of pedestals. The flat surfaces at the opposite ends of the pedestals (i.e., the second flat end surfaces) may be electrically and thermally connected (e.g., sintered) directly to a flat surface of die clip 372. Connector-lead 288*g*1 may be electrically connected to the gate terminals g of the IGBTs, while connector-lead 288*g*2 may be electrically connected to the gate terminals g of the MOSFETs. Although not shown in FIG. 3P, switch module 376P may include first and second separate straps that are attached to the same surface of die substrate 360 to which the pads of drain terminals d and collector terminal c are connected. The straps may be electrically isolated from die substrate 360. One or more bond-wires may electrically connect the first strap to the pad of the gate terminals in the IGBTs as shown, while one or more bond-wires may electrically connect the second strap to the pads of the gate terminals g in the MOSFETs. Connector-lead 288*g*1 may be electrically connected to the first strap, and connector-lead 288*g*2 may be electrically connected to the second strap. An end portion of connector-lead 288*g*1 may be directly connected (e.g., welded) to the first strap, and an end portion of connector-lead 288*g*2 may be directly connected (e.g., welded) to the second strap. Or one or more bond-wires may electrically connect to the first strap to an end portion of connector-lead 288*g*1, and one or more bond-wires may electrically connect to the second strap to an end portion of connector-lead 288*g*2. Packaged switch 304*q*P should not be limited to two MOSFETs connected in parallel with two IGBTs. In an alternative version, three or four MOSFETs may be connected in parallel with the two IGBTs, three or four IGBTS may connected in parallel with the two MOSFETs, three MOSFETS may be connected in parallel with three IGBTs, or four MOSFETS may be connected in parallel with four IGBTs. The size (i.e., length and width) of the die substrate 360 and die clip 372 should increase to accommodate each of these alternative versions of packaged switch 304*q*P.

Example Packaged Diodes 245

With continued reference to FIGS. 2E-1-2E-3, FIGS. 3M and 3N illustrate example packaged diodes 245 when seen from the side. Cases (e.g., case 249) are transparent FIGS. 3M and 3N to enable a better understanding of packaged diode components, their interaction, and their relative positions.

Example packaged diodes 245 shown in FIGS. 3M and 3N include diode modules 378M and 378N, respectively, each of which includes a power stack, which in turn includes one or more diodes D electrically and thermally connected to and positioned between die substrate 360 and die clip 372, all of which are shown symbolically. Die substrate terminals 230 and die clip terminals 344 are also shown symbolically. The surfaces of die substrate terminals 230 and die clip terminals 344 may be entirely flat and set below, set above, or flush with respective surfaces of cases 249. Diode module components, including die substrates 360 and die clips 372 may vary in size, shape, composition, etc., between packaged diodes 245 of FIGS. 3M and N.

Although not shown in FIGS. 3M and 3N each power stack may include one or more pedestals, each of which may have opposite facing first and second end surfaces that are entirely flat. Each first flat end surface of the one or more pedestals may be electrically and thermally connected (e.g., sintered) to a flat surface of a current terminal pad of a respective diode D, The second flat end surface of each of the one or more pedestals may be electrically and thermally connected (e.g., sintered) to a flat surface of die substrate 360 or die clip 372 on its side facing opposite the side that contains die substrate terminal 230 or die clip terminal 344. In an alternative version, pedestals are not used in the power stacks of FIGS. 3M and 3N, and current terminals are connected (e.g., sintered) directly to respective flat surfaces of die clip 372 and die substrate 360.

FIGS. 3M and 3N show relative positioning of components. Die substrate 360, one or more diodes D, and die clip 372 may be stacked as shown. Electrical current can be transmitted between die clip terminal 344 and die substrate terminal 230 via one or more diodes D. Diode modules 376M and 376N may include connector-leads 288*ds* and 288*dc*, but for ease of illustration neither is shown in FIGS. 3M and 3N. In many versions of a packaged diode, connector-leads 288*ds* and 288*dc* are not needed and left out.

Die substrate 360 and die clip 372 may conduct large current (e.g., 1, 5, 10, 50, 200, 400 A or more) into or out of packaged diode 245 via die substrate terminal 230 and die clip terminal 344, respectively. Diodes generate heat. Die substrates 360 and die clips 372 can conduct substantial heat generated by the one or more diodes D out of packaged diode 245 via die substrate terminals 230 and die clip terminals 344, respectively.

FIGS. 3M and 3N illustrate respective examples of packaged diode 245 that can be cooled through their die substrate and die clip terminals. In FIGS. 3M and 3N the cathode terminal of each of the one or more diodes D may have one or more conductive pads that are entirely flat. The anode terminal in each of the one or more diodes D may have one or more conductive pads that are entirely flat. The flat surface(s) of the pad(s) in the cathode terminal(s) may be directly connected (e.g., sintered) to a flat surface of die substrate 360, and the flat surface(s) of pad(s)s in the anode terminal(s) may be directly connected (e.g., sintered) to first flat end surfaces of respective pedestals. The flat surfaces at the opposite ends of the pedestal(s) (i.e., the second flat end surface(s)) may be electrically and thermally connected (e.g., sintered) to a flat surface of die clip 372. Or the flat surface(s) of pad(s) in the anode terminal(s) may be directly connected (e.g., sintered) to a flat surface of die clip 372.

Example Power Stack Terminals

Power stacks are created by electrically and thermally connecting transistors and/or diodes between die clips and die substrates. The first current terminal (e.g., collector terminal, drain terminal, cathode terminal, etc.) pad(s) of each transistor and/or diode may be sintered to a die substrate (or die clip) using a layer of highly conductive sintering material that may include silver, copper, etc. No dielectric exists between the transistor and/or diode and a die substrate terminal of the connected die substrate (or die clip terminal of the connected die clip). The second current terminal (e.g., emitter terminal, source terminal, anode terminal, etc.) pad(s) of each transistor and/or diode may be sintered to a die clip (or die substrate) through a layer of highly conductive sintering material that may include silver, copper, etc. No dielectric exists between a transistor and/or diode and a die clip terminal of the connected die clip (or die substrate terminal of a die substrate). Accordingly, no dielectric should exist between a die substrate terminal and a die clip terminal in a power stack.

Die substrate terminals and die clip terminals may have rectangular-shaped flat surfaces that are exposed through cases for connection to, for example, bus bars. The dimensions (e.g., width and length) of the exposed terminals are configured to transmit substantial current and heat. A die substrate terminal may be parallel to, but oppositely facing (i.e., 180 degrees) at least one flat surface of a die substrate to which the first current terminal (e.g., collector terminal, drain terminal, etc.) pad(s) is/are sintered. A die clip terminal may be parallel to, but oppositely facing (i.e., 180 degrees) at least one flat surface of a die clip to which the second current terminal (e.g., collector terminal, drain terminal, etc.) pad(s) is/are sintered.

Example die substrate terminal 230 and die clip terminal 344 of FIGS. 2A-1-2E-3 may be electrically connected to one or more first current terminals (e.g., drain(s)) and one or more second current terminals (e.g., source(s)), respectively, of one or more transistors inside packaged switches 247*p*, 247*q*, 247*s* and 247*d*, or die substrate terminal 230 and die clip terminal 344 may be electrically connected to one or more first current terminals (e.g., cathode(s)) and one or more second current terminals (e.g., anode(s)), respectively, of diodes inside packaged diode 245.

Die substrate terminals and die clip terminals may be configured for direct electrical and/or thermal connection to devices. Die substrate terminal 230 or die clip terminal 344 may be electrically and/or thermally connected to a surface of a heat sink, a bus bar, or a bus bar that also acts as a heat sink. For example, die substrate terminal 230 or die clip terminal 344 may be electrically and/or thermally connected to a flat surface of a "V+ bus bar" with a V+ terminal that may be electrically connected to a V+ terminal of a battery, fuel cell, DC/DC converter, etc. Die substrate terminal 230 or die clip terminal 344 may be electrically and/or thermally connected to a "V− bus bar" with a V− terminal that may be electrically connected to a V− terminal of the battery, fuel cell, DC/DC converter, etc. Die substrate terminal 230 or die clip terminal 344 may be electrically and/or thermally connected to an AC bus bar, which is also called a "phase bus bar" with an AC terminal that may be electrically connected to a terminal of a stator winding W of a motor, an inductor L of a filter, or other device. A heat sink or bus bar may include flat surfaces that may be press-fitted, welded, sintered, or connected in another manner to flat surfaces of die substrate terminals 230 or die clip terminals 344 to create an electrical and thermal connection between them. A press-fit or soldered connection can reduce or eliminate problems related to differences in coefficients of thermal expansion described below.

A bus bar can take one of many different configurations depending on the design of the power converter in which it is used. A bus bar may be assembled from several components. In general, a bus bar is a metal element that distributes high current (e.g., 10, 20, 50, 100, 200, 400, 800 A or more). The material composition (e.g., copper, aluminum, etc.) and cross-sectional area of a bus bar, or elements thereof, determines the maximum amount of current that may be carried, and parasitic parameters. Bus bars with wider cross-sectional areas may have lower parasitic parameters, including parasitic inductance, which affects voltage overshoot (aka voltage spike). The inductance of the disclosed bus bars may be 1.0, 0.8, 0.6, 0.4 nH or less between a bus bar terminal (e.g., V+, V−, or phase bus bar terminal) and a die substrate terminal or die clip terminal of a packaged switch to which the bus bar is directly connected.

A bus bar or heat sink may have one or more channels. Cooling air provided by a fan may flow through the channels. Or channels can receive tubes, which are more fully described below. A cooling fluid may flow through the tubes. The tubes may be in fluid communication with a pump and a radiator through interconnecting manifolds and hoses. Manifolds may be connected with respective ends of channels or tubes in channels.

Tubes may be formed (e.g., extruded) from metal such as copper or aluminum. The entire inner and/or outer surfaces of metal tubes can be coated with one or more layers of thermally conductive, and electrically isolating dielectric material. The outer dielectric layer can electrically insulate the metal tubes from heat sinks or bus bars in which they are received. The inner dielectric layer can electrically insulate the cooling fluid flowing in the metal tube. The outer surface of the metal tubes may be selectively coated with a dielectric material. In other words, outer surfaces of metal tubes can be partially coated with a dielectric material. In another version no dielectric exists between a cooling fluid (e.g., a dielectric fluid such as oil) flowing in metal tubes and the heat sink or bus bar in which the tubes are received. In this alternative version, outer surfaces of the metal tubes may electrically and thermally connect to the heatsinks or bus bars in which they are received. Tubes may take form in concentric metal (e.g., copper) tubes. Fluid can flow through the inner tube of the concentric tubes. A dielectric material may be positioned between the concentric tubes (i.e., between the outer surface of the inner tube and the inner surface of the outer tube). The dielectric material can electrically insulate the concentric tubes from each other.

Tubes may be formed (e.g., extruded) from thermally conductive and electrically non-conductive material such as aluminum nitride or beryllium oxide. For purposes of explanation only, thermally conductive, and electrically non-conductive tubes are formed from aluminum nitride, it being understood that tubes can be formed from other electrically non-conductive and thermally conductive materials. The entire inner and/or outer surfaces of aluminum nitride tubes can be coated with one or more layers of metal. Or metal layers may be formed on only selected sections of the outer surface of the aluminum nitride tube. In other words, aluminum nitride tubes can be partially coated with metal. One aluminum nitride tube may be received in separate bus bars, and the outer surface of only those sections of the tube that are contained in bus bars may be coated with an outer layer of metal. A thin layer of metal may be formed only on end sections of tubes (dielectric coated metal tubes or aluminum nitride tubes) to facilitate a better seal between the ends of the tubes and fluid manifolds. Bus bars may be cast around aluminum nitride tubes. Except for ends that connect with manifolds, the aluminum nitride tubes in cast bus bars need not be coated with a thin layer of metal.

In general, heat sinks or bus bars may be made (e.g., extruded, 3D printed, cast, etc.) in whole or in parts from a conductive metal like copper or aluminum, and can have different shapes, sizes, and dimensions (e.g., length, width, height, etc.) to accommodate different design objectives. A heat sink or bus bar that also acts as heat sink may be formed by casting aluminum, copper, or other material around tubes. Casting is a process in which a liquid metal is delivered into a mold that contains a negative impression (i.e., a three-dimensional negative image) of the intended shape. Bare metal tubes or metal tubes that are fully or partially coated with a thin layer of dielectric material or other material, may be received in the mold before liquid metal is delivered. Bare aluminum nitride tubes or aluminum nitride tubes that are fully or partially coated with a thin layer of metal or other material, may be received in the mold before liquid metal is delivered. In other words, bus bars can be cast around tubes. Heat sinks or bus bars that also act as heat sinks may be formed by attaching (e.g., welding, soldering, sintering, brazing, etc.) two metal halves together after bare, fully or partially coated metal or aluminum nitride tubes are inserted therebetween and placed in aligned grooves thereof. The two halves may be formed by extrusion, 3D printing, casting, etc. Before the halves are attached, a thin layer of thermal paste (also called thermal compound, thermal grease, thermal interface material (TIM), thermal gel, heat paste, heat sink compound, heat sink paste or CPU grease) may be applied to the outer surface the tube to eliminate air gaps or spaces in the interface between the tube and the heat sink or bus bar that also acts as a heat sink to create a better thermal connection. In still another version, the heat sink or bus bar in which the bare, fully or partially coated tube is received is heated so that metal of the heat sink or bus bar reflows to eliminate air gaps or spaces in the interface between the tube and the heat sink or bus bar to create a better thermal connection.

Example Switch Modules and Diode Modules

With continuing reference to FIGS. 3A-3P, FIGS. 4A-4H illustrate example switch modules 376, example diode modules 378, and their components. Each of the example switch modules 376 and diode modules 378 include a switch or diode(s) sandwiched between a die substrate and a die clip.

Figures 1, 4A:
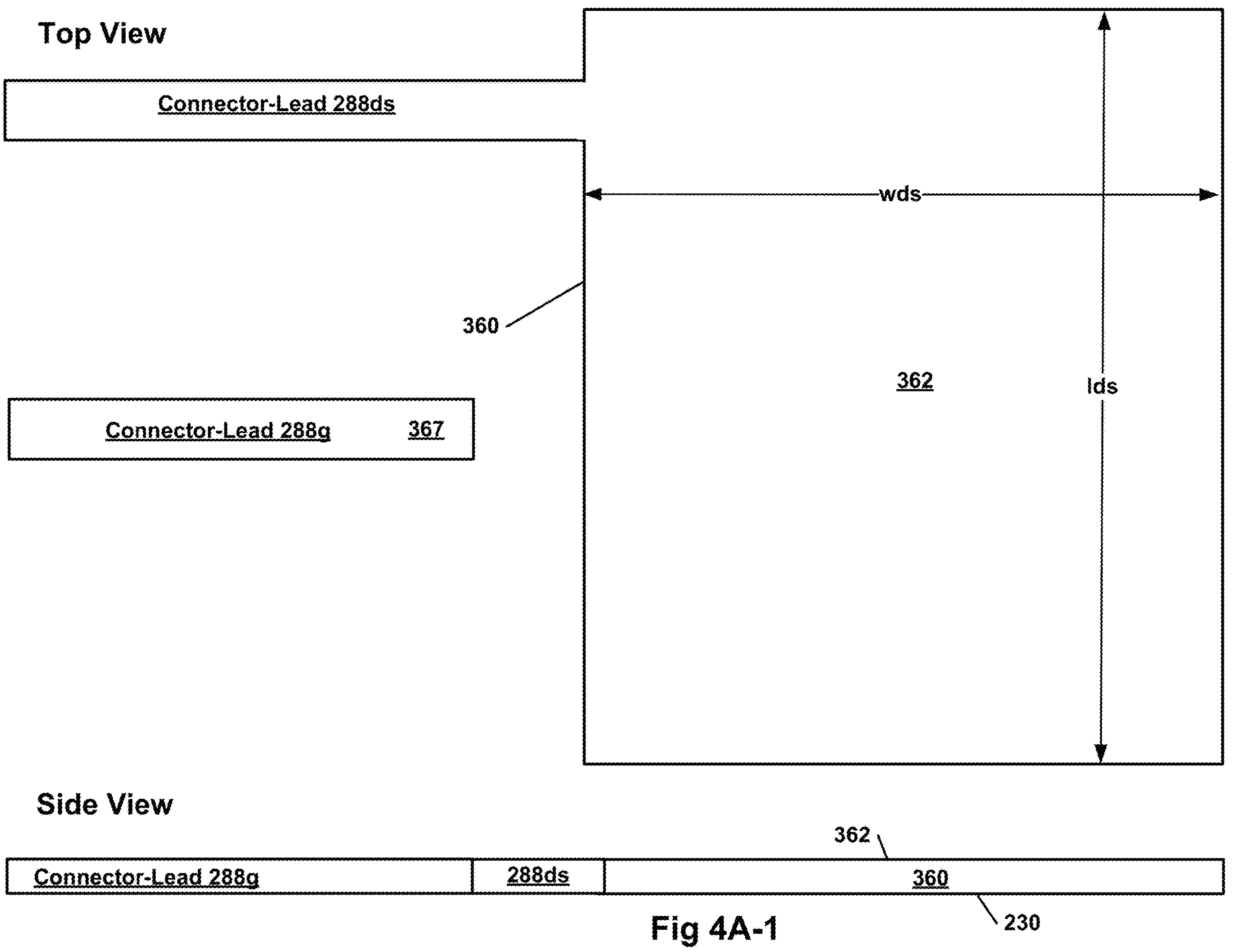
Figures 2, 4A:
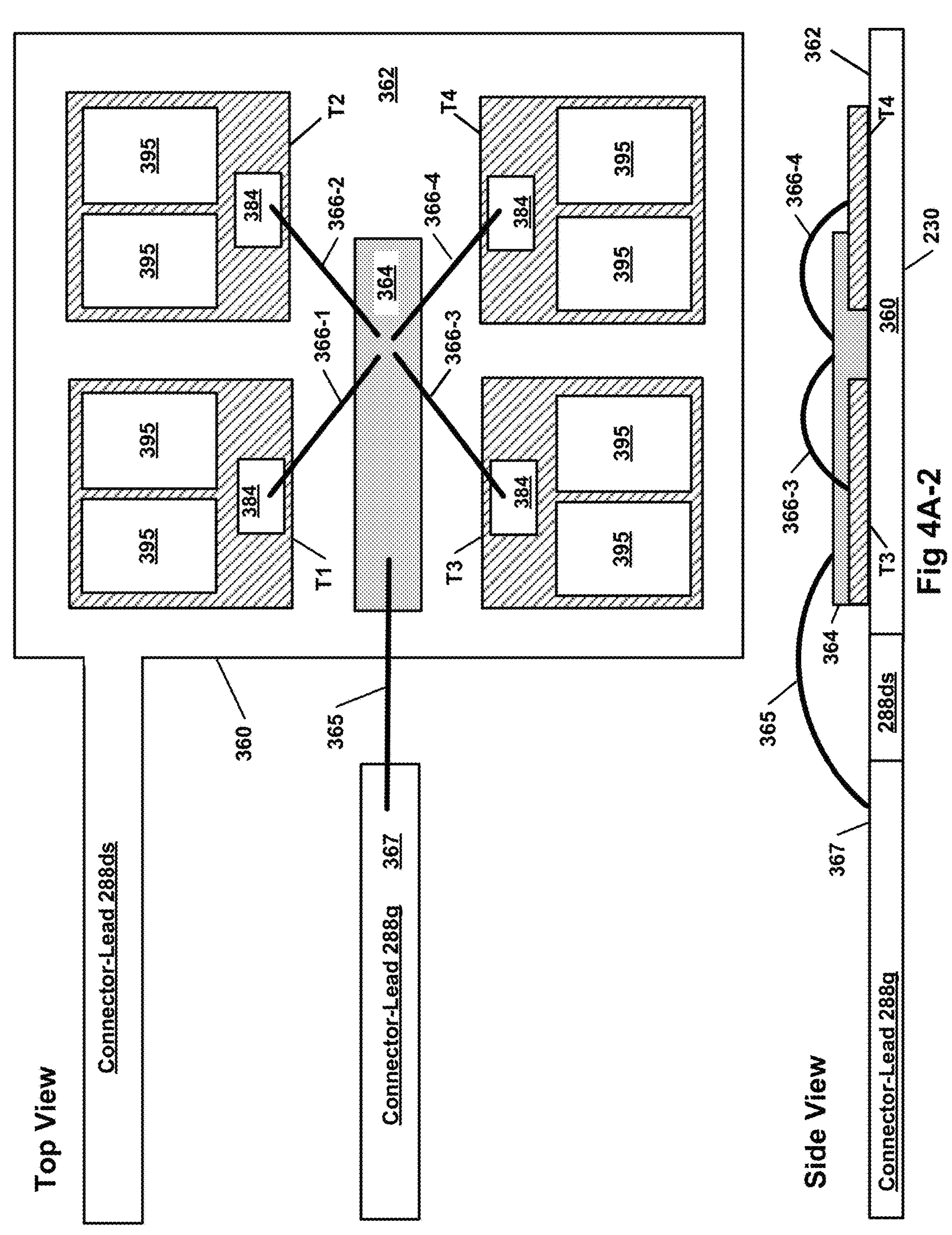
Figures 3, 4A:
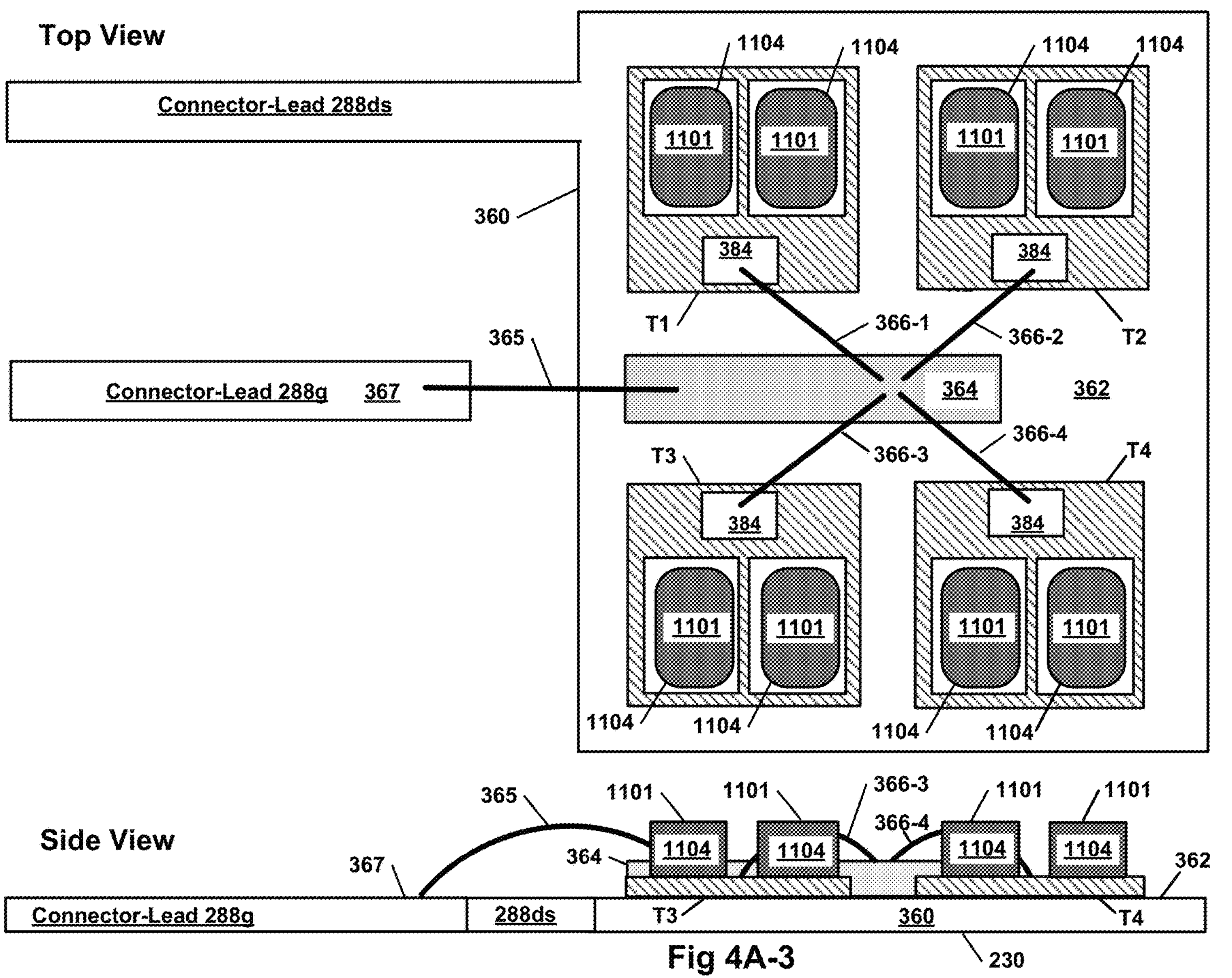

FIG. 4A-1 shows top and side views of an example die substrate 360, connector-lead **288*ds*, and connector-lead 288*g*. A die substrate may be formed (e.g., stamped, cut, sawed, diced, etc.) from a thin (e.g., 0.7 mm-1.5 mm) sheet of metal, which may or may not be electroplated with silver. Or a die substrate may be formed (e.g., stamped, cut, sawed, diced, etc.) from a thin (e.g., 0.7 mm-1.5 mm) layered sheet like that shown in FIG. 2H. Example die substrate 360 and collector-lead 288*ds* may be formed from a thin (e.g., 0.7 mm-1.5 mm) layered sheet like that shown in FIG. 2H. Connector-lead 288*ds* may be integrally connected to die substrate 360 as shown. In another version, connector-lead 288*ds* may be separately formed and subsequently attached (e.g., welded) to die substrate 360. In yet another version, no connector-lead 288*ds* is connected to die substrate 360**.

Die substrate 360 may include opposite facing, entirely flat surfaces of substantially equal area, one of which is designated 362 while the other defines example die substrate terminal 230. Die substrate terminal 230 may be configured for thermal and electrical connection to a flat surface of a device such as a bus bar as will be more fully described below.

Die substrate 360 may have a width wds around 13.5 mm, and a length lds around 16.5 mm. Connector lead **288*ds* may have a width around 1.2 mm, and length around 20 mm. Connector lead 288*g* may have a width around 1.2 mm, and length around 18 mm. Bond area 367** provides a surface where a bond-wire can be wire-bonded.

Surfaces of current terminal (e.g., drain terminal, collector, cathode terminal, etc.) pads in transistors and/or diodes may be electrically and thermally attached directly to surface 362 of die substrate 360. For example, flat first current terminal (e.g., drain terminal, collector terminal, cathodes, anode-2 terminal, etc.) pad surface(s) of switches 304 or diode(s) D shown in FIGS. 3A-3F, 3H-3K, 3M-3P may be electrically and thermally attached (e.g., sintered) directly to surface 362.

The size (i.e., width wds and length lds) of die substrate 360 may depend on the number and/or type of transistors in a switch 304 to which it is connected. For example, the area of surface 362 needed to fit four BBJTs or four IGBTs connected in parallel may be larger than the area of surface 362 needed to fit four MOSFETs connected in parallel, or the area needed to fit four MOSFETs connected in parallel may be smaller than the area of surface 362 needed to fit two MOSFETs and two IGBTs connected in parallel, assuming IGBT dies are larger in size than MOSFET dies. For ease of illustration and description, the size (length and width) of transistor dies may be presumed equal regardless of transistor type, unless obvious or otherwise noted.

FIG. 4A-2 shows the die substrate 360 of FIG. 4A-1 after four transistors T1-T4 are electrically and thermally attached to surface 362. More specifically flat surfaces of first current terminal (e.g., drain terminal, collector terminal, etc., not shown) pads of transistors T1-T4 may be sintered to surface 362. A low resistance path may exist between die substrate terminal 230 and each first current terminal pad. Each die substrate joint (e.g., sintered joint, not shown) in FIG. 4A-2 that connects a first current terminal pad surface to surface 362 may conduct 1, 2, 5, 10, 20, 50, 100, 200, 300, 750 Watts or more of heat while concurrently conducting 1, 5, 10, 50, 100, 200, 400 A or more of electrical current. Each die substrate joint may have a length and width that is substantially equal to the length and width of a respective first current terminal pad surface.

T1-T4 may be transistors of the same type, or T1-T4 may include a mixture of different types of transistors. For example, T1-T4 may be MOSFETS, and the flat surfaces of drain terminal pads in T1-T4 may be sintered to surface 362. T1-T4 may be IGBTs, and the flat surfaces of collector terminal pads in T1-T4 may be sintered to surface 362. In another example, T1 and T2 may be MOSFETS, and T3 and T4 may be IGBTs. In this version flat surfaces of drain terminal pads in T1 and T2 may be sintered to surface 362, and flat surfaces of collector terminal pads in T3 and T4 may be sintered to surface 362. In another version, one of the transistors (e.g., T1) can be replaced by a diode, while three other transistors (e.g., 2-T4) take form in IGBTs. In this version, flat collector terminal pad surfaces of the three IGBTs and the flat cathode terminal pad surface of the diode can be sintered to surface 362.

Each of the transistors T1-T4 may include a pair of second current terminal (e.g., source terminal, emitter terminal, etc.) pads, it being understood that transistors may have fewer or more than a pair of second current terminal pads. Each second current terminal pad may have a flat surface. Example flat second current terminal pad surfaces 395 are shown. Each of the transistors T1-T4 includes a control terminal (e.g., gate terminal) pad with a flat surface. Example control terminal pad surfaces 384 are shown. The pads are not shown in the side view of FIG. 4A-2.

FIG. 4A-2 also shows an example gate strap 364, bond-wire 365, and bond-wires 366. Gate strap 364, which may be formed of a conductive metal such as copper, may be attached to surface 362 through an electrically insulating material (not shown) thereby electrically isolating gate strap 364 from die substrate 360. Connector-lead 288*g* may be electrically connected to gate strap 364 through bond-wire 365. Bond-wires 366 of substantially equal length may electrically connect gate strap 364 to respective surfaces 384 of the control terminal pads. Each of the bond-wires 366 may be wire-bonded to strap 364 at substantially equal distances from the point on strap 364 where bond-wire 365 is wire-bonded. In an alternative version an end of a length-extended connector-lead 288*g* may be attached (e.g., welded) to strap 364. In still another alternative version an end of a length-extended connector-lead 288*g* may be attached to surface 362 through an electrically insulating layer thereby electrically isolating length-extended connector-lead 288 from die substrate 360. Bond-wires of substantially equal length can electrically connect length-extended connector-lead 288*g* to respective surfaces 384 of control terminal pads.

FIG. 4A-3 shows the structure of FIG. 4A-2 after example pedestals 1104 are electrically and thermally attached (e.g., sintered) directly to respective surfaces 395 of the second current terminal pads in transistors T1-T4. Pedestals, including pedestals 1104, may be formed from thin (e.g., 1.0 mm-1.2 mm) layered sheets like that shown in FIG. 2H. Pedestals 1104 may have a width around 1.65 mm and a length around 2.8 mm.

Pedestals may have opposite facing first and second end surfaces that are entirely flat. Only flat first end surfaces 1101 are shown in FIG. 4A-3. The flat end surfaces of a pedestal, including pedestal 1104, may have the same size and shape. The second flat end surfaces of pedestals 1104 can be electrically and thermally attached (e.g., sintered) directly to flat surfaces 395 of respective second current terminal pads. The second flat end surfaces of pedestals 1104 may have a shape (e.g., substantially rectangular) and size (e.g., around 2.8 mm×1.65 mm) substantially like, but slightly smaller than the shape and size of flat surfaces 395 of respective second current terminal pads to which they are electrically and thermally attached. This may ensure that pedestals 1104 do not contact transistors T1-T4 outside the areas occupied by second current terminal (e.g., source terminal) pads. Second flat end surfaces of pedestals 1104 may more evenly distribute mechanical stress. Pedestals, including pedestals 1104, may reduce current flux (i.e., current density) through source terminal pad surfaces 395 when compared to the current flux that flows through small area(s) on source terminal pad surfaces that are connected to bond-wire(s). Each second joint (e.g., sintered joint) that connects a second current terminal pad surface 395 to a second flat end surface of a pedestal 1104, and each pedestal 1104, may conduct 1, 2, 5, 10, 20, 50, 100, 200, 350 Watts or more of heat while concurrently conducting 1, 5, 10, 20, 50, 100, 200 A or more of electrical current. Each of these second joints may have a length and width that is substantially equal to the length and width of the respective second flat end surface of pedestals 1104. First flat end surfaces of pedestals, including surfaces 1101 in FIG. 4A-3, may be contained in a common plane to accommodate their attachment to a flat surface of, for example, a die clip. Pedestals, including pedestals 1104, in a switch can have different thicknesses between their flat end surfaces to accommodate transistors with current terminal pad surfaces of different heights measured with respect to surface 362, to put first end surfaces of the pedestals in the common plane so that they can be electrically and thermally attached to a flat surface of, for example, a die clip.

Figures 4, 4A:
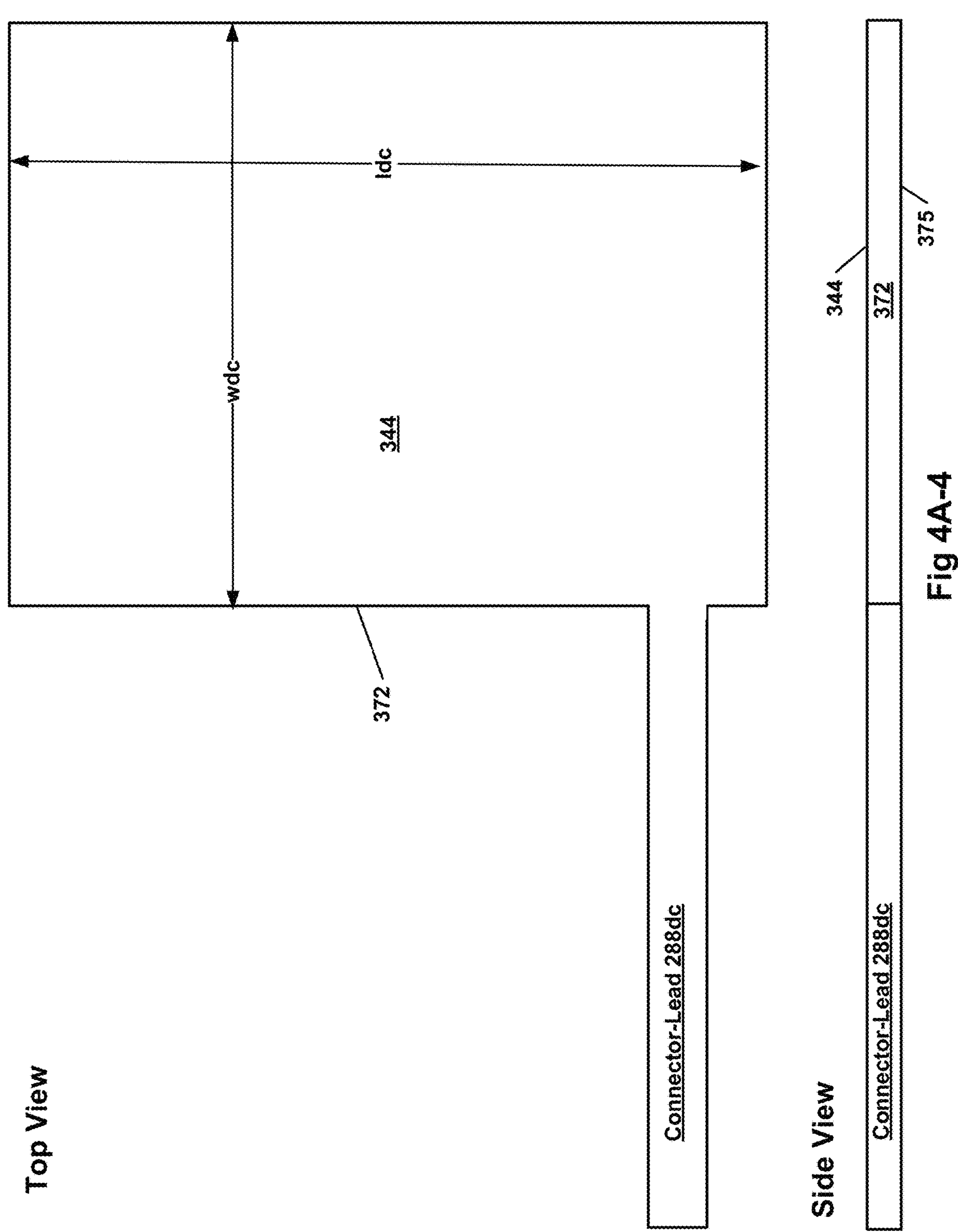

Transistors and/or diodes may be electrically and thermally connected to a die clip. FIG. 4A-4 shows top and side views of an example die clip 372 and example connector-lead 288*dc*. Die clip 372 may be formed (e.g., stamped, cut, sawed, diced, etc.) from a thin (e.g., 0.7 mm-1.5 mm) sheet of metal or metal composite. Or die clip 372 may be formed (e.g., stamped, cut, sawed, diced, etc.) from a thin (e.g., 0.7 mm-1.5 mm) layered sheet like that shown in FIG. 2H. Unless otherwise noted, die clip 372 is formed from a thin sheet of copper. Die clip 372 may include an outer layer of electroplated sintering enhancement material (e.g., silver). Connector-lead 288*dc* may be integrally connected to die clip 372 as shown. In another version, connector-lead 288*dc* may be separately formed and subsequently attached (e.g., welded) to die clip 372. In yet another version, no connector-lead 288*dc* is connected to die clip 372.

Die clip 372 includes opposite facing, substantially flat surfaces 344 and 375 of substantially equal area. Surfaces 344 and 375 may be entirely flat. Surface 344 defines an example die clip terminal 344 and may be configured for thermal and electrical connection to a flat surface of a device such as a bus bar as will be more fully described below. Surface 375 can be electrically and thermally (e.g., sintered) directly to pedestals, current terminal pads, etc.

In one version, die clip 372 has a width wdc around 13.0 mm, and a length ldc around 16.0 mm. Connector-lead 288*dc* may have a width around 1.2 mm, and length around 20 mm. Like die substrates, the size of die clip 372 may need adjustment to accommodate the number and/or type of transistors in a switch 304 to which it is connected. For example, the area of surface 375 needed to fit a switch with four IGBTs connected in parallel or four BBJTs connected in parallel, may be larger or smaller than the area of surface 375 needed to fit a switch with four MOSFETs connected in parallel, or the area needed to fit a switch with four MOSFETs connected in parallel may be smaller than the area of surface 375 needed to fit a switch with two MOSFETs and two IGBTs connected in parallel, assuming IGBT dies are larger in size than MOSFET dies.

A surface of a component such as a pedestal, including pedestal 1104, may be electrically and thermally attached directly to a flat surface of a die clip. For example, first flat end surfaces of pedestals, including surfaces 1101, can be electrically and thermally connected (e.g., sintered) directly to surface 375. In some versions a flat current terminal pad surface of transistor and/or diode may be electrically and thermally connected (e.g., sintered) directly to surface 375. For example, flat pad surfaces of drain terminals d2 shown in FIG. 3J or 3K may be sintered to surface 375 of a die clip 372 formed from a thin (e.g., 0.7 mm-1.5 mm) layered sheet like that shown in FIG. 2H. Dimensions width wdc and/or length ldc may increase or decrease depending on the number of transistors connected to die clip 372 in parallel or anti-parallel.

Figures 4, 4A, 5:
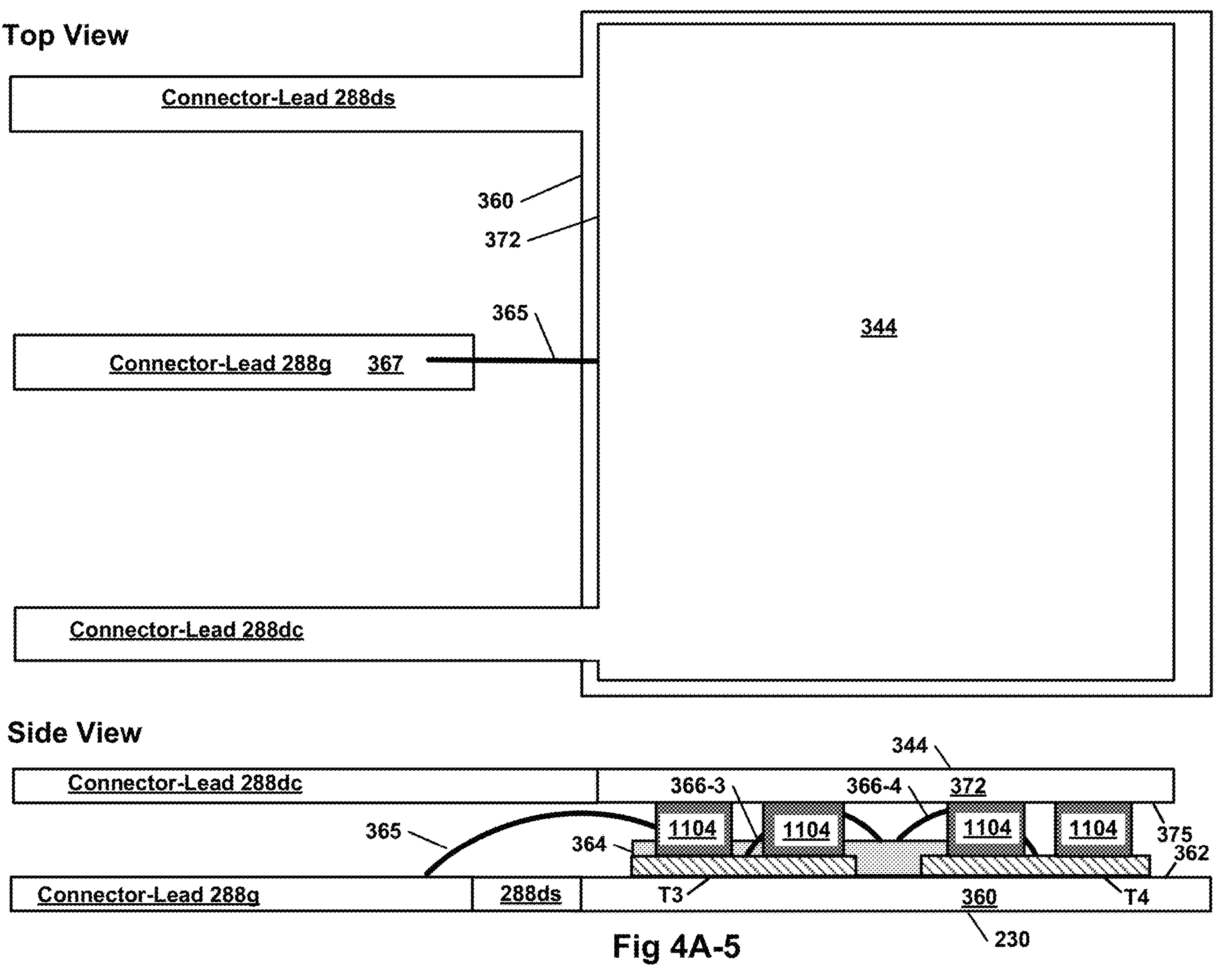

FIG. 4A-5 shows top and side views of the structure in FIG. 4A-3 after flat surface 375 of die clip 372 is electrically and thermally attached (e.g., sintered) directly to flat surfaces 1101 of pedestals 1104. Each die clip joint (e.g., sintered joint) that connects a first flat surface of a pedestal, including surface 1101, to surface 375 may conduct 1, 2, 5, 10, 20, 50, 100, 300, 600 Watts or more of heat while concurrently conducting 1, 5, 10, 20, 50, 100, 200, 400 A or more of electrical current. Each die clip joint may have a length and width that is substantially equal to the length and width of a respective first flat end surface of a pedestal, such as surface 1101. A low resistance path may exist between die clip terminal 344 and each second current terminal pad, including pad 395.

If T1-T4 take form in MOSFETs the structure shown in FIG. 4A-5 may be a version of the switch module 376B shown in FIG. 3B. If T1-T4 take form in IGBTs the structure shown in FIG. 4A-5 may be a version of the switch module 376O shown in FIG. 3O. After die clip 372 is electrically and thermally attached to pedestals 1104, a case may be formed around the switch module of FIG. 4A-5 using, for example, transfer molding, to create an example of packaged switch 247*s* shown in FIGS. 2C-1-2C-3. Or a case may be formed around the switch module of FIG. 4A-5 using, for example, transfer molding, to create an example of packaged switch 247*d*B or 247*d*O shown in FIGS. 3B and 3O, respectively, which is an example of packaged switch 247*d* shown in FIGS. 2D-1-2D-3. Prior to case formation some or all of connector-leads 288 may be bent to place case-external end portions of the connector-leads 288 in a common plane as shown in FIGS. 2C-3 and 2D-3. In an alternative version, connection-lead 288*ds* and/or 288*dc* are not included to create an alternative version of packaged switch 247*d*.

In FIG. 4A-3 pedestals 1104 are electrically and thermally connected (e.g., sintered) directly to respective second current terminal pads. A pedestal can be connected to adjacent second current terminals pads in a transistor. FIG. 4A-6 shows the structure of FIG. 4A-2 with example pedestals 1108 that are electrically and thermally attached (e.g., sintered) directly to respective pairs of second terminals. Pedestals 1108 may be longer than pedestals 1104 and may be formed from thin (e.g., 1.0 mm-1.2 mm) layered sheets like that shown in FIG. 2H, it being understood pedestals 1108 should not be limited thereto. Pedestals 1108 may have a width around 2.8 mm and a length around 3.3 mm.

Like pedestals 1104, pedestals 1108 may have opposite facing flat first and second end surfaces. Only first flat end surfaces 1107 are shown in FIG. 4A-6. Each second flat end surface is electrically and thermally attached (e.g., sintered) directly to flat surfaces 395 of adjacent second current terminal pads in a respective transistor. The flat second end surface (not shown) of each pedestal 1108 may have a shape (e.g., substantially rectangular) and size (e.g., around 2.8 mm×3.3 mm) that is substantially like the shape and size of the area that includes surfaces 395 of adjacent second current terminal pads in a transistor and the area separating the adjacent second current terminal pads. Each second joint (e.g., sintered joints) that connects a pair of adjacent second current terminal pad surfaces 395 to a flat second end surface of a pedestal 1108, and each pedestal 1108, may conduct 10, 20, 50, 100, 300, 700 Watts or more of heat while concurrently conducting 10, 20, 50, 100, 200, 400 A or more of electrical current. Each the second joints may have a length and width that is substantially equal to the length and width of the flat second end surface of pedestal 1108.

FIG. 4A-7 shows top and side views of the structure in FIG. 4A-6 after flat surface 375 die clip 372 in FIG. 4A-4 is electrically and thermally attached (e.g., sintered) directly to flat surfaces 1107 of pedestals 1108. A low resistance path may exist between die clip terminal 344 and each second current terminal pad 395. Each die clip joint (e.g., sintered joint) that connects a surface 1107 to surface 375 may conduct 10, 20, 50, 100, 300, 700 Watts or more of heat while concurrently conducting 10, 20, 50, 100, 200, 400 A or more of electrical current. Each die clip joint in FIG. 4A-7 (not shown) may have a length and width that is substantially equal to the length and width of a respective first flat end surface 1107.

If T1-T4 take form in MOSFETS, the structure shown in FIG. 4A-7 may be a version of the switch module 376B shown in FIG. 3B. If T1-T4 take form in IGBTs, the structure shown in FIG. 4A-7 may be a version of the switch module 376O shown in FIG. 3O. After die clip 372 is attached, a case may be formed around the switch module of FIG. 4A-7 using, for example, transfer molding, to create an example of packaged switch 247*s* shown in FIGS. 2C-1-2C-3. Or a case may be formed around the switch module of FIG. 4A-7 using, for example, transfer molding, to create an example of packaged switch 247*d*B or 247*d*O shown in FIGS. 3B and 3O, respectively, which is an example of a packaged switch 247*d* shown in FIGS. 2D-1-2D-3. Prior to case formation some or all of connector-leads 288 may be bent to place case-external end portions of the connector-leads 288 in a common plane as shown in FIGS. 2C-3 and 2D-3. In an alternative version, connection-lead 288*ds* and/or 288*dc* are not included to create an alternative version of packaged switch 247*d*.

In still another version of switch module 376B, pedestals may be integrally formed with bridges (i.e., integrated bridges). FIG. 4A-8 shows the structure of FIG. 4A-2 with example integrated bridges 371, each of which is electrically and thermally attached (e.g., sintered) directly to second current terminals in adjacent transistors. Integrated bridge 371 may have a substantially flat surface 383 with a length around 10.8 mm and a width around 2.8 mm.

Integrated bridge 371 may be formed (e.g., cut) from a thin (e.g., 0.7 mm-1.5 mm) layered sheet like that shown in FIG. 2H. A groove can be formed in the layered sheet to create integrated pedestals 1110. A flat end surface of each integrated pedestal 1110 can have the same size and shape as flat end surface 1107 of pedestal 1108. Each flat end surface can be electrically and thermally attached (e.g., sintered) directly to surfaces 395 of adjacent current terminal pads in a respective transistor. Each second joint (e.g., sintered joint) that connects a pair of adjacent second current terminal pad surfaces 395 to a flat second end surface of an integrated pedestal 1110, and each pedestal 1110, may conduct 10, 20, 50, 100, 300, 700 Watts or more of heat while concurrently conducting 10, 20, 50, 100, 200, 400 A or more of electrical current. Each these second joints may have a length and width that is substantially equal to the length and width of the flat second end surface of pedestal 1110. Each of the bridges 371 may have a flat surface 383 that can be sintered to a flat surface of a die clip 372.

The groove in integrated bridge 371 may extend across its entire width and span a separation between a pair of adjacent transistors. For example, the groove in integrated bridge 371-1 may be positioned over the separation between transistors T1 and T2, and the groove in integrated bridge 371-2 may be positioned over the separation between transistors T3 and T4. A groove can be formed by cutting into a layered sheet using, for example, a rotary burr (also known as die grinder bit) of a rotary tool. The groove may be deep enough to enable liquid mold compound to flow freely between the pedestals 1110 when their flat end surfaces are electrically and thermally attached (e.g., sintered) directly to second current terminal (e.g., source terminal) pad surfaces 395 in respective transistors. The groove can be rectangularly shaped (rectangle-groove) with three sides like those shown in the side-view of FIG. 4A-8, or the groove can be upside-down V shaped (i.e., V-groove) with two sides. In a V-groove, the cross-sectional width of the pedestals increase towards the bridge to which the pedestals 1110 are integrally connected. V-grooves may provide better heat spreading when compared to rectangle-grooves, but rectangle-grooves may enable better liquid mold-compound flow between pedestals 1110 during transfer molding.

FIG. 4A-9 show top and side views of the structure in FIG. 4A-8 after die clip 372 of FIG. 4A-4 is added. Specifically FIG. 4A-9 shows the structure after flat surface 375 of die clip 372 is electrically and thermally attached (e.g., sintered) directly to flat surfaces 383 of integrated bridges 371. A low resistance path may exist between die clip terminal 344 and each second current terminal pad 395. Each die clip joint (e.g., sintered joint) that connects a surface 383 to surface 375 may conduct 10, 20, 50, 100, 300, 700, 1400 Watts or more of heat while concurrently conducting 10, 20, 50, 100, 200, 400, 800 A or more of electrical current. Each die clip joint in FIG. 4A-9 (not shown) may have a length and width that is substantially equal to the length and width of a respective surface 383.

If T1-T4 are MOSFETS, the structure shown in FIG. 4A-9 may be a version of the switch module 376B shown in FIG. 3B. If T1-T4 are IGBTs, the structure shown in FIG. 4A-9 may be a version of the switch module 376O shown in FIG. 3O. After die clip 372 is electrically and thermally attached to integrated bridges 371, a case may be formed around the switch module of FIG. 4A-9 using, for example, transfer molding, to create an example of packaged switch 247*s* shown in FIGS. 2C-1-2C-3. Or a case may be formed around the switch module of FIG. 4A-9 using, for example, transfer molding, to create a version of packaged switch 247*d*B or 247*d*O shown in FIGS. 3B and 3O, respectively, which is an example of packaged switch 247*d* shown in FIG. 2D-1-2D-3. Prior to case formation some or all of connector-leads 288 may be bent to place case-external end portions of the connector-leads 288 in a common plane as shown in FIGS. 2C-3 and 2D-3. In an alternative version, connection-lead 288*ds* and/or 288*dc* are not included to create an alternative version of packaged switch 247*d*.

Returning to FIG. 4A-2, all control terminals of transistors T1-T4 are electrically connected to gate strap 364. In an alternative version, control terminals of transistors in a switch may be electrically connected to separate gate straps. FIG. 4B-1 shows the structure of FIG. 4A-2, but with gate strap 364 replaced by a pair of gate straps 359-1 and 359-2, which in turn are attached to surface 362 of the die substrate 360 through electrically insulating material (not shown). Gate straps 359-1 and 359-2 may be smaller in width than gate strap 364. Otherwise, gate straps 359-1 and 359-2 are substantially like gate strap 364. FIG. 4B-1 also shows that connector-lead 288*g* in FIG. 4A-2 is replaced with a pair of connector leads 288*g*-1 and 288*g*-2. Connector-lead 288*g* is substantially like connector leads 288*g*-1 and 288*g*-2.

Bond wires 366-1 and 366-2 of substantially equal length may electrically connect gate strap 359-1 (or length-extended connector-lead 288*g*-1) to surfaces 384 of respective control terminal (e.g., gate terminal) pads in transistors T1 and T2. Bond wires 366-3 and 366-4 of substantially equal length may electrically connect gate strap 359-2 (or length-extended connector-lead 288*g*-2) to surfaces 384 in respective control terminal pads of T3 and T4. Connector-leads 288*g*-1 and 288*g*-2 are electrically connected to gate straps 359-1 and 359-2, respectively, by bond wires 365-1 and 365-2, respectively. In an alternative version, ends of length-extended connector-leads 288*g*-1 and 288*g*-2 may be connected (e.g., welded) to gate straps 359-1 and 359-2, respectively. In yet another version, ends of extended 288*g*-1 and 288*g*-2 may be attached to surface 362 through electrically insulating material. In this alternative version bond wires 366-1 and 366-2 of substantially equal length may electrically length-extended connector-lead 288*g*-1 to surfaces 384 of respective control terminal pads of transistors T1 and T2, and bond wires 366-3 and 366-4 of substantially equal length may electrically connect length-extended connector-lead 288*g*-2 to surfaces 384 of respective control terminal pads of T3 and T4.

Transistors T1-T4 in FIG. 4B-1 may be the same type, or transistors T1-T4 may be a mixture of different types. For example, T1-T4 may all be MOSFETS or IGBTS. T1 and T2 may be MOSFETS while T3 and T4 may be IGBTs, or T1 and T3 may be MOSFETs while T2 and T4 may be IGBTs. In a mixed transistor version, the flat surfaces of first current terminal (e.g., drain and collector terminal) pads in T1-T4 may be electrically and thermally attached (e.g., sintered) directly to surface 362. In still another version, one of the transistors (e.g., T1) can be replaced by a diode, while transistors T2-T4 may take form in IGBTs. In a mixed IGBT/diode version the flat collector terminal pad(s) of the IGBT(s) and the flat cathode terminal pad(s) of the diode(s) can be electrically and thermally attached (e.g., sintered) directly to surface 362. A low resistance path may exist between the die substrate terminal 230 and drain or collector terminal pad of each transistor T or diode.

FIG. 4B-2 shows the structure of FIG. 4B-1 after pedestals 1108 are electrically and thermally attached (e.g., sintered) directly to adjacent surfaces 395 in respective transistors. FIG. 4B-3 shows top and side views of the structure in FIG. 4B-2 after die clip 372 of FIG. 4A-4 is added. Specifically, FIG. 4B-3 flat surface 375 of die clip 372 is electrically and thermally attached (e.g., sintered) directly to flat surfaces 1107 of pedestals 1108. A low resistance path may exist between die clip terminal 344 and each second current terminal pad 395. Transistors T1 and T2 can be controlled by a first control terminal signal received via connector-lead 288*g*-1, while transistors T3 and T4 can be independently controlled by a separate second terminal control signal received via connector-lead 288*g*-2.

If transistors T1-T4 are MOSFETS, the structure shown in FIG. 4B-3 may be one version of the switch module 376E of FIG. 3E. If transistors T1 and T2 are IGBTs, and T3 and T4 are MOSFETs, the structure shown in FIG. 4B-3 may be one version of the switch module 376P of FIG. 3P. In another version, each of transistors T1-T4 may be IGBTs. After die clip 372 is attached to pedestals 1108, a case may be formed around the switch module shown in FIG. 4B-3 using, for example, transfer molding, to create a version of packaged switch 247*q*E or 247*q*P shown in FIGS. 3E and 3P, respectively, which is an example of the packaged switch 247*q* shown in FIGS. 2B-1-2B-3. Prior to case formation some or all of connector-leads 288 may be bent to place case-external end portions of the connector-leads 288 in a common plane as shown in FIG. 2B-3. In an alternative version, connection-lead 288*ds* and/or 288*dc* are not included to create an alternative version of packaged switch 247*q*.

FIG. 4B-4 shows the structure of FIG. 4B-2, but with bond-wires 366-1-366-3 electrically connecting gate strap 359-1 to control terminal pad surfaces 384 of transistors T1-T3, and with bond-wire 366-4 electrically connecting gate strap 359-2 to control terminal pad surface 384 of transistor T4. Transistors T1-T4 in FIG. 4B-4 may be the same type, or transistors T1-T4 may be a mixture of different types. Transistors T1-T3 can be controlled by a control terminal signal received via connector-lead 288*g*-1, while transistor T4 can be independently controlled by a separate terminal control signal received via connector-lead 288*g*-2. FIG. 4B-5 shows top and side views of the structure in FIG. 4B-4 after die clip 372 of FIG. 4A-4 is added. Specifically FIG. 4B-5 shows the structure after flat surface 375 of die clip 372 is electrically and thermally attached (e.g., sintered) directly to flat surfaces 1107 of pedestals 1108. If T1-T3 are MOSFETs and transistor T4 is an IGBT, the structure shown in FIG. 4B-5 may be one version of the switch module 376F in FIG. 3F. After die clip 372 is electrically and thermally attached to pedestals 1108, a case may be formed around the switch module shown in FIG. 4B-5 using, for example, transfer molding, to create an example of packaged switch 247*q*F shown in FIG. 3F, which is an example of packaged switch 247*q* shown in FIGS. 2B-1-2B-3. Prior to case formation some or all of connector-leads 288 may be bent to place case-external end portions of the connector-leads 288 in a common plane as shown in FIG. 2B-3. In an alternative version, connection-lead 288*ds* and/or 288*dc* are not included to create an alternative version of packaged switch 247*q*.

Surfaces of current terminal pad transistors may be electrically and thermally attached to a die clip. FIG. 4C-1 shows die clip 372 after surfaces of first current terminal (e.g., drain, collector, etc.) pads in transistors T5-T8 are electrically and thermally attached (e.g., sintered) directly to surface 375. A low resistance path may exist between die clip terminal 344 and each first current terminal pad of transistors T5-T8. Each joint (e.g., sintered joint) that connects a first current terminal pad surface to surface 375 in FIG. 4C-1 may conduct 10, 20, 50, 100, 200, 300, 750 Watts or more of heat while concurrently conducting 50, 100, 200, 400 A or more of electrical current. Each of these joints (not shown in FIG. 4C-1) may have a length and width that is substantially equal to the length and width of a respective first current terminal pad surface. In FIG. 4C-1, die clip 372 may be formed from a thin (e.g., 0.7 mm-1.5 mm) layered sheet like that shown in FIG. 2H. T5-T8 may be transistors of the same type, or T5-T8 may include a mixture of different types of transistors. For example, T5 and T6 may be MOSFETs, and T7 and T8 may be IGBTs. In this version flat surfaces of drain terminal pads in T5 and T6, and flat surfaces of collector terminal pads in T7 and T8 may be sintered to surface 375. In another version, one of the transistors (e.g., T5) can be replaced by a diode, while transistors T6-T8 take form in IGBTs. In this version, the flat collector terminal pad(s) of the three IGBT(s) and the flat cathode terminal pad of the diode can be electrically and thermally attached (e.g., sintered) directly to surface 375.

Each of the transistors T5-T8 may include a pair of second current terminal (e.g., source terminal, emitter terminal, etc.) pads. Each second current terminal pad may have a flat surface 395. Each of the transistors T5-T8 includes a control terminal (e.g., gate terminal) pad with a flat surface 384. The pads are not shown in the side view of FIG. 4C-1.

FIG. 4C-1 also shows an example gate strap 364-2, bond-wire 365-2, and bond-wires 366. Gate strap 364-2, which may be formed of a conductive metal such as copper, may be attached to surface 375 through an electrically insulating layer (not shown) thereby electrically isolating gate strap 364-2 from die clip 372. Connector-lead 288*g*-2 may be electrically connected to gate strap 364-2 through bond-wire 365-2. Bond-wires 366 of substantially equal length may electrically connect gate strap 364-2 to respective surfaces 384 of control terminal pads. Each of the bond-wires 366 may be wire-bonded to strap 364-2 at substantially equal distances from the point on strap 364-2 where bond-wire 365-2 is wire-bonded. In an alternative version an end of a length-extended connector-lead 288-2 may be attached (e.g., welded) to strap 364-2. In still another alternative version an end of a length-extended connector-lead 288-2 may be attached to surface 375 through an electrically insulating layer thereby electrically isolating length-extended connector-lead 288-2 from die clip 372. Bond-wires of substantially equal length can electrically connect length-extended connector-lead 288*g*-2 to respective surfaces 384 of control terminal pads.

With continuing reference to FIGS. 4C-1 and 4A-6, FIG. 4C-2 shows the structure of FIG. 4C-1 after second current terminals of transistors T5-T8 are thermally and electrically attached (e.g., sintered) directly to respective end surfaces 1107 of pedestals 1108, which in turn are thermally and electrically attached (e.g., sintered) directly to respective second terminals of transistors T1-T4, respectively, so that transistors T1-T4 are electrically connected back-to-back with transistors T5-T8, respectively. For purposes of explanation only, the gate strap 364, bond-wire 365, and surface area 367 of FIG. 4A-6 are relabeled gate strap 364-1, bond-wire 365-1, and surface area 367-1 in FIG. 4C-2. Transistors T1-T4 can be controlled by a first control terminal signal received via connector-lead 288*g*-1, while transistors T5-T8 can be independently controlled by a separate second terminal control signal received via connector-lead 288*g*-2.

If T1-T8 are MOSFETs, the structure shown in FIG. 4C-2 may be one version of the switch module 376J of FIG. 3J in which source terminals of MOSFETs T1-T4 are electrically connected to source terminals of MOSFETs T5-T8, respectively. After die clip 372 is attached to pedestals 1108, a case may be formed around the switch module shown in FIG. 4C-2 using, for example, transfer molding, to create an example of packaged switch 247*q*J shown in FIG. 3J, which is an example of packaged switch 247*q* shown in FIGS. 2B-1-2B-3. Prior to case formation some or all of connector-leads 288 may be bent to place case-external end portions of the connector-leads 288 in a common plane as shown in FIGS. 2B-3. In an alternative version, connection-lead 288*ds* and/or 288*dc* are not included to create an alternative version of packaged switch 247*q*.

Figures 4, 4A, 5, 6:
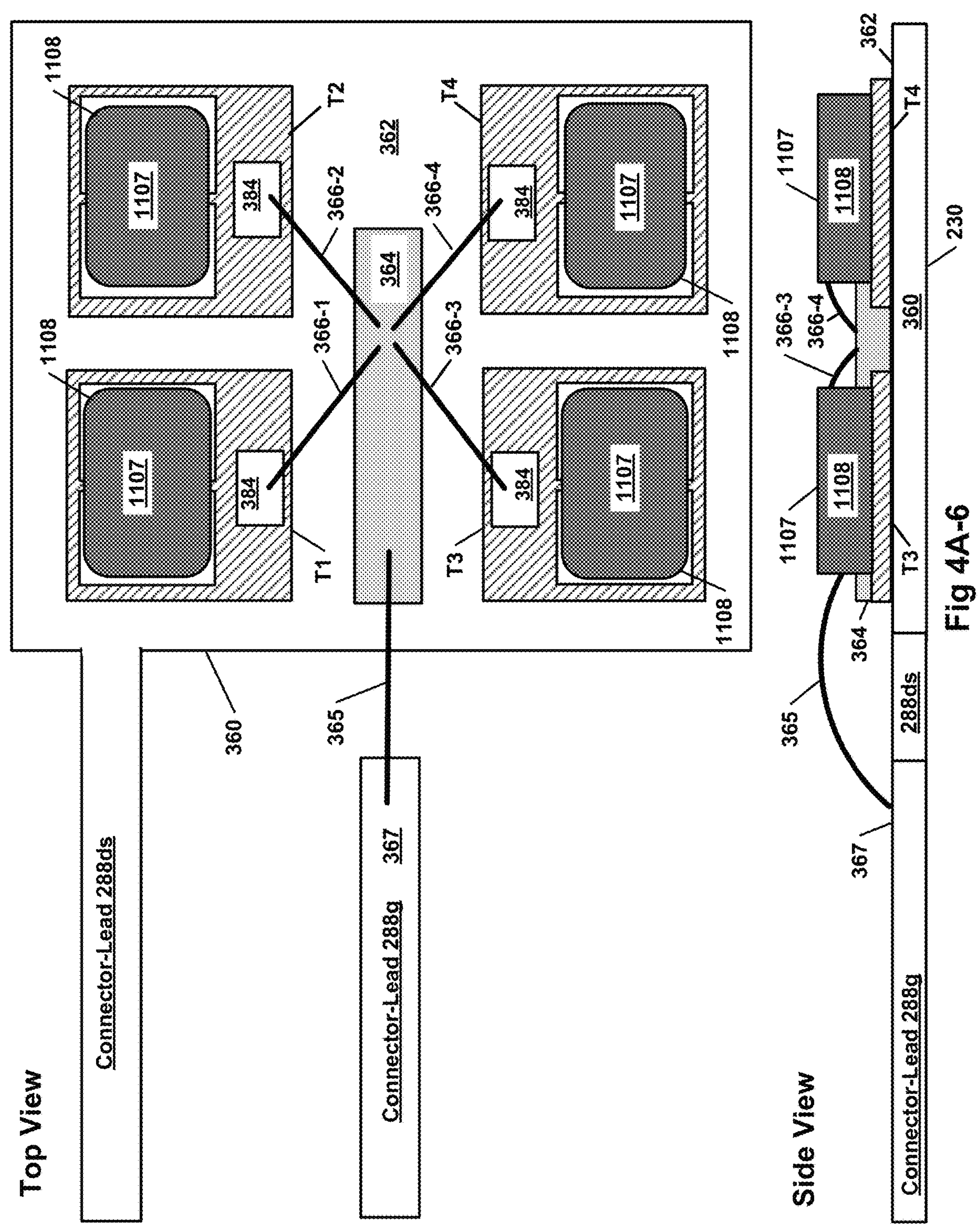
Figures 4, 4A, 5, 6, 7:
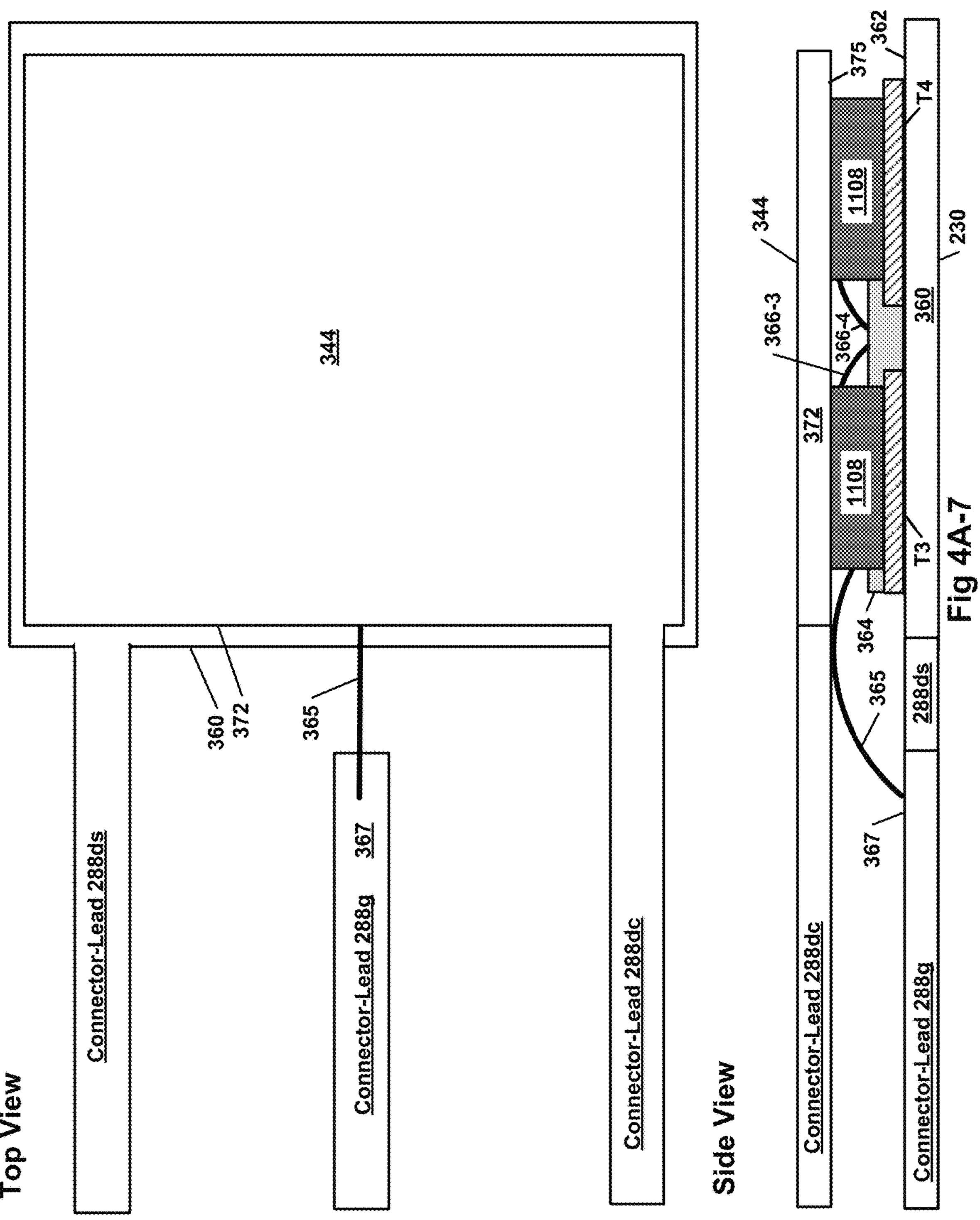
Figures 4, 4A, 5, 6, 7, 8:
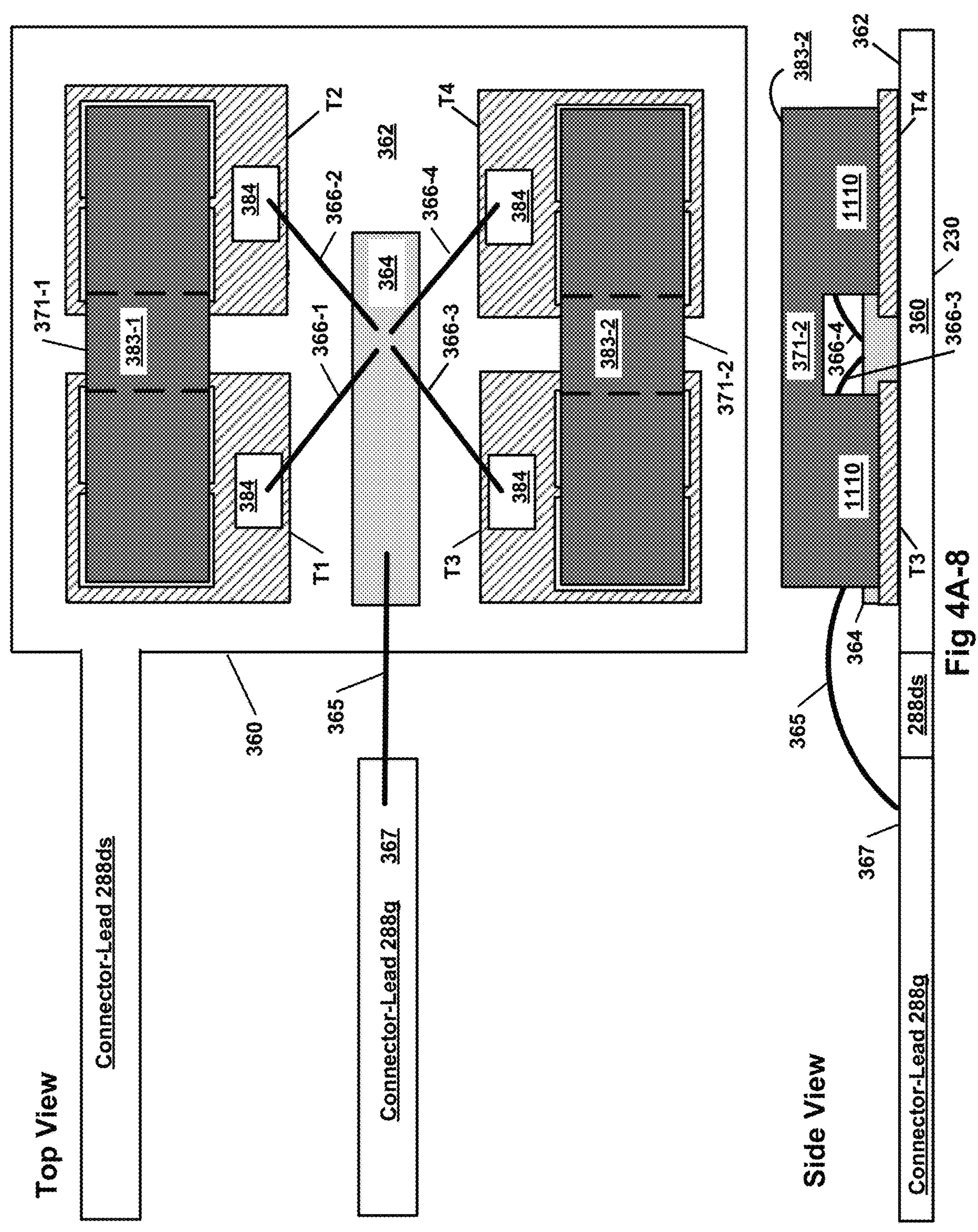
Figures 4, 4A, 5, 6, 7, 8, 9:
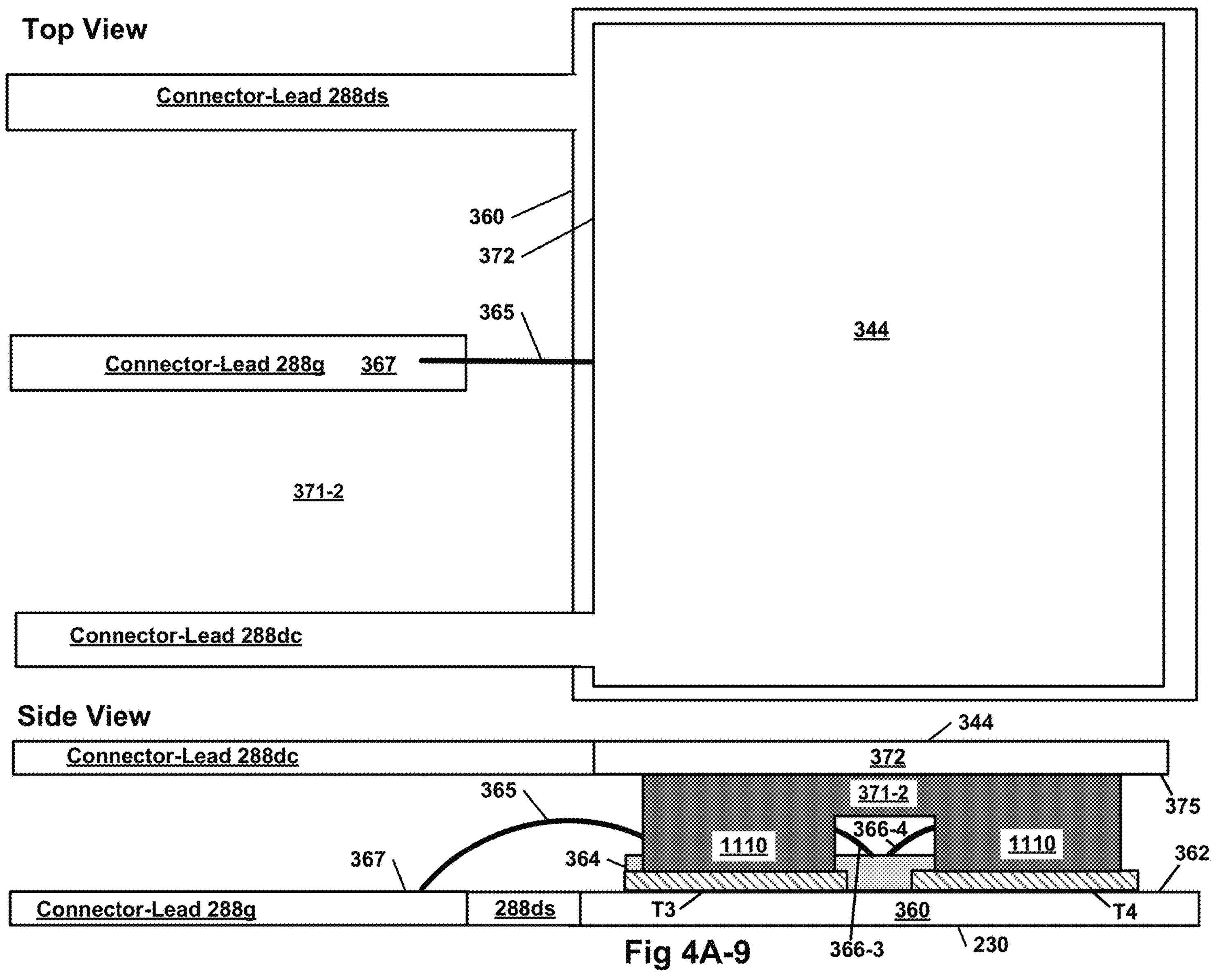
Figures 1, 4B:
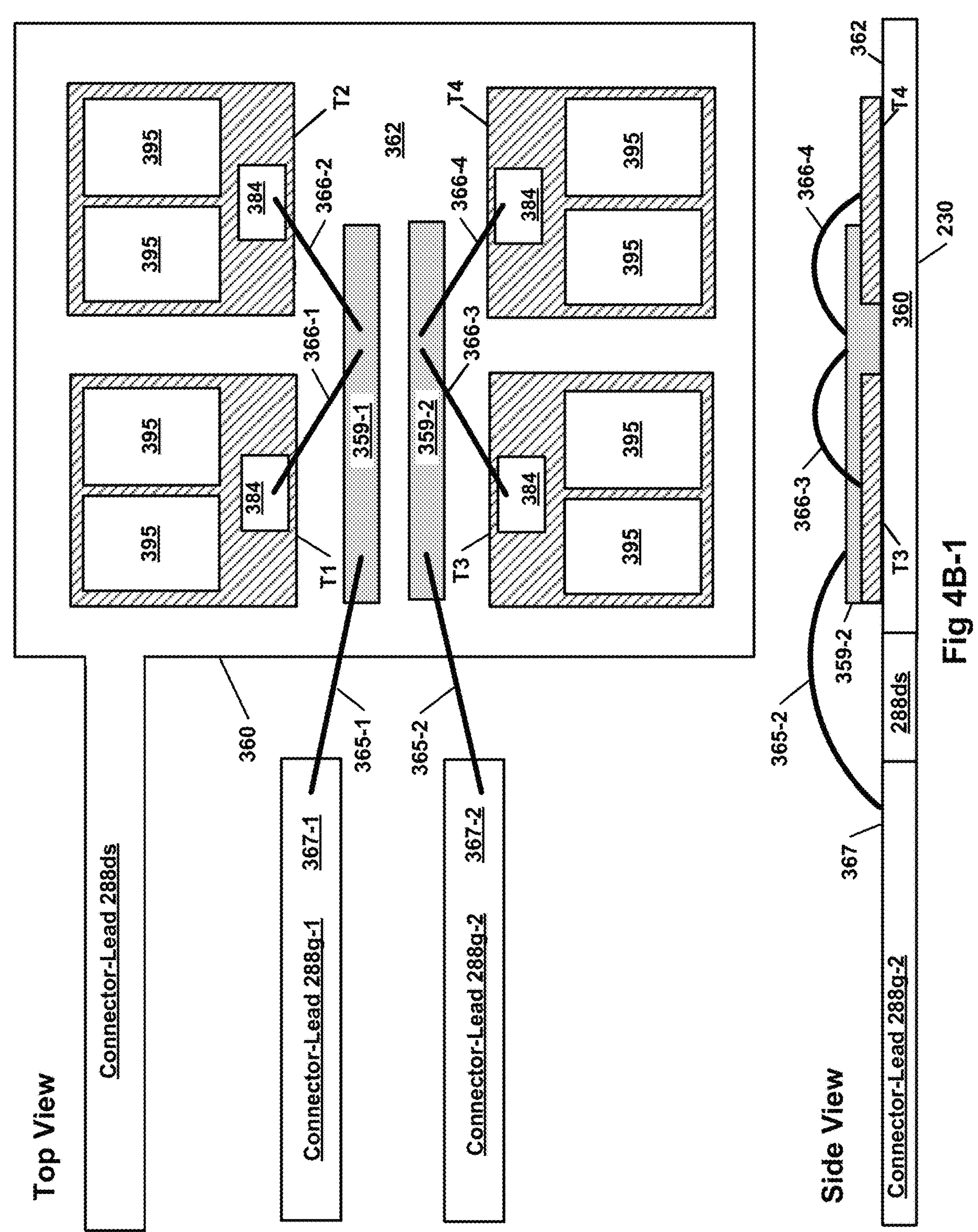
Figures 2, 4B:
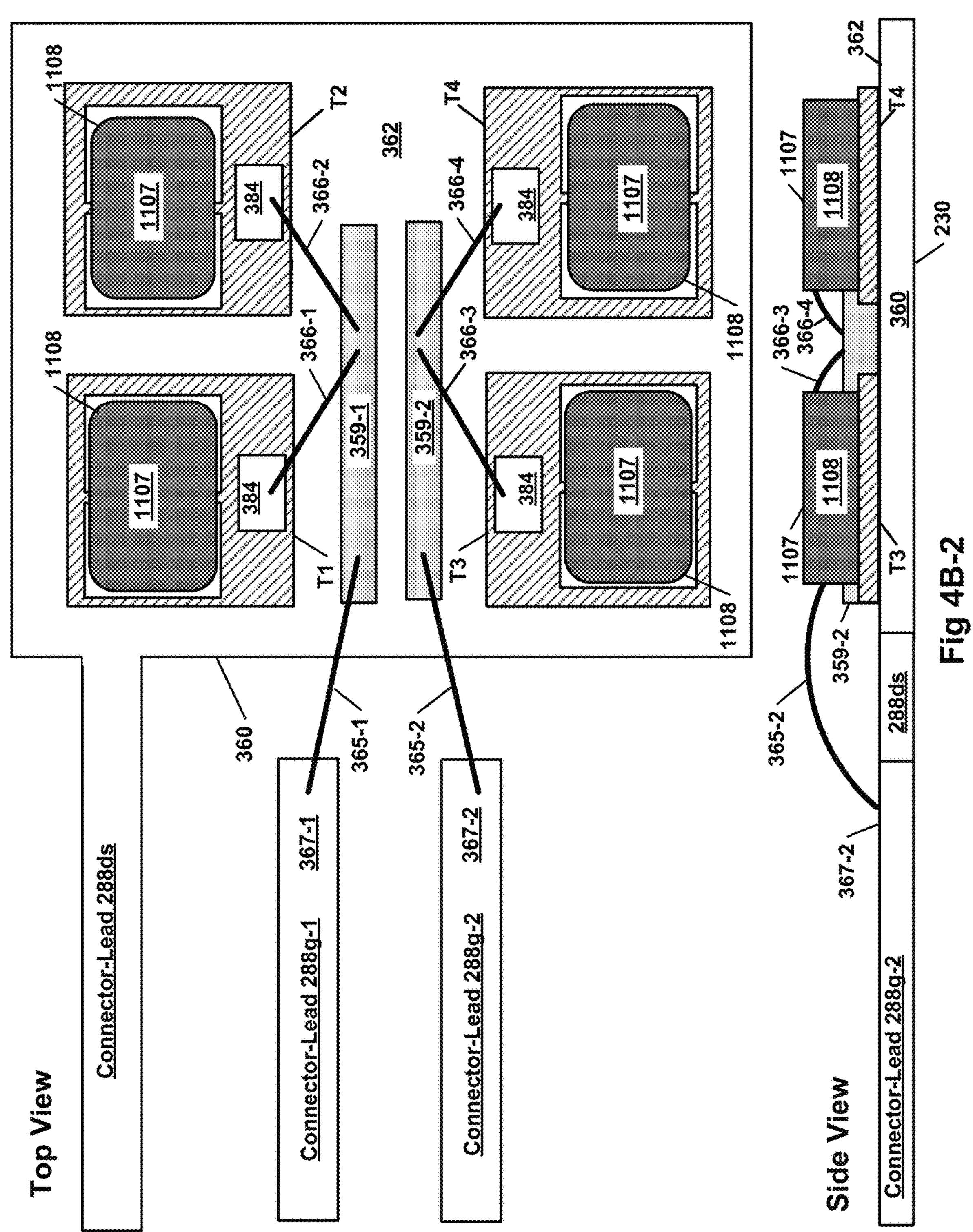
Figures 3, 4B:
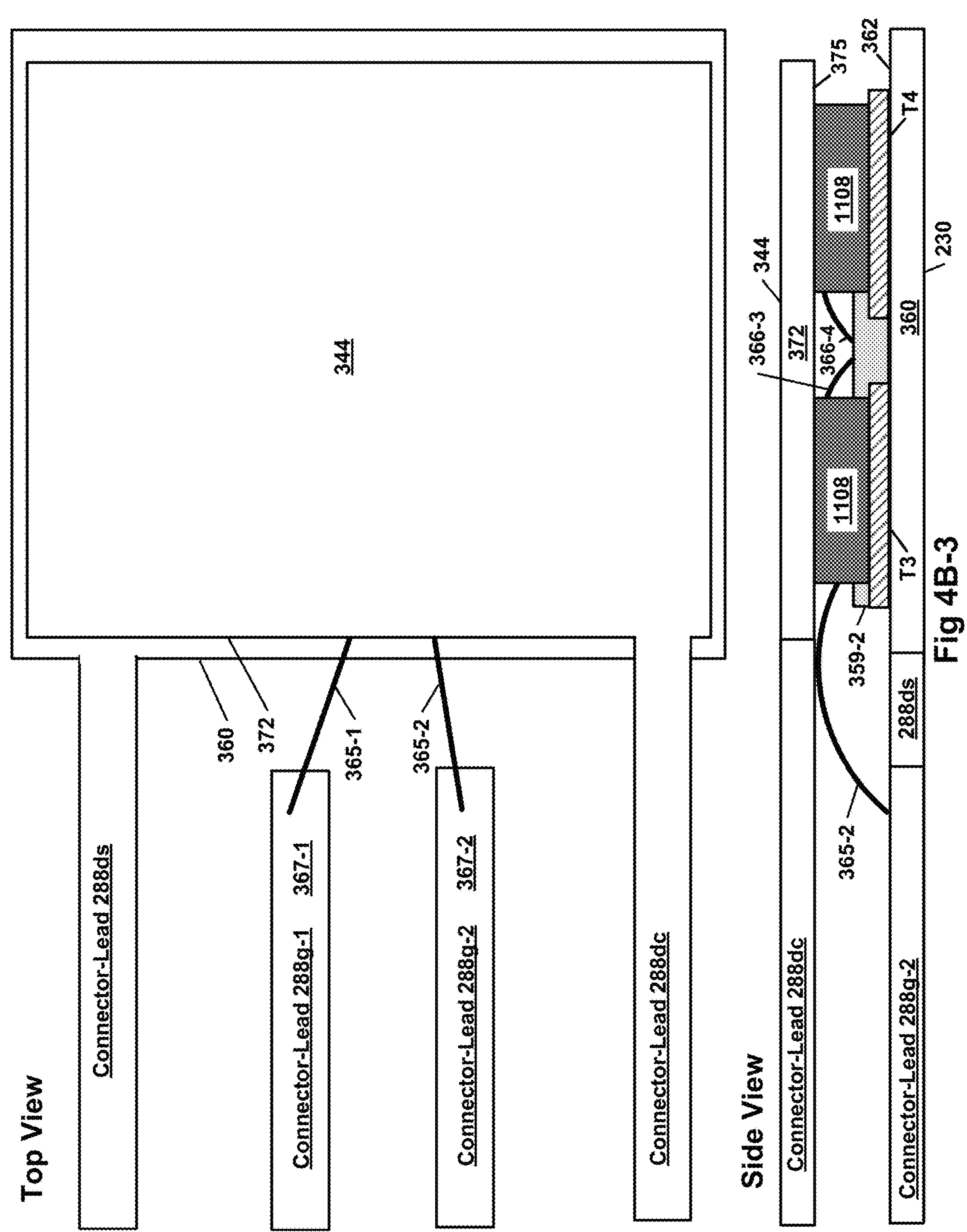
Figures 4, 4B:
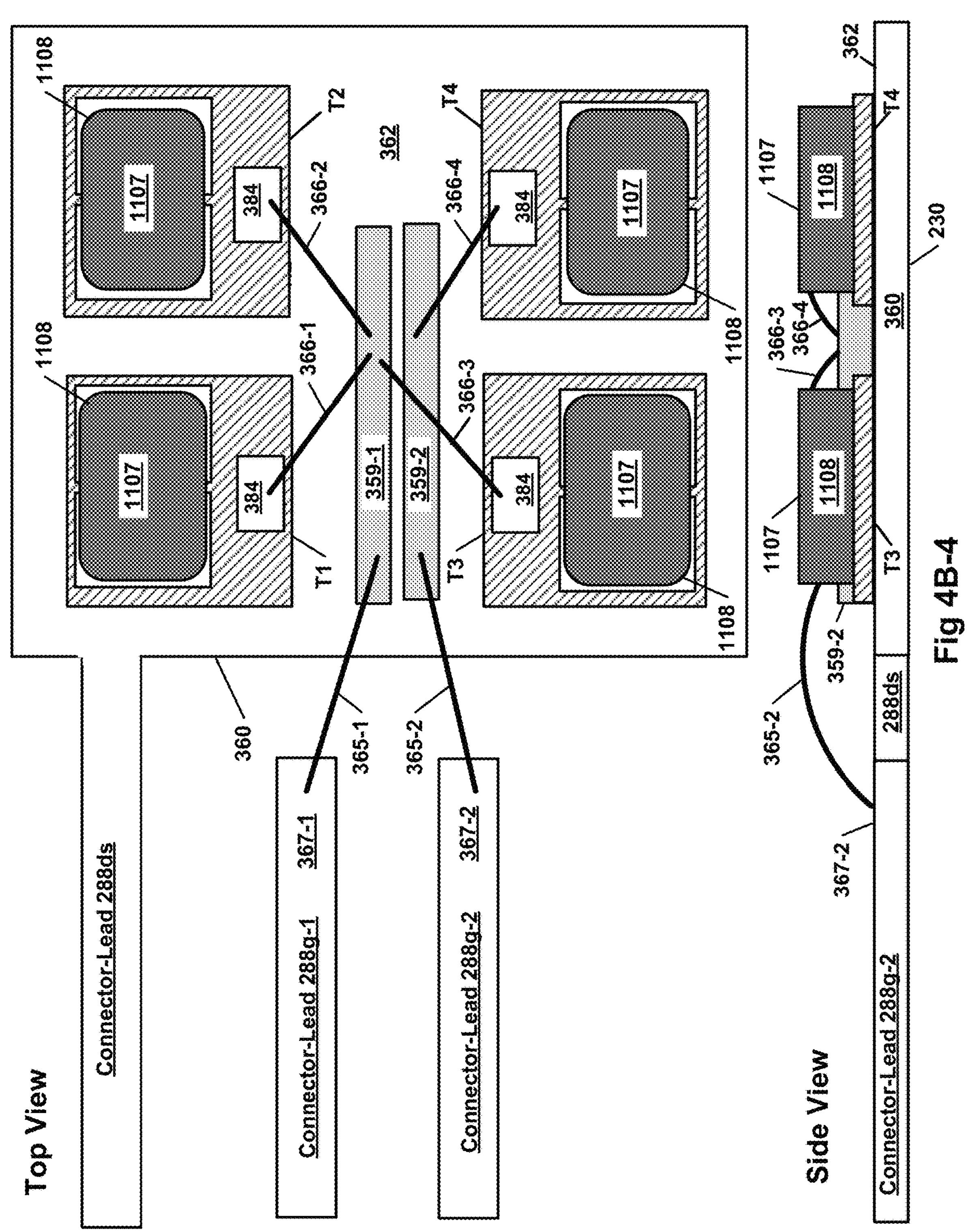
Figures 4, 4B, 5:
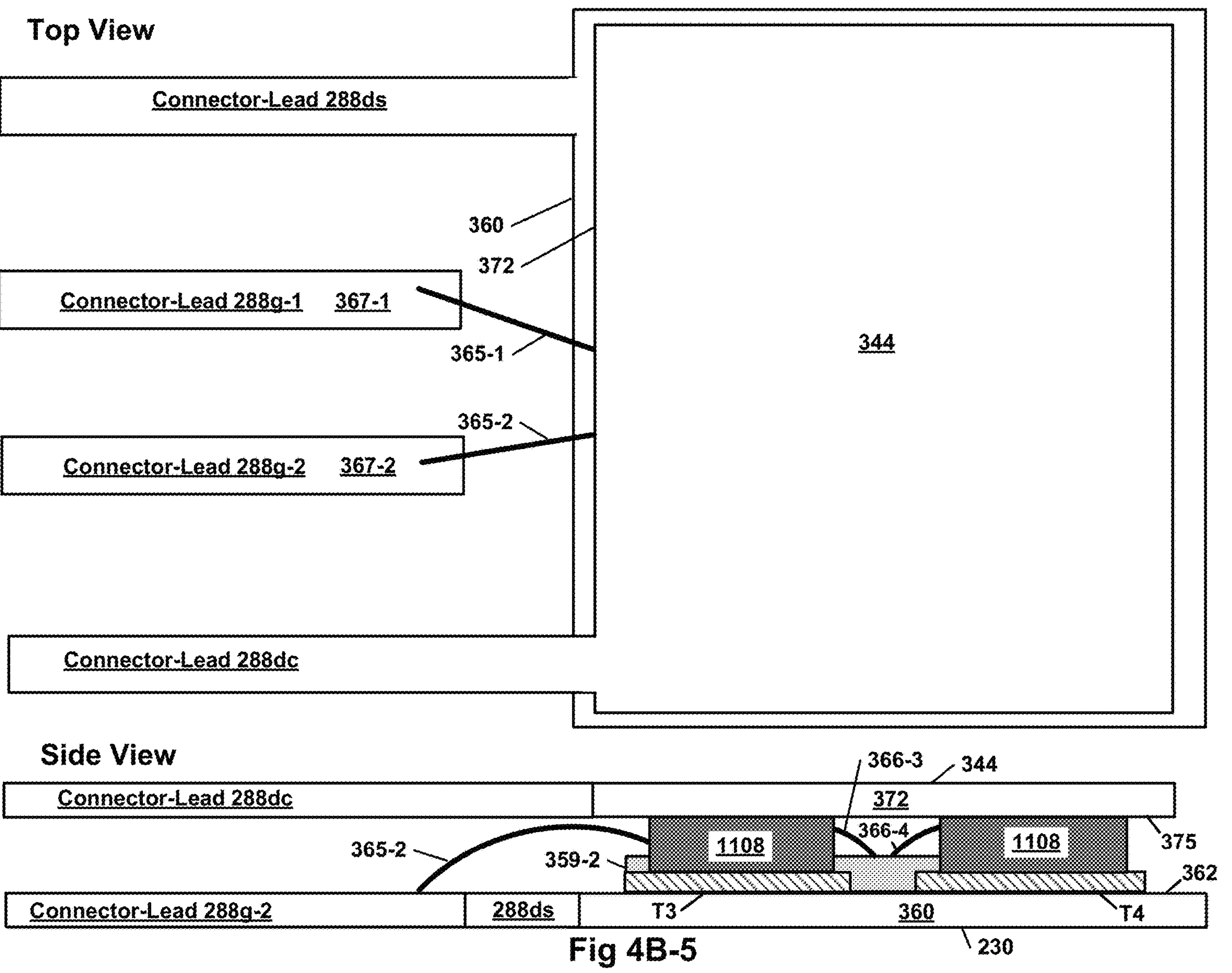
Figures 1, 4C:
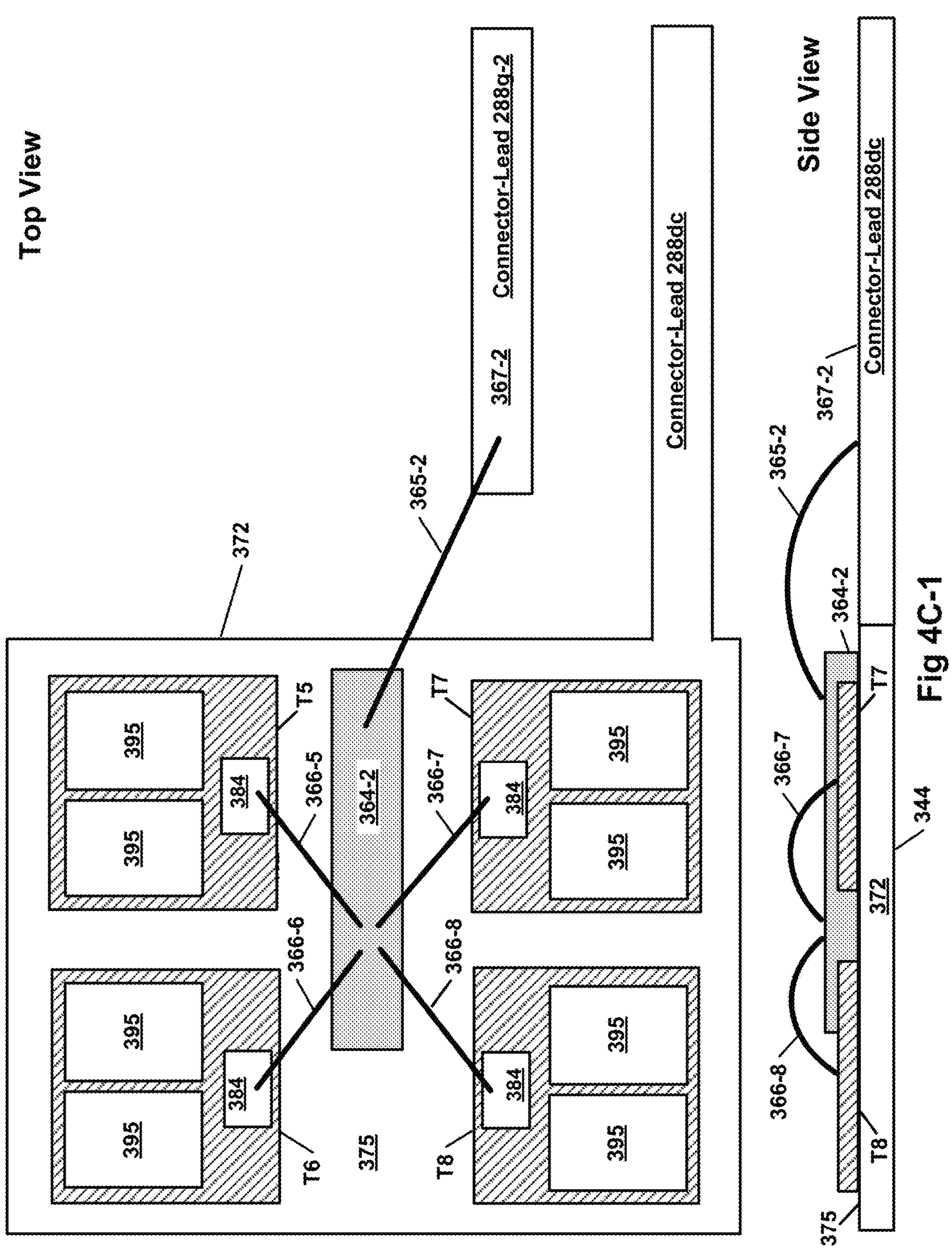
Figures 2, 4C:
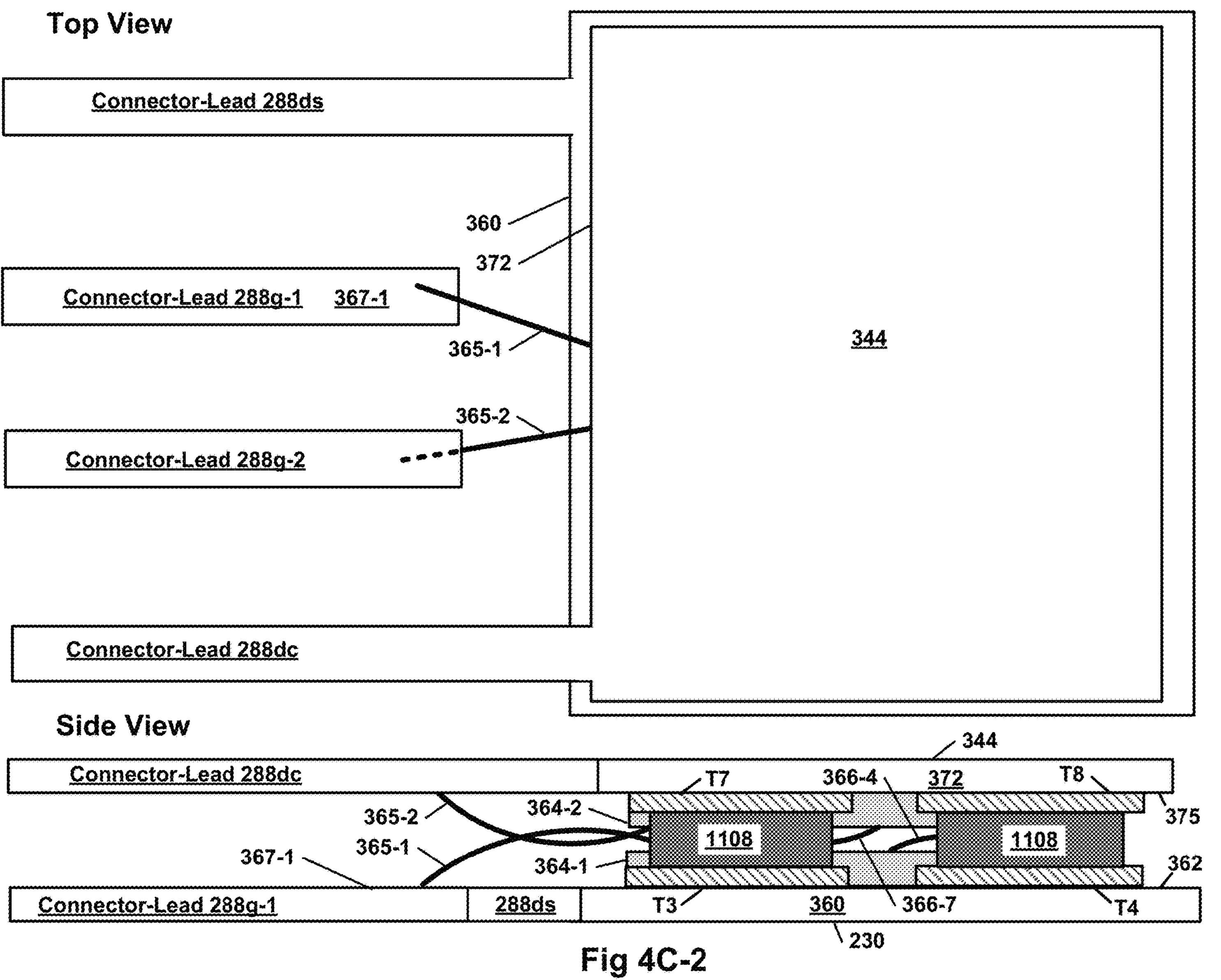
Figures 1, 4D:
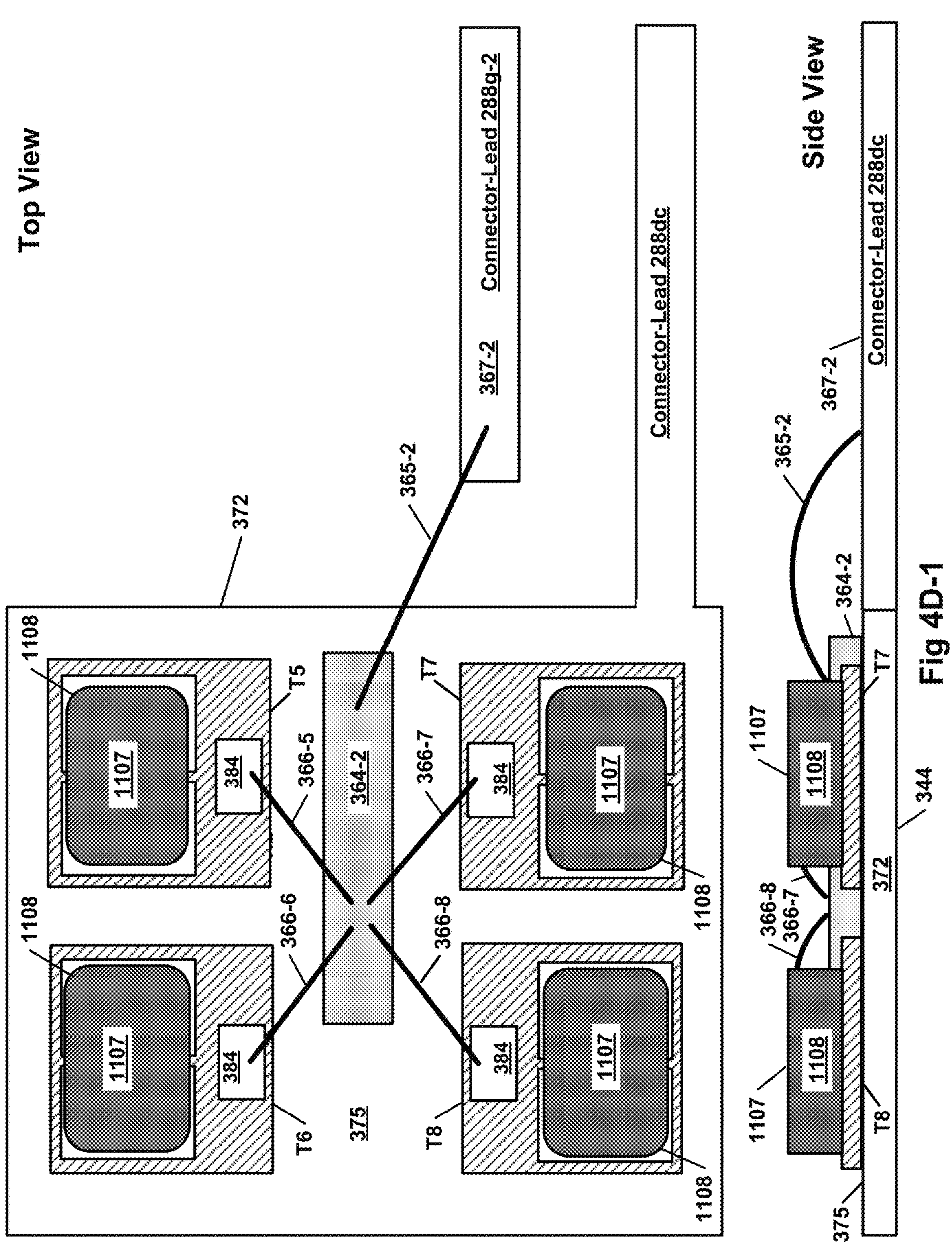
Figures 2, 4D:
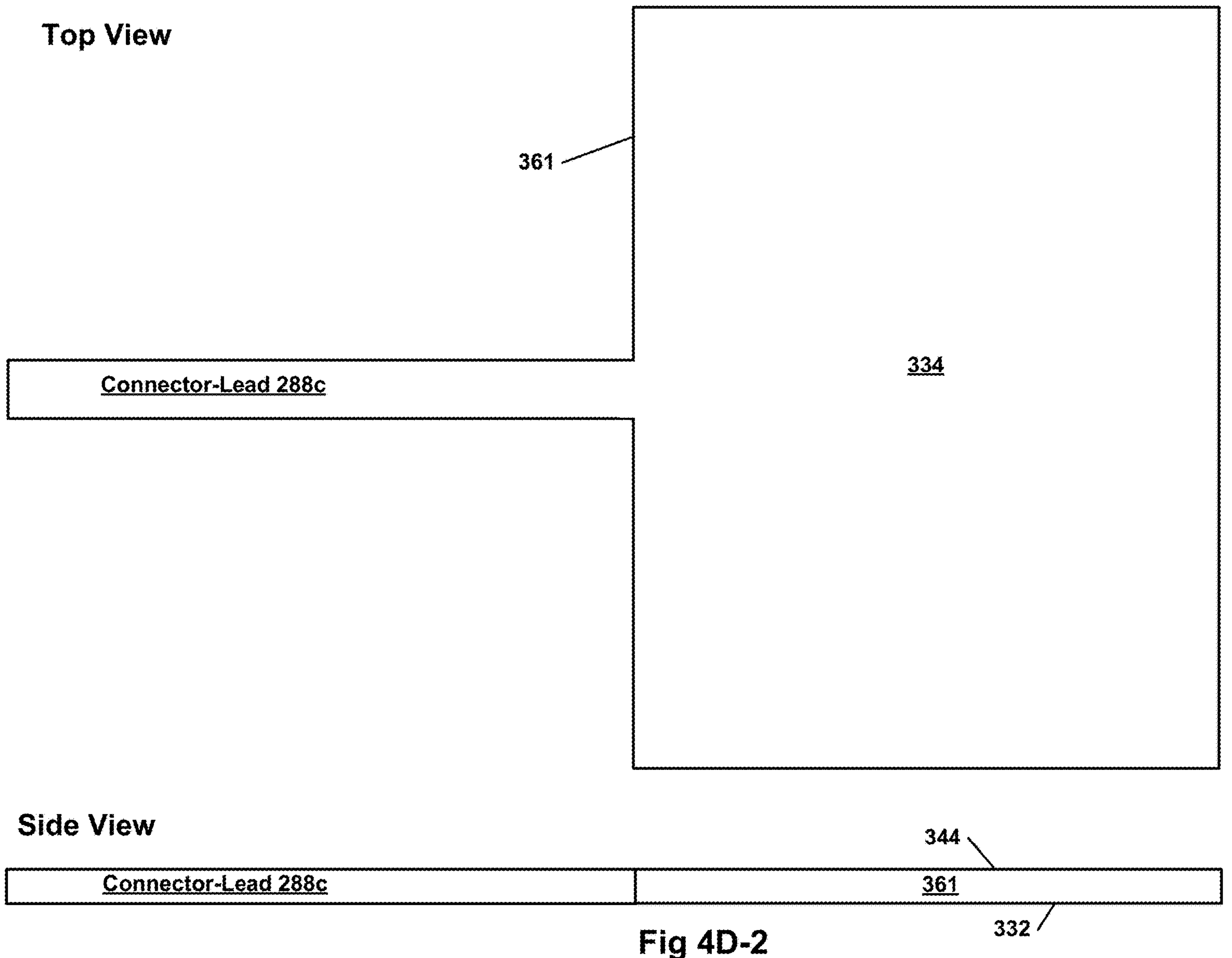
Figures 3, 4D:
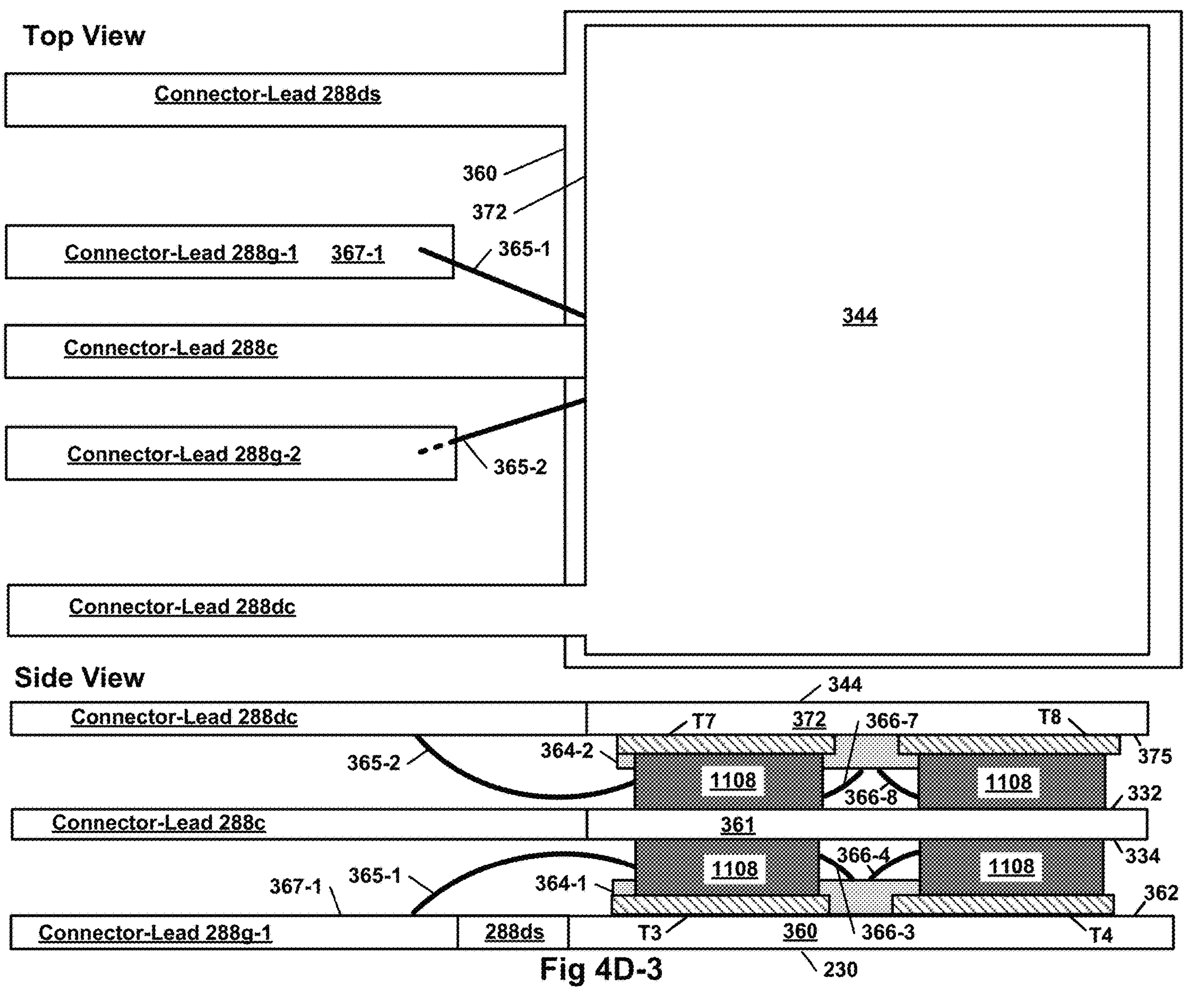

FIG. 4D-1 shows the structure of FIG. 4C-1 after second flat end surfaces of pedestals 1108 are electrically and thermally attached to adjacent second current terminal (e.g., source terminal, emitter terminal, anode terminal, etc.) pad surfaces 395 in respective transistors T5-T8.

A switch module may include a paddle positioned between a die substrate and a die clip. A paddle may be formed (e.g., stamped, cut, sawed, diced, etc.) from a thin (e.g., 0.7 mm-1.5 mm) sheet of metal or composite. Or a paddle may be formed (e.g., stamped, cut, sawed, diced, etc.) from a thin (e.g., 0.7 mm-1.5 mm) layered sheet like that shown in FIG. 2H. FIG. 4D-2 shows top and side views of an example paddle 361 and example connector-lead 288*c*. Paddle 361 may be formed from a thin (e.g., 0.7 mm-1.5 mm) sheet of copper. Paddle 361 may have the same size, shape, and composition as die clip 372 shown in FIG. 4A-4 but with a connector-lead (e.g., connector-lead 288*c*) positioned at a midpoint as shown. Connector-lead 288*c* may be integrally connected to paddle 361 as shown. In another version, connector-lead 288*c* may be electrically and thermally attached (e.g., welded) to the paddle.

Paddle 361 includes oppositely facing, substantially flat surfaces 332 and 334 that may be entirely flat. These surfaces can be electrically and thermally connected to current terminal pad surfaces of transistors. For example, flat surface 332 can be electrically and thermally attached (e.g., sintered) directly to first flat end surfaces of first pedestals, and the second flat end surfaces of the first pedestals may be electrically and thermally attached (e.g., sintered) directly to respective second current terminals in a group of first transistors, while flat surface 344 can be electrically and thermally attached (e.g., sintered) directly to first flat end surfaces of second pedestals, and the second flat end surfaces of the second pedestals may be electrically and thermally attached (e.g., sintered) directly to respective second current terminals in a second group of transistors, so that the second current terminals in the first group of transistors are electrically connected together and to the second current terminals in the second group of transistors, thereby connecting the first group back-to-back with the second group.

FIG. 4D-3 shows paddle 361 of FIG. 4D-2 after it is thermally and electrically attached to the structures shown in FIGS. 4A-6 and 4D-1. Specifically, FIG. 4D-3 shows the structures of FIGS. 4A-6 and 4D-1 after end surfaces 1107 of pedestals 1108 in FIG. 4A-6 are electrically and thermally attached (e.g., sintered) directly to flat surface 334 of paddle 361, and after end surfaces 1107 of pedestals 1108 in FIG. 4D-1 are electrically and thermally attached (e.g., sintered) directly to flat surface 332 of paddle 361. For purposes of explanation only, the gate strap 364, bond-wire 365, and surface area 367 of FIG. 4A-6 are relabeled gate strap 364-1, bond-wire 365-1, and surface area 367-1 in FIG. 4D-3.

Transistors T1-T4 can be controlled by a first control terminal signal received via connector-lead 288*g*-1, while transistors T5-T8 can be independently controlled by a separate second terminal control signal received via connector-lead 288*g*-2.

If T1-T8 take form in MOSFETs, the structure shown in FIG. 4D-3 may be one version of the switch module 376K of FIG. 3K. After 361 is attached, a case may be formed around the switch module shown in FIG. 4D-3 using, for example, transfer molding, to create an example of packaged switch 247*p* shown in FIGS. 2A-1-2A-3. Prior to case formation some or all of connector-leads 288 may be bent to place case-external end portions of the connector-leads 288 in a common plane as shown in FIG. 2A-3.

Figures 1, 4E:
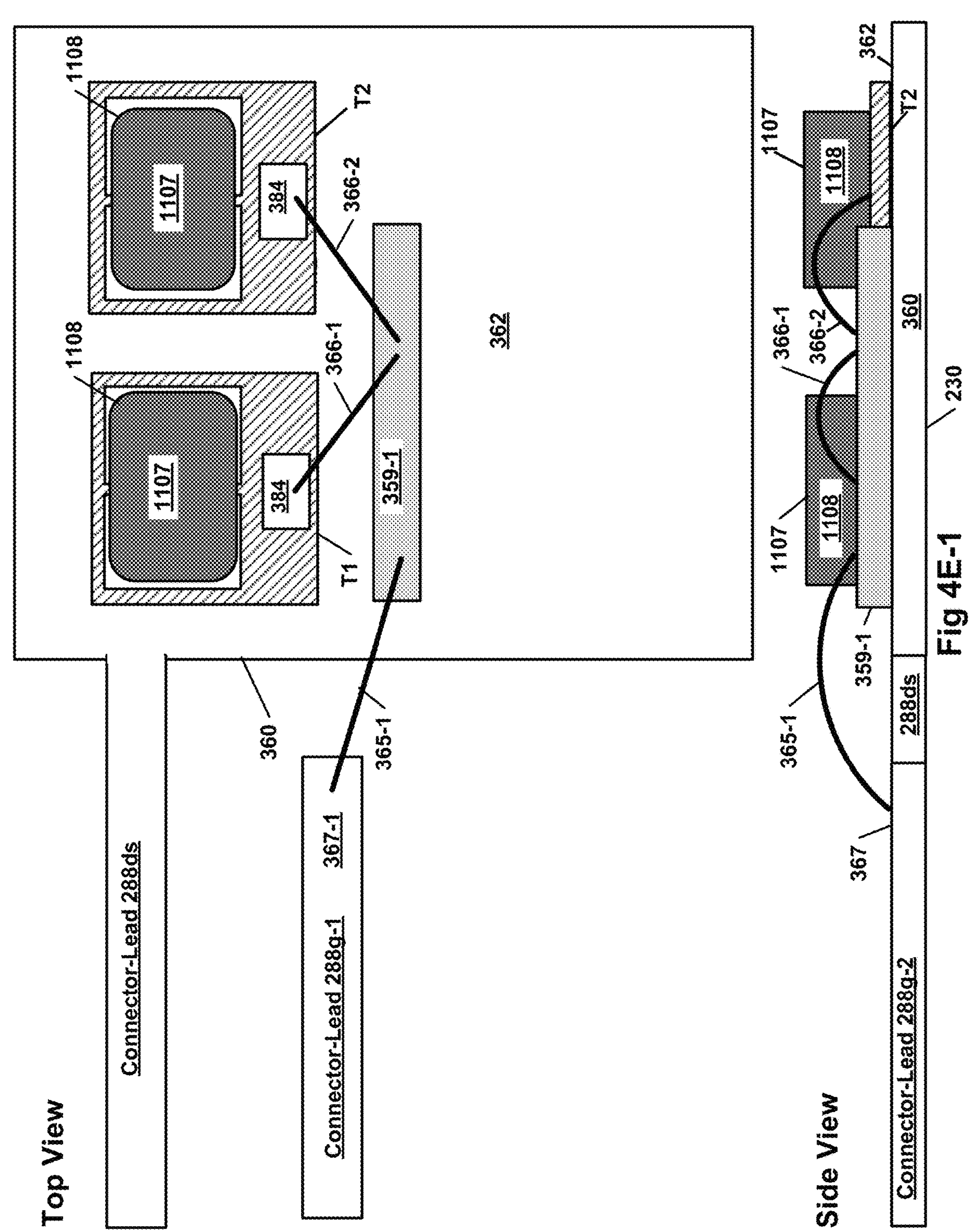
Figures 2, 4E:
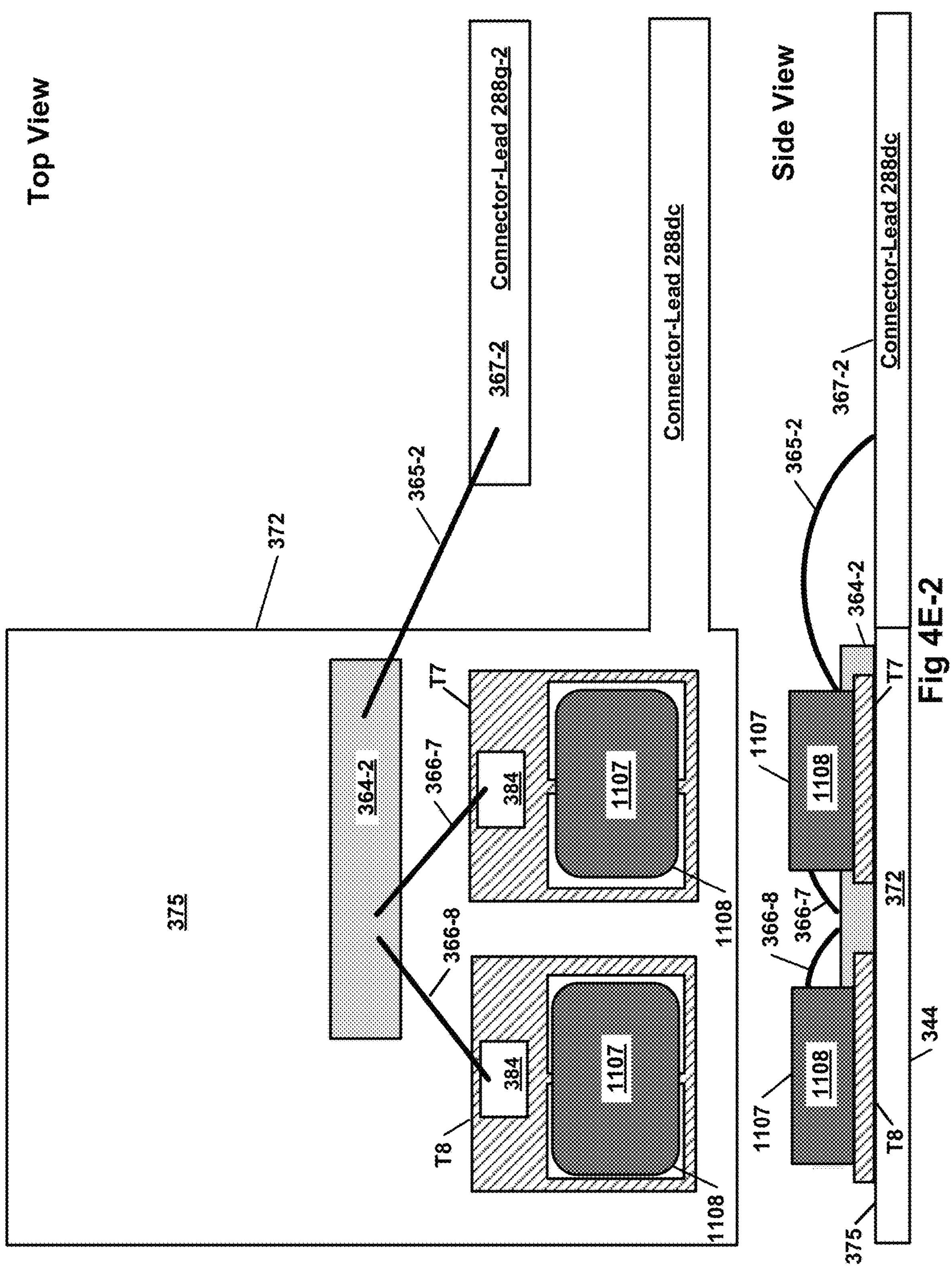
Figures 3, 4E:
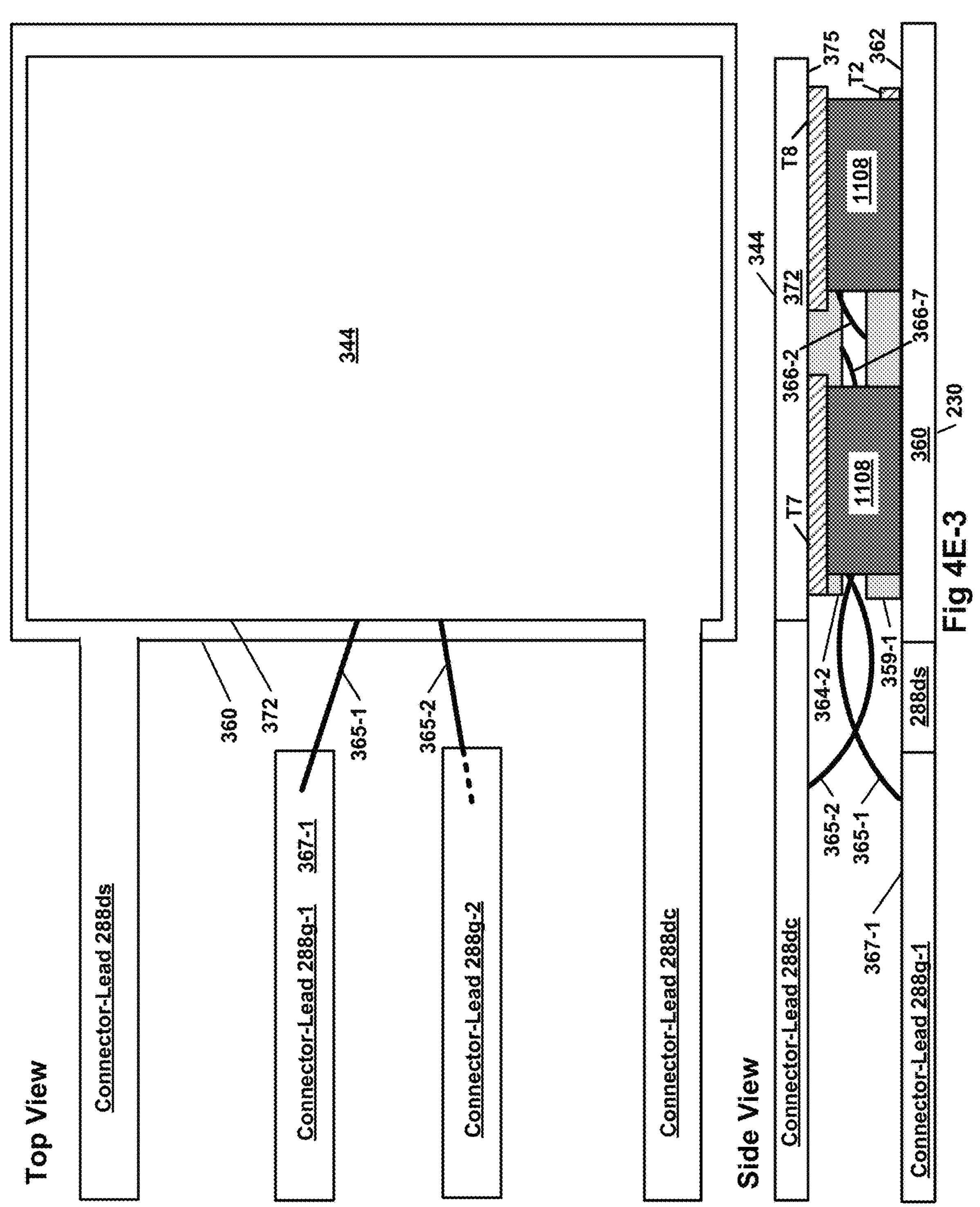

Switches may include transistors connected in anti-parallel. FIG. 4E-1 shows the structure of FIG. 4B-2, without strap 359-2, connector-lead 288*g*-2, transistor T3, transistor T4, and bond-wires 365-2, 366-3 and 366-4. FIG. 4E-2 shows the structure of FIG. 4D-1, without transistor T5, transistor T6, bond-wire 366-6, and bond-wire 366-5. FIG. 4E-3 shows the structures shown in FIGS. 4E-1 and 4E-2 after they are thermally and electrically attached (e.g., sintered) to each other. Specifically, FIG. 4E-3 shows the structures of FIGS. 4E-1 and 4E-2 after end surfaces 1107 of pedestals 1108 in FIG. 4E-1 are electrically and thermally attached (e.g., sintered) directly to flat surface 375 of die clip 372, and after end surfaces 1107 of pedestals 1108 in FIG. 4E-2 are electrically and thermally attached (e.g., sintered) directly to flat surface 362 of die substrate 360. Transistors T1 and T2 can be controlled by a first control terminal signal received via connector-lead 288*g*-1, while transistors T7 and T8 can be independently controlled by a separate second terminal control signal received via connector-lead 288*g*-2.

Transistors T1, T2, T7, and T8 in FIGS. 4E-1-4E-3 may block large reverse voltages (e.g., 5, 10, 50, 100, 200, 400, 800, 1600 V or more) without breakdown when turned off. Each of the transistors T1, T2, T7, and T8 in FIGS. 4E-1-4E-3 may be an RB-IGBT, NPT-IGBT, GTO thyristor, BJT, etc. For example, each of transistors T1, T2, T7, and T8 in FIGS. 4E-1-4E-3 may be an RB-IGBT, GTO thyristor, NPT-IGBT or BJT with flat collector terminal pad surfaces of T1 and T2 sintered to flat surface 362, and with flat collector terminal pad surfaces of T7 and T8 sintered to flat surface 375. Transistors T1, T2, T7, and T8 in FIGS. 4E-1-4E-3 may be a mix of transistors. For example, each of transistors T1 and T2 may be an RB-IGBT with flat collector terminal pad surfaces sintered to flat surface 362, while each of the transistors T7 and T8 may be NPT-IGBTs with flat collector terminal pad surfaces sintered to flat surface 375.

If each of transistors T1, T2, T7, and T8 in FIGS. 4E-1-4E-3 is an RB-IGBT, the structure shown in FIG. 4E-3 may be an version of the switch module 376I shown in FIG. 3I. Alternatively, transistors T1, T2, T7, and T8 may be NPT-IGBTs or BJTs. A case may be formed around the structure shown in FIG. 4E-3 using, for example, transfer molding, to create an example of packaged switch 247*q*I shown in FIG. 3I, which is an example of packaged switch 247*q* shown in FIGS. 2B-1-2B-3. Prior to case formation some or all of connector-leads 288 may be bent to place case-external end portions of the connector-leads 288 in a common plane as shown in FIG. 2B-3. In an alternative version, connection-lead 288*ds* and/or 288*dc* are not included to create an alternative version of packaged switch 247*q*.

Figures 1, 4F:
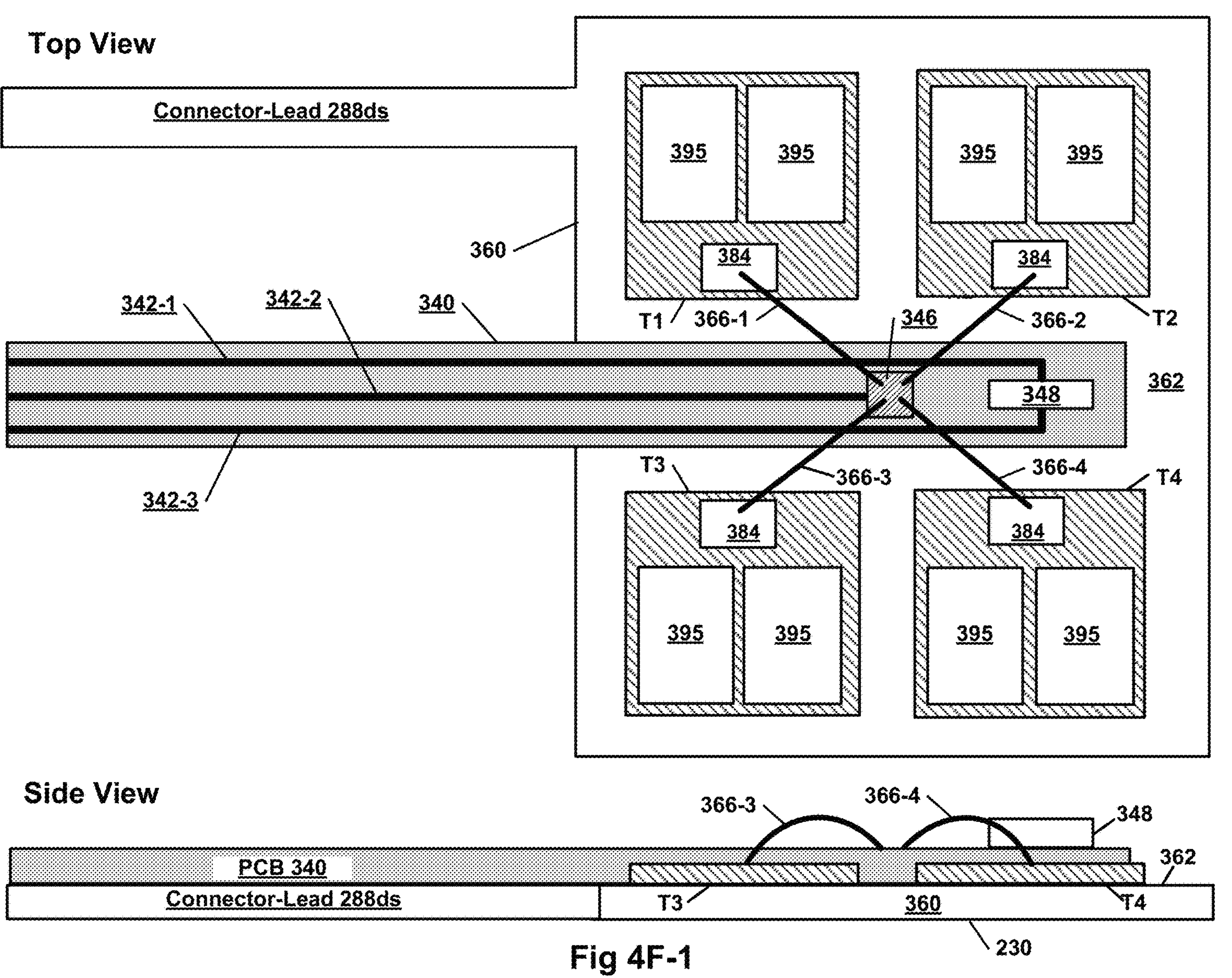
Figures 2, 4F:
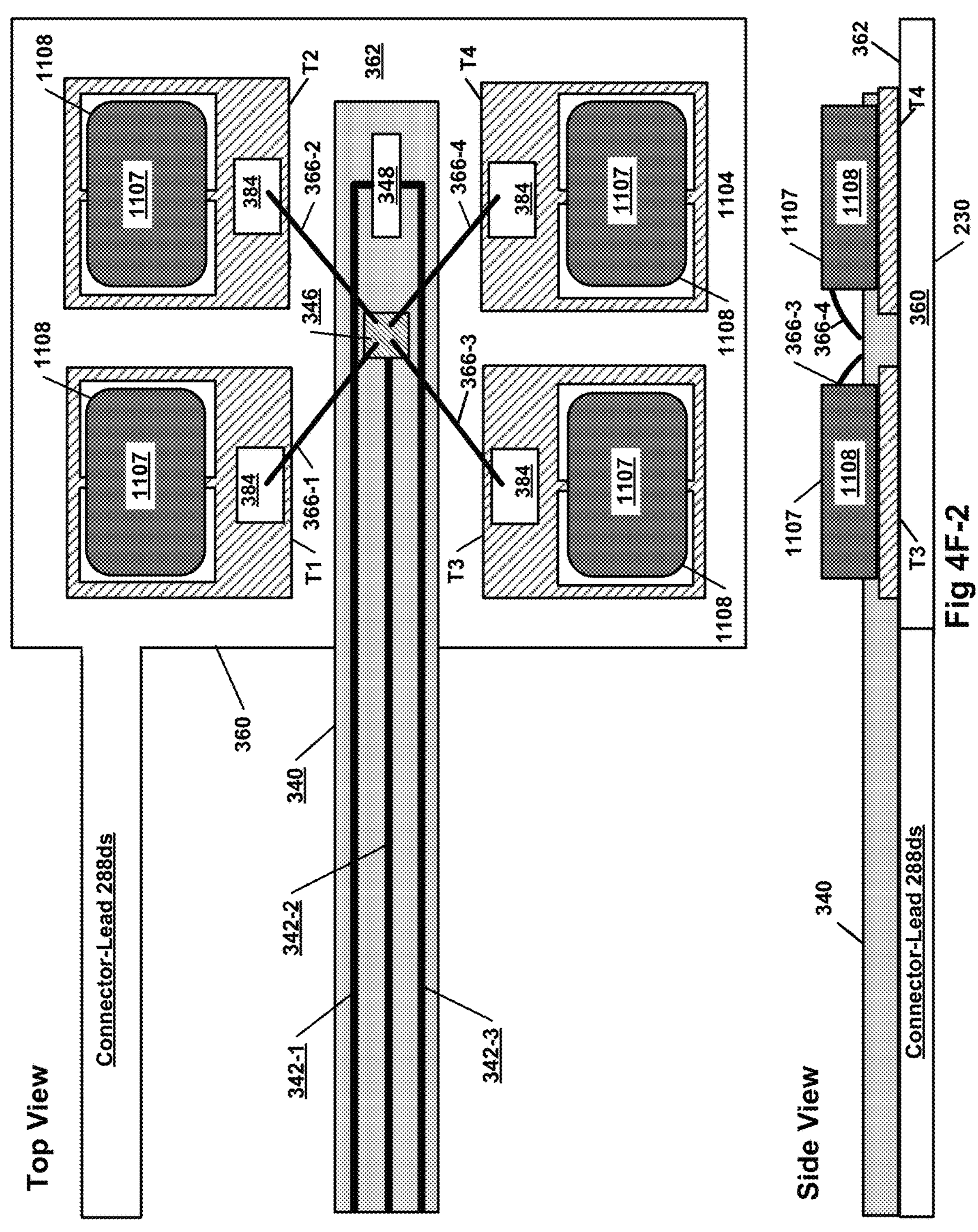
Figures 3, 4F:
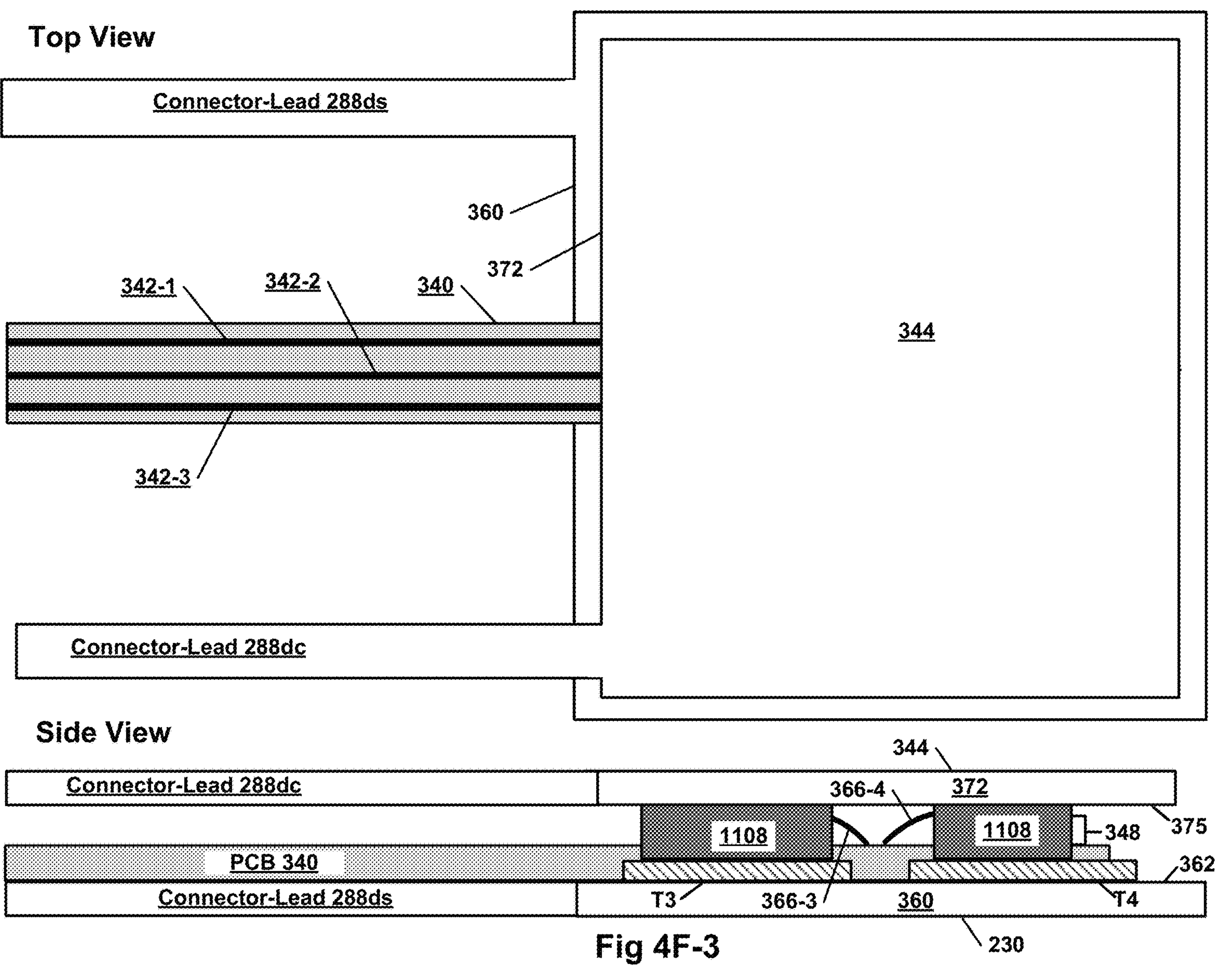

Switch modules may include sensors and other devices such as drivers. A switch module may include a PCB or DBC upon which devices such as drivers and sensors may be mounted. FIG. 4F-1 shows the structure of FIG. 4A-2, but with strap 364 replaced by PCB 340, which includes traces 342. In an alternative version, PCB 340 could be replaced with a DCB, which may be capable of transmitting more heat from a mounted device (e.g., a driver) to the underlying die substrate 360. A temperature sensor (e.g., a thermistor) 348 is mounted on PCB 340 and electrically connected to traces 342-1 and 342-3. A thermistor is a semiconductor type of resistor whose resistance is linearly dependent on temperature. Temperature sensor 348 can affect a voltage across traces 342-1 and 342-3 that depends on the temperature between transistors T2 and T4. Trace 342-2 is electrically connected to metallic pad 346. Bond-wires 366 may be wire bonded to pad 346. One end of PCB 340 can be attached (e.g., glued) to surface 362 of die substrate 360. The other end of PCB 340 extends from die substrate 360. Ends of traces 342 may be electrically connected to conductors of a connector (not shown), which in turn may be attached to a driver or control PCB (not shown) that may include a microcontroller, drivers, voltage regulators, and/or other components.

FIG. 4F-2 shows the structure of FIG. 4F-1 after surfaces of pedestals 1108 are electrically and thermally attached (e.g., sintered) directly to surfaces 395 of second current terminal (e.g., source terminal, emitter terminal, anode terminal, etc.) pads of transistors T1-T4. Flat first surfaces 1107 in FIG. 4F-2 may be contained substantially in a common plane to accommodate attachment to a flat surface of a die clip. FIG. 4F-3 show top and side views of the structure in FIG. 4F-2 after die clip 372 of FIG. 4A-4 is added. Specifically FIG. 4F-3 shows the structure after flat surface 375 of die clip 372 is electrically and thermally attached (e.g., sintered) directly to flat surfaces 1107 of pedestals 1108. After die clip 372 is attached to pedestals 1108, a case may be formed around the switch module of FIG. 4F-3 using, for example, transfer molding. The resulting packaged switch can replace one, several or all the packaged switches 247*d* employed in one, several or all the converters described below. In an alternative version, connection-lead 288*ds* and/or 288*dc* are not included to create an alternative version of a packaged switch.

The example bidirectional packaged switches shown in FIGS. 3G and 3L include BBJTs electrically and thermally connected (e.g., sintered) between die substrates and die clips. The bidirectional packaged switch shown in FIG. 3G includes one BBJT. With reference to FIGS. 2F and 2G, FIG. 4G-1 shows top and side views of an example BBJT 250, which includes example collector/emitter (c/e) terminal pads 262 and base terminal pads 264 on a top side, and example collector/emitter (c/e) terminal pads 272 and base terminal pads 278 on an oppositely facing bottom side. The c/e pads 262 and base terminal pads 264 may have substantially flat surfaces 280 and 282, respectively, and c/e pads 272 and base terminal pads 278 may have substantially flat surfaces 284 and 286, respectively. Surfaces 280 and 282 may be contained in a common plane, and surfaces 284 and 286 may be contained in another common plane. Flat surfaces 280 can be electrically and thermally connected (e.g., sintered) directly to flat surfaces of respective pedestals, and flat surfaces 282 can be connected (e.g., welded) to a flat surface of a first signal frame. Likewise, flat surfaces 284 can be electrically and thermally connected (e.g., sintered) directly to flat surfaces of respective pedestals, and flat surfaces 286 can be connected (e.g., welded) to a flat surface of second signal frame.

Figures 1, 4G:
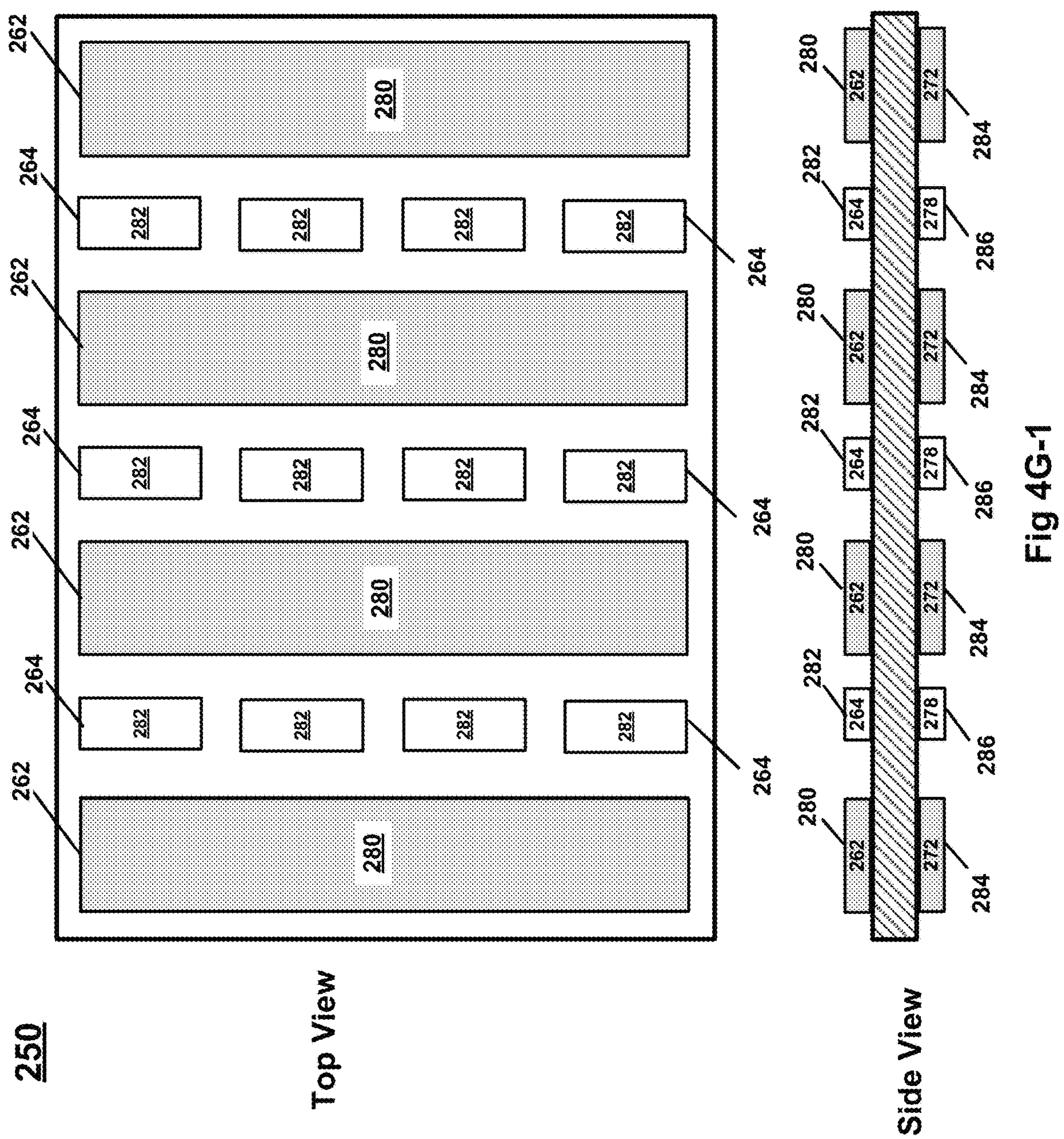
Figures 2, 4G:
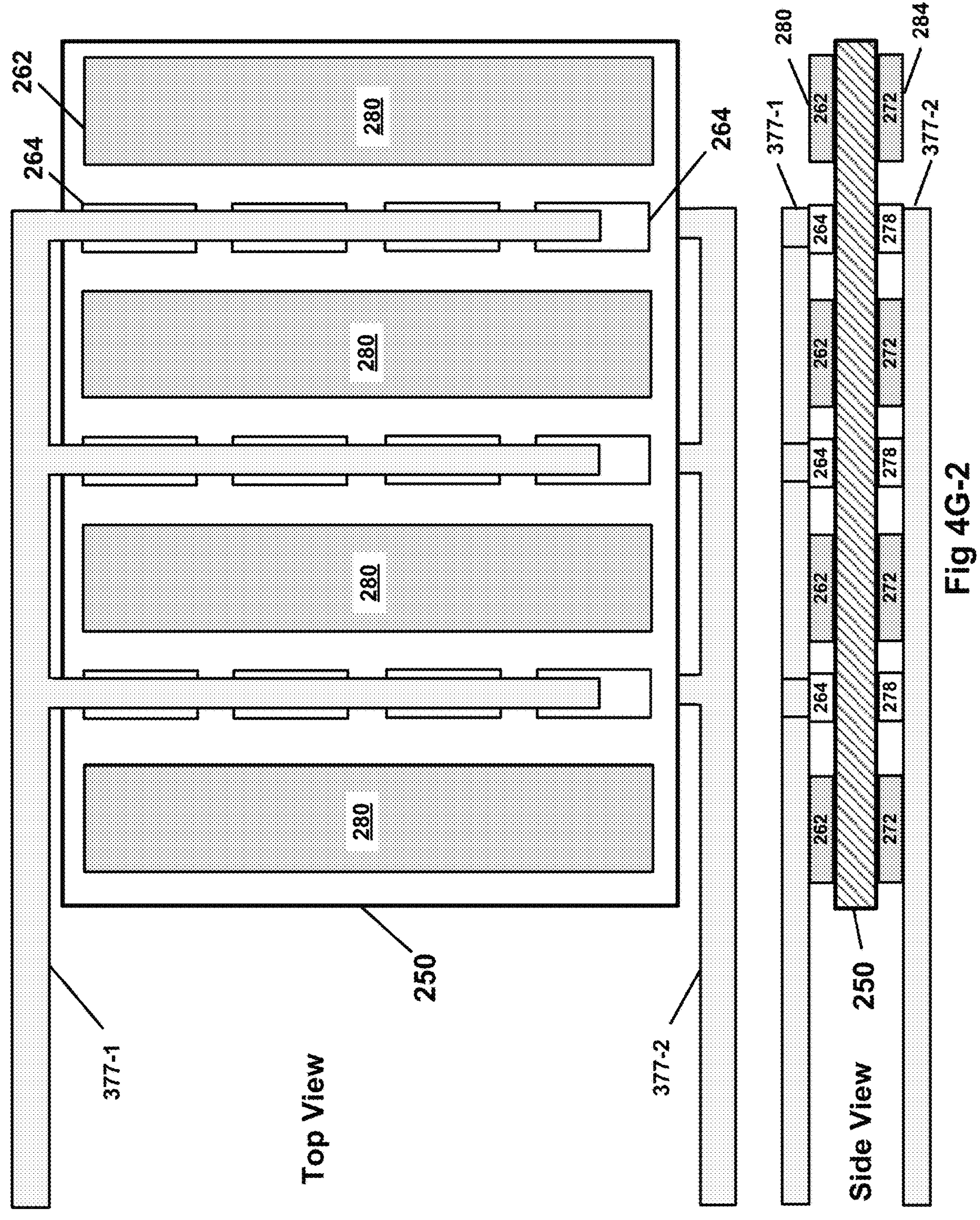
Figures 3, 4G:
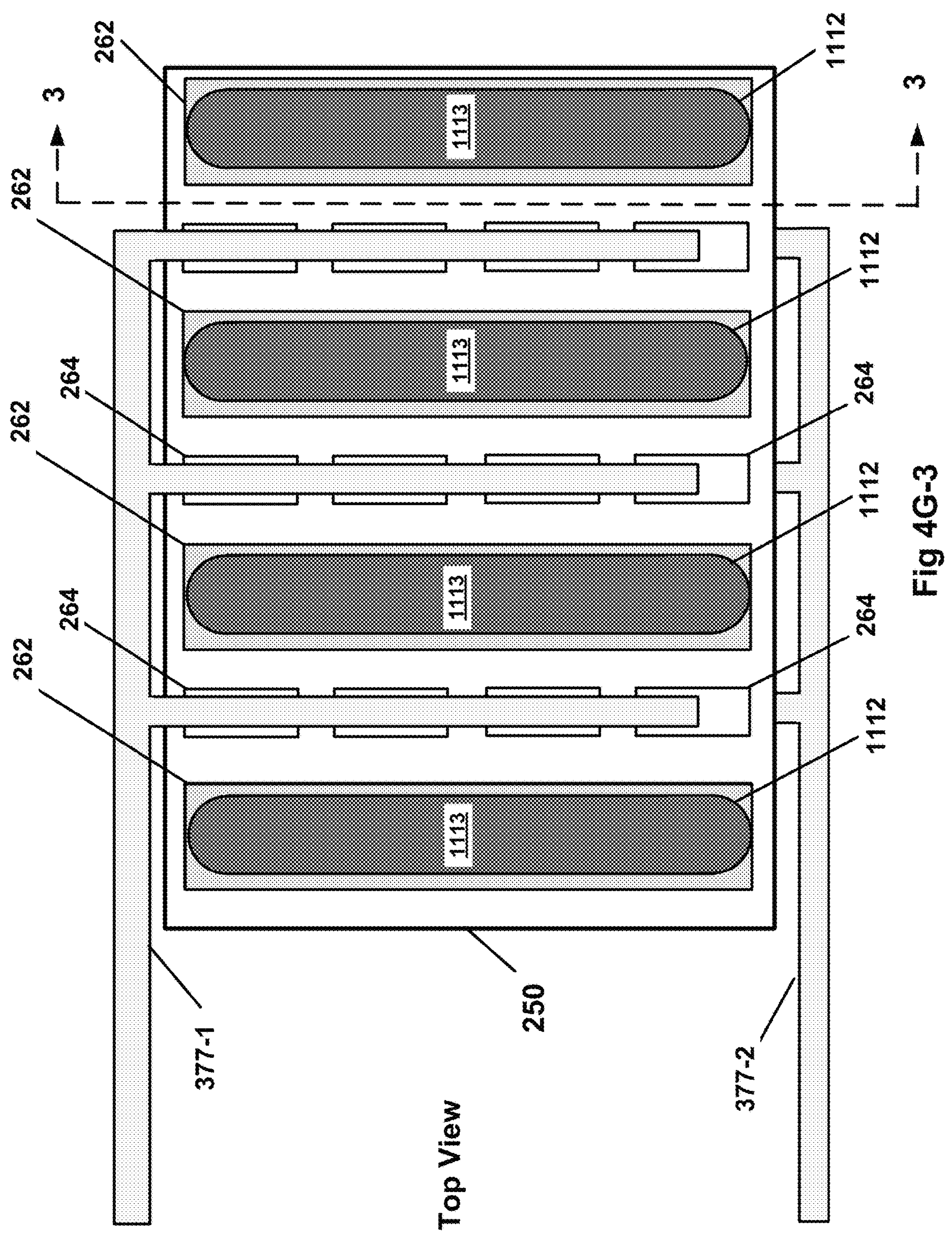
Figures 4, 4G, 5:
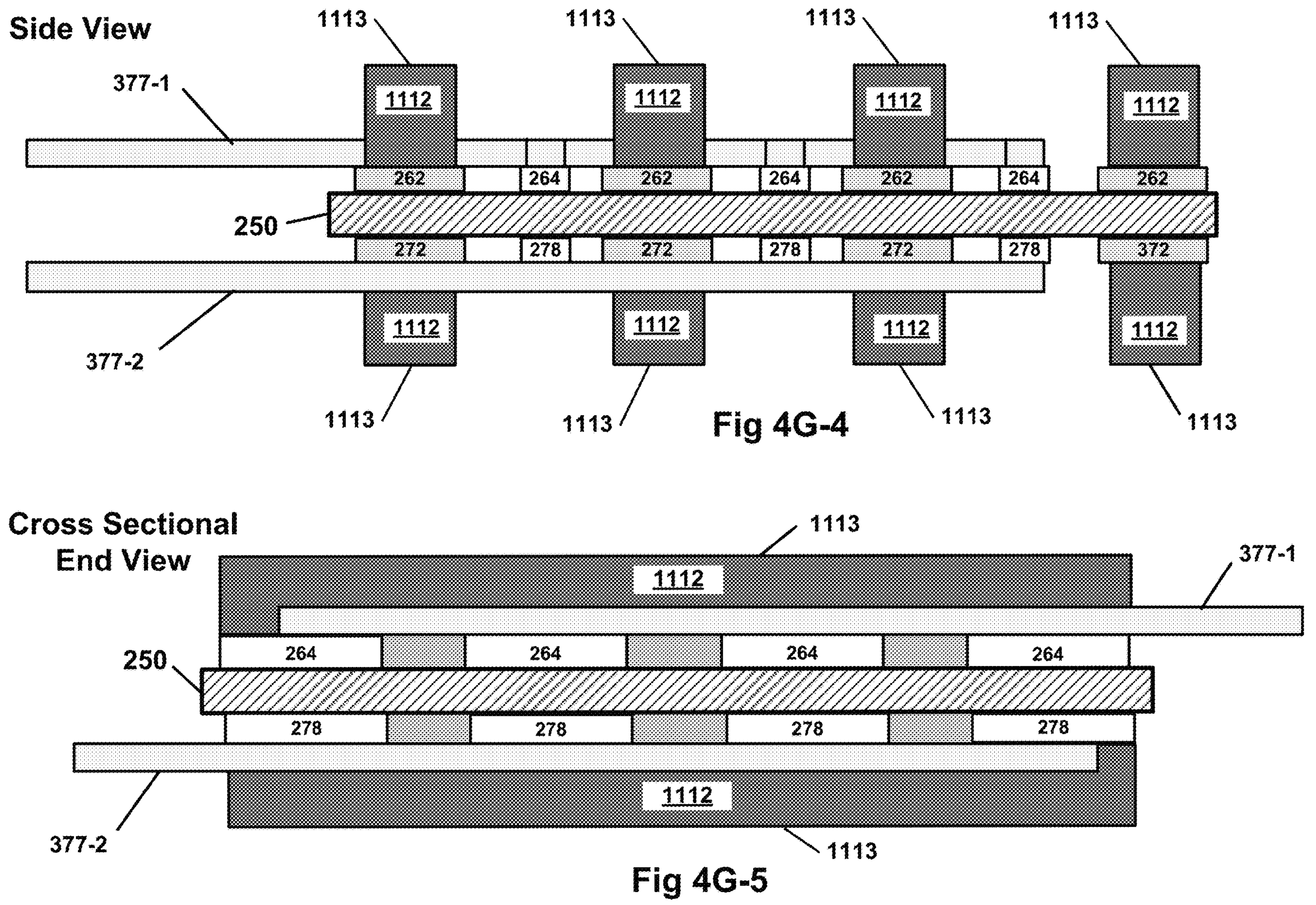
Figures 4, 4G, 5, 6:
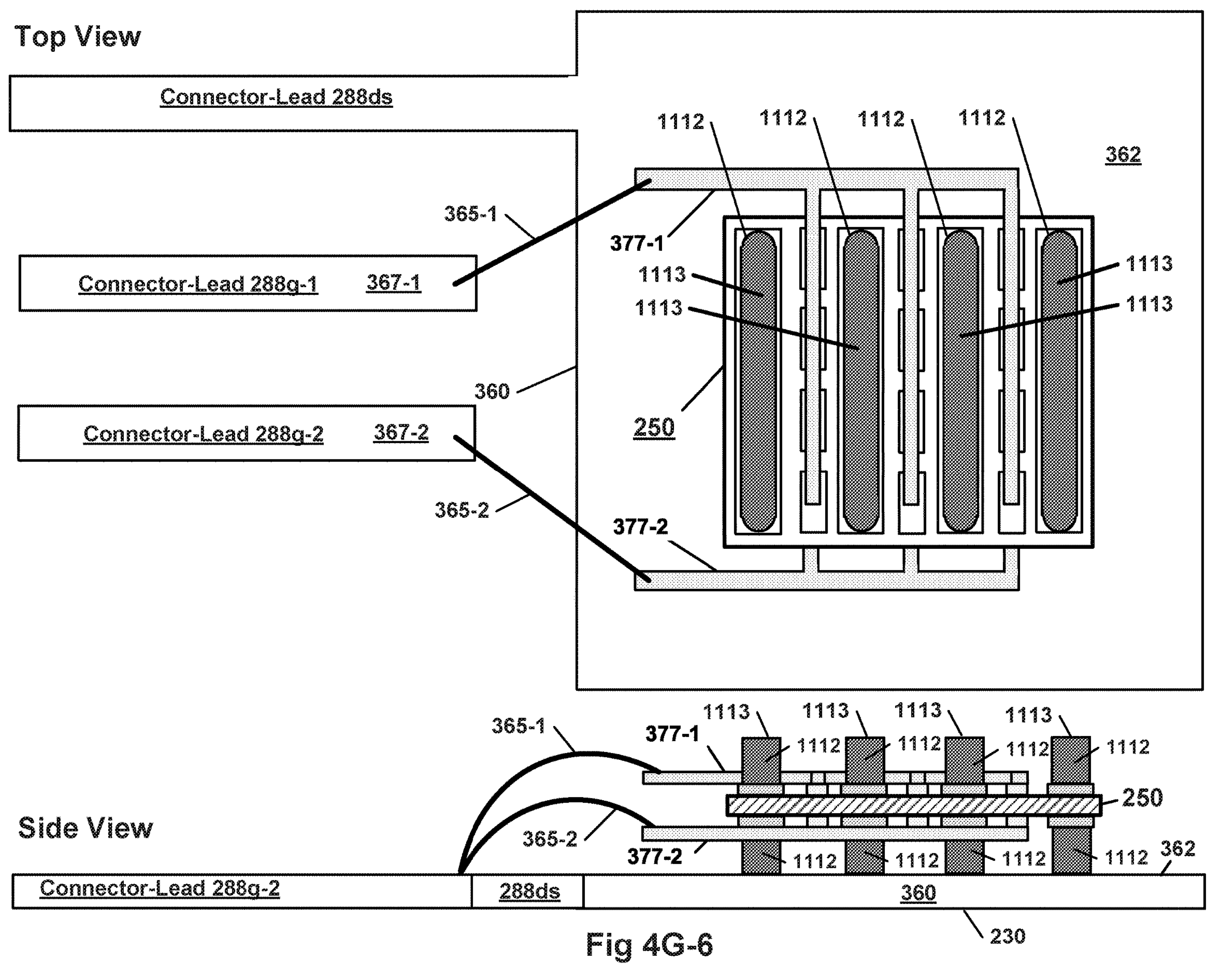
Figures 4, 4G, 5, 6, 7:
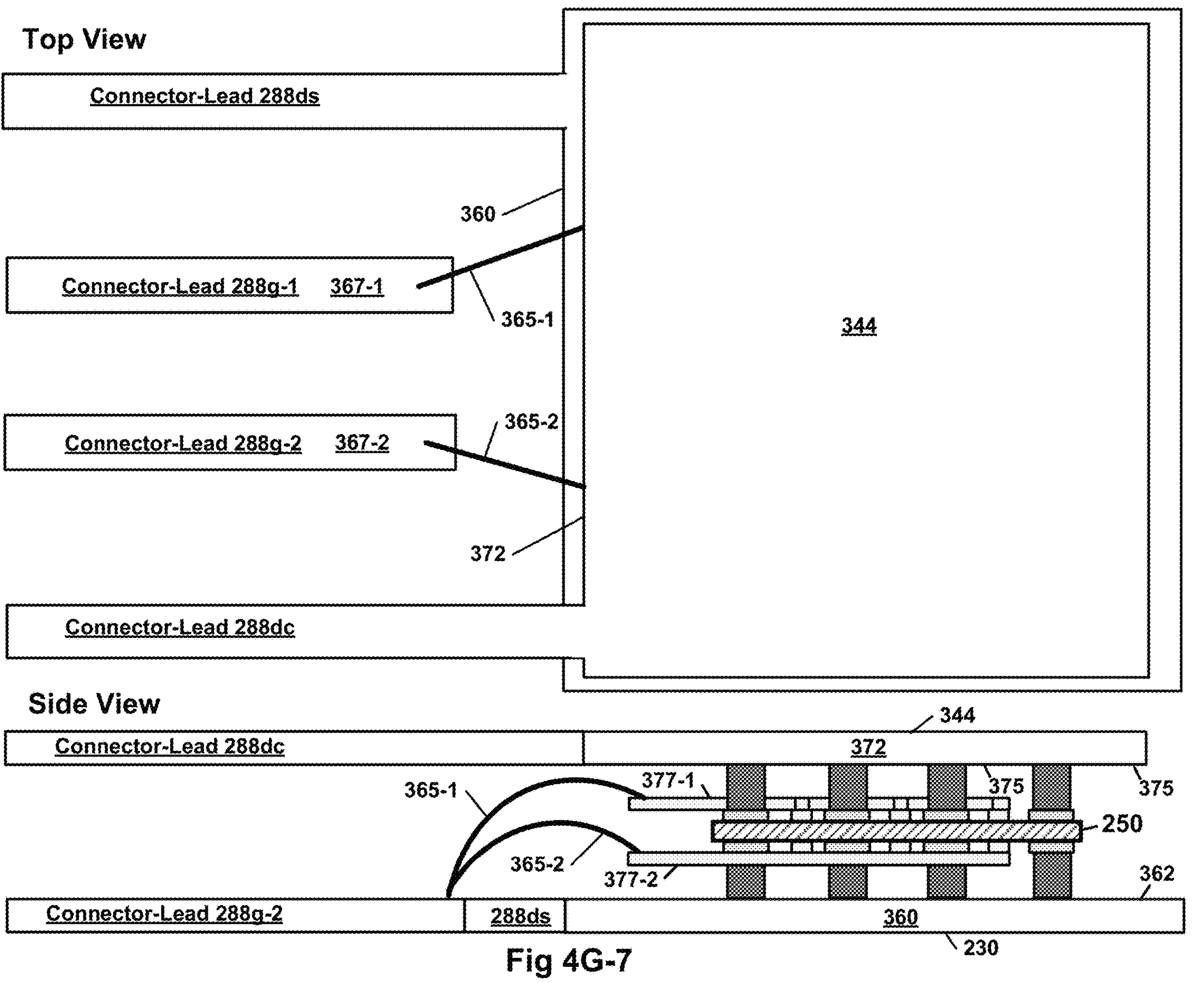
Figures 4, 4G, 5, 6, 7, 8:
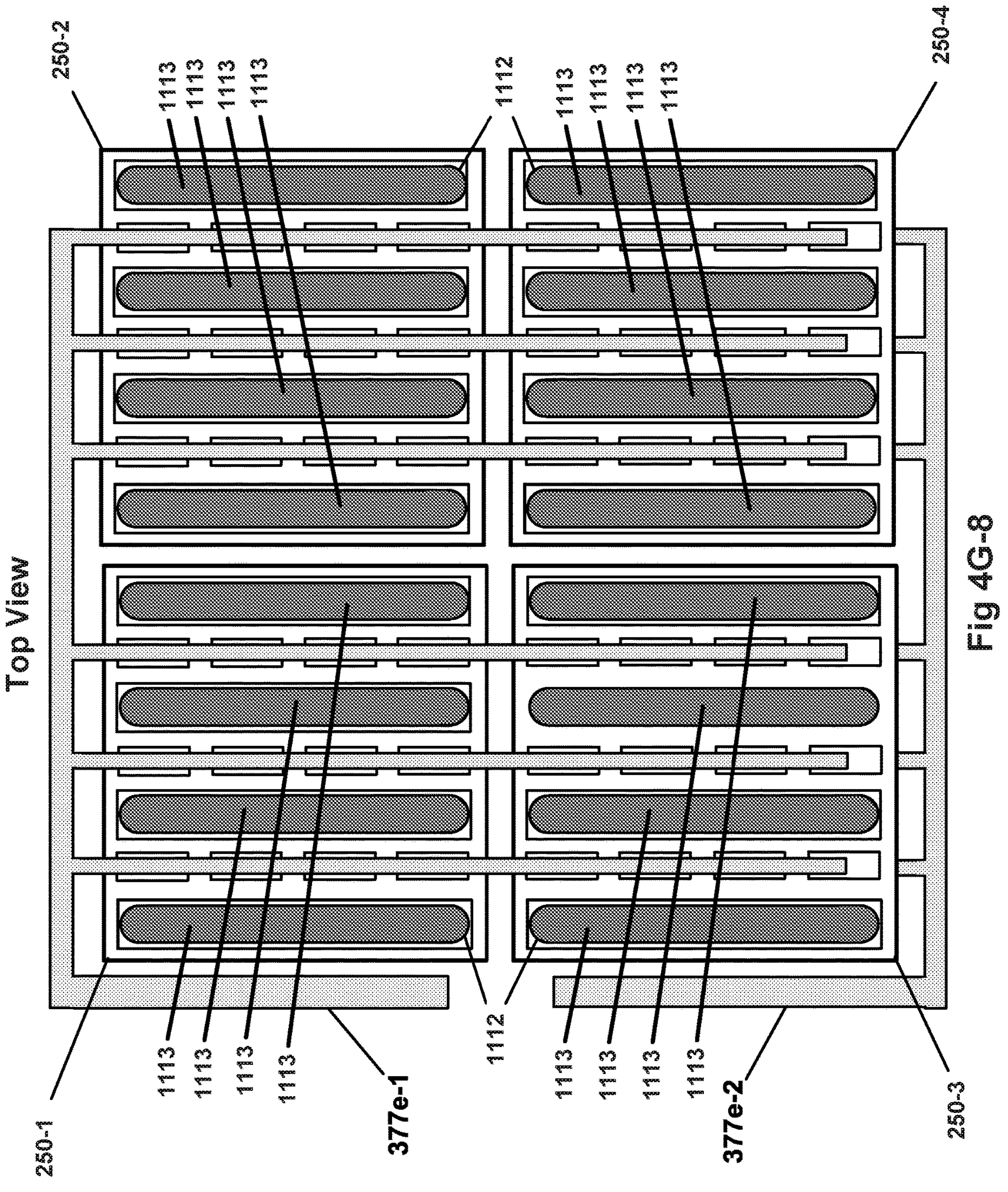
Figures 4, 4G, 5, 6, 7, 8, 9:
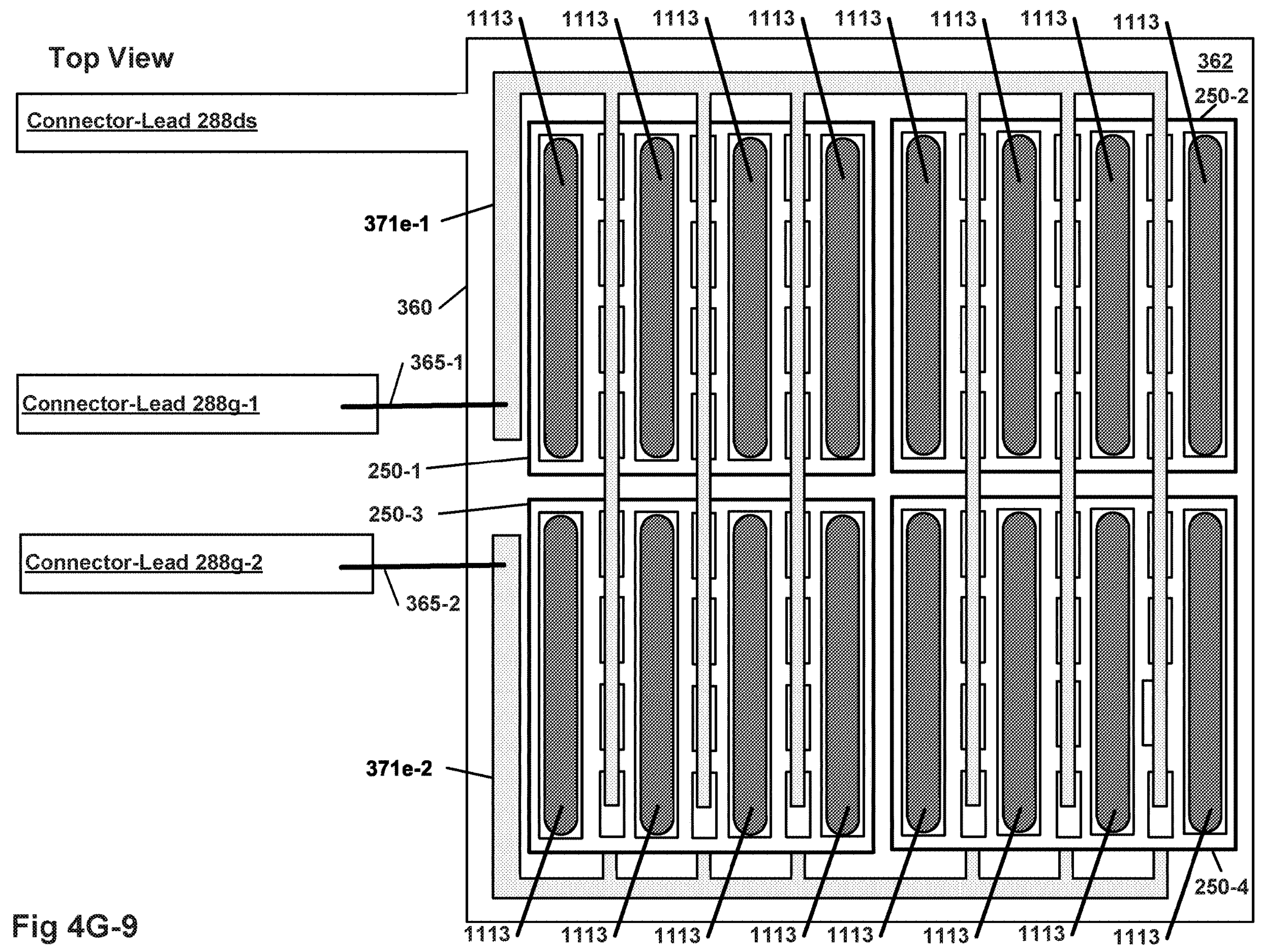
Figures 4, 4G, 5, 6, 7, 8, 9, 10, 11:
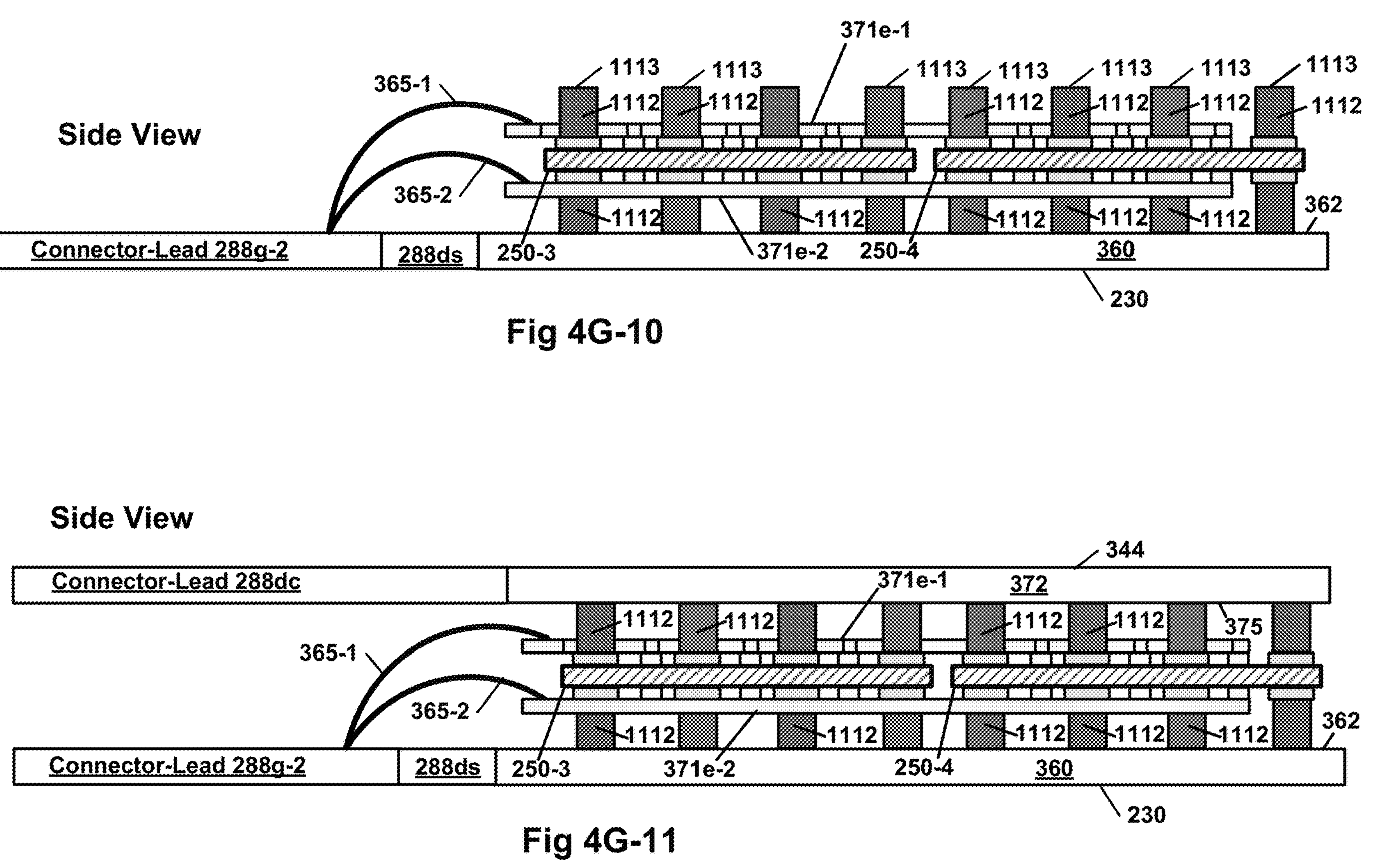
Figures 4, 4G, 5, 6, 7, 8, 9, 10, 11, 12:
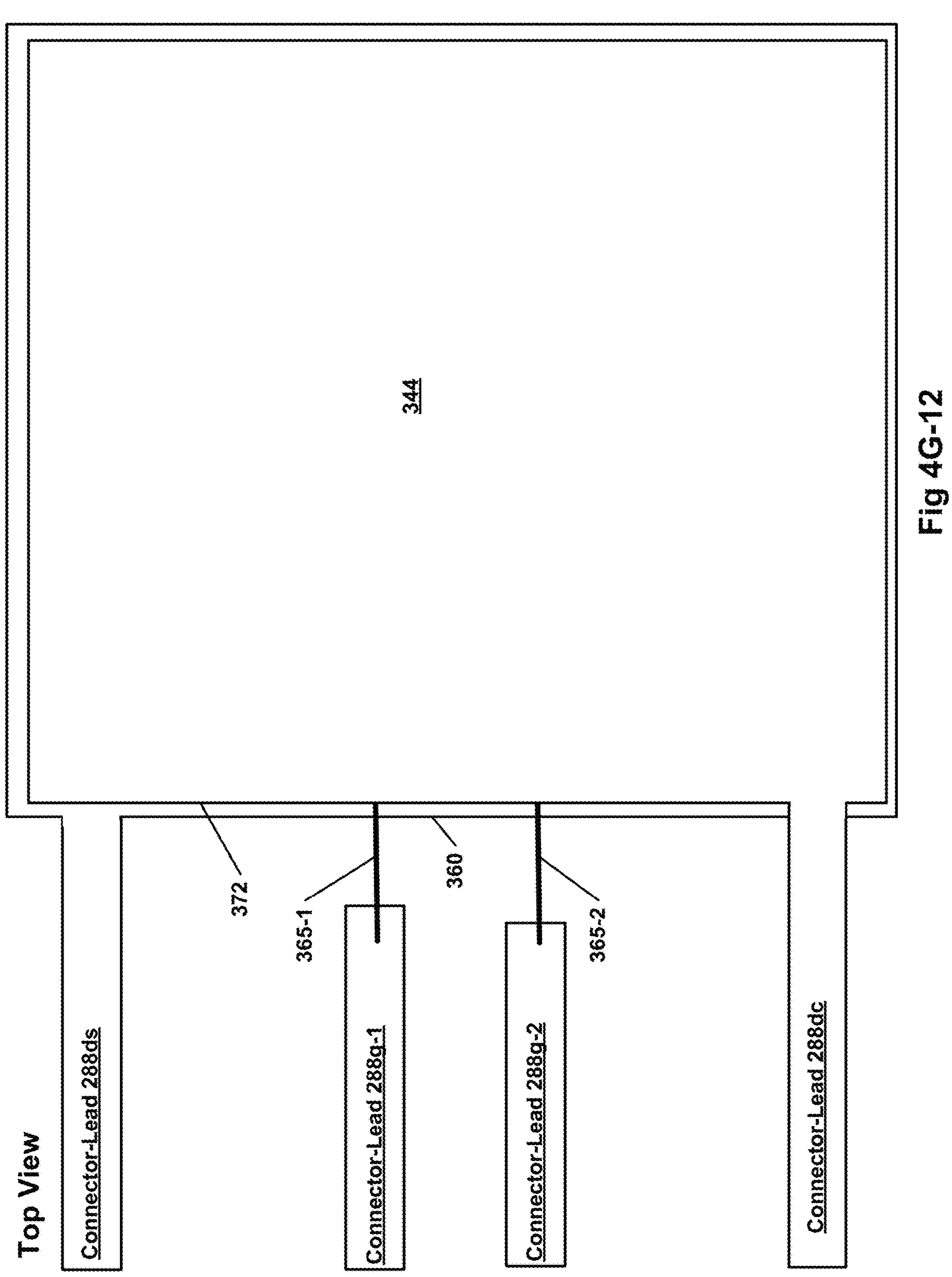

Signal frames can be connected to flat surfaces of base terminal pads. FIG. 4G-2 shows top and side views of BBJT 250 with signal frames 377-1 and 377-2 connected to base terminal pad surfaces 282 and 286, respectively. Specifically, a flat surface of signal frame 377-1 is connected to flat surfaces 282 of base terminal pads 264 on the top side of BBJT 250, and a flat surface of signal frame 377-2 is connected to flat surfaces 286 of base terminal pads 278 on the bottom side of BBJT 250. Signal frames 377 may be formed (e.g., cut, stamped, diced, etc.) from a thin (e.g., 1.0 mm-2.0 mm) sheet of metal such as copper. Signal frames can transmit base control signals to base terminal pads.

Pedestals can be connected to flat surfaces of c/e terminal pads. FIG. 4G-3 is a top view of the structure shown in FIG. 4G-2 after pedestals 1112 are electrically and thermally attached (e.g., sintered) directly to surfaces 280 and 284 of the c/e terminals pads on both sides of BBJT 250. FIG. 4G-4 shows a side view of the structure in FIG. 4G-3. FIG. 4G-5 shows a cross sectional view of the structure in FIG. 4G-3 taken along line 3-3. Pedestals 1112 in FIG. 4G-3 may be like the pedestals 1104 or 1108 show in figures above, except pedestals 1112 in FIG. 4G-3 are substantially longer. Pedestals 1112 may have oppositely facing flat first and second surfaces. Only first flat surfaces 1113 are shown in FIG. 4G-3. The second flat surfaces are electrically and thermally attached (e.g., sintered) directly to flat surfaces 280 or 284 of respective c/e terminal pads 262 or 272. The flat second end surfaces of pedestals 1112 may have a shape (e.g., substantially rectangular) and size that is substantially like, but slightly smaller than the shape and size of the substantially flat surfaces 280 or 284 of respective second current terminal pads 262 or 272 to which they are electrically and thermally attached. Flat first surfaces 1113 in FIG. 4G-3 may be contained substantially in a common plane to accommodate attachment to a flat surface of a bridge or a die clip.

A die clip and a die substrate can be electrically and thermally attached (e.g., sintered) directly to pedestals 1112 of the structure shown in FIG. 4G-3. FIG. 4G-6 illustrates top and side views of the of the structure shown in FIG. 4G-3 after die substrate 360 of FIG. 4A-1 is electrically and thermally attached (e.g., sintered) directly to pedestals 1112 on the bottom side of BBJT 250 as shown. More specifically, the first flat surfaces of pedestals 1112 may be sintered to surface 362 of die substrate 360. FIG. 4G-6 also shows connector leads 288*g*-1 and 288*g*-2, which are electrically connected to signal frames 377-1 and 377-2, respectively, by bond wires 365-1 and 365-2, respectively. FIG. 4G-7 illustrates top and side views of the of the structure shown in FIG. 4G-6 after die clip 372 of FIG. 4A-4 is electrically and thermally attached (e.g., sintered) directly to pedestals 1112 on the top side of BBJT 250 as shown. More specifically, the first flat surfaces of pedestals 1112 may be sintered to surface 375 of die clip 372. Die substrate 360 and die clip 372 may be formed from a thin sheet of copper in this version.

The structure shown in FIG. 4G-7 is one example of the switch module 376G shown in FIG. 3G. A case may be formed around the structure shown in FIG. 4G-7 using, for example, transfer molding, to create an example of packaged switch 247*q*G shown in FIG. 3G, which is an example of packaged switch 247*q* of FIGS. 2B-1-2B-3. Prior to case formation some or all of connector-leads 288 may be bent to place case-external end portions of the connector-leads 288 in a common plane as shown in FIG. 2B-3. In an alternative version, connection-lead 288*ds* and/or 288*dc* are not connected to die substrate 360 and die clip 372, respectively.

The bidirectional packaged switch shown in FIG. 3L includes four BBJT electrically and thermally connected (e.g., sintered) between a die substrate 360 and die clip 372. FIG. 4G-8 shows a top view of four BBJTs 250. Signal frames 377*e*-1 and 377*e*-2 may be connected to base terminal pad surfaces on the top and bottom sides, respectively, of BBJTs 250-1-250-4. Specifically, a flat surface of signal frame 377*e*-1 is connected to flat surfaces of base terminal pads on the top sides of BBJTs 250-1-250-4, and a flat surface of signal frame 377*e*-2 is connected to flat surfaces of base terminal pads on the bottom side of BBJTs 250-1-250-4. Signal frames 377 may be formed (e.g., cut, stamped, diced, etc.) from a thin (e.g., 1.0 mm-2.0 mm) sheet of metal such as copper. Signal frames can transmit base control signals to base terminal pads.

Pedestals can be connected to flat surfaces of c/e terminal pads on both side of BBJTs 250-1-250-4. In FIG. 4G-8 flat second end surfaces of pedestals 1112 may be electrically and thermally attached (e.g., sintered) directly to surfaces of respective c/e terminals pads on both sides of BBJTs 250-1-250-4. A die clip and a die substrate can be electrically and thermally attached (e.g., sintered) directly to pedestals 1112 of the structure shown in FIG. 4G-8. FIGS. 4G-9 and 4G-10 illustrate top and side views of the of the structure shown in FIG. 4G-8 after die substrate 360 of FIG. 4A-1 is electrically and thermally attached (e.g., sintered) directly to pedestals 1112 on the bottom sides of BBJTs 250-1-250-4. More specifically, the first flat end surfaces 1113 of pedestals 1112 on the bottom sides of BBJTs 250-1-250-4 may be sintered to surface 362 of die substrate 360. FIG. 4G-9 also shows connector leads 288*g*-1 and 288*g*-2, which are electrically connected to signal frames 377*e*-1 and 377*e*-2, respectively, by bond wires 365-1 and 365-2, respectively. FIGS. 4G-11 and 4G-12 illustrate side and top views of the of the structure shown in FIG. 4G-10 after die clip 372 of FIG. 4A-4 is electrically and thermally attached (e.g., sintered) directly to pedestals 1112 on the top sides of BBJTs 250-1-250-4. More specifically, the first flat end surfaces 1113 of pedestals 1112 on the top side of BBJTs 250-1-250-4 may be sintered to surface 375 of die clip 372. Die substrate 360 and die clip 372 may be formed from a thin sheet of copper in this version.

The structure shown in FIGS. 4G-11 and 4G-12 is one example of the switch module 376L shown in FIG. 3L. A case may be formed around the structure shown in FIG. 4G-11 using, for example, transfer molding, to create an example of packaged switch 247*ql* shown in FIG. 3L, which is an example of packaged switch 247*q* shown in FIGS. 2B-1-2B-3. Prior to case formation some or all of connector-leads 288 may be bent to place case-external end portions of the connector-leads 288 in a common plane as shown in FIG. 2B-3. In an alternative version, connection-lead 288*ds* and/or 288*dc* are not included to create an alternative version of packaged switch 247*q*.

Figure 4H:
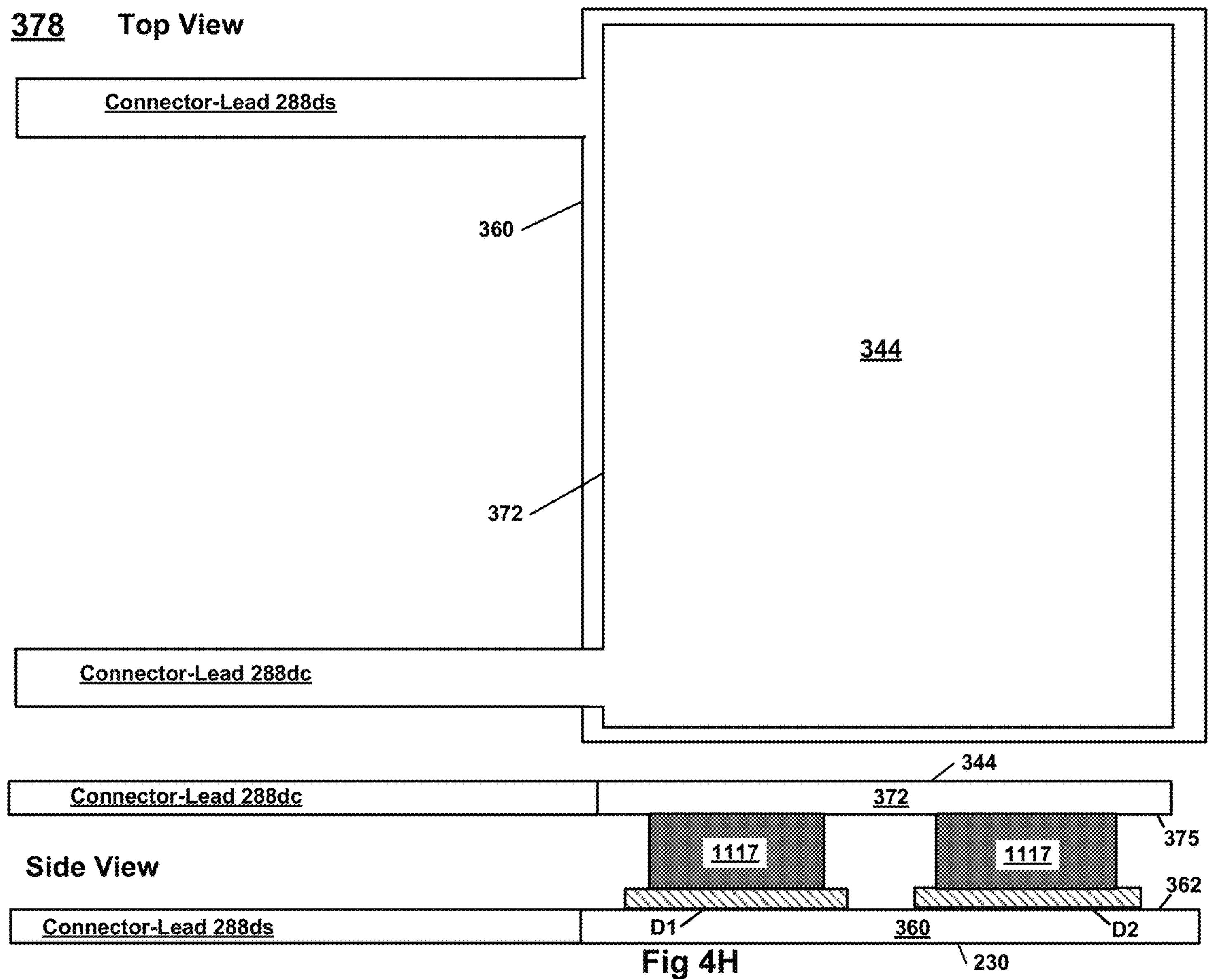
FIG. 4H shows top and side views of an example diode module.

FIG. 4H shows top and side views of an example diode module 278N of FIG. 3N, which includes a pair of diodes D1 and D2 sandwiched between die clip 372 and die substrate 360. D1 and D2 may be diodes of the same type, or D1 and D2 may include a mixture of different types of diodes.

FIG. 4H shows diodes D1 and D2 after flat surfaces of their first current terminal (e.g., cathode terminal, not shown) pads are electrically and thermally (e.g., sintered) directly to surface 362. A low resistance path may exist between die substrate terminal 230 and each first current terminal pad. Each die substrate joint (e.g., sintered joint, not shown) in FIG. 4H that connects a first current terminal pad surface to surface 362 may conduct 10, 20, 50, 100, 200, 300, 750 Watts or more of heat while concurrently conducting 50, 100, 200, 400 A or more of electrical current. Each die substrate joint may have a length and width that is substantially equal to the length and width of a respective first current terminal pad surface.

Each diode D1 and D2 may include a second current terminal (e.g., anode terminal, not shown) pad. Each second current terminal pad may have a flat surface. FIG. 4H shows pedestals 1117, which may be substantially like pedestals 1108 described above. Each pedestal 1117 may have opposite facing first and second flat end surfaces. Second flat end surfaces of pedestals 1117 may be electrically and thermally attached (e.g., sintered) directly to respective flat surfaces of second current terminal pads in diodes D1 and D2. The flat second end surfaces of pedestals 1117 may have a shape and size substantially like, but slightly smaller than the shape and size of flat surfaces of respective second current terminal pads to which they are electrically and thermally attached. Each second joint (e.g., sintered joint) that connects a second current terminal pad surface to a second flat end surface of a pedestal 1117, and each pedestal 1117, may conduct 10, 20, 50, 100, 200, 300, 600 Watts or more of heat while concurrently conducting 10, 20, 50, 100, 200, 400 A or more of electrical current. Each of these second joints may have a length and width that is substantially equal to the length and width of the respective second flat end surface of pedestals 1117.

FIG. 4H shows flat surface 375 of die clip 372 electrically and thermally attached (e.g., sintered) directly to first flat end surfaces of pedestals 111. Each die clip joint (e.g., sintered joint) that connects a first flat end surface of a pedestal 1117 to surface 375 may conduct 10, 20, 50, 100, 300 Watts or more of heat while concurrently conducting 10, 20, 50, 100, 200 A or more of electrical current. Each die clip joint may have a length and width that is substantially equal to the length and width of a respective first flat end surface of a pedestal 1117. A low resistance path may exist between die clip terminal 344 and each second current terminal pad of diodes D1 and D2.

A case may be formed around example diode module 378 of FIG. 4H using, for example, transfer molding, to create an example of packaged diode 245 shown in FIGS. 2E-1-2E-3. Prior to case formation connector-leads 288 may be bent to place case-external end portions of the connector-leads 288 in a common plane as shown in FIG. 2E-3. In an alternative version, connection-lead 288*ds* and 288*dc* are not connected to die substrate 360 and die clip 372 to create a "connector-lead less" version of packaged diode 245.

Example Power Converters

Inverter 460*i*T

Power converters (hereinafter also referred to as converters), including inverters and rectifiers, of this disclosure have high power densities. For example, an inverter or rectifier of this disclosure can deliver 200 kW or more of peak power while occupying a very small volume.

Figures 1, 5A:
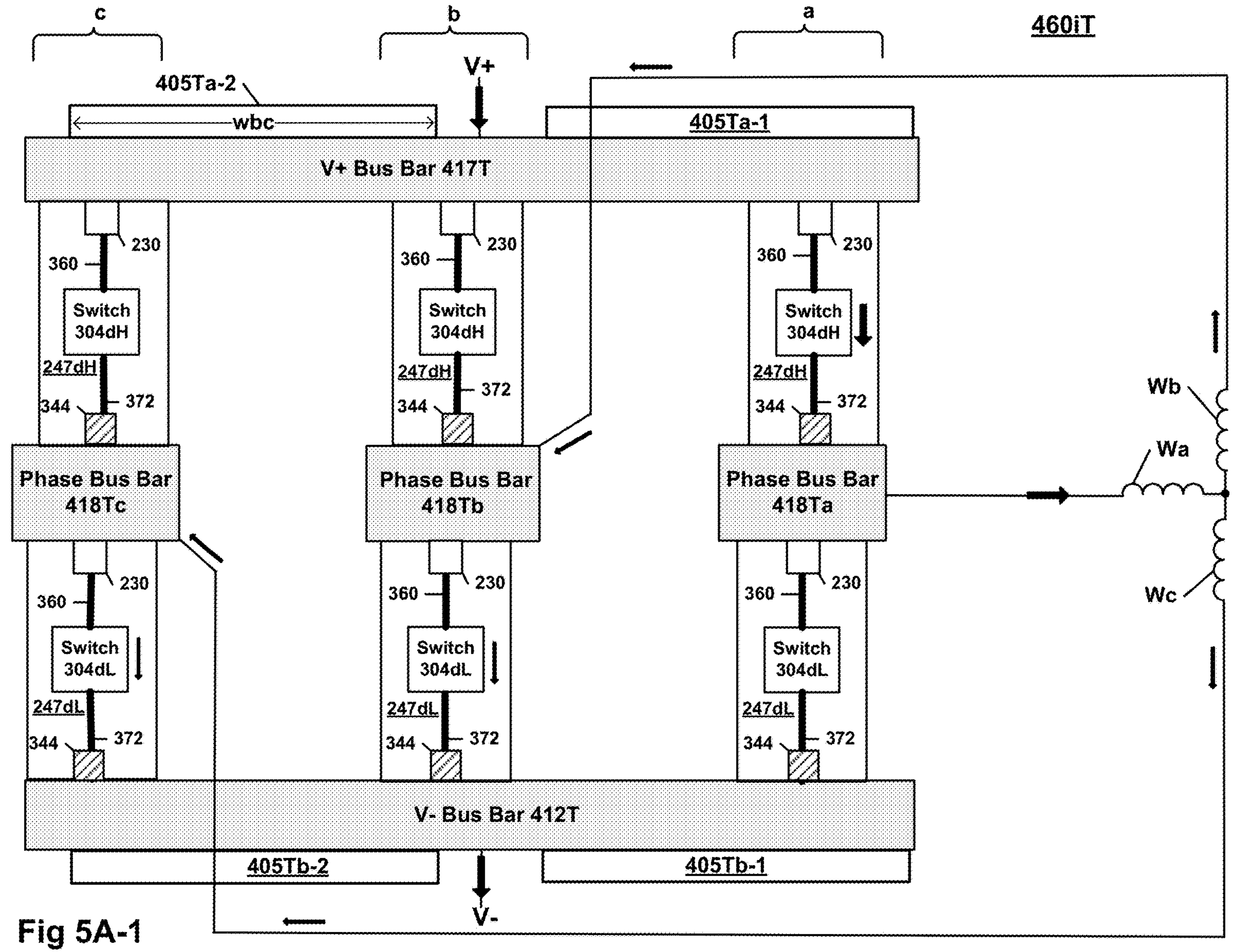
Figures 2, 5A:
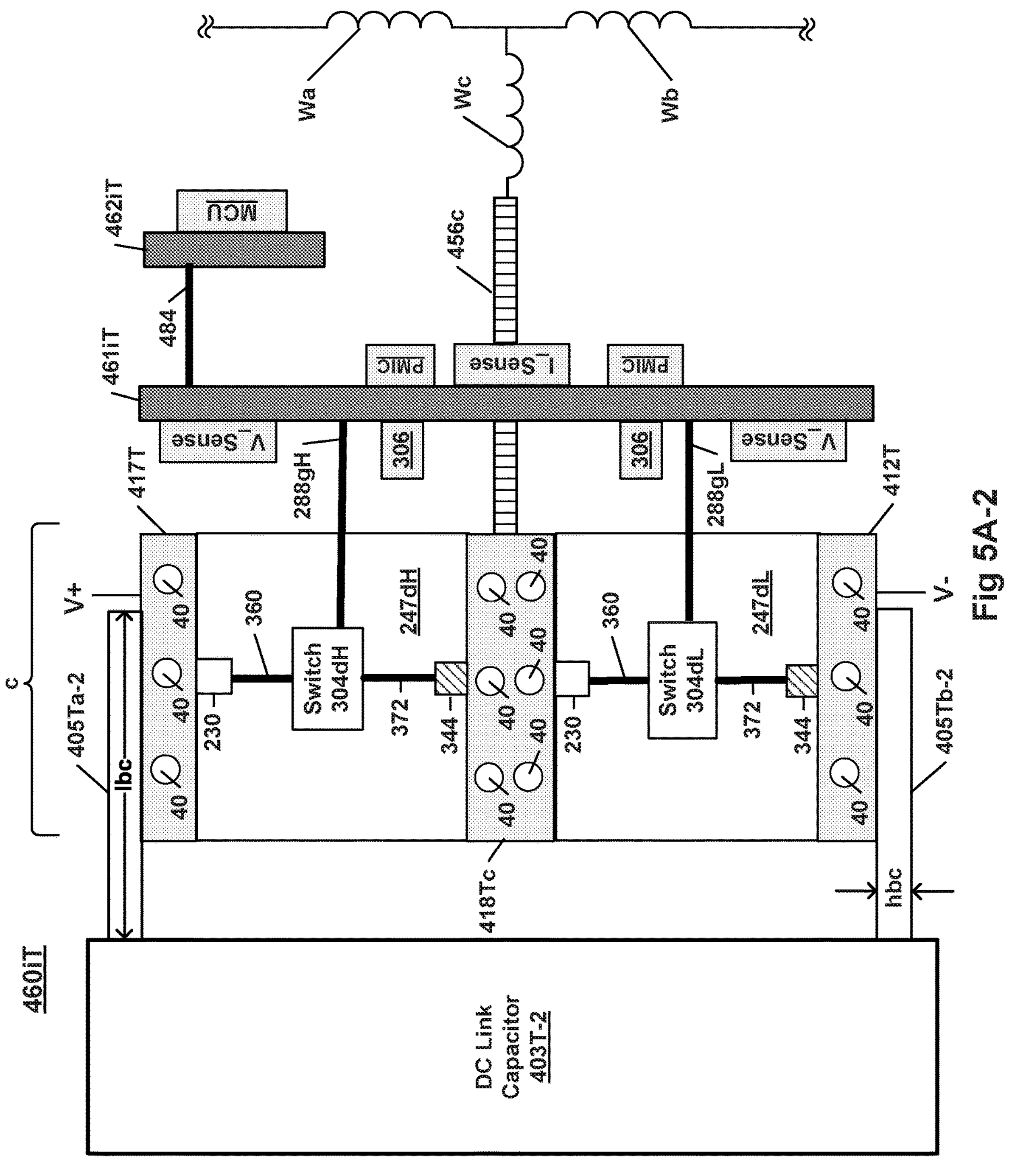
Figures 3, 4, 5, 5A:
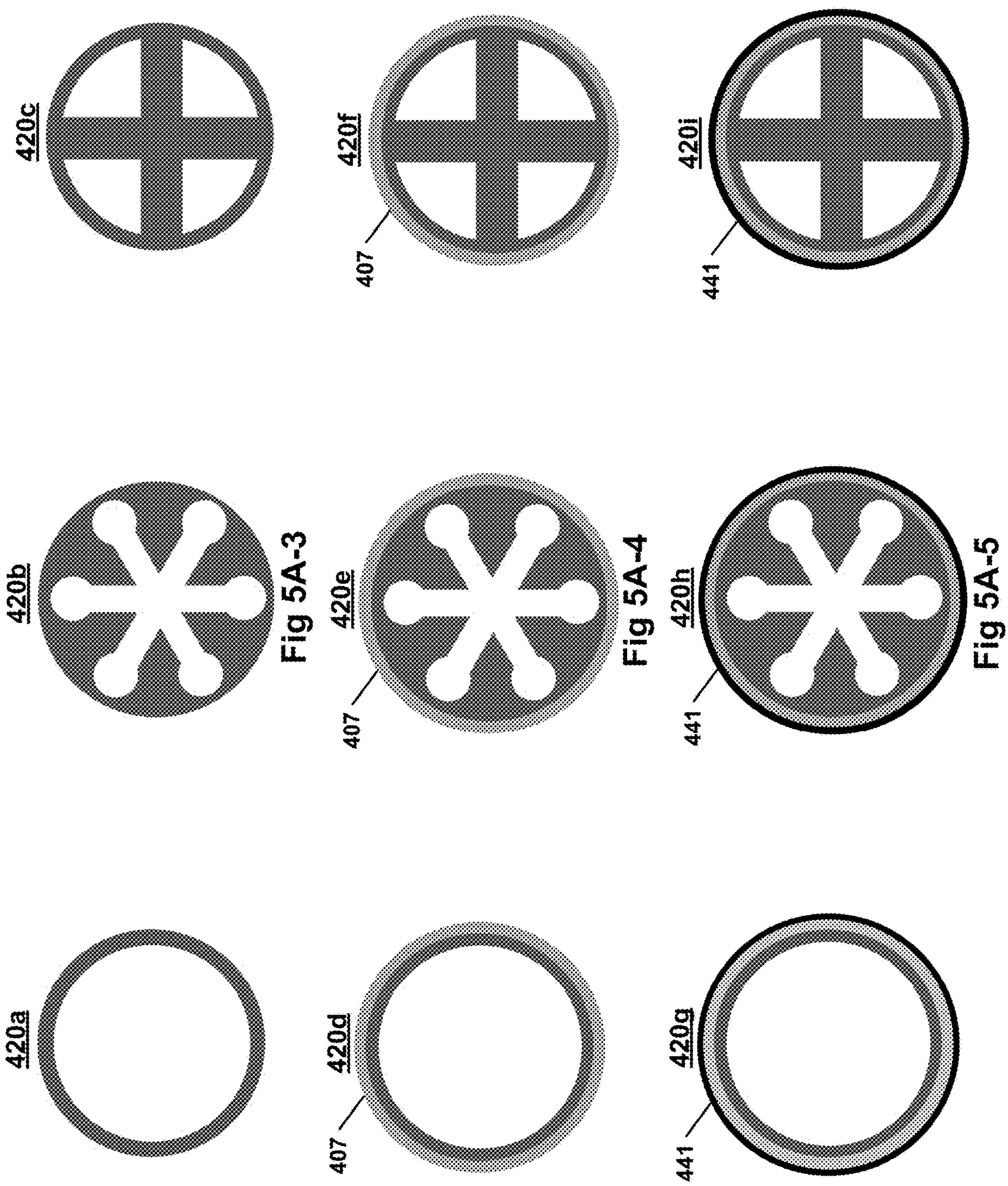
Figures 5, 5A, 6, 7:
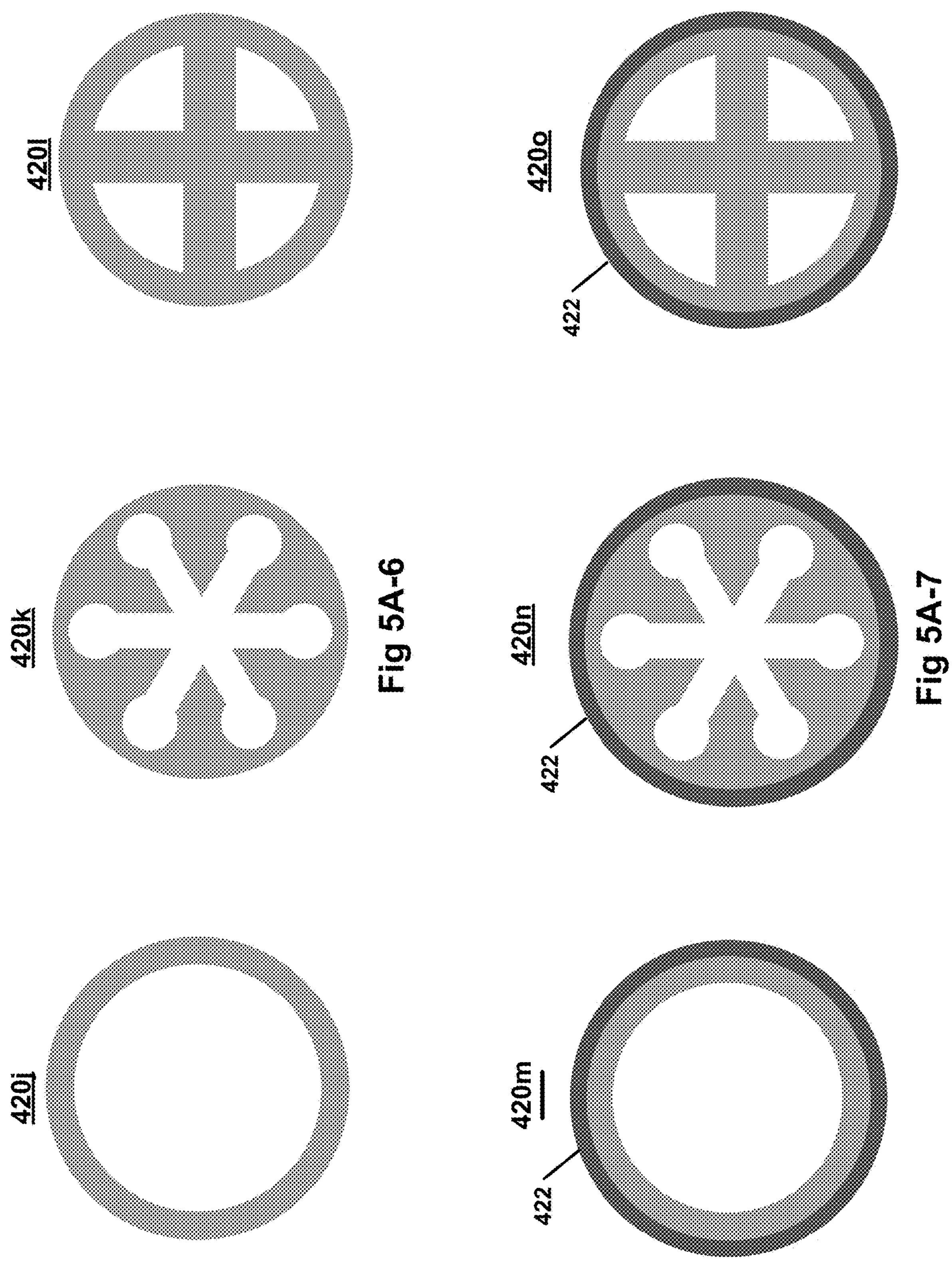
Figures 5, 5A, 6, 7, 8, 9:
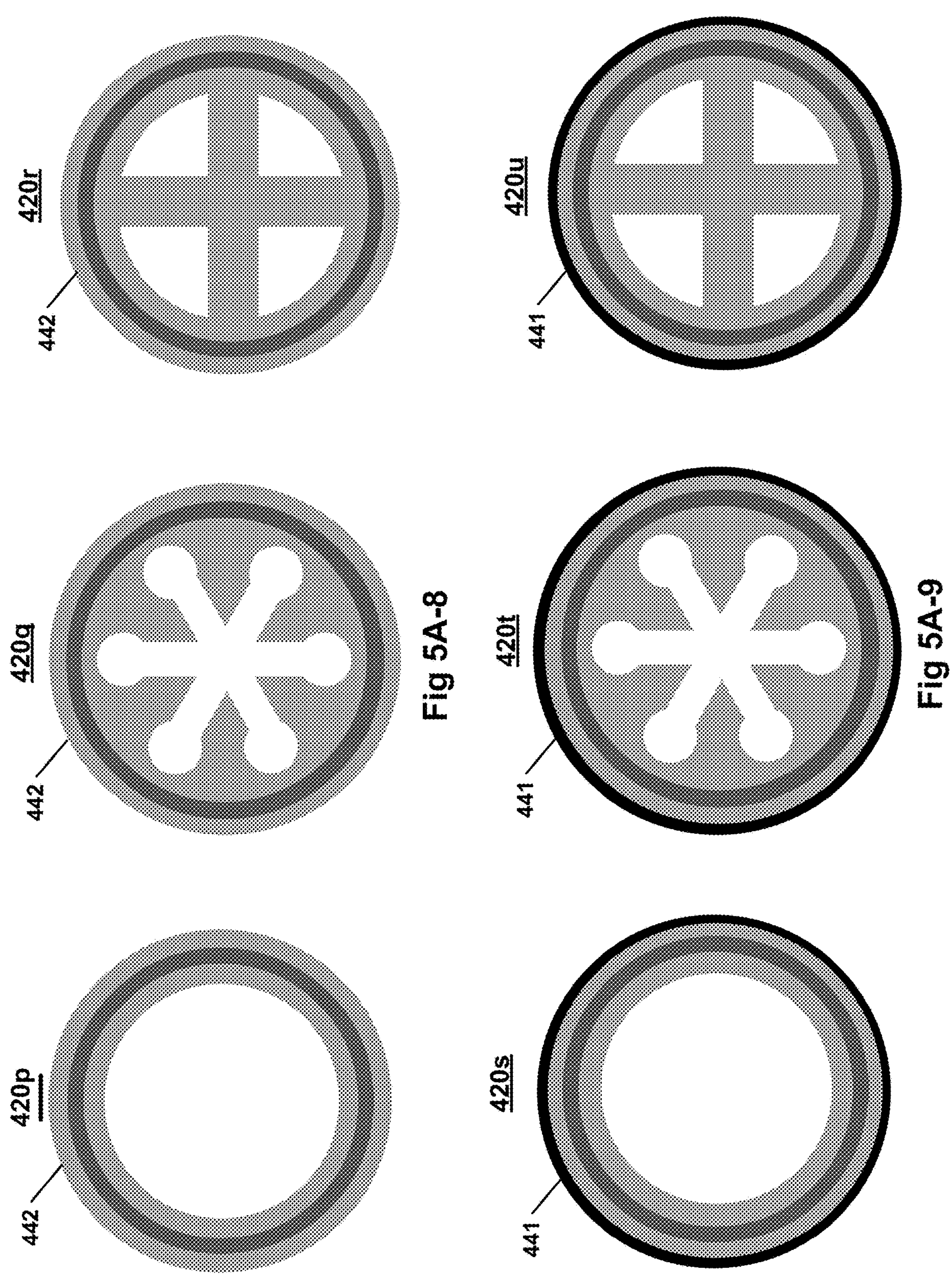
Figures 5, 5A, 6, 7, 8, 9, 10, 11, 12:
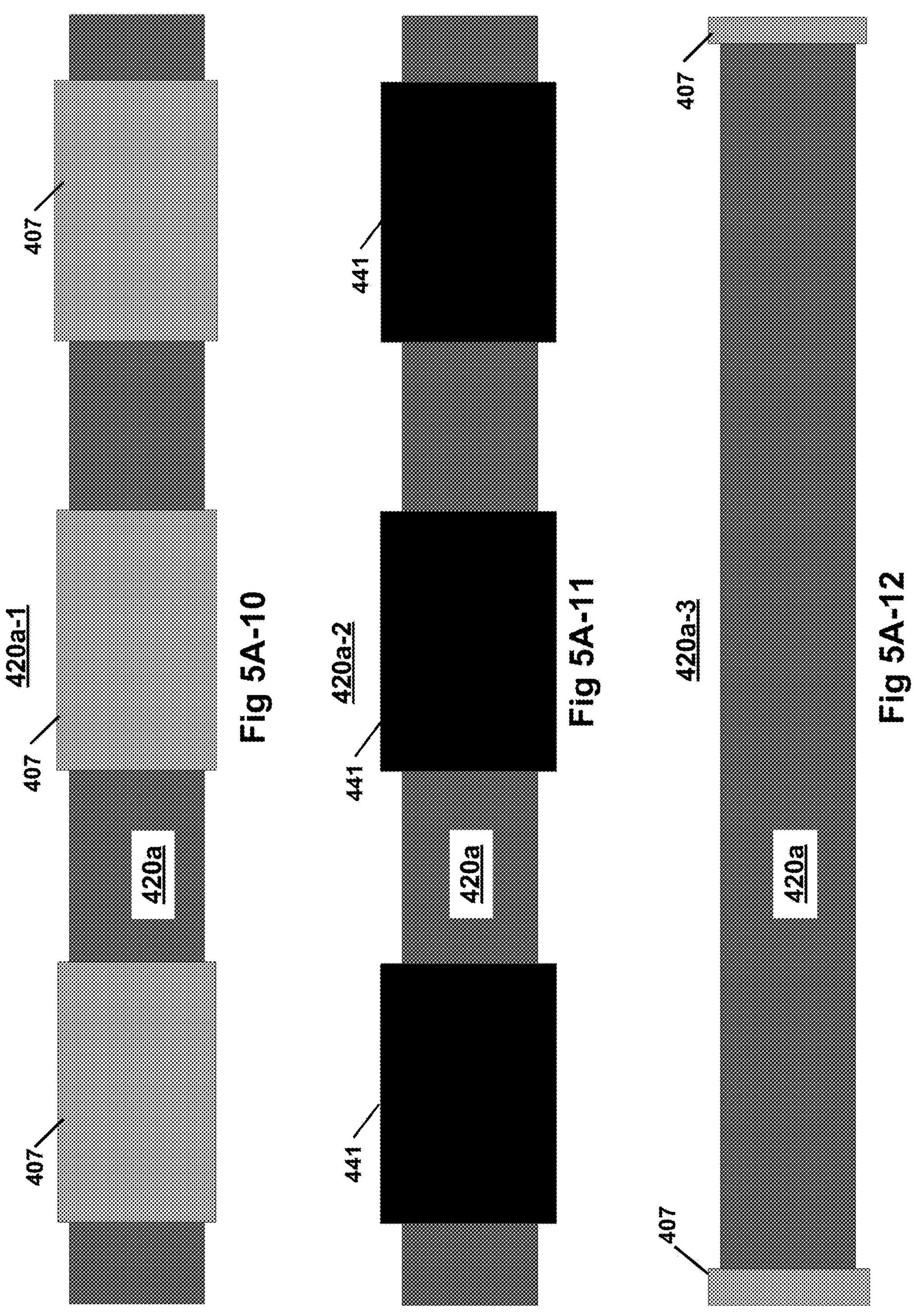
Figures 5, 5A, 6, 7, 8, 9, 10, 11, 12, 13, 14, 15:
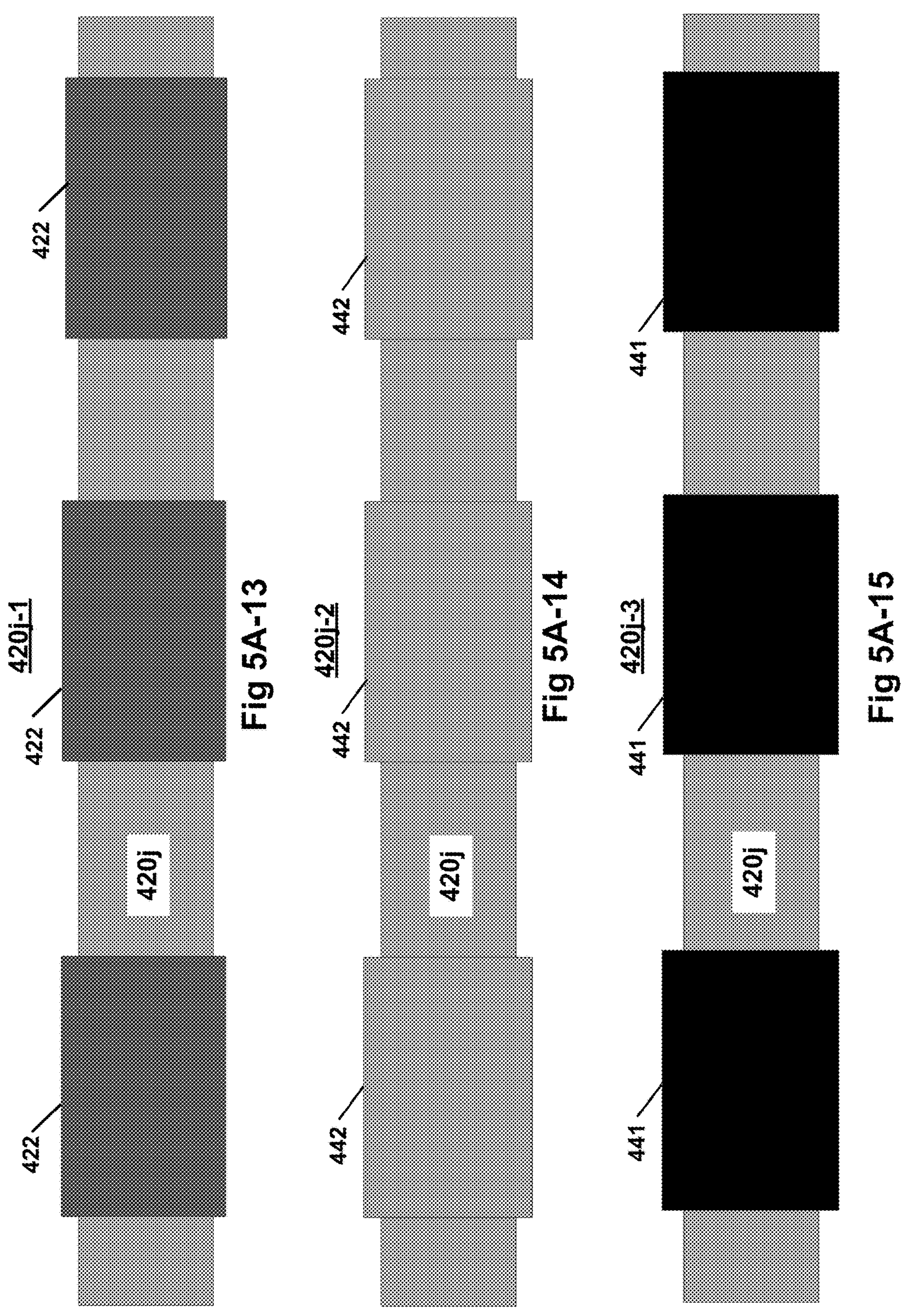
Figures 5, 5A, 6, 7, 8, 9, 10, 11, 12, 13, 14, 15, 16, 17:
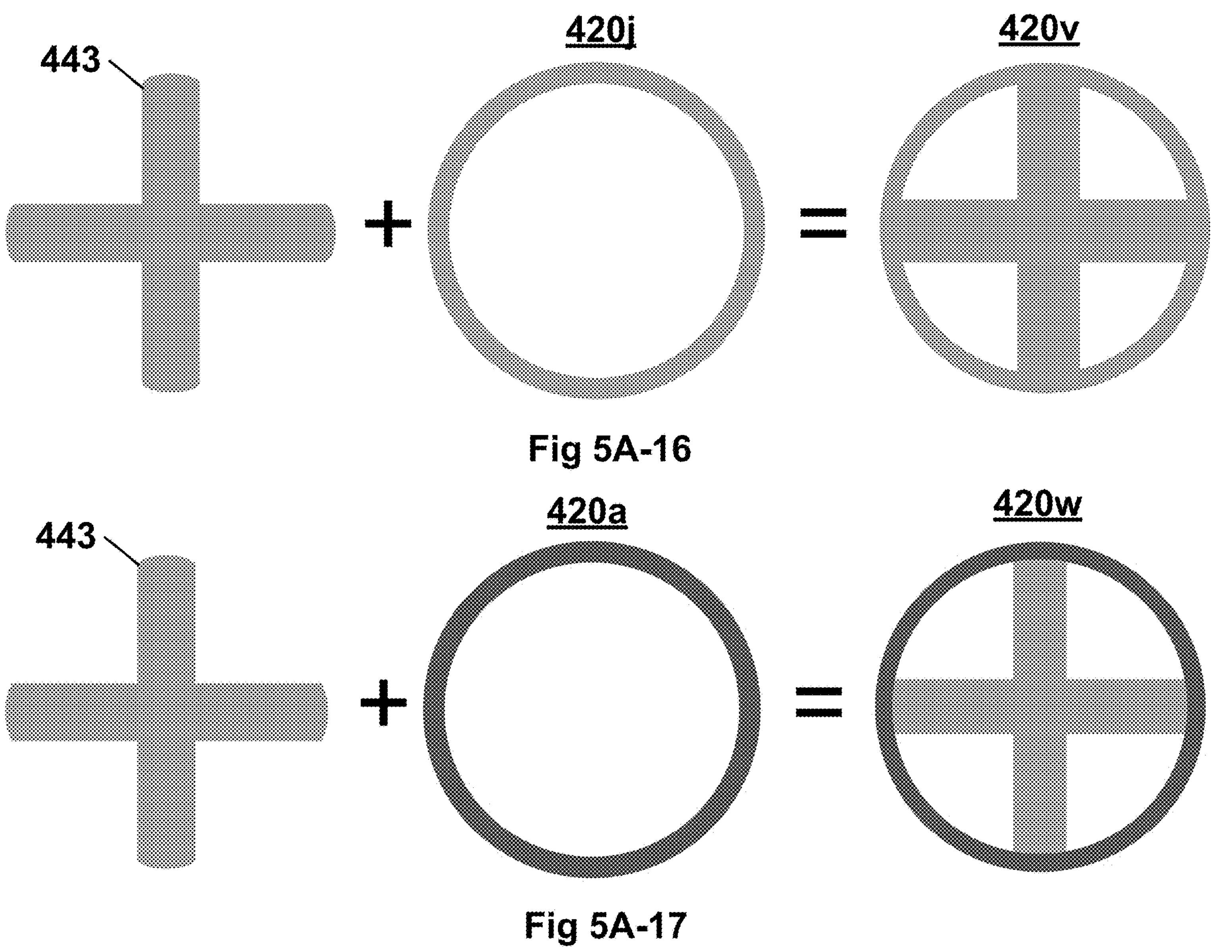
Figures 5, 5A, 6, 7, 8, 9, 10, 11, 12, 13, 14, 15, 16, 17, 18:
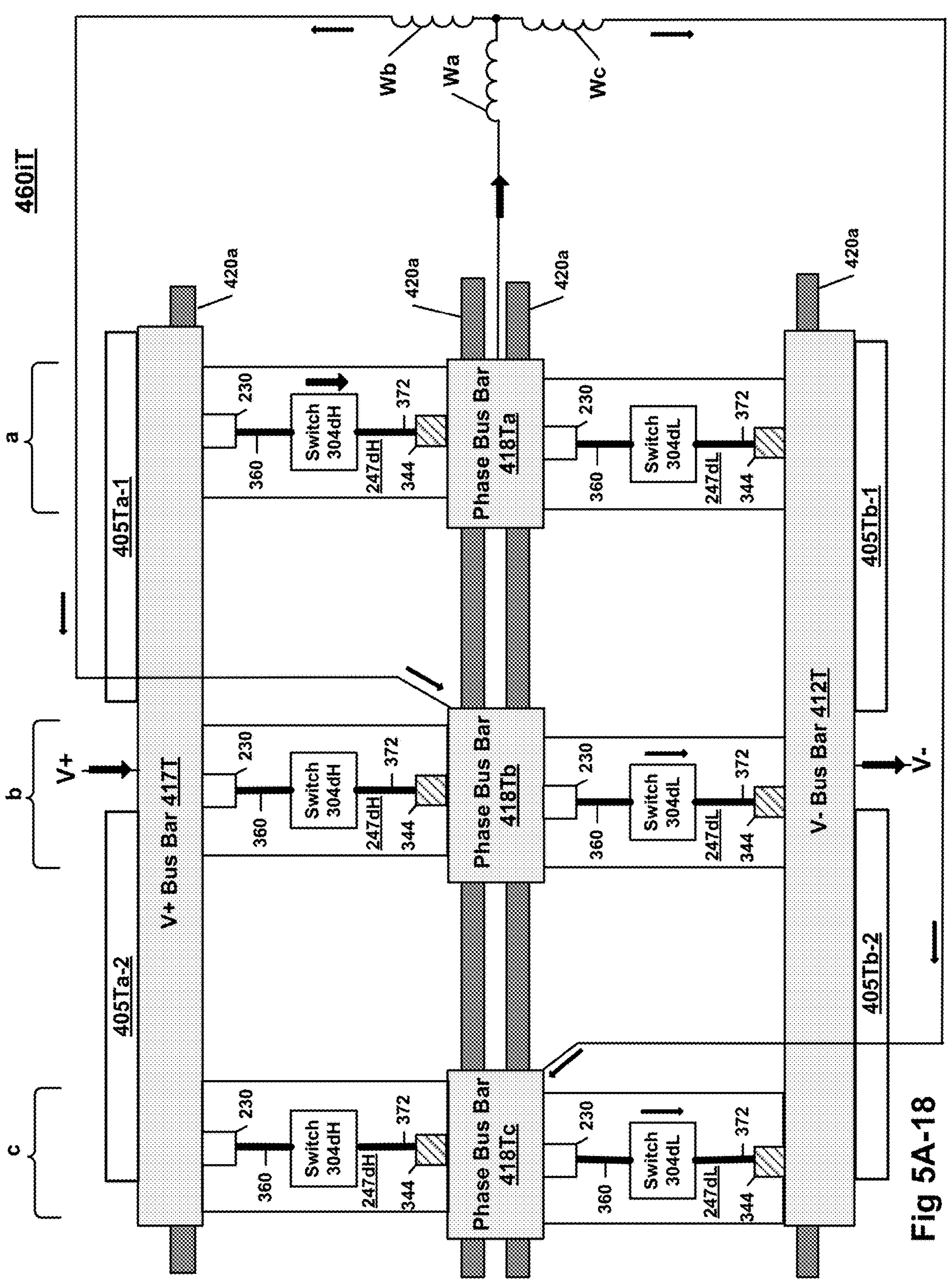
Figures 5, 5A, 6, 7, 8, 9, 10, 11, 12, 13, 14, 15, 16, 17, 18, 19:
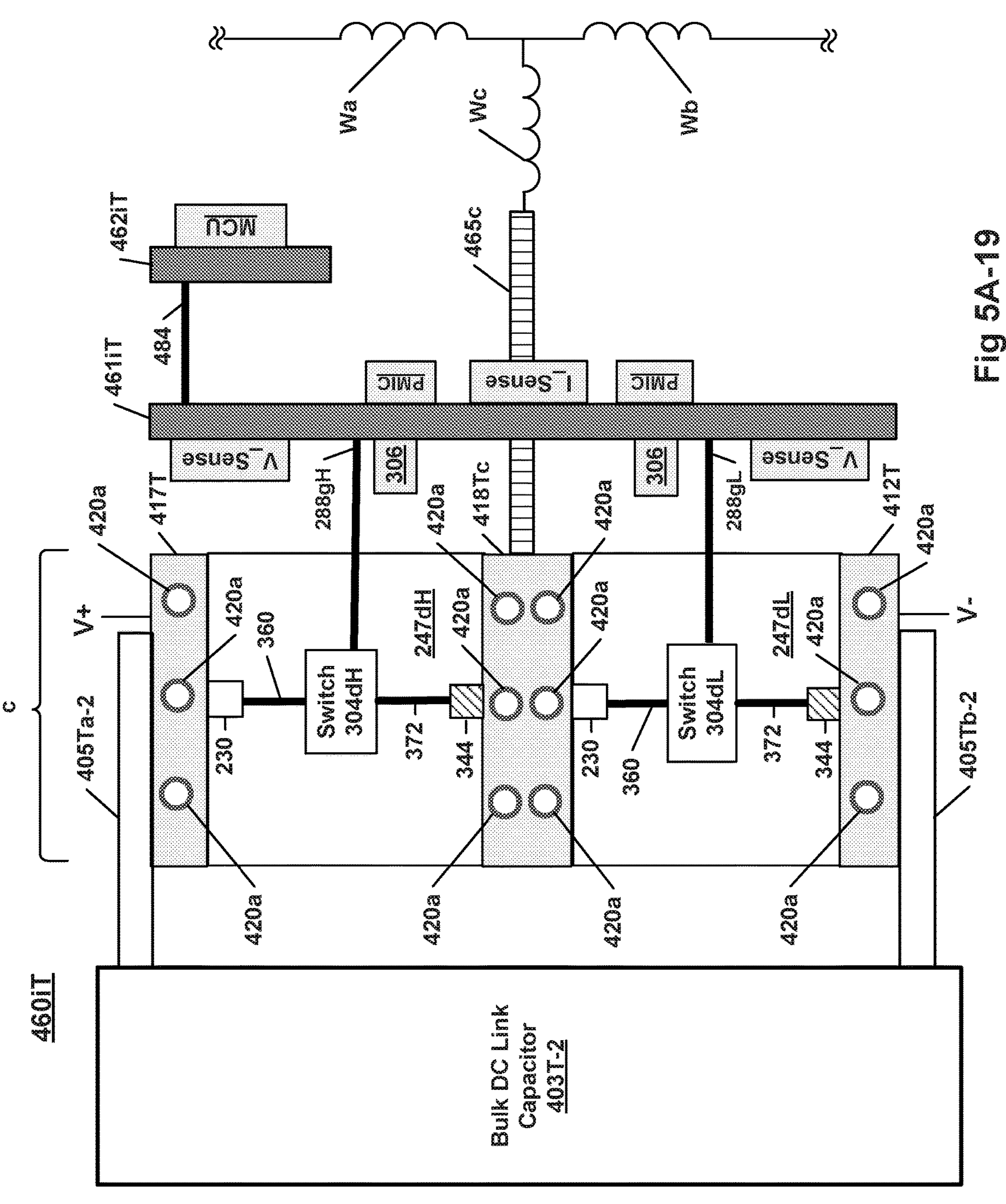
Figures 5, 5A, 6, 7, 8, 9, 10, 11, 12, 13, 14, 15, 16, 17, 18, 19, 20:
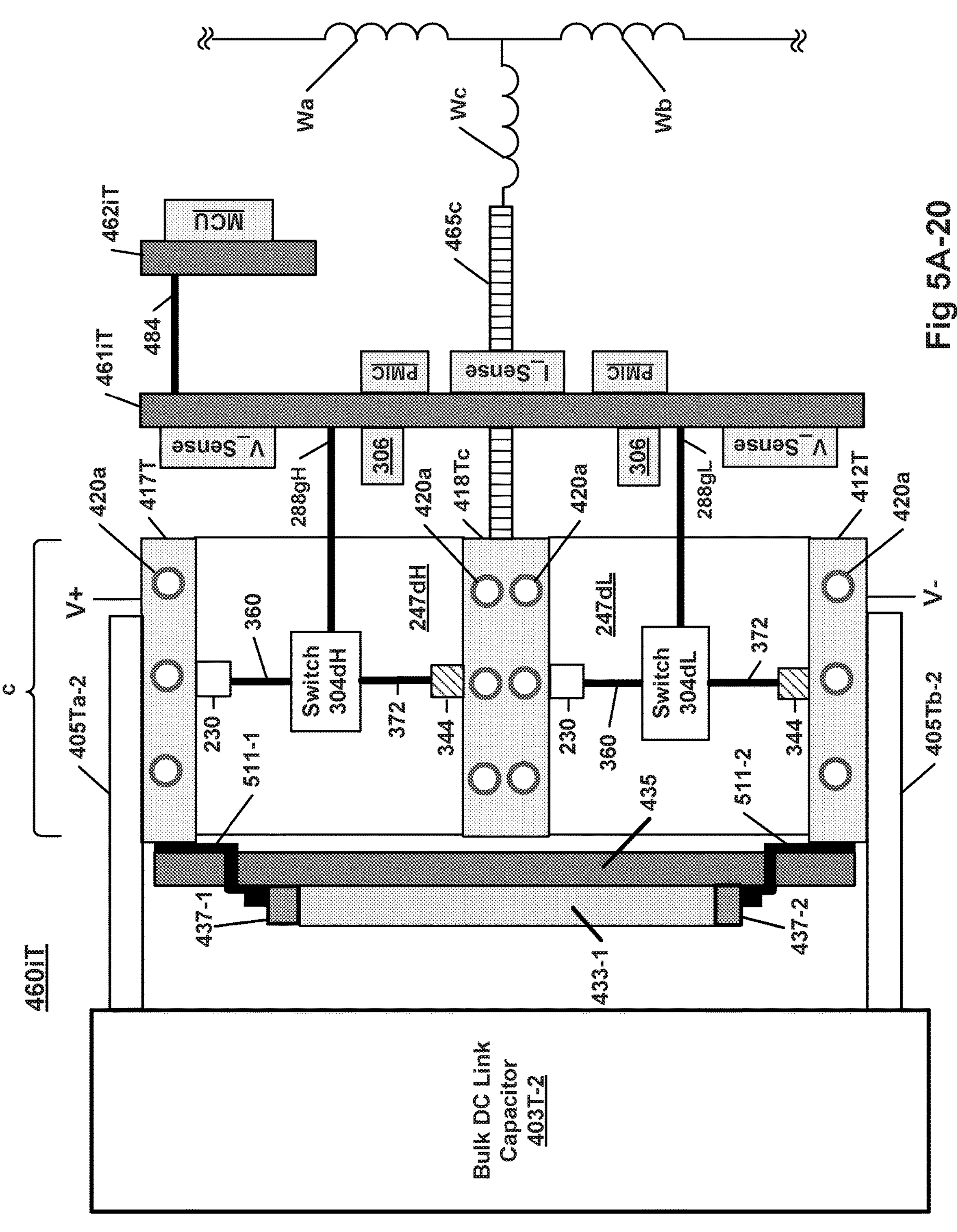
Figures 5, 5A, 6, 7, 8, 9, 10, 11, 12, 13, 14, 15, 16, 17, 18, 19, 20, 21:
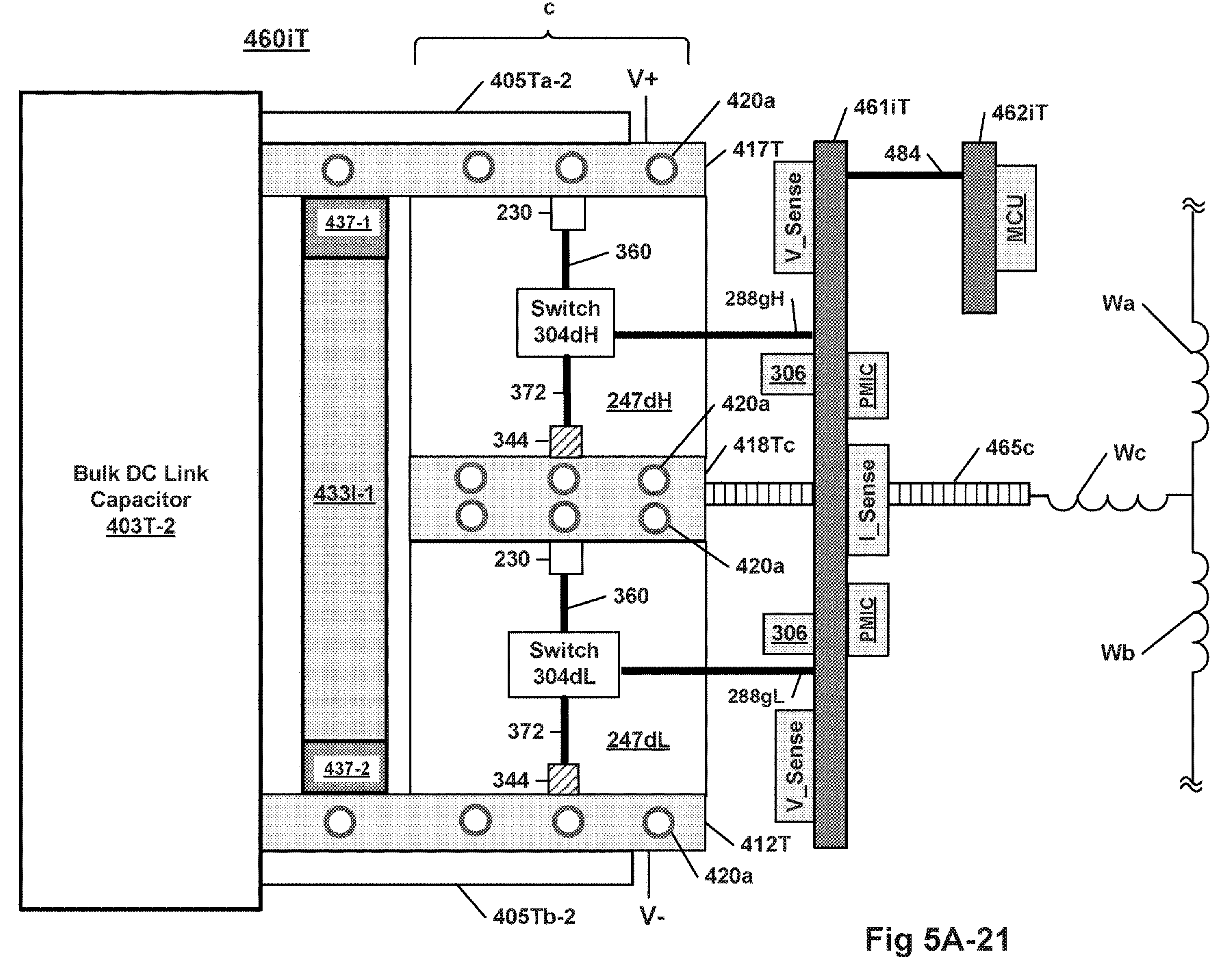
Figures 5, 5A, 6, 7, 8, 9, 10, 11, 12, 13, 14, 15, 16, 17, 18, 19, 20, 21, 22:
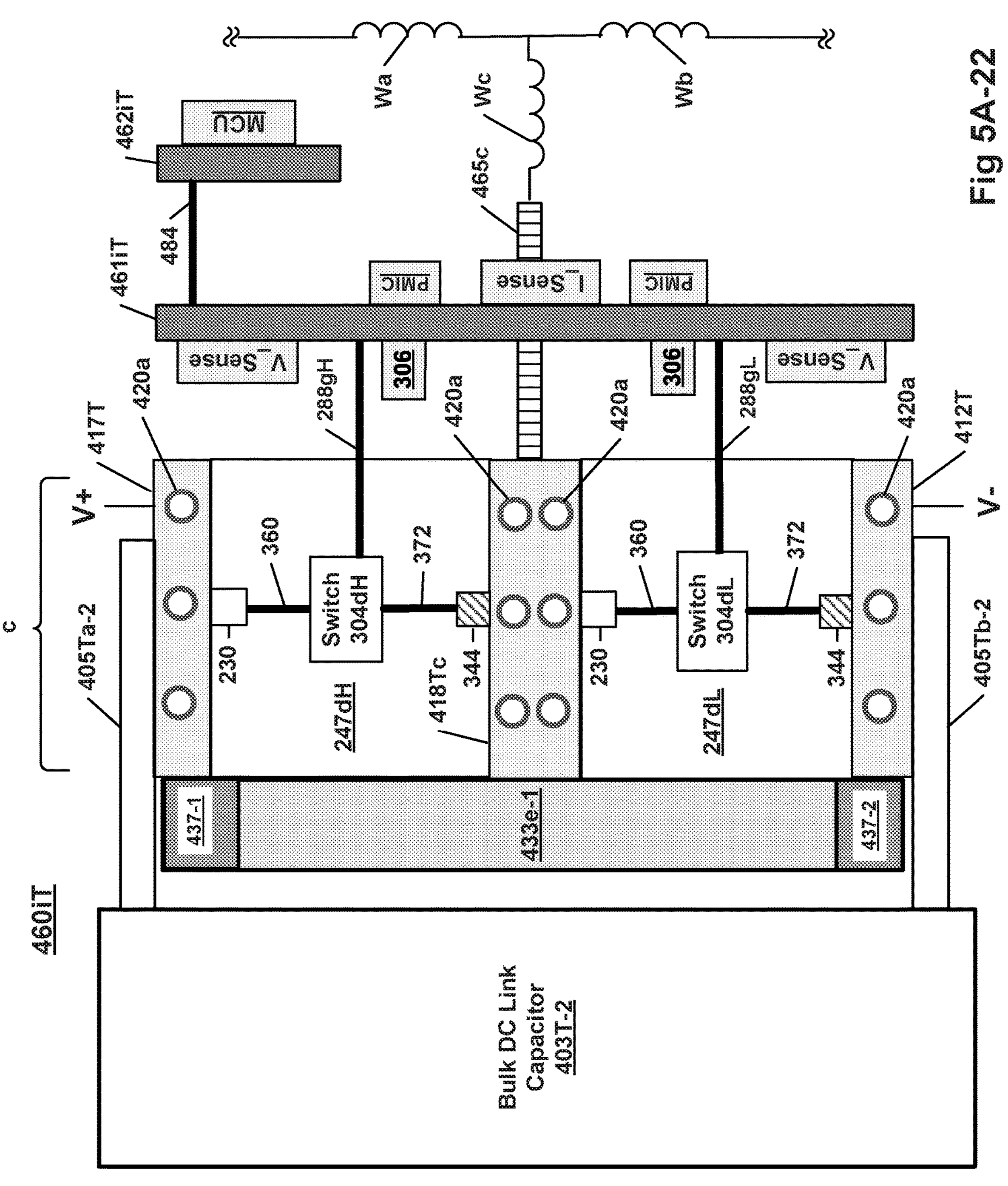
Figures 5, 5A, 6, 7, 8, 9, 10, 11, 12, 13, 14, 15, 16, 17, 18, 19, 20, 21, 22, 23:
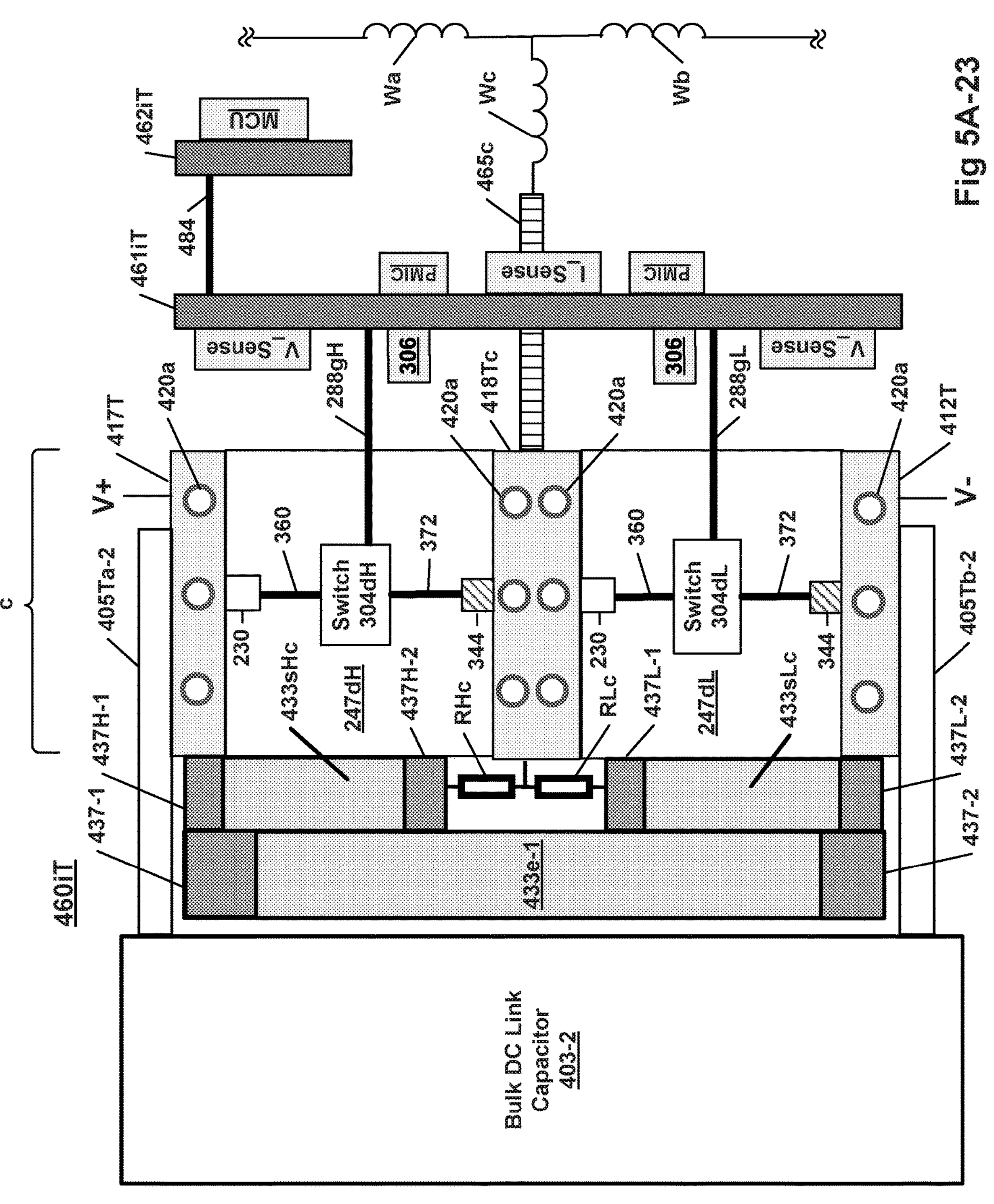
Figures 5, 5A, 6, 7, 8, 9, 10, 11, 12, 13, 14, 15, 16, 17, 18, 19, 20, 21, 22, 23, 24:
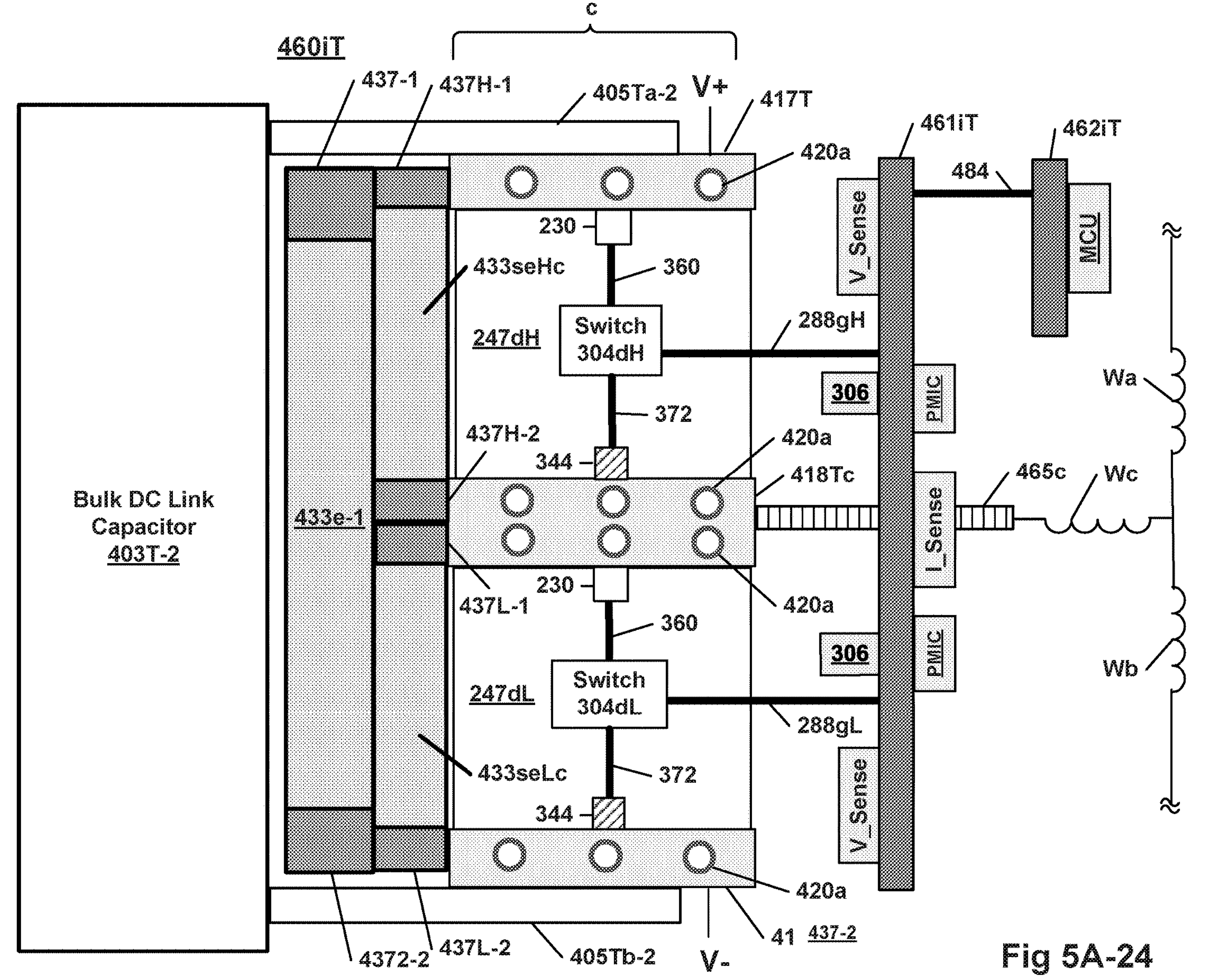
Figures 5, 5A, 6, 7, 8, 9, 10, 11, 12, 13, 14, 15, 16, 17, 18, 19, 20, 21, 22, 23, 24, 25:
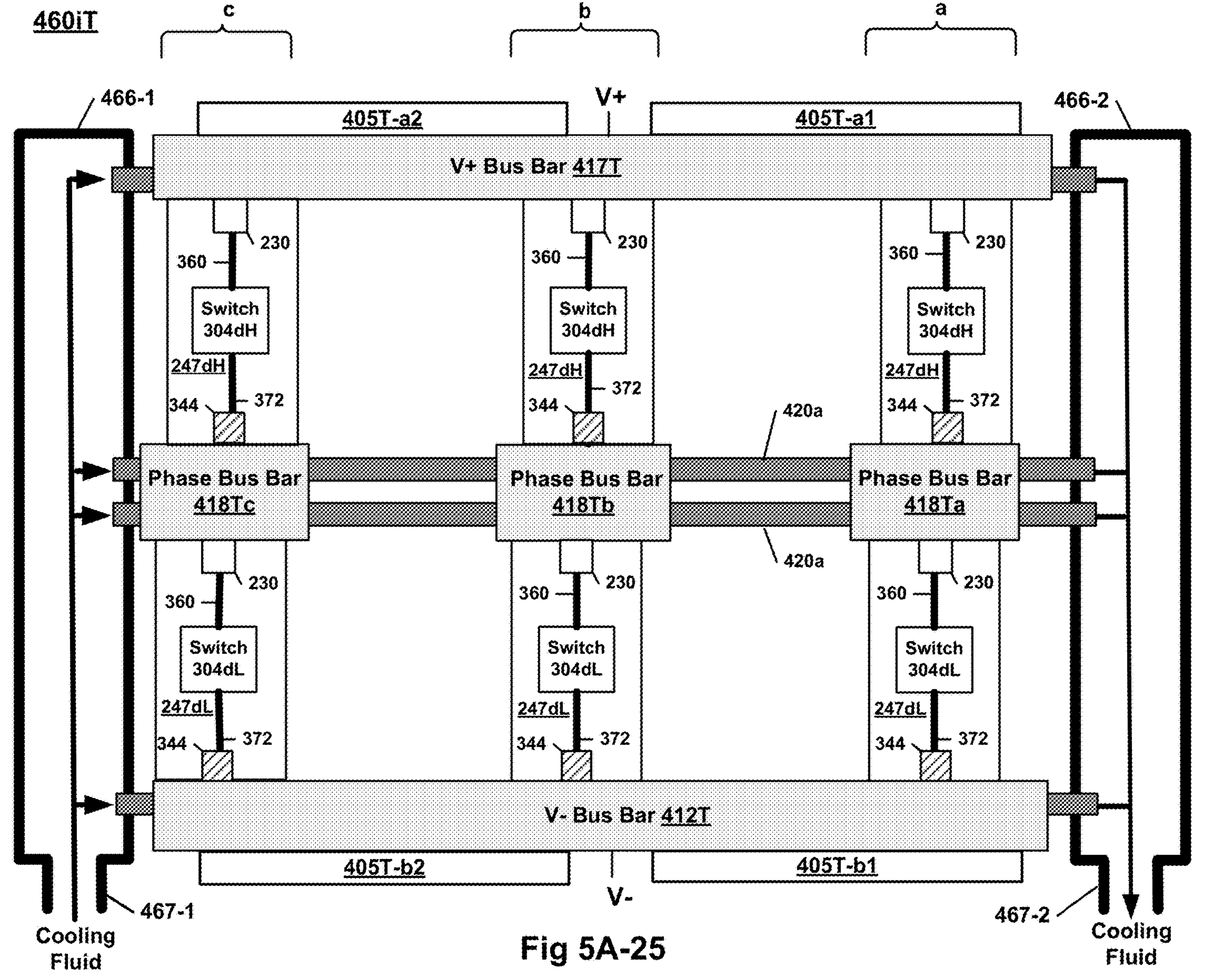
Figures 5, 5A, 6, 7, 8, 9, 10, 11, 12, 13, 14, 15, 16, 17, 18, 19, 20, 21, 22, 23, 24, 25, 26:
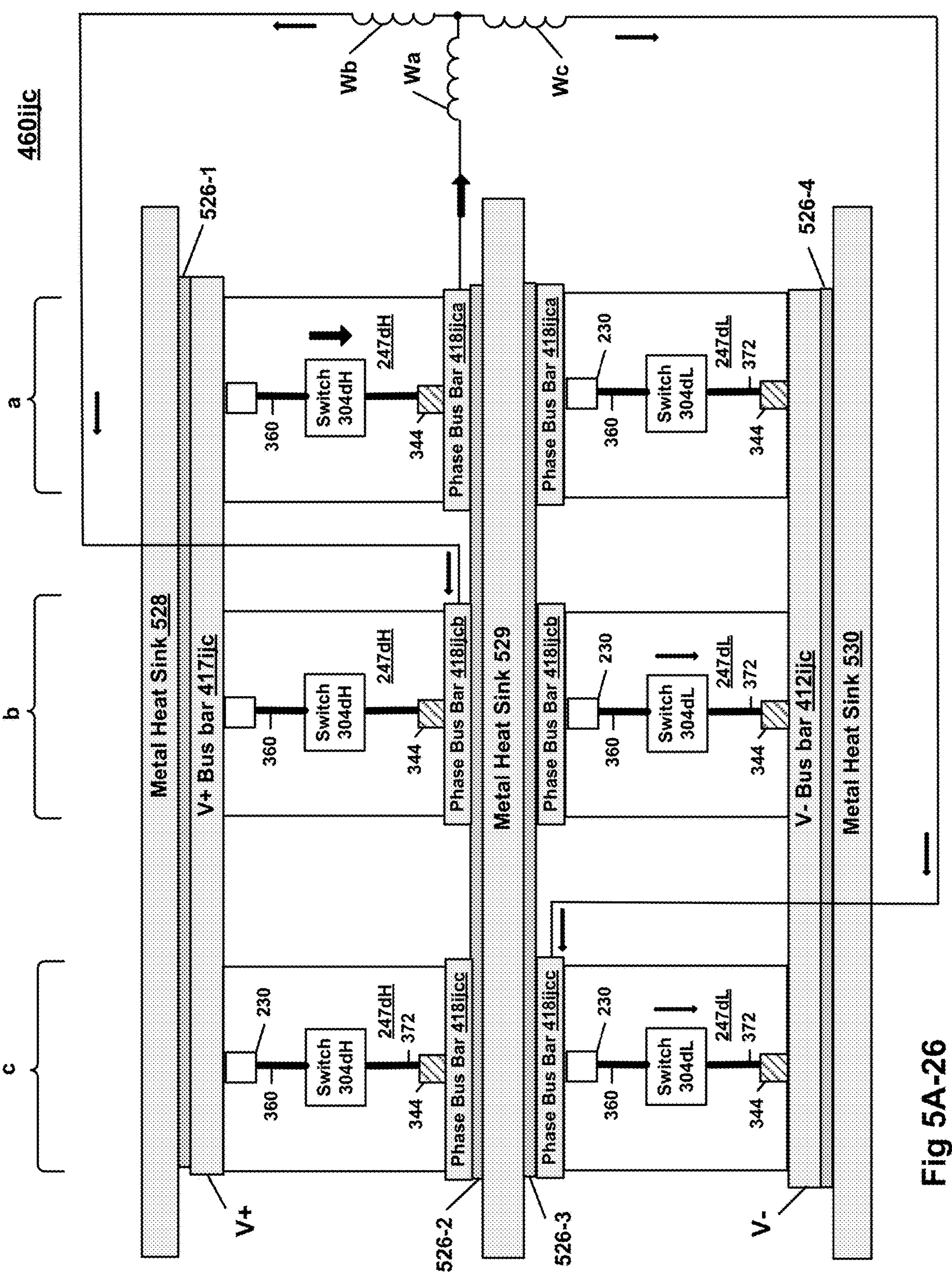
Figures 5, 5A, 6, 7, 8, 9, 10, 11, 12, 13, 14, 15, 16, 17, 18, 19, 20, 21, 22, 23, 24, 25, 26, 27:
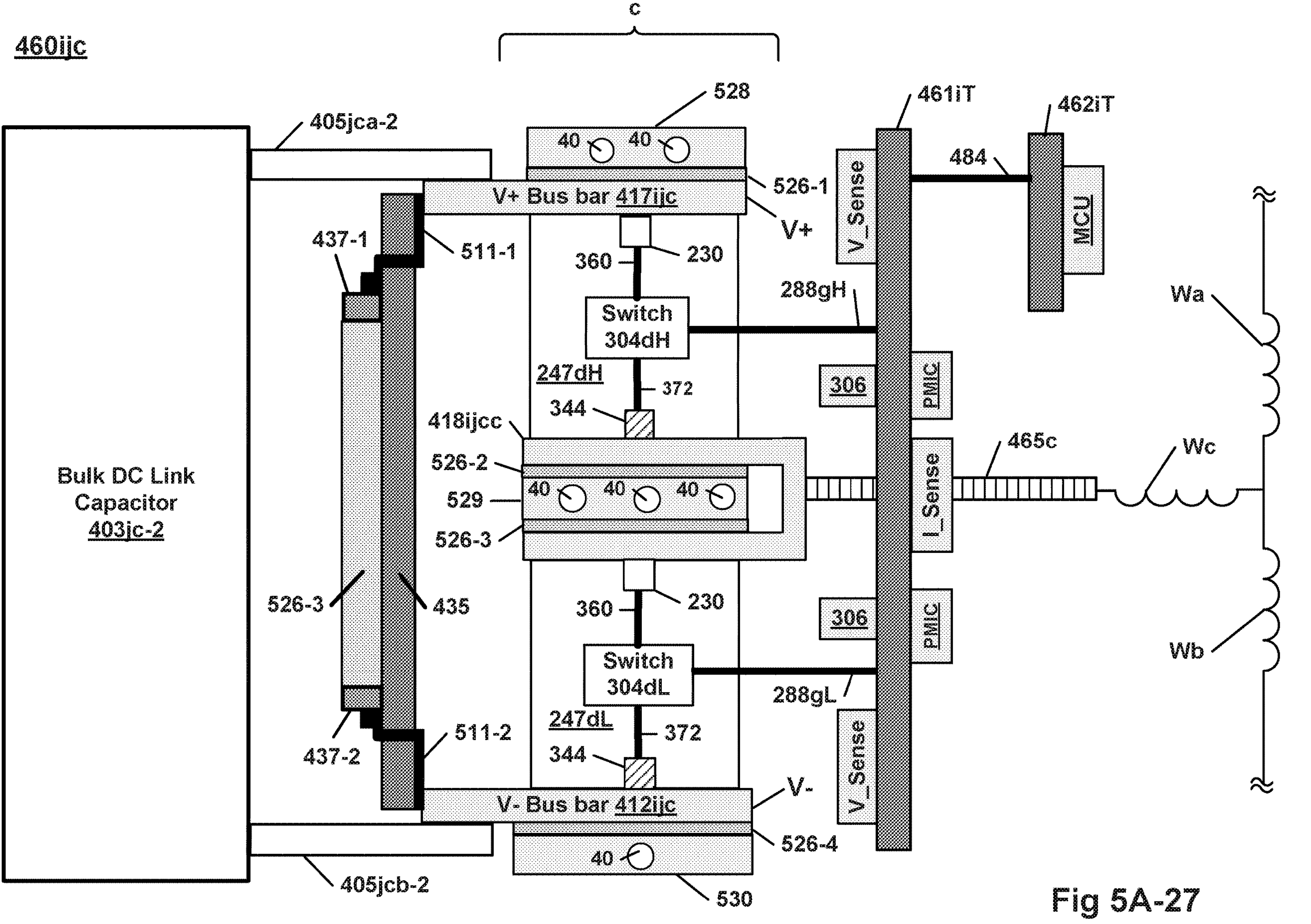

FIGS. 5A-1 and 5A-2 illustrate relevant components of an example inverter 460*i*T when seen from the front and side, respectively. Several components (e.g., driver PCB 461*i*, control PCB 462*i*, and DC link capacitors 403T) shown in FIG. 5A-2 are not shown or fully shown in FIG. 5A-1 but are described below.

Converters and other power systems of this disclosure may employ packaged switches 247 described above. Example inverter 460*i*T is shown with packaged switches 247*d*, it being understood that in an alternative version switches 247*d* can be replaced with packaged switches 247*p* or packaged switches 247*q*. All packaged switches 247*d* of inverter 460*i*T may be the same. Packaged switches 247*d* of inverter 460*i*T may be packaged switch 247*d*A, 247*d*B, or 247*d*D of FIGS. 3A, 3B, and 3D, respectively.

A converter or other power system may use one or more bus bars to distribute electric current to switches 304 or diodes D. Inverter 460*i*T includes V+ bus bar 417T, V− bus bar 412T, and phase bus bars 418T. Bus bars, like V+ bus bar 417T, V− bus bar 412T, and phase bus bars 418T, may also act as heat sinks to cool switches 304 or diodes D as will be more fully described below. Case surfaces of packaged switches 247, like packaged half bridges 247*d* in FIG. 5A-1, may be thermally connected to flat surfaces of bus bars, like V+ bus bar 417T, V− bus bar 412T, and phase bus bars 418T.

A converter may have one or more phases. Inverter 460*i*T has three phases designated a-c. Each phase in FIG. 5A-1 includes packaged switches 247*d*H and 247*d*L that are electrically and thermally connected to a phase bus bar 418T, which in combination is sandwiched between V+ bus bar 417T and V− bus bar 412T. Packaged switches 247*d*H and 247*d*L are also electrically and thermally connected to V+ bus bar 417T and V− bus bar 412T, respectively.

The volume of converters and other power systems may be conserved by stacking packaged switches and bus bars. FIG. 5A-1 illustrates the linear positioning of packaged switches 247*d*, V+ bus bar 417T, phase bus bars 418T, and V− bus bar 412T with respect to each other. Packaged switches 247*d*H in FIG. 5A-1 may have die substrate terminals 230 that are electrically and thermally connected (e.g., sintered, press-fitted, etc.) to a flat surface or respective flat surfaces of V+ bus bar 417T, and die clip terminals 344 that are electrically and thermally connected (e.g., sintered, press-fitted, etc.) to flat surfaces of respective phase bus bars 418Ta-418Tc, which in turn may be electrically connected to windings Wa-Wc, respectively. Packaged switches 247*d*L in FIG. 5A-1 may have die substrate terminals 230 that are electrically and thermally connected (e.g., sintered, press-fitted, etc.) to flat surfaces of respective phase bus bars 418*a*-418*c*, and die clip terminals 344 that are electrically and thermally connected (e.g., sintered, press-fitted, etc.) to a flat surface or respective flat surfaces of V− bus bar 412T.

Bus bars, like V+ bus bar 417T, V− bus bar 412T, and phase bus bars 418T in FIGS. 5A-1 and 5A-2, may have a rectangular cross-section. Example phase bus bars 418T may have a height, width, and length around 12 mm, 29 mm, and 35 mm, respectively. Example V+ bus bar 417T and V− bus bar 412T may have a height, width, and length around 8 mm, 29 mm, and 100 mm, respectively. Bus bars may have different dimensions to accommodate differences in converter design.

Different materials expand at different rates when heated. Materials such as solder or silver sintering paste could be used to attach die substrate or die clip terminals to bus bars, for example, but the attachment materials may crack when heated or cooled due to mismatches in CTEs (coefficients of thermal expansion). A mechanical structure (e.g., a clamp) can press-fit die substrate terminals 230 and die clip terminals 344 against respective flat surfaces of bus bars. Press-fitting may reduce or eliminate problems related to mismatched CTEs. Ideally, the surfaces of components that are pressed together should be smooth to optimize electrical and thermal conduction therebetween. A grease or similar material may added to increase electrical and thermal conduction between press-fitted components.

Although not shown in the figures, die substrate terminals 230 or die clip terminals 344 may be electrically and thermally connected to flat surfaces of respective bus bar pedestals, which in turn are electrically and thermally connected to and extending from a heat sink, bus bar, or a bus bar that also acts as a heat sink. A bus bar pedestal surface may be slightly smaller in shape to a surface of a connected terminal 230 or 344, which may be flush with or positioned slightly below a case surface of a packaged switch 247 or packaged diode 245 in which it is contained. Heat and/or electrical current may be transferred between terminal 230 or 344 and its connected bus bar pedestal. Although not required, a thin layer of thermally and/or electrically conductive grease or other material could be applied between a terminal 230 or 344 and its connected bus bar pedestal surface to enhance thermal and/or electrical conductivity when they are pressed together.

In general heat sinks and bus bars that also act as heat sinks may contain one or more channels through which a cooling fluid can flow. Channels can receive and hold metal conduits, which in turn have their own channel(s) through which the cooling fluid may flow.

Bus bar or heat sink channels may be rectangular, oval, square, etc., in cross section, and conduits received in the channels should have a similar cross-sectional shape. It is presumed bus bar or heat sink channels are circular (i.e., round) in cross section, and that the conduits they hold are also circular in cross section, it being understood the present disclosure should not be limited thereto. Thus, conduits are presumed to be round tubes, it being understood that tubes of other shapes (e.g., oval) are contemplated. The round tubes (hereinafter tubes) may have an outer diameter that is substantially equal to the diameter of the channels in which they are received. Tubes can be in fluid communication with a pump or other devices.

Each bus bar or heat sink in a converter may have one or more rows of channels for receiving tubes. Each of V+ bus bar 417T and V− bus bar 412T has a single row of three channels 40 that can receive tubes, and phase bus bars 418T has two rows of three channels 40 that can receive tubes. In an alternative version, phase bus bar 418T may have only one row of channels. All channels in a converter may have the same dimensions (e.g., diameter). In an alternative version, channel dimensions may vary in a bus bar or heat sink, or between bus bars in a converter.

Each bus bar or heat sink in a converter may have the same number of channel rows. For example, each bus bar in a converter may have only one row of channels. The number of rows may differ between bus bars or heat sinks in a converter. For example, phase bus bars in a converter may have two rows of channels, while each of the DC bus bars (e.g., V+ bus bar and V− bus bar) has one row of channels.

Each row in a converter may have the same number or channels. The number of channels in rows may differ in or between bus bars or heat sinks in a converter. For example, a V− bus bar in a converter may have one row of two channels, while a V+ bus bar in the converter may have one row of three channels, or vice versa. A V− bus bar in a converter may have one row with one channel, a V+ bus bar in the converter may have one row of two channels, and a phase bus bar positioned between the V+ and V− bus bars may have one row of three channels. A bus bar (e.g., a phase bus bar) may have two rows of channels, the first row having two channels and the second row having three channels.

To enhance heat transfer, channels may be positioned near (e.g., within 8, 4, 3 mm or less) to the surface of the bus bar that is connected (e.g., sintered) to die clip or die substrate terminals. Channels extend parallel to the long axis of heat sinks or bus bars. In an alternative version, channels could extend perpendicular to the long axis of heat sinks or bus bars. The remaining disclosure will presume that channels extend parallel to the long axis of heat sinks or bus bars that also act as heat sinks, it being understood the present disclosure should not be limited thereto.

Example Tubes

Bus bar channels can receive tubes. When received, the outer cylindrical surfaces of tubes can be thermally connected to cylindrical surfaces of bus bar channels. A thermally conductive material (e.g., a thermally conductive grease) may be used to enhance the thermal conduction between tubes and the cylindrical surfaces of bus bar channels in some versions.

Bus bar channels can receive tubes that are composed of one or more materials. Tubes can efficiently transfer heat to a cooling fluid flowing through the tubes. Tubes can electrically isolate bus bars from a non-dielectric cooling fluid that flows through the tubes. Tubes (e.g., aluminum nitride tubes) can electrically isolate phase bus bars in a converter. A tube itself may be formed of a dielectric material (e.g., aluminum nitride) and act as a medium for heat transfer. Where a tube is made of a dielectric material of high thermal conductivity, the tube can be used as a scaffold for a subsequent metal layer that may provide a better electrical and/or thermal connection to a surface of a bus bar channel in which the tube is received. This may allow for processes for connecting (e.g., soldering, sintering, brazing, welding etc.) of the tube to the wall surface of the bus bar channel in which the tube is received. These connecting processes may increase thermal and/or electrical conductivity between the tube and the bus bar. In the case of tubes formed of two or more materials, one layer (e.g., primarily a metal) may act as a scaffold for a subsequent layer of dielectric material. A third layer of metal may be formed on the subsequent dielectric layer to allow for connecting processes.

FIGS. 5A-3-5A-17 show example tubes 420*a*-420*w* that may be received in bus bar channels. FIG. 5A-3 shows cross-sectional views of example tubes 420*a*-420*c* that may be formed (e.g., extruded, hot pressed, cast, isostatic pressed, grown, etc.) from a thermally conductive dielectric material such as aluminum nitride. A thin (e.g., 0.05-1.0 mm) layer of metal may be formed on substantially all the outer cylindrical surface of a tube. Tubes 420*a*-420*c* are bare. In other words, no metal layer is formed on the outer surfaces of tubes 420*a*-420*c*. FIG. 5A-4 shows cross-sectional views tubes 420*d*-420*f*, which are tubes 420*a*-420*c*, respectively, after a thin layer of metal 407 is formed on substantially all the outer surfaces. Metal 407 layer could be formed using any one of many methods such as chemical vapor deposition, physical vapor deposition or spraying, roll coating, pad printing, etc. After the metal layer 407 is formed, the tube may be heated before it is added to a channel 40.

Metal layer 407 may be formed on only selected portions of the outer surface of a dielectric tube. For example, a thin layer of metal may be formed on only those portions of a dielectric tube for connection to surfaces of respective phase bus bar channels. FIG. 5A-10 is a side view of tube 420*a*-1, which is dielectric tube 420*a* with a thin metal layer 407 formed on selected portions of the tube's outer surface. Tube 420*a*-1 may be received in aligned cylindrical channels of three phase bus bars. The cylindrical surfaces of the three aligned channels can be thermally and electrically connected to respective surfaces of metal layers 407 formed on tube 420*a*-1. The three phase bus bars with commonly received tube 420*a*-1 will be electrically isolated from each other. FIG. 5A-12 is a side view of tube 420*a*-3, which is dielectric tube 420*a* with a thin metal layer 407 formed only on end portions.

FIG. 5A-6 shows cross-sectional views of example tubes 420*j*-420*l*, which may be formed (e.g., extruded, cast, hot pressed, powder compacted, 3D printed, etc.) from a metal such as copper or aluminum. A thin layer (e.g., 0.05-1.0 mm) of dielectric material (e.g., aluminum oxide, aluminum nitride, silicon nitride, chemical vapor deposited diamond coating, etc.) may be formed on substantially all a tube's inner and/or outer cylindrical surface. FIGS. 5A-7 show cross-sectional views of example tubes 420*m*-420*o*, which are the metal tubes 420*j*-420*l*, respectively, with a thin layer of dielectric 422 formed on substantially all the outer cylindrical surfaces.

A thin layer of dielectric 422 could be formed on only selected portions of outer cylindrical surfaces of metal tubes in some versions. For example, a thin layer of dielectric may be formed on only those portions of a metal tube for connection to cylindrical surfaces of respective phase bus bar channels. FIG. 5A-13 is a side view of tube 420*j*-1, which is metal tube 420*j* with a thin dielectric layer 422 formed on selected portions of the tube's outer surface. Tube 420*j*-1 may be received in aligned cylindrical channels of three phase bus bars. Cylindrical surfaces of the three aligned channels can be connected to respective surfaces of dielectric layers 422. The three phase bus bars with commonly received tube 420*j*-1 will be electrically isolated from each other.

Before tubes are received in bus channels, a thin connecting layer of solder, sinter material, braze material, etc., may be deposited on substantially all the outer surfaces. FIG. 5A-5 shows cross-sectional views of example tubes 420*g*-420*i*, which may be formed by depositing a thin connecting layer 422 of solder, sinter material, braze material, etc., on substantially all the outer surfaces A thin connecting layer 441 may also be formed on substantially all the outer surfaces of tubes 420*m*-420*o*, but before the thin connecting layer is formed, a thin metal layer may be formed on substantially all of the dielectric layer 422. FIG. 5A-8 shows cross-sectional views of example tubes 420*p*-420*r*, which may have tubes 420*m*-420*o*, respectively, after a thin metal layer 442 is formed on substantially all of the surface of dielectric layer 422. FIG. 5A-9 shows cross-sectional views of example tubes 420*s*-420*u*, which may be tubes 420*p*-420*r*, respectively, after a thin connecting layer 441 is formed on substantially all of the surface of metal layer 442.

A connecting layer 441 may be formed on only selected portions of a tube. For example, a thin connecting layer may be formed on only those portions of a tube that connect to cylindrical surfaces of respective phase bus bar channels. FIG. 5A-11 is a side view of tube 420*a*-2, which is dielectric tube 420*a*-1 with thin connecting layers 441 formed on respective metal layers 407. Tube 420*a*-2 may be received in aligned cylindrical channels of three phase bus bars. Cylindrical surfaces of the three aligned channels can be thermally and electrically connected to respective surfaces of connecting layers 441 formed on tube 420*a*-2. The three phase bus bars with commonly received tube 420*a*-2 will be electrically isolated from each other.

Thin connecting layers 441 may also be formed on the surfaces of dielectric layers 422 of tube 420*j*-1, but before the thin connecting layers are formed, thin metal layers may be formed on the surfaces of dielectric layers 422. FIG. 5A-14 is a side view of tube 420*j*-2, which is dielectric tube 420*j*-1 with thin metal layers 442 formed on respective dielectric layers 422. FIG. 5A-15 is a side view of tube 420*j*-3, which is dielectric tube 420*j*-2 with thin connecting layers 441 formed on respective metal layers 442. Tube 420*j*-2 may be received in aligned cylindrical channels of three phase bus bars. Cylindrical surfaces of the three aligned channels can be thermally and electrically connected to respective surfaces of connecting layers 441 formed on tube 420*j*-2. The three phase bus bars with commonly received tube 420*j*-2 will be electrically isolated from each other.

Tubes may be assembled from individually formed components. FIGS. 5A-16 and 5A-17 show an insert 443 in cross section that may be formed (e.g., extruded) from metal or dielectric material. Insert 443 may have a length that is substantially equal to tube 420*a* or 420*j*, which are also shown in FIGS. 5A-16 and 5A-17. Insert 443 can be inserted into tube 420*a* or 420*j*. Insert 443 may have rounded ends. When inserted, surfaces of the rounded ends can connect to the inner cylindrical surface of tubes 420*a* or 420*j* to create tubes 420*v* and 420*w*, respectively.

A dielectric layer 422 formed on an outer cylindrical surface of a tube may be the only dielectric in a thermal path between switch 304 and cooling fluid in the tube. In an alternative version, a thin layer of dielectric may be formed on a tube's cylindrical inner surface. In this version the layer may be the only dielectric in a thermal path between switch 304 and fluid in the tube. In yet another version thin layers of dielectric may be formed on both the inner and outer cylindrical walls of a tube. These two dielectric layers may be the only dielectrics in a thermal path between switch 304 and fluid in the tube.

A dielectric tube (e.g., 420*a*, 420*b*, or 420*c*) or dielectric layer 422 on a metal tube may electrically insulate cooling fluid in the tube from a bus bar in which the tube is received. A dielectric tube or a dielectric layer 422 should have a high dielectric strength (e.g., 1-10 k V). Dielectric layer 422 may be thin (e.g., 3.0, 5.0, 10.0, 50.0, 100.0, 200.0, 250.0 μm or more). Dielectric layer 422 is presumed to be around 200.0 μm, it being understood the layer may be thinner or thicker in other versions. The thickness of a dielectric tube wall or dielectric layer 422 affects the heat transfer to the cooling fluid. The table below includes a calculated heat transfer W for dielectric layer 422 of different materials and thicknesses. W is proportional to k·A·(T1−T2)/d, where k is the thermal conductivity, A is area, ΔT=70 is the temperature difference across the dielectric layer, and d is the thickness in micrometers. A voltage of 4 k V is presumed across the dielectric for the calculated heat transfer W.

| | Thermal Conductivity | Dielectric Strength | Thickness Requirement (@4000 V) | | Heat Transfer (W) (@ΔT-° C., area-cm²) | |
|---|---|---|---|---|---|---|
| | (W/mK) | (kV/mm) | (μm) | (mils) | (W) | ΔT = 70 A = 1 |
| $Al_2O_3$ | 24.0 | 16.9 | 236.7 | 9.3 | 710 | |
| $Si_3N_4$ | 90.0 | 12.0 | 333.3 | 13.1 | 1,890 | |
| AlN | 170.0 | 16.7 | 239.5 | 9.4 | 4,968 | |
| BN-Hex | 30.0 | 40.0 | 100.0 | 3.9 | 2,100 | |
| AlN + AO (50/50) | 92.0 | 26.6 | 150.5 | 5.9 | 4,279 | |
| AlN + AO (75/25) | 126.0 | 21.7 | 184.7 | 7.3 | 4,775 | |
| HBN + AO (50/50) | 27.5 | 35.7 | 112.0 | 4.4 | 1,718 | |
| Diamond | 1500.0 | 1000.0 | 4.0 | 0.2 | 2,625,000 | |
| Epoxy | 4.0 | 19.7 | 203.0 | 8.0 | 138 | |
| Teflon | 0.3 | 60.0 | 66.7 | 2.6 | 34 | |
| HDPE | 0.2 | 20.0 | 200.0 | 7.9 | 7 | |
| Nylon | 0.3 | 14.0 | 285.7 | 11.2 | 6 | |
| Rubber | 0.1 | 12.0 | 333.3 | 13.1 | 3 | |
| Phenolic | 0.2 | 6.9 | 579.7 | 22.8 | 2 | |
| Polyamide | 0.3 | 55.0 | 72.7 | 2.9 | 29 | |
| Polycarbonate | 0.2 | 38.0 | 105.3 | 4.1 | 15 | |
| Liquid Crystal Polymer | 1.6 | 25.6 | 156.3 | 6.2 | 72 | |

A dielectric layer 422 may be formed by spraying (e.g., plasma spraying or flame spraying) a dielectric material on the outer cylindrical surface of tubes. A dielectric layer 422 may be formed by rolling a tube in a dielectric material (e.g., a TIM). A dielectric layer 422 can be formed on the outer cylindrical surface of tubes by CVD, PVD, coating (pad printing, brushing, dipping, electro-depositing (in the case of porcelain enamels or electrostatic painting) etc., and heated). A dielectric layer 422 can be formed by wrapping a thin (e.g., 3.0, 5.0, 10.0, 50.0, 100.0, 200.0, 250.0 μm or more) dielectric film around an outer surface of a tube.

In another version, a dielectric layer 422 may be grown on the outer and/or inner cylindrical surfaces of tubes. For example, a dielectric layer 422 may be grown on the inner and/or outer cylindrical surface of aluminum tubes 420*j*-420*l* using plasma electrolysis oxidation, or by using a type II or III hard anodizing process. A tube can have multiple dielectric layers. For example, a thin layer (e.g., 3.0, 5.0, 10.0, 50.0, 100.0 μm or more) of dielectric material (e.g., aluminum nitride) may be formed on the outer cylindrical surface of a metal tube after the tube's outer surface is anodized. Other processes for forming a dielectric layer or dielectric layers are contemplated.

Anodization is an electrolytic passivation process for creating or increasing the thickness of a natural oxide layer on the surface of metal parts. Anodization builds up an oxide on the surface of the metal part as well as into the metal too, about half and half. The resulting oxide layer is electrically insulating. The oxide layer may be grown by passing a direct current through an electrolytic solution, typically sulphuric acid, or chromic acid, in which all or a part of the metal part (e.g., a tube) is suspended and exposed. The metal part serves as the anode (the positive electrode in an electrolytic cell). Current flow through the electrolytic solution releases hydrogen at the cathode (the negative electrode) and oxygen at the surface of the metal part, creating a build-up of the oxide. The voltage required may range from 1 to 300 V DC. Higher voltages are typically required for thicker oxide coatings formed in sulfuric and organic acid. The anodizing current varies with the overall area of the metal part sections being anodized and typically ranges from 30 to 300 A/m2. Conditions such as electrolyte concentration, acidity, solution temperature, and current may be controlled to allow the formation of a consistent oxide layer. Harder, thicker oxide layers tend to be produced by more concentrated solutions at lower temperatures with higher voltages and currents.

An anodizing process may be used for growing a dielectric layer of oxide on the outer and/or inner cylindrical surfaces of aluminum tubes. The tube serves as the anode for the process. Current flows through the electrolytic bath solution in which some or all the tube is suspended, and releases hydrogen at the cathode (the negative electrode) and oxygen at the outer and/or surface of the tube, creating a build-up of the oxide. The anodizing process may be used to grow dielectric layer, such as dielectric layer 422, on only the outer surface of aluminum tubes, such as tubes 420*j*-420*l*, employed in rectifiers or inverters.

Plasma electrolytic oxidation (PEO) is another electrochemical surface treatment process for growing insulating layers on metal tubes. It is like anodizing, but it typically employs higher potentials, so that discharges occur, and the resulting plasma modifies the structure of the oxide layer. This process may be used to grow thick (50, 100, 200, 250, 300 μm or more), largely crystalline, oxide coatings on tubes made of metals such as aluminum, magnesium, and titanium. The coating is a chemical conversion of the metal into oxide and grows both inwards and outwards from the original metal surface. In plasma electrolytic oxidation of aluminum, at least 200 V should be applied. This locally exceeds the dielectric breakdown potential of the growing oxide film, and discharges occur. These discharges result in localized plasma reactions, with conditions of high temperature and pressure which modify the growing oxide. Processes may include melting, melt-flow, re-solidification, sintering and densification of the growing oxide. One of the most significant effects is that the oxide is partially converted from amorphous alumina into crystalline forms such as corundum (α-Al2O3) which is much harder. Plasma electrolytic oxidation includes immersing a tube in a bath of electrolyte, which usually consists of a dilute alkaline solution such as KOH. The tube is electrically connected to become one of the electrodes in an electrochemical cell, with the other electrode typically being made from an inert material such as stainless steel, and often consisting of the wall of the bath itself. Potentials over 200 V may be applied between these two electrodes. Higher voltages may be used to form thicker oxide layers.

Anodization or plasma electrolysis oxidation may provide several advantages when compared to other methods (e.g., spraying a dielectric on the outer cylindrical surface of tubes, which may require smoothing to ensure a better thermally conductive interface to the bus bar channel surface in which the tube is received) for forming dielectric layer such as dielectric layer 422. For example, anodization may provide a more mechanically robust dielectric layer. The outer surface of an anodized dielectric layer may be smoother when compared to other methods, which may increase heat transfer between the heat sink or bus bar on one side of the dielectric and the tube on the other side.

Tube channels can have different cross-sectional shapes as shown in FIGS. 5A-3-5A-9. Each tube 420 includes one or more channels through which a cooling fluid can flow. Tubes 420*a*, 420*b*, 420*d*, 420*e*, 420*g*, 420*h*, 420*j*, 420*k*, 420*m*, 420*n*, 420*p*, 420*q*, 420*s*, and 420*t* include a single channel, while tubes 420*c*, 420*f*, 420*i*, 420*l*, 420*o*, 420*r*, 420*u*, 420*v*, and 420*w* include multiple channels.

Tubes 420*a*, 420*d*, 420*g*, 420*j*, 420*m*, 420*p*, and 420*s* may have a smooth cylindrical inner wall. In an alternative version, tubes 420*a*, 420*d*, 420*g*, 420*j*, 420*m*, 420*p*, and 420*s* may have a rifled inner cylindrical wall. Rifling is a process of machining helical grooves into the inner surface of a tube for the purpose of creating or increasing fluid turbulence or molecular contact.

The channel of tubes 420*b*, 420*e*, 420*h*, 420*k*, 420*n*, 420*q*, and 420*t* is "flower" shaped with a ring of small cylindrical sub-channels, which have substantially the same cross section, and which are in fluid communication with a centrally located cylindrical sub-channel that may be larger in cross section when compared to those of cylindrical sub-channels in the ring. Spoke sub-channels enable fluid communication between respective cylindrical sub-channels in the ring with the centrally located cylindrical sub-channel. Each spoke sub-channel may have any one of many cross-sectional shapes. In the illustrated version, each spoke sub-channel is substantially rectangular in cross section although square or circular cross sections are also contemplated. The flower shaped tube may provide increased heat transfer to the cooling liquid flow through the tube when compared to a tube with a flat and smooth (e.g., not rifled) inner cylindrical surface like that shown in tube 420*a*.

Tubes, regardless of whether made from a metal or a dielectric, may be constructed using three-dimensional printing techniques or an extrusion process. Extrusion is a process used to create objects of a fixed cross-sectional profile by pushing material through a die of the desired cross-section. It may be done with hot or cold material. Commonly extruded materials include metals, polymers, ceramics, etc.

Dielectric layer 422 can electrically insulate cooling fluid in a metal tube. Dielectric layer 422 can transfer heat to the cooling fluid flowing through the tube albeit with a higher thermal resistance when compared to metal such as copper. In an alternative version, no dielectric (e.g., layer 422) exists between the cooling fluid and switch 304. However, in this alternative version, the cooling fluid should be a dielectric.

Diameters of tubes in a bus bar or heat sink need not be equal. The number, position, and/or diameter of tubes in a bus bar may depend on one or more variables. For example, the number, position, and/or diameter of the tubes may depend on a desired thermal capacitance of the bus bar or heat sink in which the tubes are received. Or the number, position, and/or diameter of the tubes in a bus bar may depend on a desired thermal resistance between a switch 304 and fluid in the tubes. Or the number, position, and/or diameter of tubes in a bus bar may depend on optimizing the thermal capacitance in the bus bar.

In general, a converter's DC bus bars (i.e., V+ and V− bus bars) may receive any version of tubes 420*a*-420*u*, 420*v*, 420*w* and 420*a*-3 in their channels 40. If pure metal tubes 420*j*-420*l* are received in channels 40 of a converter's DC bus bars, the cooling fluid flowing through the tubes to extract heat should be a dielectric (e.g., air, oil, deionized water, etc.). Phase bus bars in a converter must be electrically isolated from each other. Phase bus bars in a converter may be limited to receiving tubes 420*a*-420*c*, 420*m*-420*o*, 420*a*-1, 420*a*-2, 420*a*-3, 420*j*-1, 420*j*-3, or 420*w* in their aligned channels 40 to maintain electrical isolation. FIGS. 5A-18 and 5A-19 show inverter 460*i*T of FIGS. 5A-1 and 5A-2, respectively, with dielectric tubes 420*a* received in respective bus bar channels 40. Phase bus bars 418Ta-418Tc are thermally connected to each other and electrically isolated from each other by commonly received dielectric tubes 420*a*.

All tubes 420 in FIGS. 5A-18 and 5A-19 are dielectric tubes 420*a*. A power converter may employ a mix of tube types. For example, phase bus bars in a converter, like phase bus bars 418Ta-418Tc, may commonly receive 420*a*-2, while the converter's DC bus bars, like V+ bus bar 417T and V− bus bar 412T, may receive tubes 420*h* and 420*m*, respectively. Or phase bus bars in a converter, like phase bus bars 418Ta-418Tc, may commonly receive tubes 420*n*, while the converter's DC bus bars, like V+ bus bar 417T and V− bus bar 412T, may receive tubes 420*s* and 420*u*, respectively.

Converters and other power systems may include one or more capacitors (hereinafter "DC link capacitors") that are electrically connected between DC bus bars (i.e., V+ and V− bus bars). A DC link capacitor can take form in a film capacitor (e.g., a polypropylene film capacitor). A DC link capacitor may take form in a ceramic capacitor (e.g., class 1 or class 2 multilayer ceramic capacitors). Other types of DC link capacitors may be used, including electrolytic capacitors. A converter may include a mix of DC link capacitor types. For example, a converter may include one or more thin film DC link capacitors and one or more ceramic DC link capacitors, all electrically connected in parallel between V+ and V− bus bars.

DC link capacitors can get hot. DC link capacitors can be thermally connected to V+ and/or V− bus bars. The one or more DC link capacitors of converters and other power systems may be cooled by thermal connections to DC bus bars to which they are electrically attached.

A DC link capacitor may be contained in a cuboid shaped package formed of a dielectric material such as plastic. For purposes of explanation only, each DC link capacitor of this disclosure is contained in a cuboid shaped package with substantially flat dielectric side walls. A DC link capacitor in a package may be referred to as a packaged DC link capacitor.

A "bulk" packaged DC link capacitor (bulk capacitor) may have first and second metal capacitor-leads extending from a side wall. The first and second metal capacitor-leads may be electrically and thermally connected to first and second electrodes, respectively, of a film capacitor. Flat surfaces of first and second metal capacitor-leads at the other ends may be electrically and thermally connected to respective flat surfaces of V+ and V− bus bars, respectively. A surface of a flat dielectric side wall of a bulk capacitor may be thermally connected to a flat surface of V+ and/or V− bus bars that also act as heat sinks. Opposite facing surfaces of flat dielectric side walls of a bulk capacitor may be thermally connected to respective flat surfaces of V+ and V− bus bars, respectively, that also act as heat sinks. The side wall and/or capacitor-lead thermal connections may enable heat extraction from the bulk capacitor.

A packaged ceramic DC link capacitor may have first and second metal terminals at opposite ends of the package. The first and second metal terminals may be electrically and thermally connected to the first and second electrodes, respectively, of a multilayer ceramic capacitor. The first and second metal terminals may be electrically connected to V+ and V− bus bars, respectively, that also act as heat sinks. Each of the first and second metal terminals may have a flat end surface and flat side wall surfaces. The flat end surfaces of the first and second metal terminals may face opposite directions. Flat surfaces of the first and second metal terminals may be electrically and thermally connected to respective flat surfaces of V+ and V− bus bars, respectively. Or first and second metal terminals may be electrically connected to first and second traces, respectively, of a PCB, and the first and second traces on may be electrically connected to V+ and V− bus bars, respectively.

Inverter 460*i*T includes bulk capacitors 403T. Example bulk capacitors 403 have four dielectric side walls extending between a dielectric top and a dielectric bottom. Bulk capacitors 403T has first and second metal capacitor-leads 405Ta and 405Tb, respectively, extending from the capacitor's front dielectric side wall. Capacitor-leads, including capacitor-leads 405T, may be rectangular in cross section. Example capacitor-leads 405T have a height hbc, length lbc, and width wbc around 6 mm, 20 mm, and 20 mm, respectively. Capacitor-leads, including capacitor-leads 405T, may have substantially flat, rectangular-shaped opposite facing top and bottom surfaces. The areas of the example top and bottom surfaces may be around 400 $mm^2$. A substantial portion (e.g., 10, 20, 50, 75, 90% or more) of a capacitor-lead's flat surface area may be electrically and thermally connected (e.g., welded, soldered, press-fitted by screws or other fasteners, etc.) to a flat surface of a V+ or V− bus bar. For example, a substantial portion of a capacitor-lead 405Ta-2's flat bottom surface area may be electrically and thermally connected to a flat surface of V+ bus bar 417T, and a substantial portion of capacitor-lead 405Tb-2's flat top surface area may be electrically and thermally connected to a flat surface of V− bus bar 412T. V+ bus bar 417 and V− bus bar 412 can extract a substantial amount of heat (e.g., 1, 2, 5, 10, 20, 40, 80, 100, 200, 300 Watts or more) from bulk DC link capacitors 403T through flat surfaces of their capacitor-leads 405Ta and/or 405Tb, respectively.

FIG. 5A-19 shows a space between the front side wall and bus bars bus bars 417T, 418T, and 412T. In an alternative version, the flat surfaces of the dielectric front side walls of example bulk capacitors 403 may be thermally connected to flat side wall surfaces of bus bars 417T, 418T, and/or 412T. FIG. 5A-20 shows inverter 460*i*T of FIG. 5A-19 with a row of example packaged ceramic DC link capacitors 433. For ease of illustration, only one packaged ceramic DC link capacitor 433-1 of the row is shown.

Each of the packaged ceramic DC link capacitors 433 may include first and second metal terminals 437-1 and 437-2, respectively, connected electrically to the V+ and V− bus bars, respectively. FIG. 5A-20 shows example packaged ceramic DC link capacitors 433 mounted on a PCB 435 and electrically connected in parallel.

Dielectric side walls extend between the first and second metal terminals 437-1 and 437-2. First and second metal terminals 437-1 and 437-2 may be electrically connected to first and second metal traces 511-1 and 511-2, respectively, on the side of PCB 435 opposite the side with capacitors 433. Metal vias can electrically connect 511-1 and 511-2 to respective terminals 437-1 and 437-2. The ends of first and second traces 511-1 and 511-2 may be widened to create large surface areas that can be electrically and thermally connected to respective side wall surfaces of the V+ and V− bus bars 417T and 412T, respectively.

A row of packaged ceramic DC link capacitors can fit between V+ and V− bus bars. FIG. 5A-21 shows inverter 460*i*T of FIG. 5A-19 with a row of example packaged ceramic DC link capacitors 4331. For ease of illustration, only one packaged ceramic DC link capacitor 4331-1 of the row is shown. FIG. 5A-21 also shows that a surface of the front dielectric wall in DC link capacitor 403-1 is thermally connected to side wall surfaces of bus bars 417T and 412T, it being understood that the front dielectric wall need not be thermally connected to the bus bars.

Each of the packaged ceramic DC link capacitors 4331 in FIG. 5A-21 may be longer than the packaged ceramic DC link capacitors 433 in FIG. 5A-20. The packaged ceramic DC link capacitors 4331 in the row are electrically connected between the V+ and V− bus bars. In an alternative two or more rows of packaged ceramic DC link capacitors 4331 may be electrically connected between the V+ and V− bus bars. Like the packaged capacitors 433 shown in FIG. 5A-20, packaged capacitors 4331 in FIG. 5A-21 may have first and second metal terminals, 437-1 and 437-2, respectively, that are electrically and thermally connected to first and second electrodes of a ceramic capacitor in the package. Metal terminals 437-1 and 437-2 have opposite facing flat end surfaces. Flat end surfaces of the first terminals connectors 437-1 may be electrically and thermally connected directly to a flat surface of bus bar 417T, and flat end surfaces of the second terminals 437-2 may be electrically and thermally connected directly to a flat surface of V− bus bar 412T. V+ bus bar 417T and V− bus bar 412T can extract a substantial amount of heat (e.g., 1, 2, 5, 10, 20, 40, 80 Watts or more) from capacitors 4331 through flat end surfaces of their metal terminals 437-1 and/or 437-2, respectively.

Lengths and/or widths of bus bars 417T and 412T may need to be extended to accommodate the packaged ceramic DC link capacitors 4331 positioned therebetween.

First and second metal terminals 437-1 and 437-2 of packaged ceramic DC link capacitors may be electrically and thermally attached (e.g., welded) directly to respective flat side wall surfaces of bus bars 417T and 412T. FIG. 5A-22 shows inverter 460*i*T of FIG. 5A-19 with a row of example packaged ceramic DC link capacitors 433*e*. For ease of illustration, only one packaged ceramic DC link capacitor 433*e*-1 of the row is shown.

Each of the packaged ceramic DC link capacitors 433*e* in FIG. 5A-22 may be longer than the packaged ceramic DC link capacitors 433 in FIG. 5A-19. The packaged ceramic DC link capacitors 433*e* in the row are electrically connected between the V+ and V− bus bars. Like the packaged capacitors 433 shown in FIG. 5A-20, packaged capacitors 433*e* in FIG. 5A-22 may have first and second metal terminals, 437-1 and 437-2, respectively, that are electrically and thermally connected to first and second electrodes of a multilayer ceramic capacitor in the package. Metal terminals 437-1 and 437-2 have flat side wall surfaces, which may be electrically and thermally connected (e.g., welded) directly to flat side wall surfaces of bus bar 417T and V− bus bar 412T, respectively. V+ bus bar 417T and V− bus bar 412T can extract a substantial amount of heat (e.g., 1, 2, 5, 10, 20, 40, 80 Watts or more) from capacitors 433*e* through flat side wall surfaces of their metal terminals 437-1 and/or 437-2, respectively.

Each switch 304 of a converter such as inverter 460*i*T may be electrically connected in parallel with one or more snubber circuits. Each snubber circuit may include a snubber resistor electrically connected in series with a snubber capacitor (e.g., multilayer ceramic capacitor), which may be contained in a cuboid shaped package with substantially flat dielectric side walls. Like the packaged ceramic DC link capacitors described above, each packaged snubber capacitor may have first and second metal terminals at opposite ends of the package. A packaged snubber circuit may be positioned adjacent to a package switch 247 to which it is electrically connected. A packaged snubber capacitor circuit may also be electrically connected between a phase bus bar such as a phase bus bar 418T and a DC bus bar such as V+ bus bar 417T or V− bus bar 412T.

FIG. 5A-23 shows the inverter 460*i*T of FIG. 5A-22 with example snubber circuits for phase c. The snubber circuits include snubber capacitors 433*s*H and 433*s*L electrically connected in series with snubber resistors RH and RL, respectively. Although not shown, phases a and b may include similar snubber circuits. Snubber capacitors 433*s* may be like ceramic capacitors 433 of FIG. 5A-20 but shorter. Snubber capacitors 433*s* may have first and second metal terminals, 437-1 and 437-2, respectively, that are electrically and thermally connected to first and second electrodes, respectively, of a multilayer ceramic capacitor in the package.

Opposite facing flat side wall surfaces of terminal 437H-1 may be electrically and thermally connected (e.g., welded) directly to flat side wall surface of V+ bus bar 417T and flat side wall surface of first terminal 437-1 of ceramic capacitor 433*e*, respectively. Opposite facing flat side wall surfaces of terminal 437L-2 may be electrically and thermally connected (e.g., welded) directly to flat side wall surface of V− bus bar 412T and flat side wall surface of first terminal 437-2 of ceramic capacitor 433*e*, respectively. First electrodes of snubber resistors RHc and RLc are electrically connected (e.g., welded) to terminals 437H-2 and 437L-1, respectively. Second electrodes snubber resistors RHc and RLc are electrically connected to each other and to a flat surface of phase bus bar 418T FIG. 5A-24 shows inverter 460*i*T of FIG. 5A-23 without resistors R. In this version, flat side wall surfaces of terminals 437H-2 and 437L-1 may be electrically and thermally connected (e.g., welded) directly to a flat side wall surface of phase bus bar 418Tc. Flat end surfaces of terminals 437H-2 and 437L-1 also may be electrically and thermally connected (e.g., welded) directly together. Snubber circuits in phases a and b are similarly connected to respective phase bus bar-leads. V+ bus bar 417T and V− bus bar 412T can extract a substantial amount of heat (e.g., 1, 2, 5, 10, 20, 40, 80, 100 Watts or more) from capacitors 433*se*H and 433*se*L through flat side wall surfaces of metal terminals 437H-1 and 437L-2, respectively. Phase bus bars 418T in FIG. 5A-24 can extract a substantial amount of heat (e.g., 1, 2, 5, 10, 20, 40, 80 Watts or more) from capacitors 433*se*H and 433*se*L through flat side wall surfaces of metal terminals 437H-2 and/or 437L-1, respectively.

Returning to FIG. 5A-18, electrical current symbols are shown that represent electrical current flow through inverter system 460*i*T at an instant in time. More particularly, FIG. 5A-18 shows electrical current flow through activated high-side switch 304*d*H of phase-a, while low-side switches 304*d*L of phases b and c are activated and conducting current to the V− terminal through the V− bus bar 412T. All other switches are deactivated in the figure. Each electrical current symbol in inverters of this document is drawn with substantially the same length. The electrical current symbols in inverters of this document are drawn with varying widths. Wider electrical current symbols represent electrical currents with larger magnitudes.

Die substrate terminals 230 and die clip terminals 344 may be pressed-fitted, soldered, sintered, welded, or connected by other means directly to corresponding flat surfaces of bus bars to establish thermal and electrical connectivity. Each of the die substrate terminals 230 of packaged switches 247*d*H of FIG. 5A-18, may be pressed-fitted, soldered, sintered, welded, or connected by other means directly to a flat surface or respective flat surfaces of V+ bus bar 417T. The die clip terminals 344 of packaged switches 247*d*H of FIG. 5A-18, may be pressed-fitted, soldered, sintered, welded, or connected by other means directly to flat surfaces of respective bus bars 418T. The die substrate terminals 230 of packaged switches 247*d*L of FIG. 5A-18, may be pressed-fitted, soldered, sintered, welded, or connected by other means directly to flat surfaces of respective bus bars 418T. Each of the die clip terminals 344 of packaged switches 247*d*L of FIG. 5A-18, may be pressed-fitted, soldered, sintered, welded, or connected by other means directly to a flat surface or respective flat surfaces of V− bus bar 412T.

A converter like inverter 460*i*T of FIGS. 5A-18 and 5A-19, may include a control PCB, such as control PCB 462*i* of FIG. 5A-19. A converter like inverter 460*i*T may include a driver PCB, such as driver PCB 461*i* of FIG. 5A-19. Driver PCBs, like driver PCB 461*i*, may be electrically connected to switches 304 through respective sets of connector-leads 288. Only connector-leads 288*g*H and 288*g*L of phase c are shown in FIG. 5A-19.

Power and control PCBs may be in data communication with each other. Power and control PCBs may have opposite facing surfaces. Components (e.g., drivers (e.g., base driver, gate drivers, etc.), current sensors, voltage sensors, PMICs, MCUs, etc.) may be mounted on one or each side of power and control PCBs such as PCBs 461*i* or 462*i*. Terminals of the components may be electrically connected to traces on the power and control PCBs. Metal vias can connect traces on opposite sides of power and control PCBs such as PCBs 461*i* and 462*i*. Traces of a driver PCB may be electrically connected to respective connector-leads 288.

A driver PCB may include drivers in data communication with respective packaged switches 247 via respective connector-leads 288*g* or respective sets of connecter-leads 288*g*1 and 288*g*2. Drivers on a driver PCB may provide control signals to respective transistor control terminals or respective groups of transistor control terminals. A driver PCB may include PMICs that provide supply voltages to respective drivers.

A driver PCB may include voltage sensors in data communication with respective packaged switches 247 via respective sets of connector-leads 288*dc* and 288*ds*. A voltage sensor can sense a voltage across current terminals of a switch 304 in a packaged switch 247 via connector-leads 288*dc* and 288*ds*.

A driver PCB may include apertures through which respective phase bus bar-leads may extend. FIG. 5A-19 shows an example phase bus bar-lead 465*c*. A phase bus bar-lead extends between first and second ends. The first end may be electrically connected to a phase bus bar.

A driver PCB may include current sensors connected to traces on the driver PCB and configured to measure electrical current flow through respective phase bus bar-leads. Each of the current sensors may take form in a current transformer (CT) sensor, which may have an aperture through which a respective phase bus bar-lead may extend. If the current sensors have apertures for receiving bus bar-leads, they may align with respective apertures in the driver PCB through which respective phase bus bar-leads extend. Current sensors without apertures can be positioned on the driver PCB near (e.g., within 5 mm, 3 mm, 1 mm, or less) respective phase bus-bar leads.

Driver PCB 461*i* in FIG. 5A-19 includes drivers 306 in data communication with respective packaged switches 247*d* of phase c through respective connector-leads 288*g*. Drivers 306 may be positioned on PCB 461*i* near (e.g., within 8 mm, 3 mm, 1 mm, or less) respective connector-leads 288*g* to reduce stray inductance, capacitance, and resistance therebetween. For example, trace connections between terminals of drivers 306 and respective connector-leads 288*g* may be 5 mm or less. PMICs provide supply voltages for respective drivers 306 and may be placed as close as possible on the opposite side of driver PCB 461*i*T as shown. Driver PCB 461*i* in FIG. 5A-19 includes voltage sensors V_Sense in data communication with respective packaged switches 247*d*. Example phase bus bar-lead 465*c* extends laterally between first and second ends. The first end of phase bus bar-lead 465*c* is electrically connected to phase bus bar 418Tc, and the second end is electrically connected to winding Wc. Phase bus bar-lead 465*c* extends through an aperture in PCB 460*i*. Current sensor I_Sense measures electrical current flowing through phase bus bar-connector 465*c*. I_Sense may include an aperture through which phase bus bar-connector 465*c* extends. FIG. 5A-19 shows drivers 306, voltage sensors V_Sense, PMICs, current sensor I_Sense, and a phase bus bar-lead 465 for phase c. Similar groups of drivers 306, voltage sensors V_Sense, PMICs, current sensor I_Sense, and phase bus bar-lead 465 are mounted on or extending through PCB 461*i* for phases a and b.

Drivers, voltage sensors, current sensors, etc., mounted on a driver PCB may be in data communication with a data processing unit such as an MCU, which may be mounted on a control PCB. The data processing unit may be positioned on a control PCB at point furthest away from phase bus bar-leads to reduce adverse effects of electromagnetic interference (EMI). The data may be communicated through a data connection that may include pin and socket connectors, which are also known as “headers,” mounted on driver and control PCBs, respectively. The data connection may include a flexible data bus such as a flexible circuit or flexible PCB. Ends of a flexible circuit or flexible PCB may be electrically connected to pin and socket headers.

FIG. 15A-19 shows an MCU mounted on control PCB 462*i*. The MCU may be in data communication with each driver 306, V_Sense, and I_Sense mounted on driver PCB 461*i*T through a data connection 484, which may include pin and socket connectors (not shown) that are electrically connected to traces on driver PCB 461*i*T and control PCB 462*i*T, respectively. Pins of the pin connector may be directly received by respective sockets of the socket connector. Driver PCBs and control PCBs may be parallel to each other. Driver PCB 461*i*T and control PCB 462*i* in FIG. 5A-19 are parallel to each other. Alternatively, control PCB 462*i* may be positioned above and parallel to the flat surface of V+ bus bar 417T. Other configurations are considered.

All tubes 420, such as tubes 420*a* in FIG. 15A-18, received in all bus bars of a converter may be substantially equal in length. Each tube 420 has first and second ends. A converter may have first and second fluid manifolds. The first ends of all tubes 420 in a converter may be in fluid communication with the first manifold, while the second ends of all the tubes in the converter may be in fluid communication with the second manifold. A manifold may have input and output ports that are in fluid communication with an inner chamber. A first manifold may have an input port, which in turn may be in fluid communication with a pump. The first manifold may have one or more output ports that receive and are in fluid communication with the first ends of respective tubes 420. A second manifold may have one or more input ports that receive and are in fluid communication with second ends of respective tubes 420. The second manifold may have an output port, which may be in fluid communication with a heat exchange system such as a radiator. A port may include an aperture in a side wall of a manifold, through which fluid can flow into or out of the manifold's inner chamber. A seal can be added between an input or output port of a manifold and a tube it receives. A seal is a device that helps join items (e.g., a tube and a port) together by preventing leakage. The first and second manifolds may be substantially similar in size, shape, composition, etc. Manifolds may be formed (e.g., molded) from a dielectric material.

FIG. 5A-25 shows inverter 460*i*T of FIG. 5A-18 with example first and second manifolds 466-1 and 466-2, respectively, in fluid communication with first and second ends, respectively, of tubes 420*a*. The first ends of tubes 420*a* extend through respective output ports of manifold 466-1, and the second ends of tubes 420*a* extend through respective input ports of manifold 466-2. Manifolds 466 are shown in cross section to facilitate a better understanding of how fluid flows through them. In one version, input, and output ports 467-1 and 467-2, respectively, of manifolds 466-1 and 466-2, respectively, may be positioned at ends of manifolds 466-1 and 466-2, respectively, and closer to V− bus bar 412T than they are to V+ bus bar 417T as shown. Alternative positions or locations of the input and output ports 467-1 and 467-2 for manifolds 466-1 and 466-2, respectively, are contemplated.

Inverter 460*ijc*

Packaged switches 247 can be used in power converters with bus bars that lack tubes 420. FIGS. 5A-26 and 5A-27 illustrate relevant components of an example inverter 460*ijc* when seen from the front and sides, respectively, with bus bars that lack cooling tubes 420. Several components (i.e., driver PCB 461*i*, control PCB 462*i*, and DC link capacitors 403*jc*) shown in FIG. 5A-27 are not shown in FIG. 5A-26 but are described below.

Inverter 460*ijc* employs packaged switches 247*d*, it being understood that in an alternative version packaged switches 247*d* may be swapped with packaged switches 247*p* or packaged switches 247*q*.

All packaged switches 247*d* of inverter 460*ijc* may be the same. Packaged switches 247*d* of inverter 460*ijc* may be packaged switch 247*d*A, 247*d*B, 247*d*C, or 247*d*D of FIGS. 3A, 3B, 3C, and 3D, respectively.

Inverter 460*ijc* includes V+ bus bar 417*ijc*, V− bus bar 412*ijc*, and phase bus bars 418*ijc*. As seen in FIGS. 5A-26 and 5A-27 the bus bars are solid metal and lack channels. V+ bus bar 417*ijc* and V− bus bar 412*ijc* have the same shapes (e.g., rectangular) and sizes. As seen in FIG. 5A-27, phase bus bars 418*ijc*, including bus bar 418*ijcc*, are C-shaped.

Inverter 460*ijc* includes metal heat sinks 528-530, which may be electrically isolated from each other. Each includes a row of channels 40 through which cooling fluid may flow. Heat sink 528 is thermally connected to but electrically isolated from V+ bus bar 417*ijc* by substantially flat layer 526-1 of dielectric material (e.g., diamond-based dielectric, beryllium oxide, etc.). Heat sink 529 is thermally connected to but electrically isolated from phase bus bars 418*ijc* by substantially flat layers 526-2 and 526-3 of dielectric material (e.g., diamond-based dielectric, beryllium oxide, etc.). Heat sink 530 is thermally connected to but electrically isolated from V− bus bar 412*ijc* by substantially flat layer 526-4 of dielectric material (e.g., diamond-based dielectric, beryllium oxide, etc.). Layers 526 may be formed from any of the dielectric materials listed in the table above. Other dielectric materials are also contemplated.

Inverter 460*ijc* has three phases designated a-c. Each phase a-c in FIG. 5A-26 includes two packaged switches 247*dh* and 247*d*L that are electrically and thermally connected to a phase bus bar 418*ijc*, which in combination is sandwiched between V+ bus bar 417*ijc* and V− bus bar 412*ijc*. Packaged switches 247*d*H and 247*d*L are also electrically and thermally connected to V+ bus bar 417*ijc* and V− bus bar 412*ijc*, respectively.

FIG. 5A-26 illustrates the linear positioning of packaged switches 247*d*, V+ bus bar 417*ijc*, phase bus bars 418*ijc*, V− bus bar 412*ijc*, and dielectric layers 526-1-526-4 with respect to each other. Packaged switches 247*d*H in FIG. 5A-26 may have die substrate terminals 230 that are electrically and thermally connected (e.g., sintered, press-fitted, etc.) to a flat surface or respective flat surfaces of V+ bus bar 417*ijc*, and die clip terminals 344 that are electrically and thermally connected (e.g., sintered, press-fitted, etc.) to flat surfaces of respective phase bus bars 418*ijca*-418*ijcc*, which in turn have terminals that may be electrically connected to windings Wa-Wc, respectively. Packaged switches 247*d*L in FIG. 5A-26 may have die substrate terminals 230 that are electrically and thermally connected (e.g., sintered, press-fitted, etc.) to flat surfaces of respective phase bus bars 418*ijca*-418*ijcc*, and die clip terminals 344 that are electrically and thermally connected (e.g., sintered, press-fitted, etc.) to a flat surface or respective flat surfaces of V− bus bar 412*ijc*.

Example V+ bus bar 417*ijc* and V− bus bar 412*ijc* may have a height, width, and length around 4 mm, 29 mm, and 100 mm, respectively. Heat sinks 528-530 may have a height, width, and length around 8 mm, 29 mm, and 130 mm, respectively.

Inverter 460*ijc* may include driver PCB 461*ijc* and control PCB 462*i.jc* Driver PCB 461*ijc* in FIG. 5A-27 includes drivers 306 in data communication with respective packaged switches 247*d* of phase c through respective connector-leads 288*g*. Current sensor I_Sense measures electrical current flowing through phase bus bar-connector 465*c*. FIG. 5A-27 shows an MCU mounted on control PCB 462*ijc*. The MCU may be in data communication with each driver 306, V_Sense, and I_Sense mounted on driver PCB 461*ijc* through data connection 484.

All heat sinks 528-530 may be substantially equal in length. All heat sinks 528-530 have first and second ends. The first ends of heat sinks 528-530 may be in fluid communication with the first manifold, while the second ends of heat sinks 528-530 may be in fluid communication with the second manifold.

Rectifier 460*r*T

Figures 1, 5B:
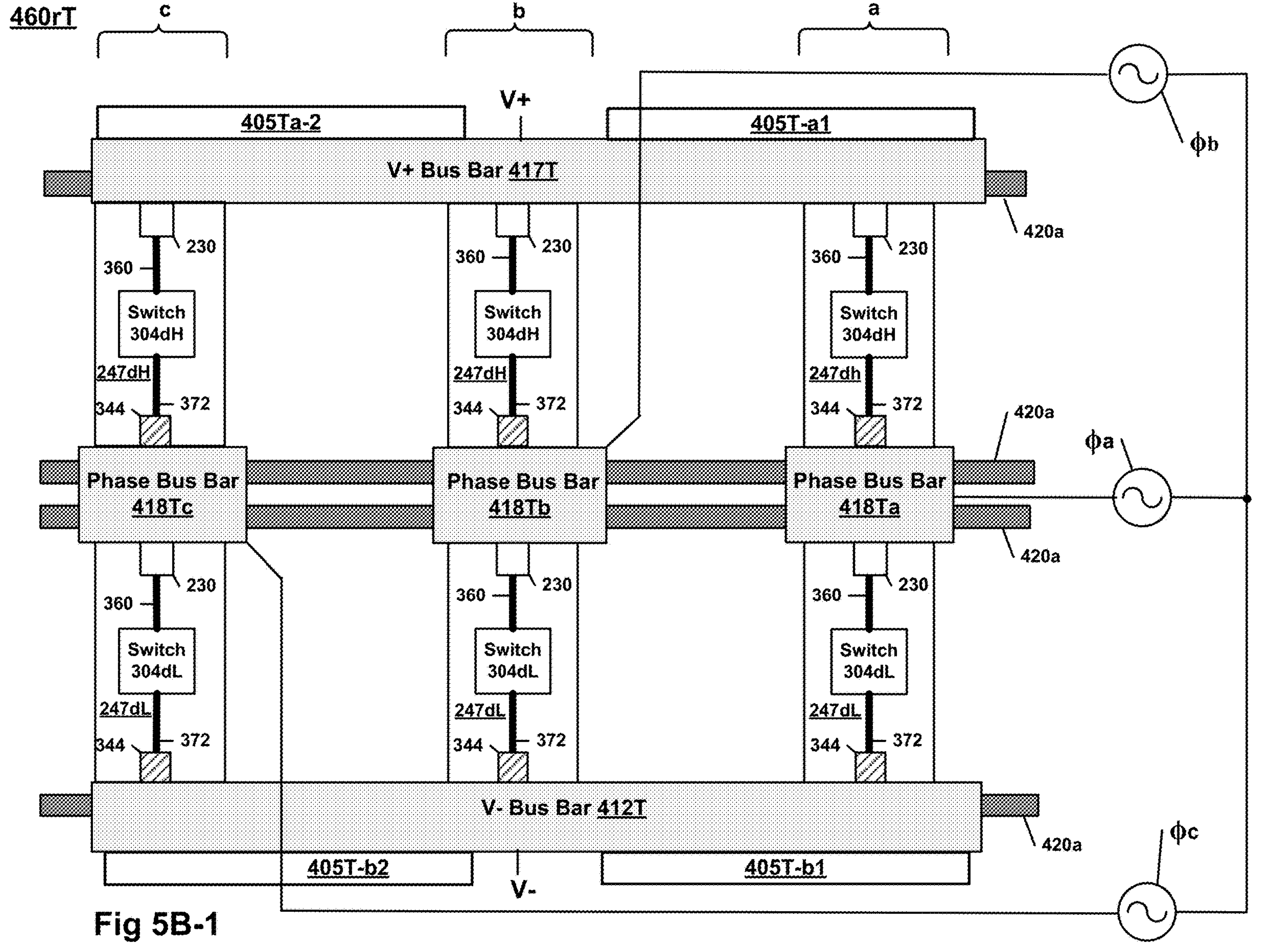
Figures 2, 5B:
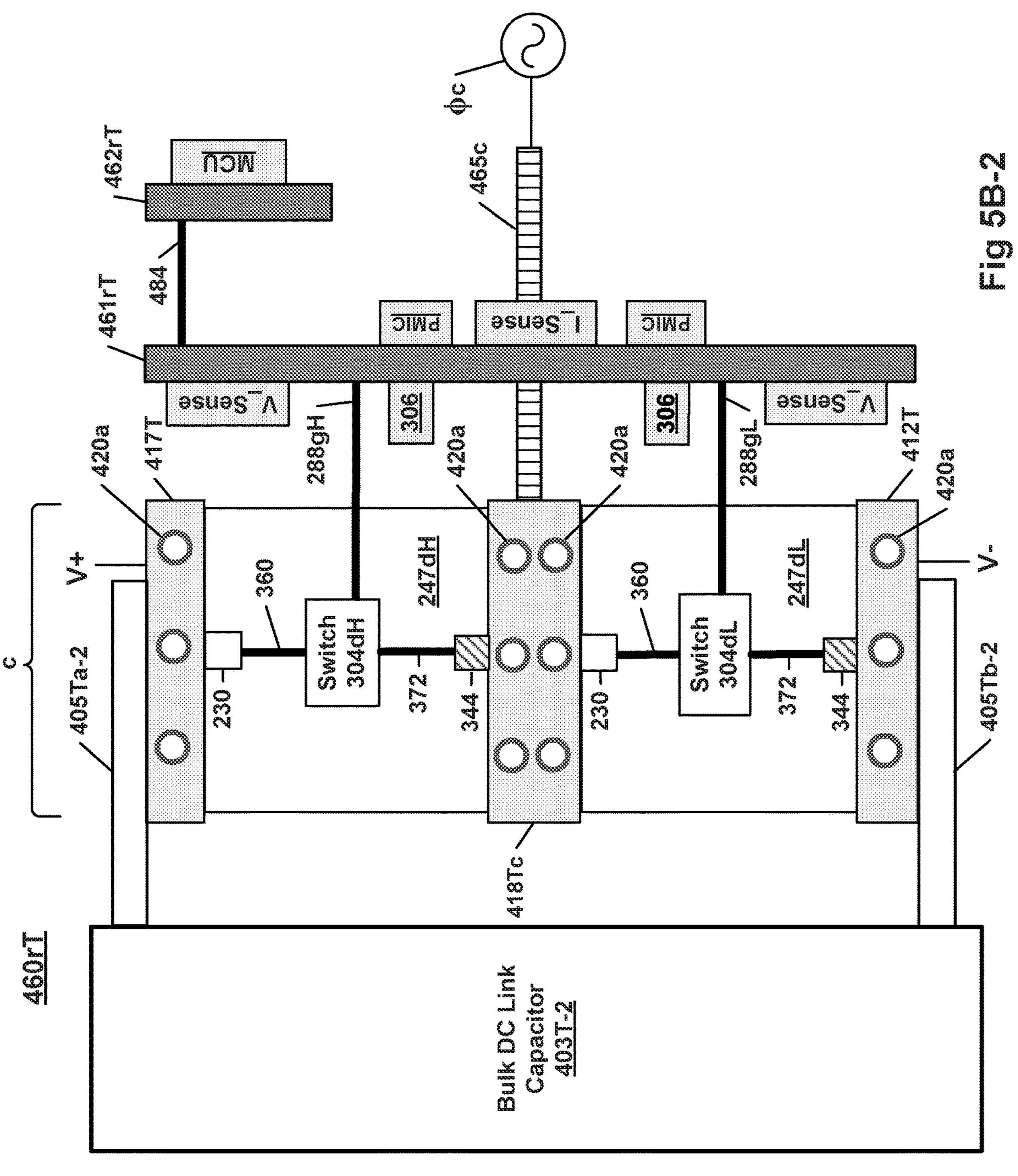

Packaged switches 247 may be employed in rectifiers. FIGS. 5B-1 and 5B-2 illustrate relevant components of an example rectifier 460*r*T when seen from the front and side, respectively. Rectifier 460*r*T could be connected to inductive elements like inductive elements La-Lc of an LCL filter 162 of FIG. 1C, which in turn is coupled to a three-phase AC power source 164 also shown in FIG. 1C. For ease of illustration only, LCL filter 162 is not shown in the figures for rectifiers of this disclosure. The AC sources ϕa-ϕc are shown directly connected to phase bus bars of rectifiers, including phase bars 418Ta-418Tc, respectively, of FIG. 5B-1.

Rectifier 460*r*T and inverter 460*i*T are substantially similar, but differences exist. The microcontroller mounted on the control PCB 462*r*T in rectifier system 460*r*T may be different than the microcontroller mounted on the control PCB 462*i*T in inverter system 460*i*, or the CPU executable instructions stored in memory of microcontroller mounted on the control PCB 462*r*T in rectifier system 460*r*T may be different than CPU executable instructions stored in memory of the microcontroller mounted on the control PCB 462*i*T in inverter system 462*i*. Control PCB 462*r*T may also include a phase-lock loop (PLL) and other components for synchronizing the control of switches 304 to the frequency (e.g., 60 Hertz) of the three-phase AC input voltages provided by the AC sources ϕa-ϕc.

Passive Rectifier

Rectifier 460*r*T is an example of an "active" rectifier since it employs packaged switches 247. Passive rectifiers are also contemplated. Passive rectifiers do not employ switches. Rather, passive rectifiers employ diodes. The compact rectifier 460*r*T shown in FIGS. 5B-1 and 5B-2 may be converted into a passive rectifier by replacing packaged switches 247*d* with packaged diodes 245M or 245N shown in FIGS. 3M and 3N, respectively.

Figure 5C:
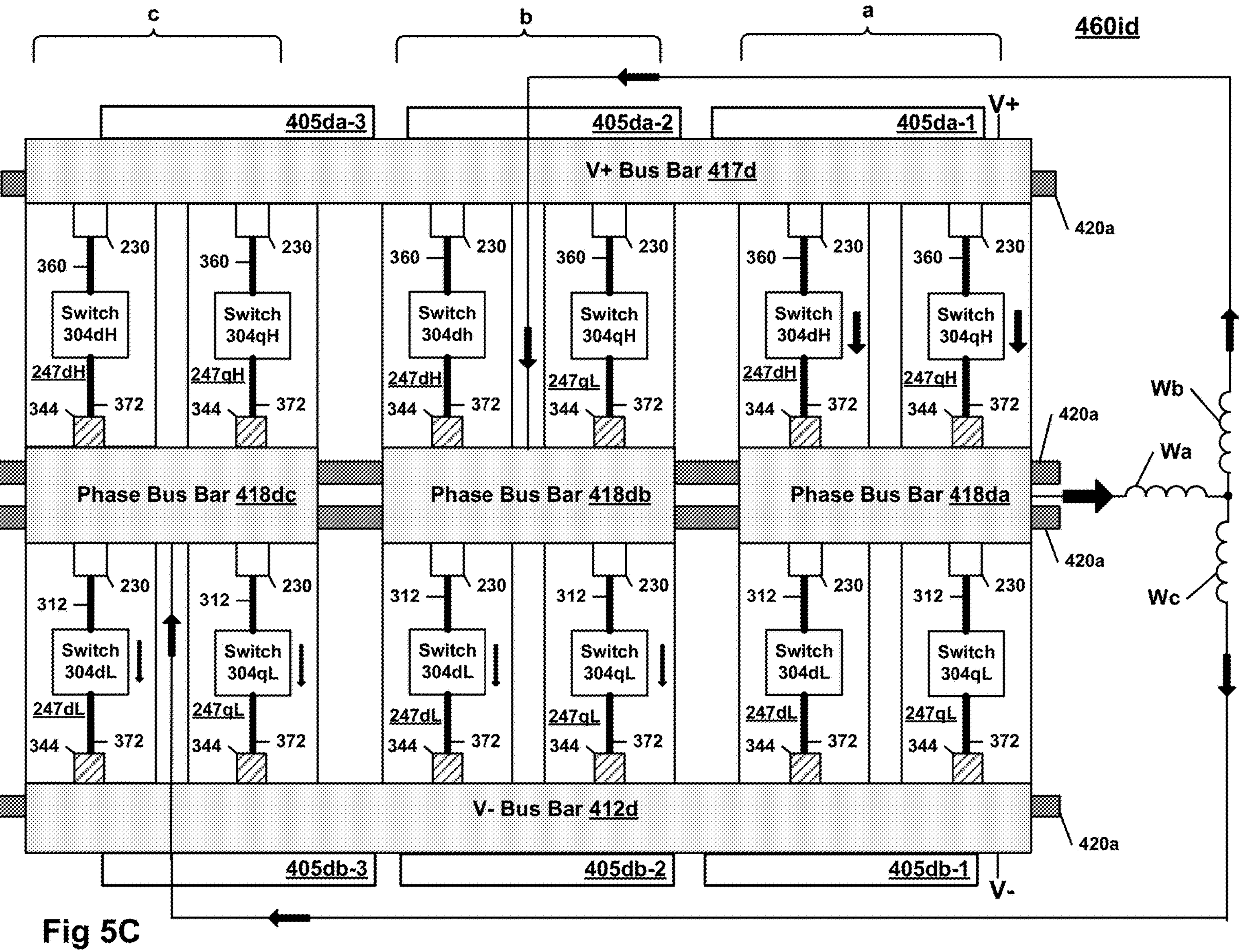
FIG. 5C is a front view of an example converter.
Figures 1, 5D:
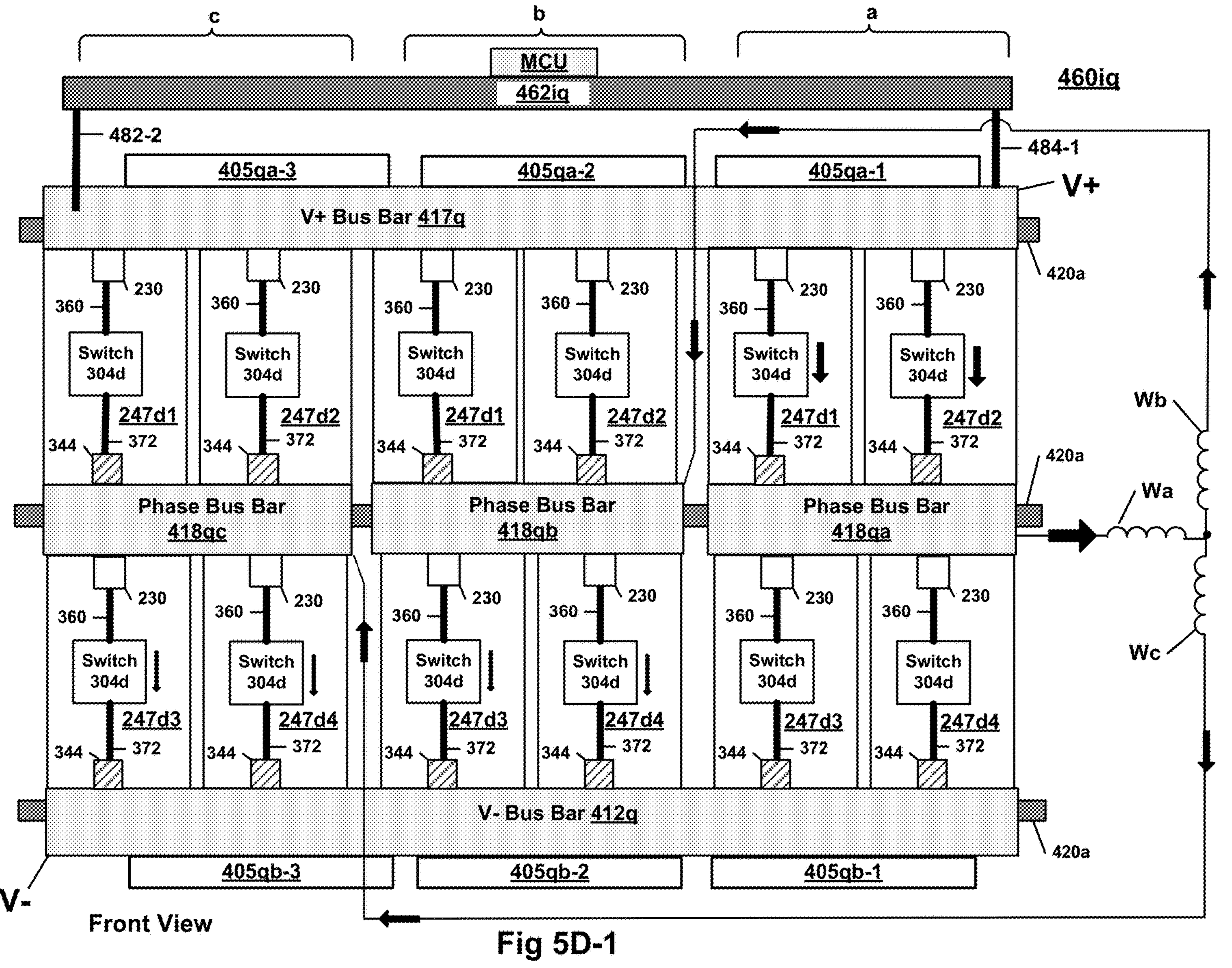
Figures 2, 5D:
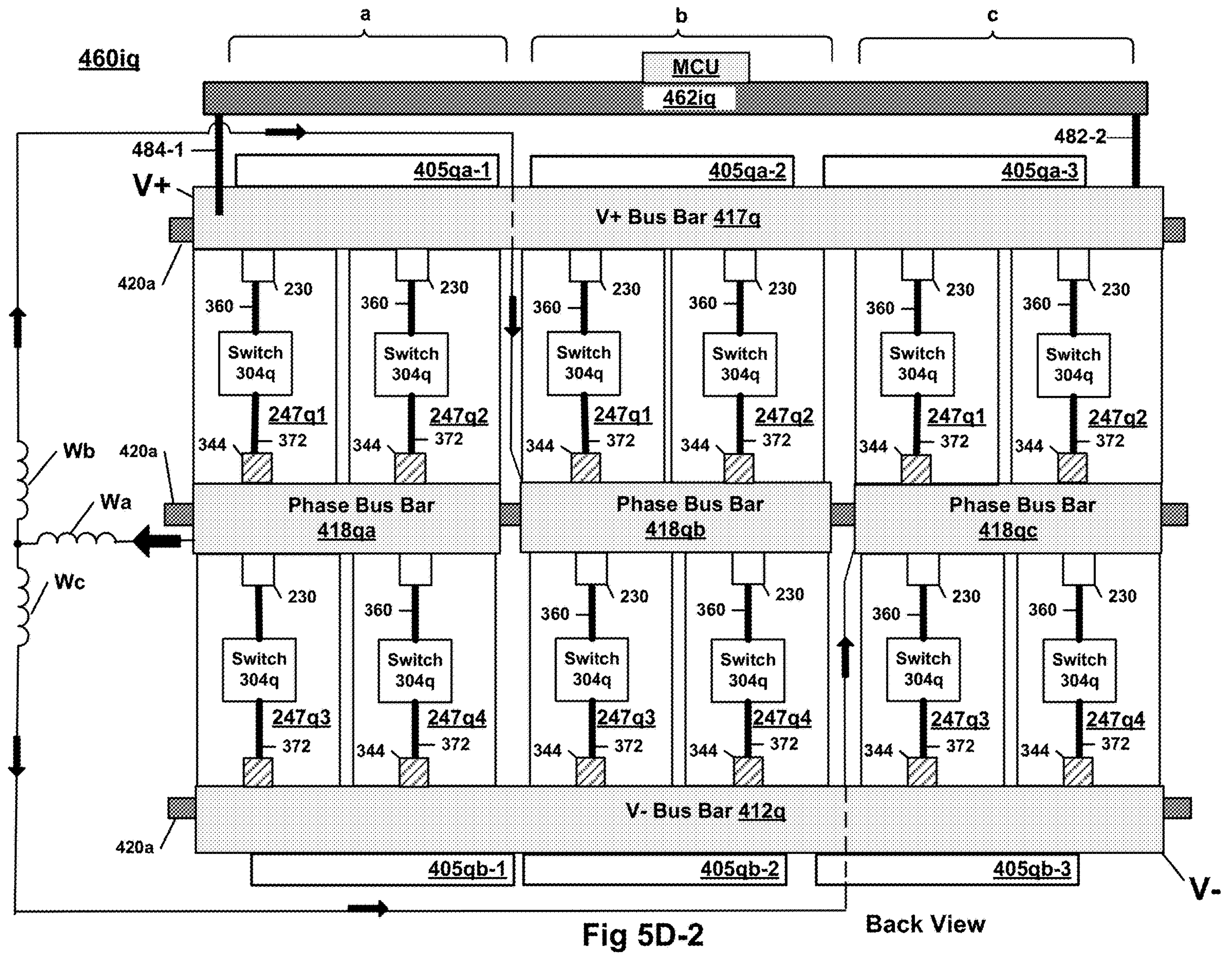
Figures 3, 5D:
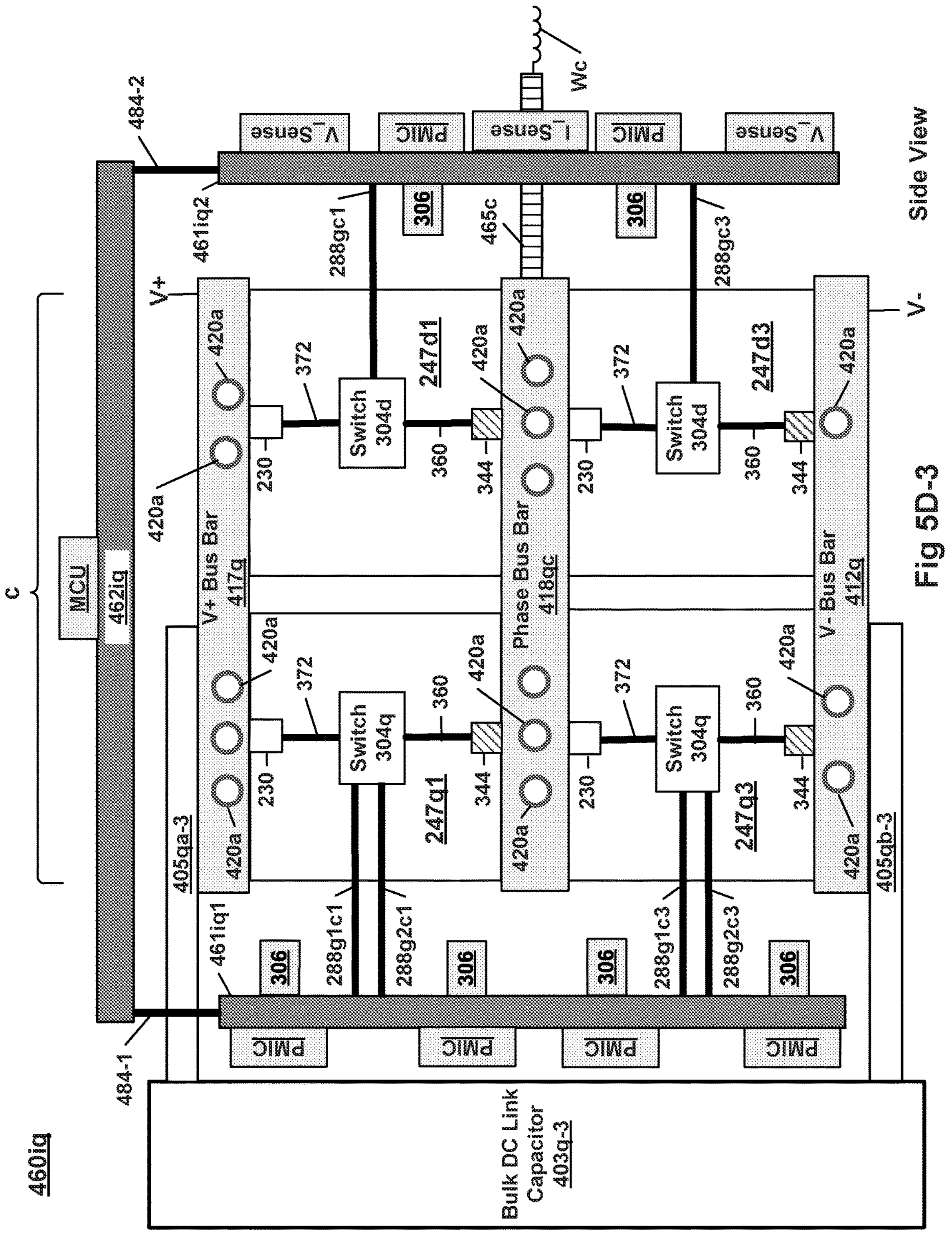
Figures 1, 5E:
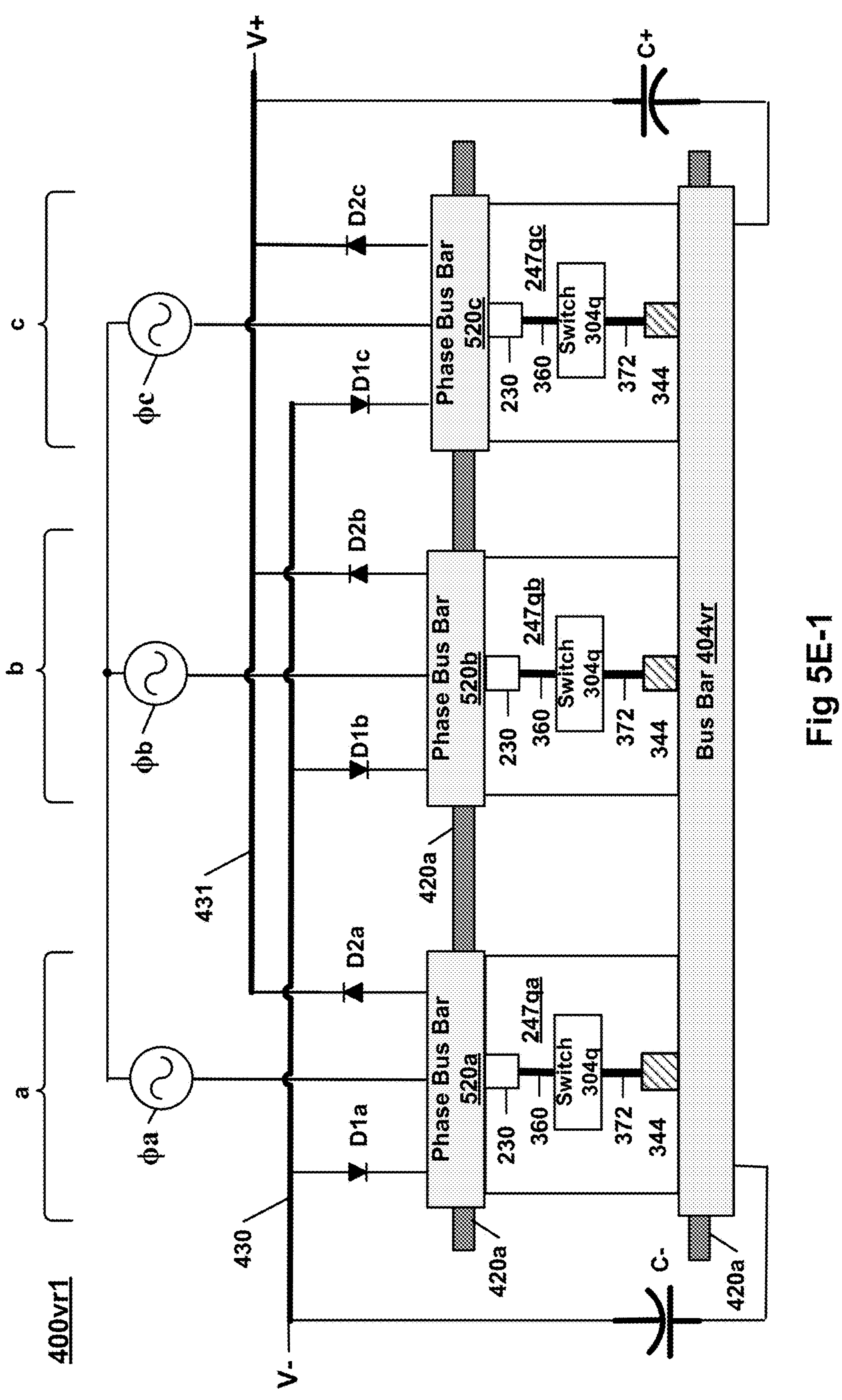
Figures 2, 3, 5E:
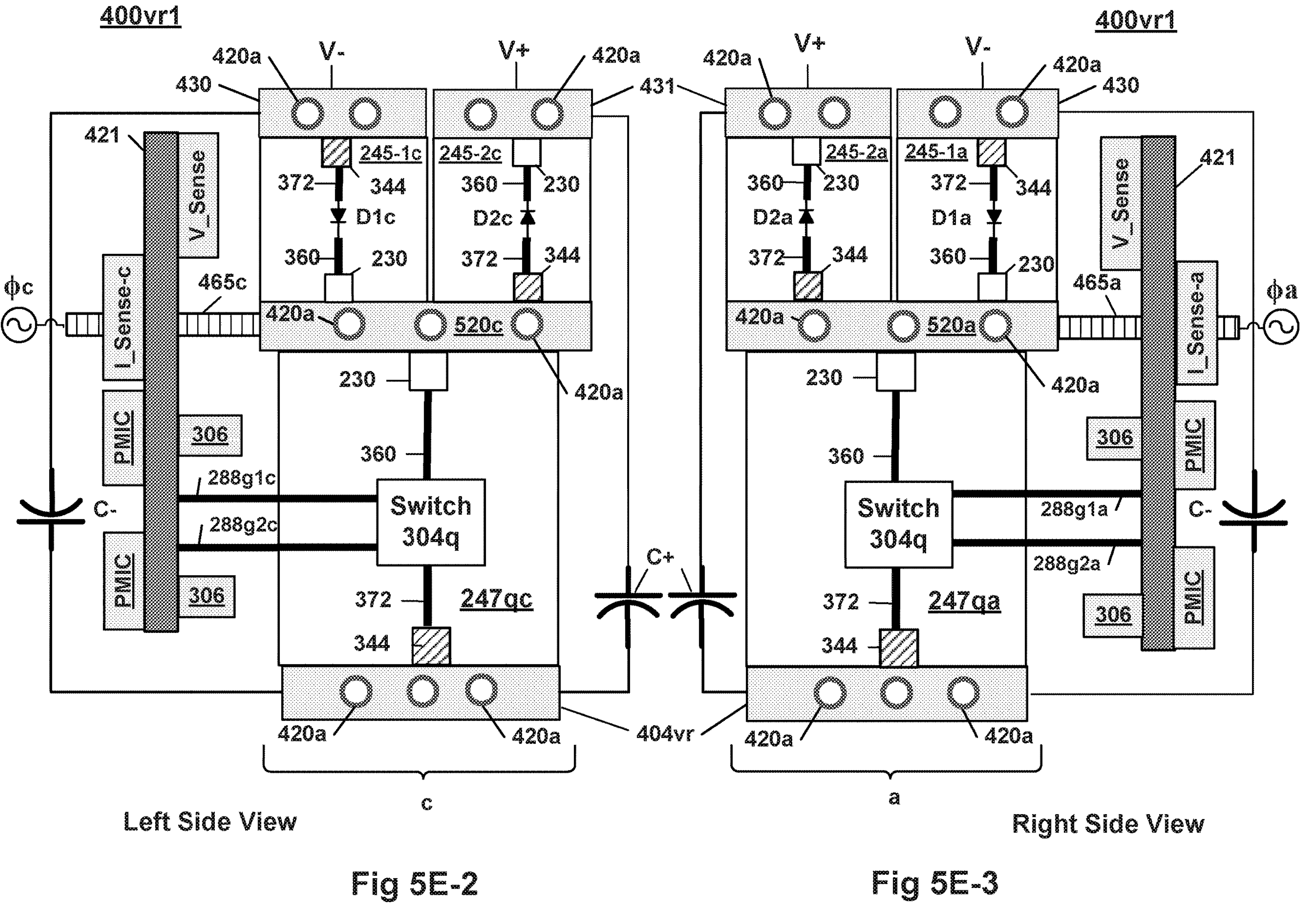
Figures 1, 5F:
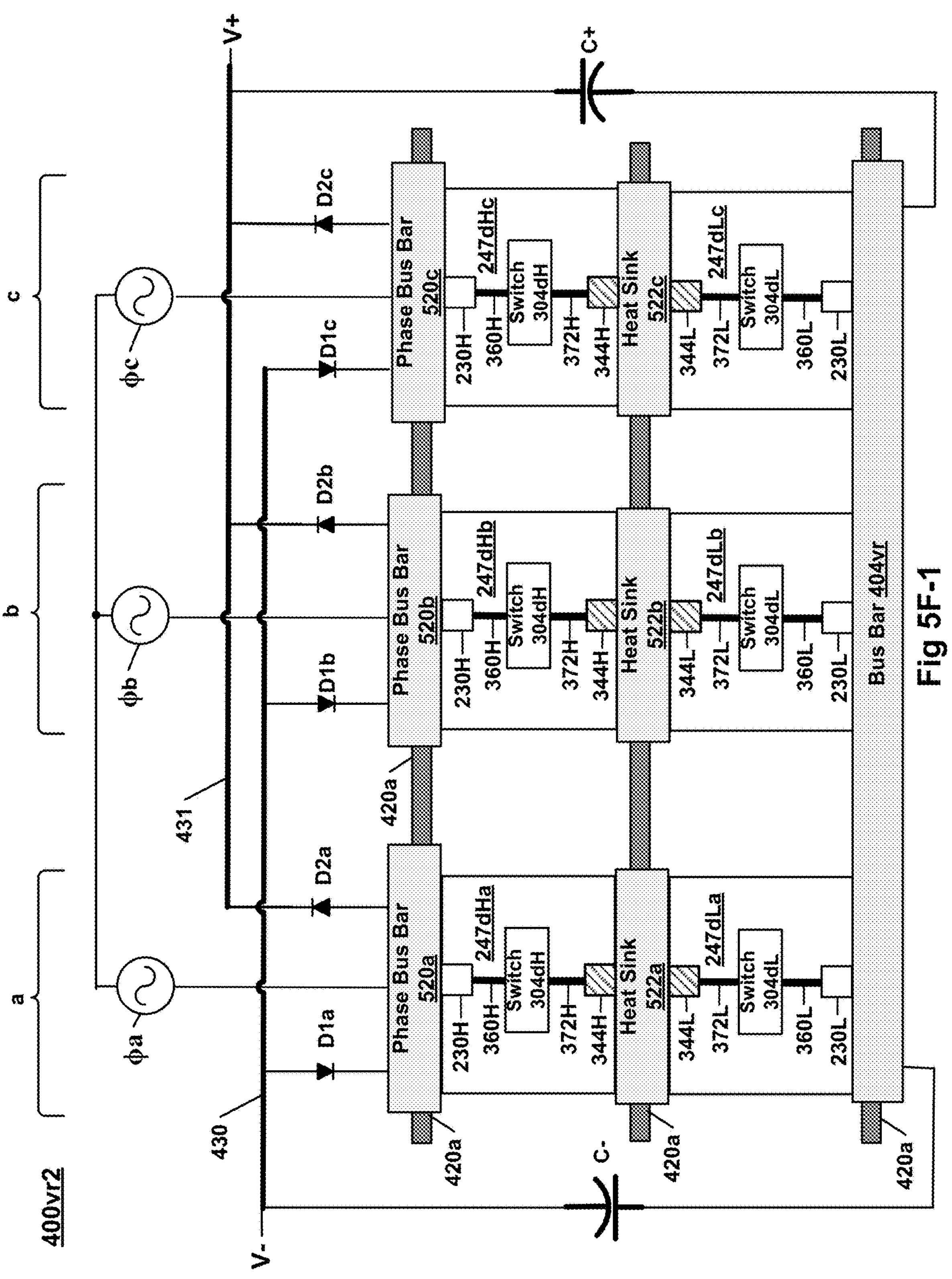
Figures 2, 3, 5F:
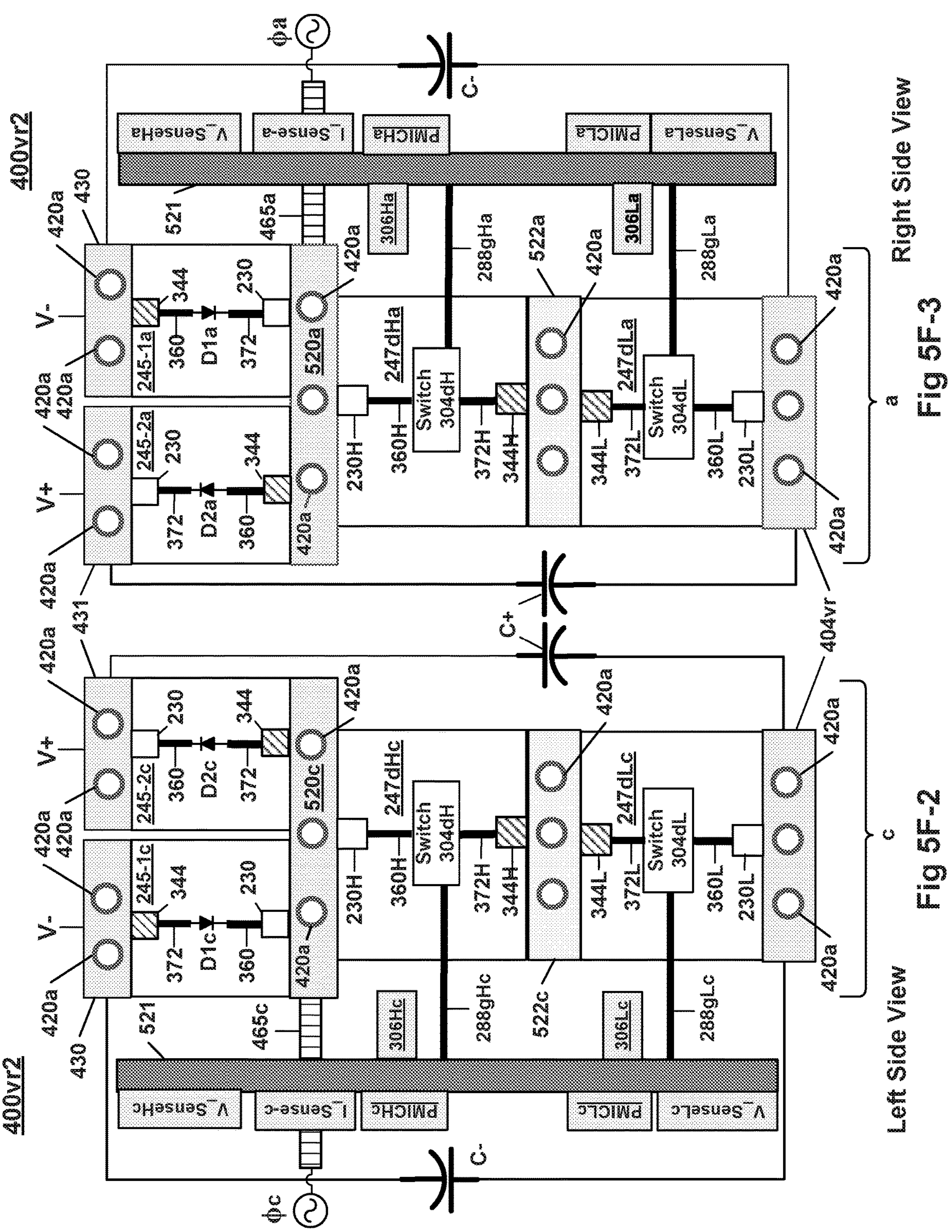
Figures 1, 5G:
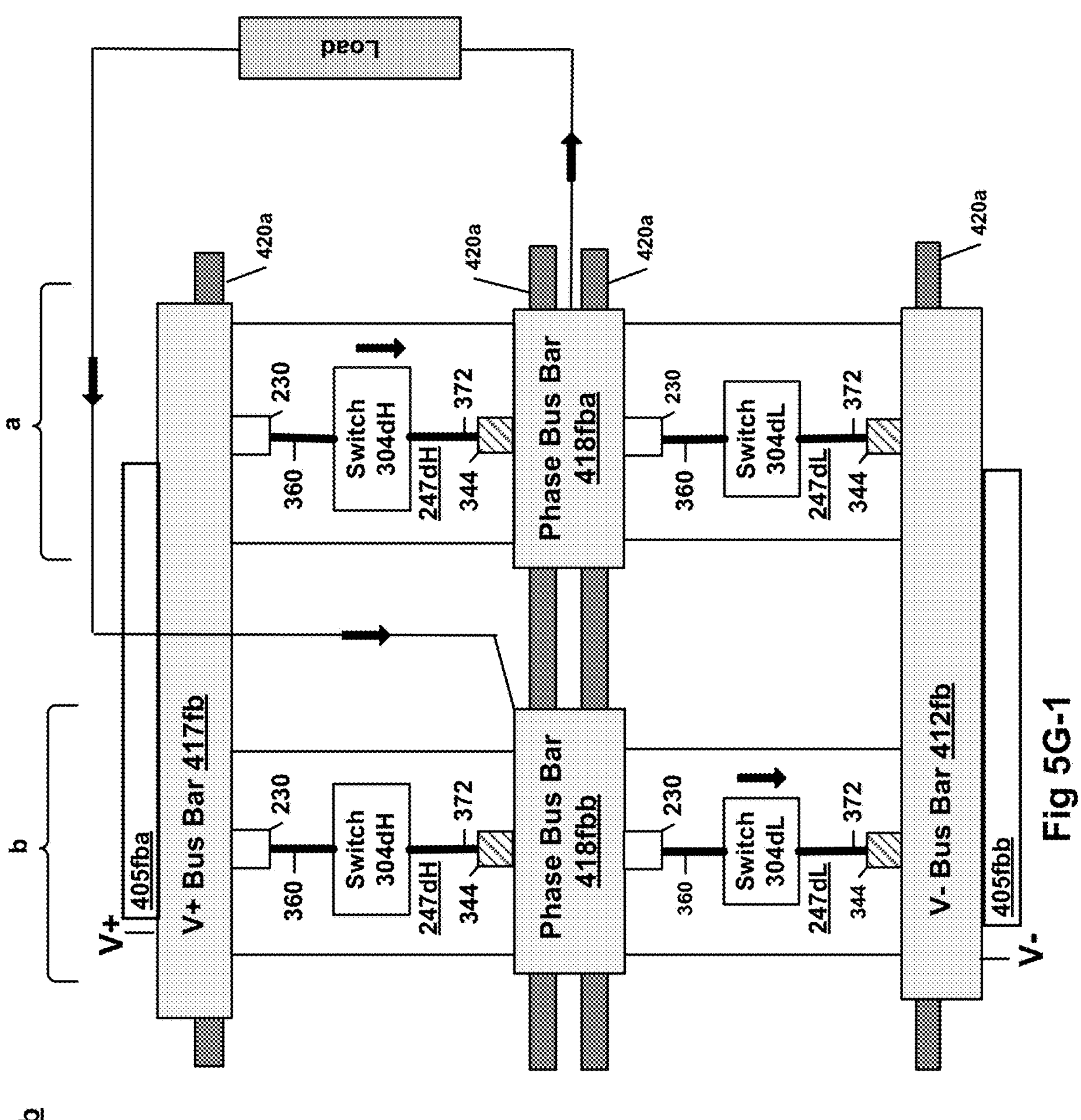
Figures 2, 5G:
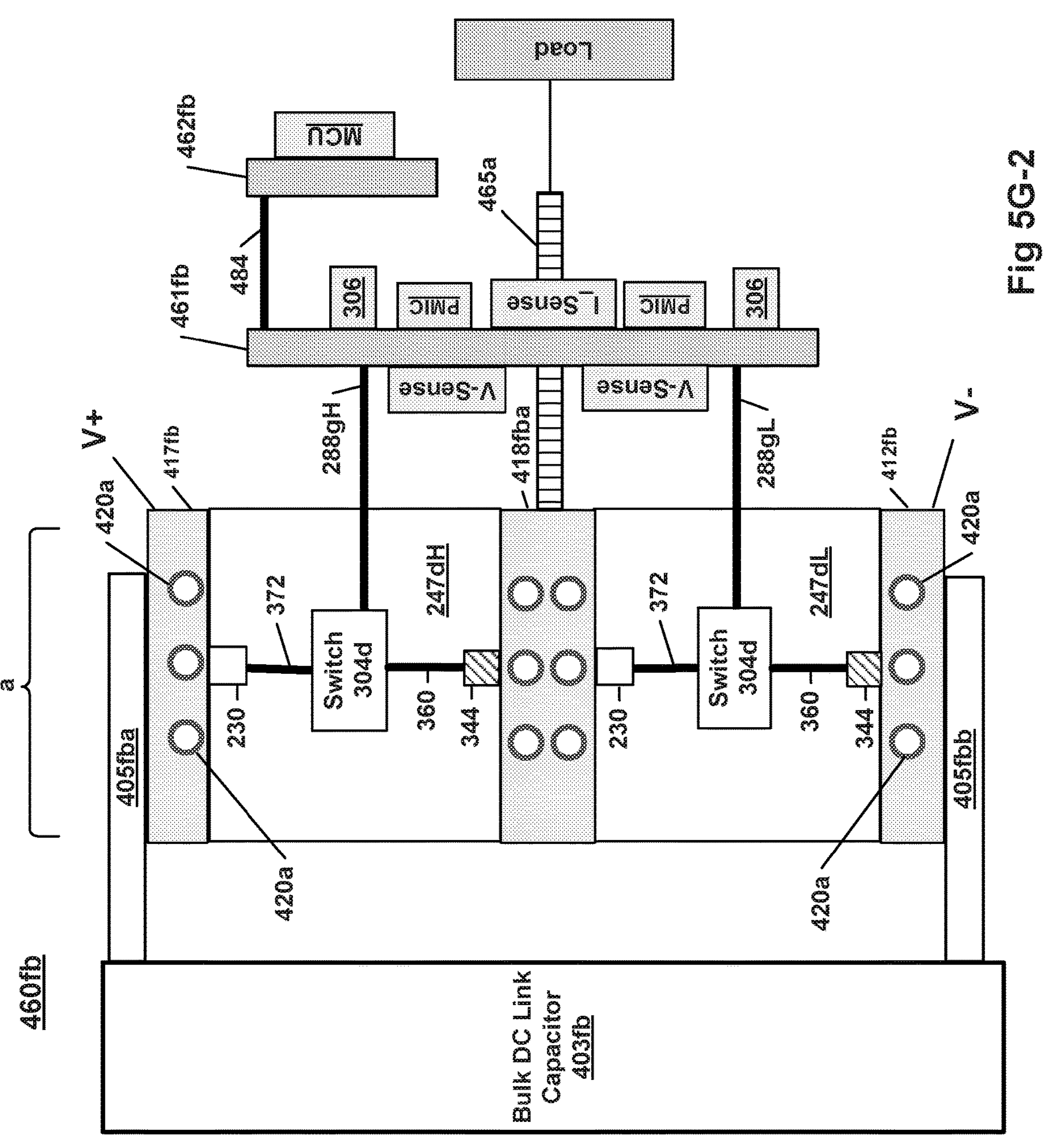
Figure 5H:
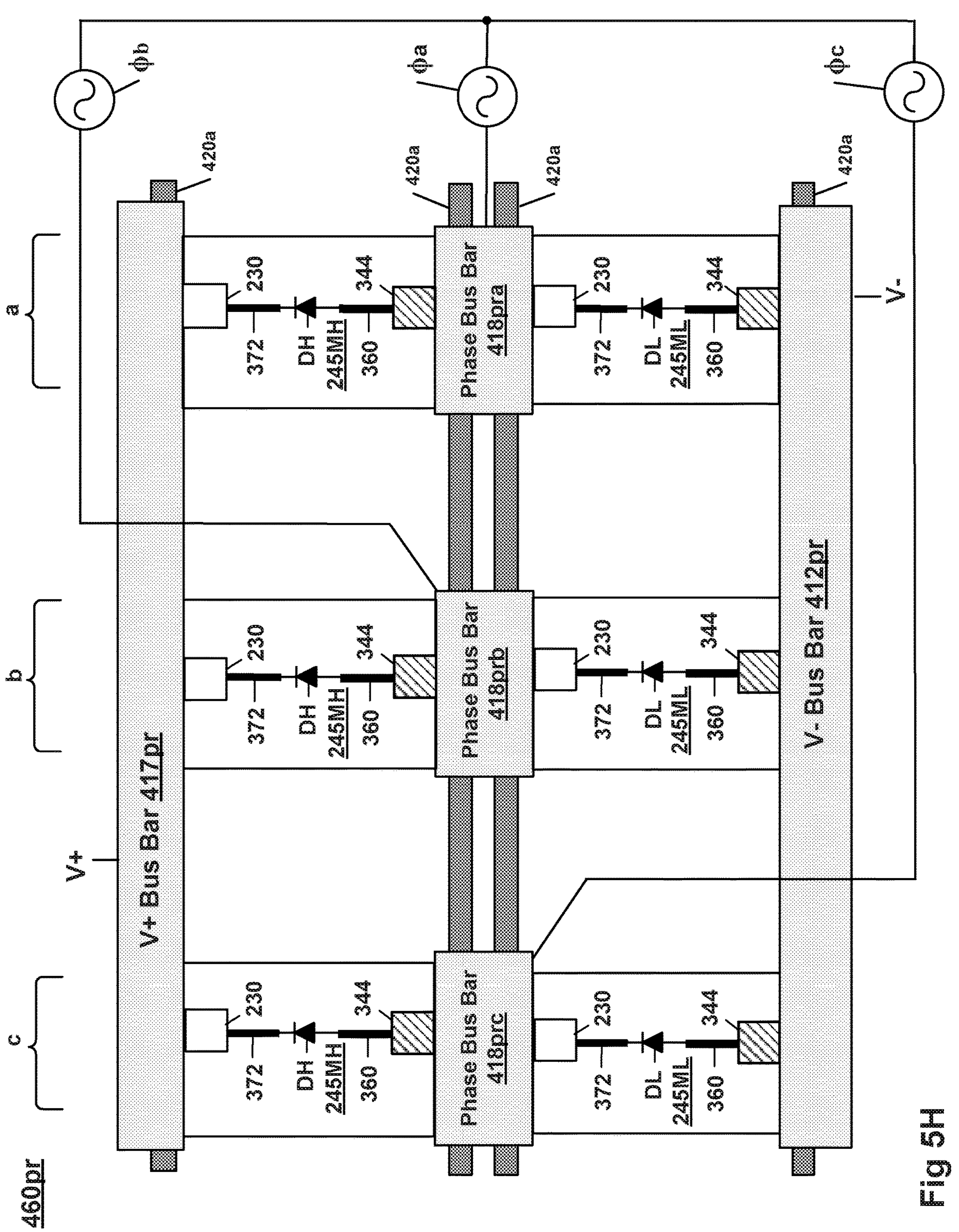
FIG. 5H is a front view of an example converter.

FIG. 5H shows an example passive rectifier 460*pr* in which the packaged switches 247*d* of FIG. 5B-1 are replaced by packaged diodes 245M. The packaged diodes 245 may be connector-lead less. V+ bus bar 417T, V− bus bar 412T, and Phase bus bars 418T of FIG. 5B-1 are renamed 417*pr*, 412*pr*, 418*pr*, respectively, in FIG. 5H. Passive rectifier 460*pr* may lack a control PCB and a driver PCB.

Die substrate terminals 230 of packaged diodes 245MH are electrically and thermally attached (e.g., sintered, press-fitted, etc.) directly to a flat surface or respective flat surfaces of V+ bus bar 417*pr*. Die clip terminals 344 of packaged diodes 245MH are electrically and thermally attached (e.g., sintered, press-fit, etc.) to a flat surface of a respective phase bus bar 418*pr*.

Die substrate terminals 230 of packaged diodes 245ML are electrically and thermally connected (e.g., sintered, press-fit, etc.) directly to a flat surface of a respective phase bus bar 418*pr*. Die clip terminals 344 of packaged diodes 245ML are electrically and thermally connected (e.g., sintered, press-fit, etc.) directly to a flat surface or respective flat surfaces of V− bus bar 404*pr*.

Inverter 460*id*

FIG. 5C illustrates relevant components of an example inverter 460*id* when seen from the front. Several components (i.e., driver PCB, control PCB, manifolds, and DC link capacitors) are not shown or fully shown in FIG. 5C.

Inverter 460*id* has three phases designated a-c. Each of the phases includes four packaged switches 247, and a phase bus bar 418*d*, respectively, which in turn are sandwiched between V+ bus bar 417*d* and V− bus bar 412*d*. The figure illustrates the linear positioning of packaged switches 247, V+ bus bar 417*d*, phase bus bars 418*d*, and V− bus bar 412*d* with respect to each other. Phase bus bars 418*da*-418*dc* are electrically connected to stator windings Wa-Wc, respectively.

All packaged switches 247 of inverter 460*id* may be a version of packaged switch 247*d*, 247*p* or 247*q*. In FIG. 5C, each phase of inverter 460*id* has a mix of packaged switch versions. As shown each phase includes a pair of packaged switches 247*d*, and a pair of packaged switches 247*q*. Packaged switches 247*d* may be packaged switch 247*d*A, 247*d*B, 247*d*C, 247*d*D or 247*d*O of FIG. 3A, 3B, 3C, 3D, or 3O, respectively, and packaged switches 247*q* may be packaged switch 247*q*E, 247*q*F, 247*q*G, 247*q*I, 247*q*J, 247*ql*, 247*q*P of FIGS. 3E, 3F, 3G, 3I, 3J, 3L, and 3P, respectively. For example, each of packaged switches 247*d* may be packaged switch 247*d*O shown in FIG. 3O or packaged switch 247*d*B shown in FIG. 3B, and each of packaged switches 247*q* may be packaged switch 247*q*P shown in FIG. 3P or packaged switch 247*q*F shown in FIG. 3F. In another version, each packaged switch 247*q* in FIG. 5C may be swapped with packaged switch 247*d*B, while each packaged switch 247*d* is packaged switch 247*d*A or 247*d*O. Packaged switches 247 in inverter 460*id* may take form packaged switches that lack connector-lead 288*ds* and/or 288*dc*. All switches 304 in inverter 460*id* can be independently controlled by an MCU or other data processing device.

Packaged switches 247*d*H and 247*q*H in each phase may have die substrate terminals 230 that are electrically and thermally connected (e.g., sintered, press-fitted, etc.) directly to a flat surface or respective flat surfaces of V+ bus bar 417*d*, and die clip terminals 344 that are electrically and thermally connected (e.g., sintered, press-fitted, etc.) directly to a flat surface or respective flat surfaces of a corresponding phase bus bar 418*d*, which in turn have terminals that may be electrically connected to windings Wa-Wc, respectively. Packaged switches 247*d*L and 247*q*L in each phase may have die substrate terminals 230 that are electrically and thermally connected (e.g., sintered, press-fitted, etc.) directly to a flat surface or respective flat surfaces of a corresponding phase bus bar 418*d*, and die clip terminals 344 that are electrically and thermally connected (e.g., sintered, press-fitted, etc.) directly to a flat surface or respective flat surfaces of V− bus bar 412*d*.

V+ bus bar 417*d*, V− bus bar 412*d*, and phase bus bars 418*d* in FIG. 5C may have a rectangular cross-section. Example phase bus bars 418*d* may have a height, width, and length around 12 mm, 30 mm, and 70 mm, respectively. Example V+ bus bar 417*d* and V− bus bar 412*d* may have a height, width, and length around 8 mm, 30 mm, and 230 mm, respectively.

FIG. 5C shows inverter 460*id* with dielectric tubes 420*a* received in respective channels (not shown) of the bus bars. All tubes 420*a* in FIG. 5C may be substantially equal in length. Each tube 420*a* has first and second ends, which may be in fluid communication with first and second fluid manifolds (not shown), respectively, like those shown in FIG. 5A-25. Phase bus bars 418*da*-418*dc* are thermally connected to each other and electrically isolated from each other by commonly received dielectric tubes 420*a*.

Inverter 460*id* includes packaged DC link capacitors, like those shown in FIG. 5A-2, with capacitor-leads 405. Inverter 460*id* may also include packaged multilayer ceramic DC link capacitors with first and second metal terminals electrically and thermally connected directly to bus bars 417*d* and 412*d*, respectively.

FIG. 5C includes electrical current symbols that represent electrical current flow through inverter system 460*id* at an instant in time. More particularly, FIG. 5C shows electrical current flow through activated switches 304 of packaged switches 247*d*H and 247*q*H in phase-a, while switches 304 of packaged switches 247*d*L and 247*q*L in phases b and c are activated and conducting current to the V− terminal through the V− bus bar 412*d*. All other switches are deactivated in the figure.

Inverter 460*id* may include a control PCB and a driver PCB like those shown FIG. 5A-2. The driver PCB may include drivers that are electrically connected to and control respective switches 304 in packaged switches 247*d* through respective connector-leads 288*g*, and drivers that are electrically connected to and control respective switches 304 in packaged switches 247*q* through respective sets of connector-leads 288*g*1 and 288*g*2.

Inverter 460*iq*

FIGS. 5D-1, 5D-2 and 5D-3 illustrate relevant components of an example inverter 460*iq* when seen from the front, back, and side, respectively. Several components (i.e., driver PCB 461*iq*1, driver PCB 461*iq*2, and DC link capacitors 403*q*) are not shown or fully shown in all figures but are described below.

FIGS. 5D-1 and 5D-2 show front and back views of example inverter 460*iq*. FIGS. 5D-1 and 5D-2 show leads 405*q* of DC link capacitors 403*q*. Inverter 460*iq* has three phases designated a-c, each of which includes eight packaged switches 247.

Inverter 460*iq* has a mix of packaged switches 247*d* and 247*q*. As seen in FIGS. 5D-1 and 5D-2, each phase includes packaged switches 247*d*1-247*d*4 and packaged switches 247*q*1-247*q*4. Alternatively, all packaged switches of inverter 460*iq* may be swapped with a version of packaged switch 247*p*, 247*q*, or 247*d*. Transistors of switches 304 in packaged switches 247 of inverter 460*iq*, regardless of whether the transistors are in packaged switches 247*d*, 247*p*, or 247*q*, can be independently controlled by an MCU on control PCB 462*iq*. Packaged switches 247*d*2, 247*d*4, and 247*q*1-247*q*4 in each phase may take form in packaged switches that lack connector-lead 288*dc* and/or 288*ds*.

All packaged switches 247*d*1-247*d*4 may be the same, and all packaged switches 247*q*1-247*q*4 may be the same. Packaged switches 247*d* of inverter 460*iq* may be packaged switch 247*d*A, 247*d*B, 247*d*C, 247*d*D or 247*d*O of FIGS. 3A, 3B, 3C, 3D, and 3O, respectively, and packaged switches 247*q* may be packaged switch 247*q*E, 247*q*F, 247*q*G, 247*q*I, 247*q*J, 247*q*1, or 347*q*P of FIGS. 3E, 3F, 3G, 3I, 3J, 3L, and 3P, respectively. For example, each of packaged switches 247*d*1-247*d*4 may be packaged switch 247*d*O shown in FIG. 3O or packaged switch 247*d*B shown in FIG. 3B, and each of packaged switches 247*q*1-247*q*4 may be packaged switch 247*q*P shown in FIG. 3P or packaged switch 247*q*F shown in FIG. 3F.

Inverter 460*iq* includes V+ bus bar 417*q*, V− bus bar 412*q*, and phase bus bars 418*q*. Bus bars, like V+ bus bar 417*q*, V− bus bar 412*q*, and phase bus bars 418*q*, may also act as heat sinks to cool switches 304 or diodes D.

Each phase a-c includes packaged switches 247*d*1-247*d*4 and packaged switches 247*q*1-247*q*4 that are electrically and thermally connected to a phase bus bar 418*q*, which in combination is sandwiched between V+ bus bar 417*q* and V− bus bar 412*q*. Packaged switches 247*d*1, 247*d*2, 247*q*1, and 247*q*2 are electrically and thermally connected to V+ bus bar 417*q*, and packaged switches 247*d*3, 247*d*4, 247*q*3, and 247*q*4 are electrically and thermally connected to V− bus bar 412*q*.

FIGS. 5D-1 and 5D-2 illustrate the linear positioning of packaged switches 247, V+ bus bar 417*q*, phase bus bars 418*q*, and V− bus bar 412*q* with respect to each other. Packaged switches 247*d*1 and 247*d*2 in each phase may have die substrate terminals 230 that are electrically and thermally connected (e.g., sintered, press-fitted, etc.) directly to a flat surface or respective flat surfaces of V+ bus bar 417*q*, and die clip terminals 344 that are electrically and thermally connected (e.g., sintered, press-fitted, etc.) directly to a flat surface or respective flat surfaces of a corresponding phase bus bar 418*q*, which in turn have terminals that may be electrically connected to windings Wa-Wc, respectively. Packaged switches 247*q*1 and 247*q*2 in each phase may have die substrate terminals 230 that are electrically and thermally connected (e.g., sintered, press-fitted, etc.) directly to the flat surface or respective flat surfaces of V+ bus bar 417*q*, and die clip terminals 344 that are electrically and thermally connected (e.g., sintered, press-fitted, etc.) directly to a flat surface or respective flat surfaces of a corresponding phase bus bar 418*q*. Packaged switches 247*d*3 and 247*d*4 in each phase may have die substrate terminals 230 that are electrically and thermally connected (e.g., sintered, press-fitted, etc.) directly to a flat surface or respective flat surfaces of a corresponding phase bus bar 418*q*, and die clip terminals 344 that are electrically and thermally connected (e.g., sintered, press-fitted, etc.) directly to a flat surface or respective flat surfaces of V− bus bar 412*q*. Packaged switches 247*q*3 and 247*q*4 in each phase may have die substrate terminals 230 that are electrically and thermally connected (e.g., sintered, press-fitted, etc.) directly to a flat surface or respective flat surfaces of a corresponding phase bus bar 418*q*, and die clip terminals 344 that are electrically and thermally connected (e.g., sintered, press-fitted, etc.) directly to the flat surface or respective flat surfaces of V− bus bar 412*q*.

Bus bars, like V+ bus bar 417*q*, V− bus bar 412*q*, and phase bus bars 418*q* in FIGS. 5D-1-5D-3, may have a rectangular cross-section. Example phase bus bars 418*q* may have a height, width, and length around 8 mm, 60 mm, and 70 mm, respectively. Example V+ bus bar 417*q* and V− bus bar 412*q* may have a height, width, and length around 8 mm, 60 mm, and 230 mm, respectively. Bus bars may have different dimensions to accommodate differences in converter design.

FIGS. 5D-1-5D-3 show inverter 460*iq* with dielectric tubes 420*a* received in respective channels (not shown). In alternative versions tubes other than 420*a*, such as tubes 420*b*, can be received in channels. Phase bus bars 418*qa*-418*qc* are thermally connected to each other and electrically isolated from each other by commonly received dielectric tubes 420*a*.

Inverter 460*iq* may include packaged DC link capacitors 403*q*. First and second metal capacitor-leads 405*qa* and 405*qb* may extend from one of the packaged capacitor's dielectric wall. Example capacitor-leads 405*q* have a height hbc, length lbc, and width wbc around 6 mm, 30 mm, and 50 mm, respectively. Capacitor-leads, including capacitor-leads 405, may have substantially flat, rectangular-shaped opposite facing top and bottom surfaces. A substantial portion (e.g., 10, 20, 50, 75, 90% or more) of each capacitor-lead 405*qa*'s flat bottom surface area may be electrically and thermally connected (e.g., welded, soldered, press-fitted by screws or other fasteners, etc.) directly to a flat surface of V+ bus bar 417*q*, and a substantial portion (e.g., 10, 20, 50, 75, 90% or more) of each capacitor-lead 405*qb*'s flat top surface area may be electrically and thermally connected (e.g., welded, soldered, press-fitted by screws or other fasteners, etc.) directly to a flat surface of V− bus bar 412*q*.

Inverter 460*iq* may include one or more packaged ceramic DC link capacitors (e.g., multilayer ceramic capacitors) with first and second metal terminals that are electrically and thermally connected directly or indirectly to flat surfaces V+ bus bar 417*q* and V− bus bar 412*q*, respectively.

FIG. 5D-1 includes electrical current symbols that represent electrical current flow through inverter system 460*iq* at an instant in time. More particularly, FIG. 5D-1 shows electrical current flow through activated switches 304 in packaged switches 247*d*1 and 247*d*2 of phase-a, while switches 304 in packages 247*d*3 and 247*d*4 of phases b and c are activated and conducting current to the V− terminal through the V− bus bar 412*q*. All other switches, including switches 304 in packaged switches 247*q*, are deactivated, it being understood that a combination of packaged switches 247*d* and 247 may operate to convert power.

Inverter 460*iq* may include driver PCBs 461*iq*1 and 461*iq*2 with drivers 306 that are electrically connected to and control respective switches 304 through respective connector-leads 288 or respective sets of connector-leads 288*g*1 and 288*g*2. Only connector-leads 288*gc*, 288*g*1, and 288*g*2 of phase c are shown in FIG. 5D-3. Inverter 460*iq* may include a control PCB 462*iq* with an MCU that is in data communication with drivers 306, current sensors I_Sense, voltage sensors V_Sense, and other components mounted on driver PCBs 461*iq*1 and 461*iq*2. Data connections 484-1 and 484-2 may facilitate data communication.

Driver PCB 461*iq*1 in FIG. 5D-3 includes drivers 306 in data communication with respective packaged switches 247*q* of phase c through respective sets of connector-leads 288*g*1 and 288*g*2. Driver PCB 461*iq*1 also includes drivers that are in similar data communication with respective packaged switches 247*q* in phases a and b. Driver PCB 461*iq*2 in FIG. 5D-3 includes drivers 306 in data communication with respective packaged switches 247*d* of phase c through respective connector-leads 288*gc*. Driver PCB 462*iq*2 also includes drivers that are in similar data communication with respective packaged switches 247*d* in phases a and b.

Driver PCB 461*iq*2 includes voltage sensors V_Sense in data communication with respective packaged switches 247*d* via respective pairs or connector-leads 288*ds* and 288*dc* (not shown). Example phase bus bar-lead 465*c* extends laterally between first and second ends. The first end of phase bus bar-lead 465*c* is electrically connected to phase bus bar 418*qc*, and the second end is electrically connected to winding Wc. Phase bus bar-lead 465*c* extends through an aperture in PCB 461*iq*2. Current sensor I_Sense measures electrical current flowing through phase bus bar-connector 465*c*. I_Sense may include an aperture through which phase bus bar-connector 465*c* extends. FIG. 5D-3 shows voltage sensors V_Sense, PMICs, current sensor I_Sense, and a phase bus bar-lead 465 for phase c. Similar groups voltage sensors V_Sense, PMICs, current sensor I_Sense, and phase bus bar-lead 465 are mounted on or extending through PCB 461*iq*2 for phases a and b.

All tubes 420*a* received in all bus bars, such as bus bar 412*q*, may be substantially equal in length. Each tube 420*a* has first and second ends. The first ends of all tubes 420*a* may be in fluid communication with the first manifold, while the second ends of all the tubes 420*a* may be in fluid communication with the second manifold.

Vienna Rectifier 400*vr*1

FIGS. 5E-1-5E-3 illustrate relevant components of an example rectifier 400*vr*1 when seen from the front and the sides. Rectifier 400*vr*1 is an example of a three-phase "Vienna" rectifier. Rectifier system 400*vr*1 cannot operate bi-directionally. Driver PCB 421 is shown in FIGS. 5E-2 and 5E-3 but not in FIG. 5E-1. Although not shown, rectifier 400*vr*1 may have manifolds and a control PCB with an MCU.

Referencing FIG. 5E-1, rectifier 400*vr*1 has three phases designated a-c. Each phase may include a bidirectional packaged switch 247. Phases a-c include packaged switches 247*qa*-247*qc*, respectively. Each of packaged switches 247*qa*-247*qc* may be packaged switch 247*q*G, 247*q*I, 247*q*J, or 247*ql* of FIGS. 3G, 3I, 3J, and 3L, respectively. In an alternative version, each phase may include a packaged switch 247*p*K shown in FIG. 3K. All switches 304 of rectifier 400*vr*1 can be independently controlled by an MCU or other data processing device.

Rectifier 400*vr*1 may include rectangularly shaped V+ bus bar 431, V− bus bar 430, phase bus bars 520, and common bus bar 404*vr*, each of which may also act as heat sinks to cool switches 304 or diodes D.

Each of the phase bus bars 520 may have a height, width, and length around 10 mm, 37 mm, and 30 mm, respectively. Cases of packaged switches 247*qa*-247*qc* may be thermally connected to phase bus bars 520*a*-520*c*, respectively. Packaged switches 247*qa*-247*qc* may have die substrate terminals 230 that are electrically and thermally connected directly to surfaces of phase bus bars 520*a*-520*c*, respectively. Phase bus bars 520*a*-520*c* are electrically connected to AC sources ϕa-ϕc, respectively. All figures show a common bus bar 404*vr*, which may have a height, width, and length around 10 mm, 30 mm, and 100 mm, respectively. Cases of packaged switches 247*q* may be thermally connected to surfaces of bus bar 404*vr* and respective phase bus bars 520.

FIGS. 5E-2 and 5E-3 are left and right-side views of rectifier 400*vr*1 of FIG. 5E-1. As seen, V− bus bar 430 and V+ bus bar 431 have a rectangular cross section shape. Bus bars 430 and 431 may have a height, width, and length around 10 mm, 17 mm, and 100 mm, respectively. Bus bars 430 and 431 may have dimensions that are unequal to each other in another version. V− bus bar 430 and V+ bus bar 431 have terminals that may provide DC power to a device such as a DC/DC converter. Like bus bar 404*vr* and phase bus bars 520, bus bar 430 and bus bar 431 have channels that hold tubes 420*a* through which a cooling fluid can flow.

FIGS. 5E-2 and 5E-3 show the linear positioning of packaged switches 247*q*, phase bars 520, V− bus bar 430, V+ bus bar 431 and bus bar 404*vr* with respect to each other in phases a and c.

Each phase of rectifier 400*vr*1 may include a pair of packaged diodes 245-1 and 245-2, which include diodes D1 and D2, respectively. For purposes of explanation only, packaged dies 245-1 and 245-2 take form in packaged diode 245M shown of FIG. 3M. Die substrate terminals 230 of packaged diodes 245-2 and die clip terminals 344 of packaged diodes 245-1 in each phase are electrically and thermally attached (e.g., sintered, press-fitted, etc.) directly to a flat surface or respective flat surfaces of V+ bus bar 431 and V− bus bar 430, respectively. Die substrate terminals 230 of packaged diodes 245-1 and die clip terminals 344 of packaged diodes 245-2 in each phase are electrically and thermally attached (e.g., sintered, press-fit, etc.) directly to a flat surface or respective flat surfaces of a corresponding phase bus bar 520.

Die substrate terminals 230 of packaged switches 247*qa*-247*qc* are electrically and thermally connected (e.g., sintered, press-fit, etc.) directly to flat surfaces of phase bus bars 520*a*-520*c*, respectively. Die clip terminals 344 of packaged switches 247*qa*-247*qc* are electrically and thermally connected (e.g., sintered, press-fit, etc.) directly to a flat surface or respective flat surfaces of common bus bar 404*vr.*

Capacitors C− and C+, which may be polar capacitors as shown, are electrically connected to bus bar 404*vr*. Capacitors C− and C+ may also be thermally connected to bus bar 404*vr*. Surfaces of first terminals or leads of capacitors C− and C+ may be sintered, soldered, press-fitted, welded, or connected by other means to a flat surface or respective flat surfaces of bus bar 404*vr*. Capacitors C− and C+ are electrically connected bus bars 430 and 431, respectively. Surfaces of second terminals or leads of capacitors C− and C+ may be sintered, soldered, press-fitted, welded, or connected by other means to flat surfaces of V− bus 430 and V+ bus bar 431, respectively. Bus bars 430 and 431 are shown symbolically in FIG. 5E-1.

FIGS. 5E-1-5E-3 show rectifier 400*vr*1 with dielectric tubes 420*a* received in respective bus bar channels (not shown). In alternative versions tubes other than 420*a*, such as tubes 420*b*, can be received in channels. Phase bus bars 520 are thermally connected to each other and electrically isolated from each other by commonly received dielectric tubes 420*a*.

Rectifier 400*vr*1 may include driver PCB 421 with drivers 306 that are electrically connected to and control respective switches 304 through respective sets of connector-leads 288*g*1 and 288*g*2. Only connector-leads 288*g*1 and 288*g*2 of phases c and a are shown in FIG. 5E-2 and FIG. 5E-3, respectively. Rectifier 400*vr*1 may include a control PCB with an MCU in data communication with drivers 306, current sensors I_Sense, voltage sensors V_Sense, and other components mounted on driver PCB 421. A connector (e.g., a flexible PCB, not shown) may facilitate the data communication.

Driver PCB 421 includes voltage sensors V_Sense in data communication with respective packaged switches 247*q* via respective pairs or connector-leads 288*ds* and 288*dc* (not shown). Example phase bus bar-leads 465*a* and 465*c* extend laterally between first and second ends. The first ends of phase bus bar-leads 465*a* and 465*c* are electrically connected to phase bus bars 520*a* and 520*c*, respectively, and the second ends are electrically connected to AC sources a and 4*c*, respectively. Phase bus bar-leads 465*a* and 465*c* extend through respective apertures in PCB 421. Current sensors I_Sense-a and I_Sense-c measure electrical current flowing through phase bus bar-connectors 465*a* and 465*c*, respectively. I_Sense-a and I_Sense-c may include respective apertures through which phase bus bar-connectors 465*a* and 465*c*, respectively, extend. FIGS. 5E-2 and 5E-3 show voltage sensors V_Sense, PMICs, drivers 306, current sensors I_Sense, and phase bus bar-leads 465 for phases a and c, respectively. A voltage sensor V_Sense, PMICs, drivers 306, current sensor I_Sense, and phase bus bar-lead 465 are mounted on or extending through PCB 421 for phase b.

A control PCB of rectifier 400*vr*1 may include a phase-lock loop (PLL) and other components for synchronizing the control of switches 304 to the frequency (e.g., 60 Hertz) of the three-phase AC input voltages provided by the AC sources ϕa-ϕc. Additional components may be added for power factor correction.

All tubes 420, such as tubes 420*a* in FIG. 5E-1, received in all bus bars may be substantially equal in length. Each tube 420*a* has first and second ends. The first ends of all tubes 420*a* may be in fluid communication with a first manifold, while the second ends of all the tubes 420*a* may be in fluid communication with the second manifold.

Vienna Rectifier 400*vr*2

FIGS. 5F-1-5F-3 illustrate relevant components of an example rectifier 400*vr*2 when seen from the front and the sides. Rectifier 400*vr*2 is another example of a three-phase Vienna rectifier. Rectifier system 400*vr*2 cannot operate bi-directionally. Driver PCB 521 is shown in FIGS. 5F-2 and 5F-3 but not in FIG. 5F-1. Although not shown, rectifier 400*vr*2 may have manifolds and a control PCB with an MCU.

Referencing FIG. 5F-1, rectifier 400*vr*2 has three phases designated a-c. Each phase may include a pair of packaged switches 247*d*H and 247*d*L. Each of packaged switches 247*d* may be packaged switch 247*d*A, 247*d*B, or 247*d*D of FIGS. 3A, 3B, and 3D, respectively. All switches 304 of rectifier 400*vr*2 can be independently controlled by an MCU or other data processing device.

Rectifier 400*vr*2 may include rectangularly shaped V+ bus bar 431, V− bus bar 430, phase bus bars 520, and common bus bar 404*vr*, each of which may also act as heat sinks to cool switches 304 or diodes D. In addition, rectifier 400*vr*2 may include metal heat sinks 522.

Each of the phase bus bars 520 may have a height, width, and length around 10 mm, 37 mm, and 30 mm, respectively. Each of the metal heat sinks 520 are rectangular in shape and may have a height, width, and length around 10 mm, 30 mm, and 30 mm, respectively. Cases of packaged switches 247*d*Ha-247*d*Hc may be thermally connected to phase bus bars 520*a*-520*c*, respectively. Packaged switches 247*d*Ha-247*d*Hc may have die substrate terminals 230 that are electrically and thermally connected to surfaces of phase bus bars 520*a*-520*c*, respectively. Phase bus bars 520*a*-520*c* are electrically connected to AC sources ϕa-ϕc, respectively. Packaged switches 247*d*Ha-247*d*Hc may have die clip terminals 344 that are electrically and thermally connected to surfaces of metal heat sinks 522*a*-522*c*, respectively.

All figures show a common bus bar 404*vr*, which may have a height, width, and length around 10 mm, 30 mm, and 100 mm, respectively. Cases of packaged switches 247*d*La-247*d*Lc may be thermally connected to surfaces of bus bar 404*vr* and respective heat sinks 522*qa*-522*c*. Packaged switches 247*d*La-247*d*Lc may have die substrate terminals 230 that are electrically and thermally connected to a surface or respective surfaces of common bus bar 404*vr*. Packaged switches 247*d*La-247*d*Lc may have die clip terminals 344 that are electrically and thermally connected to surfaces of heat sinks 522*qa*-522*c*, respectively.

FIGS. 5F-2 and 5F-3 are left and right-side views of rectifier 400*vr*2 of FIG. 5F-1. As seen, V− bus bar 430 and V+ bus bar 431 have a rectangular cross section shape. Bus bars 430 and 431 may have a height, width, and length around 10 mm, 17 mm, and 100 mm, respectively. Bus bars 430 and 431 may have dimensions that are unequal to each other in another version. V− bus bar 430 and V+ bus bar 431 have terminals that may provide DC power to a device such as a DC/DC converter. Like bus bar 404_vr_, metal heat sinks 522, and phase bus bars 520, bus bar 430 and bus bar 431 have channels that hold tubes 420_a_ through which a cooling fluid can flow.

FIGS. 5F-2 and 5F-3 show the linear positioning of packaged switches 247_d_, phase bars 520, V− bus bar 430, heat sinks 522, V+ bus bar 431 and bus bar 404_vr_ with respect to each other in phases a and c.

Each phase of rectifier 400_vr_2 may include a pair of packaged diodes 245-1 and 245-2, which include diodes D1 and D2, respectively. For purposes of explanation only, packaged dies 245-1 and 245-2 take form in packaged diode 245M shown of FIG. 3M. Die substrate terminals 230 of packaged diodes 245-2 and die clip terminals 344 of packaged diodes 245-1 in each phase are electrically and thermally attached (e.g., sintered, press-fitted, etc.) directly to a flat surface or respective flat surfaces of V+ bus bar 431 and V− bus bar 430, respectively. Die substrate terminals 230 of packaged diodes 245-1 and die clip terminals 344 of packaged diodes 245-2 in each phase are electrically and thermally attached (e.g., sintered, press-fit, etc.) to a flat surface or respective flat surfaces of a corresponding phase bus bar 520.

Die substrate terminals 230 of packaged switches 247_d_Ha-247_d_Hc are electrically and thermally connected (e.g., sintered, press-fit, etc.) directly to flat surfaces of phase bus bars 520_a_-520_c_, respectively. Die clip terminals 344 of packaged switches 247_d_Ha-247_d_Hc are electrically and thermally connected (e.g., sintered, press-fit, etc.) directly to flat surfaces of respective metal heat sinks 522_a_-522_c_, respectively. Die clip terminals 344 of packaged switches 247_d_La-247_d_Lc are electrically and thermally connected (e.g., sintered, press-fit, etc.) directly to flat surfaces of metal heat sinks 522_a_-522_c_, respectively. Die substrate terminals 230 of packaged switches 247_d_La-247_d_Lc are electrically and thermally connected (e.g., sintered, press-fit, etc.) directly to flat surfaces of common bus bar 404_vr_.

Capacitors C− and C+, which may be polar capacitors as shown, are electrically connected to bus bar 404_vr_. Capacitors C− and C+ may also be thermally connected to bus bar 404_vr_. Surfaces of first terminals or leads of capacitors C− and C+ may be sintered, soldered, press-fitted, welded, or connected by other means to a flat surface of bus bar 404_vr_. Capacitors C− and C+ are electrically connected to bus bars 430 and 431, respectively. Capacitors C− and C+ may also be thermally connected to bus bars 430 and 431, respectively. Surfaces of second terminals or leads of capacitors C− and C+ may be sintered, soldered, press-fitted, welded, or connected by other means to surfaces of V− bus 430 and V+ bus bar 431, respectively. Bus bars 430 and 431 are shown symbolically in FIG. 5F-1.

FIGS. 5F-1-5F-3 show rectifier 400_vr_2 with dielectric tubes 420_a_ received in respective bus bar and heat channels (not shown). Heat sinks 522 are thermally connected but electrically isolated by commonly received tubes 420_a_. In alternative versions of rectifier 400_vr_2 tubes other than 420_a_, such as tubes 420_b_, can be received in channels. Phase bus bars 520 are thermally connected to each other and electrically isolated from each other by commonly received dielectric tubes 420_a_.

Rectifier 400_vr_2 may include driver PCB 521 with drivers 306 that are electrically connected to and control respective switches 304 through respective connector-leads 288. Only connector-leads 288_g_H, and 288_g_L of phases c and a are shown in FIG. 5F-2 and FIG. 5F-3, respectively. Rectifier 400_vr_2 may include a control PCB with an MCU in data communication with drivers 306, current sensors I_Sense, voltage sensors V_Sense, and other components mounted on driver PCB 521. A connector (e.g., a flexible PCB, not shown) may facilitate the data communication.

Driver PCB 521 includes voltage sensors V_Sense in data communication with respective packaged switches 247_d_ via respective pairs connector-leads 288_ds_ and 288_dc_ (not shown). Example phase bus bar-leads 465_a_ and 465_c_ extend laterally between first and second ends. The first ends of phase bus bar-leads 465_a_ and 465_c_ are electrically connected to phase bus bars 520_a_ and 520_c_, respectively, and the second ends are electrically connected to AC sources a and 4_c_, respectively. Phase bus bar-leads 465_a_ and 465_c_ extend through respective apertures in PCB 521. Current sensors I_Sense-a and I_Sense-c measure electrical current flowing through phase bus bar-connectors 465_a_ and 465_c_, respectively. I_Sense-a and I_Sense-c may include respective apertures through which phase bus bar-connectors 465_a_ and 465_c_, respectively, extend. FIGS. 5F-2 and 5F-3 show voltage sensor V_Senses, PMICs, current sensors I_Sense, drivers 306, and a phase bus bar-leads 465 for phases a and c, respectively. A voltage sensor V_Sense, current sensor I_Sense, PMICs, drivers 306, and phase bus bar-lead 465 are mounted on or extending through PCB 521 for phase b.

A control PCB of rectifier 400_vr_2 may include a PLL and other components for synchronizing the control of switches 304 to the frequency of the three-phase AC input voltages provided by the AC sources ϕa-ϕc. Additional components may be added for power factor correction.

All tubes 420, such as tubes 420_a_ in FIG. 5F-1, received in all bus bars and heat sinks may be substantially equal in length. Each tube 420_a_ has first and second ends. The first ends of all tubes 420_a_ may be in fluid communication with a first manifold, while the second ends of all the tubes 420_a_ may be in fluid communication with the second manifold.

Inverter 460_fb_

FIGS. 5G-1 and 5G-2 illustrate relevant components of an example full bridge inverter 460_fb_ when seen from the front and side, respectively. Several components (i.e., driver PCB 461_fb_, and control PCB 462_fb_) shown in FIG. 5G-2 are not shown or fully shown in FIG. 5G-1 but are described below.

Inverter 460_fb_ includes packaged switches 247_d_, it being understood that in an alternative version packaged switches 247_d_ may be replaced by packaged switches 247_p_ or packaged switches 247_q_.

All packaged switches 247_d_ of inverter 460_fb_ are the same. Packaged switches 247_d_ of inverter 460_fb_ may be packaged switch 247_d_A, 247_d_B, or 247_d_D of FIGS. 3A, 3B, and 3D, respectively.

Inverter 460_fb_ includes V+ bus bar 417_fb_, V− bus bar 412_fb_, and phase bus bars 418_fb_. Case surfaces of packaged switches 247 may be thermally connected to flat surfaces of bus bars, like V+ bus bar 417_fb_, V− bus bar 412_fb_, and phase bus bars 418_fb_.

Inverter 460_fb_ has two legs designated a and b. Each leg includes packaged switches 247_d_H and 247_d_L that are electrically and thermally connected to a phase bus bar 418_fb_, which in combination is sandwiched between V+ bus bar 417_fb_ and V− bus bar 412_fb_. Packaged switches 247_dh_ and 247_d_L are also electrically and thermally connected to V+ bus bar 417_fb_ and V− bus bar 412_fb_, respectively.

FIG. 5G-1 illustrates the linear positioning of packaged switches 247_d_, V+ bus bar 417_fb_, phase bus bars 418_fb_, and V− bus bar 412_fb_ with respect to each other. Die substrate terminals 230 and die clip terminals 344 may be pressed-fitted, soldered, sintered, welded, or connected by other means directly to corresponding flat surfaces of bus bars to establish thermal and electrical connectivity. Packaged switches 247dH in FIG. 5G-1 may have die substrate terminals 230 that are electrically and thermally connected (e.g., sintered, press-fitted, etc.) directly to a flat surface or respective flat surfaces of V+ bus bar 417fb, and die clip terminals 344 that are electrically and thermally connected (e.g., sintered, press-fitted, etc.) directly to flat surfaces of respective phase bus bars 418fba and 418fb, which in turn have terminals that may be electrically connected to terminals of a load. Packaged switches 247dL in FIG. 5G-1 may have die substrate terminals 230 that are electrically and thermally connected (e.g., sintered, press-fitted, etc.) directly to flat surfaces of respective phase bus bars 418fba and 418fbb, and die clip terminals 344 that are electrically and thermally connected (e.g., sintered, press-fitted, etc.) directly to a flat surface or respective flat surfaces of V− bus bar 412fb.

Bus bars, like V+ bus bar 417fb, V− bus bar 412fb, and phase bus bars 418fb in FIGS. 5G-1 and 5G-2, may have a rectangular cross-section. Example phase bus bars 418fb may have a height, width, and length around 12 mm, 29 mm, and 35 mm, respectively. Example V+ bus bar 417fb and V− bus bar 412fb may have a height, width, and length around 8 mm, 29 mm, and 70 mm, respectively. Bus bars may have different dimensions to accommodate differences in converter design.

FIGS. 5G-1 and 5G-2 show inverter 460fb with dielectric tubes 420a received in respective bus bar channels (not shown). In alternative versions tubes other than 420a, such as tubes 420b, can be received in the channels.

Phase bus bars 418fba and 418fbb are thermally connected to each other and electrically isolated from each other by commonly received dielectric tubes 420a. Tubes 420a are received in V+ bus bar 417fb, V− bus bar 412fb, and phase bus bars 418fb.

Inverter 460fb may include packaged DC link capacitor 403. First and second metal capacitor-leads 405fba and 405fbb extend from one of the capacitor's dielectric wall. A flat bottom surface of capacitor-lead 405fba may be electrically and thermally connected (e.g., welded, soldered, press-fitted by screws or other fasteners, etc.) directly to a flat surface of a bus bar such as V+ bus bar 417fb, and a flat top surface area of capacitor-lead 405fbb may be electrically and thermally connected to a flat surface of V− bus bar 412fb.

One or more packaged ceramic DC link capacitors may be electrically and thermally connected between V+ bus bar 417fb and V− bus bar 412fb. The one or more packaged ceramic DC link capacitors may have first and second metal terminals that may be electrically and thermally connected to a flat surface of V+ bus bar 417fb and V− bus bar 412fb, respectively.

FIG. 5G-1 includes electrical current symbols that represent electrical current flow through inverter 460fb at an instant in time. More particularly, FIG. 5G-1 shows electrical current flow through activated high-side switch 304dH of leg-a, while low-side switch 304dL of leg b is activated and conducting current to the V− terminal through the V− bus bar 412fb. All other switches 304 are deactivated in the figure.

Inverter 460fb may include control PCB 462fb and driver PCB 461fb. Drivers on driver PCB 461fb, may be electrically connected to respective switches 304 through respective connector-leads 288g. Only drivers and connector-leads 288gH and 288gL of leg-a are shown in FIG. 5G-2. PMICs provide supply voltages for respective drivers 306 and may be placed as close as possible on the opposite side of driver PCB 461fb as shown. Driver PCB 461fb in FIG. 5G-2 includes voltage sensors V_Sense in data communication with respective packaged switches 247d. Example phase bus bar-lead 465a extends laterally between first and second ends. The first end of phase bus bar-lead 465a is electrically connected to phase bus bar 418fba, and the second end is electrically connected to a load (e.g., primary side of a transformer). Phase bus bar-lead 465a extends through an aperture in PCB 461fb. Current sensor I_Sense measures electrical current flowing through phase bus bar-connector 465a. I_Sense may include an aperture through which phase bus bar-connector 465a extends. FIG. 5G-2 shows drivers 306, voltage sensors V_Sense, PMICs, current sensor I_Sense, and a phase bus bar-lead 465 for leg-a. A similar group of drivers 306, voltage sensors V_Sense, PMICs, current sensor I_Sense, and phase bus bar-lead 465 are mounted on or extending through PCB 461fb for leg b. FIG. 5G-2 shows an MCU mounted on control PCB 462fb. The MCU may be in data communication with each driver 306, V_Sense, and I_Sense mounted on driver PCB 461fb through a data connection 484.

All tubes 420, such as tubes 420a in FIG. 5G-1, received in all bus bars may be substantially equal in length. Although not shown in FIGS. 5G-1 and 5G-2, first and second manifolds similar to manifolds 466, may be in fluid communication with first and second ends, respectively, of tubes 420a.

Inverter 460it

FIGS. 5O-1, 5O-2 and 5O-3 illustrate relevant components of an example inverter 460it when seen from the front and sides. Several components (i.e., driver PCB 461it, driver PCB 461it, and DC link capacitors 403t) are not shown or fully shown in all figures but are described below.

Figures 3, 5I:
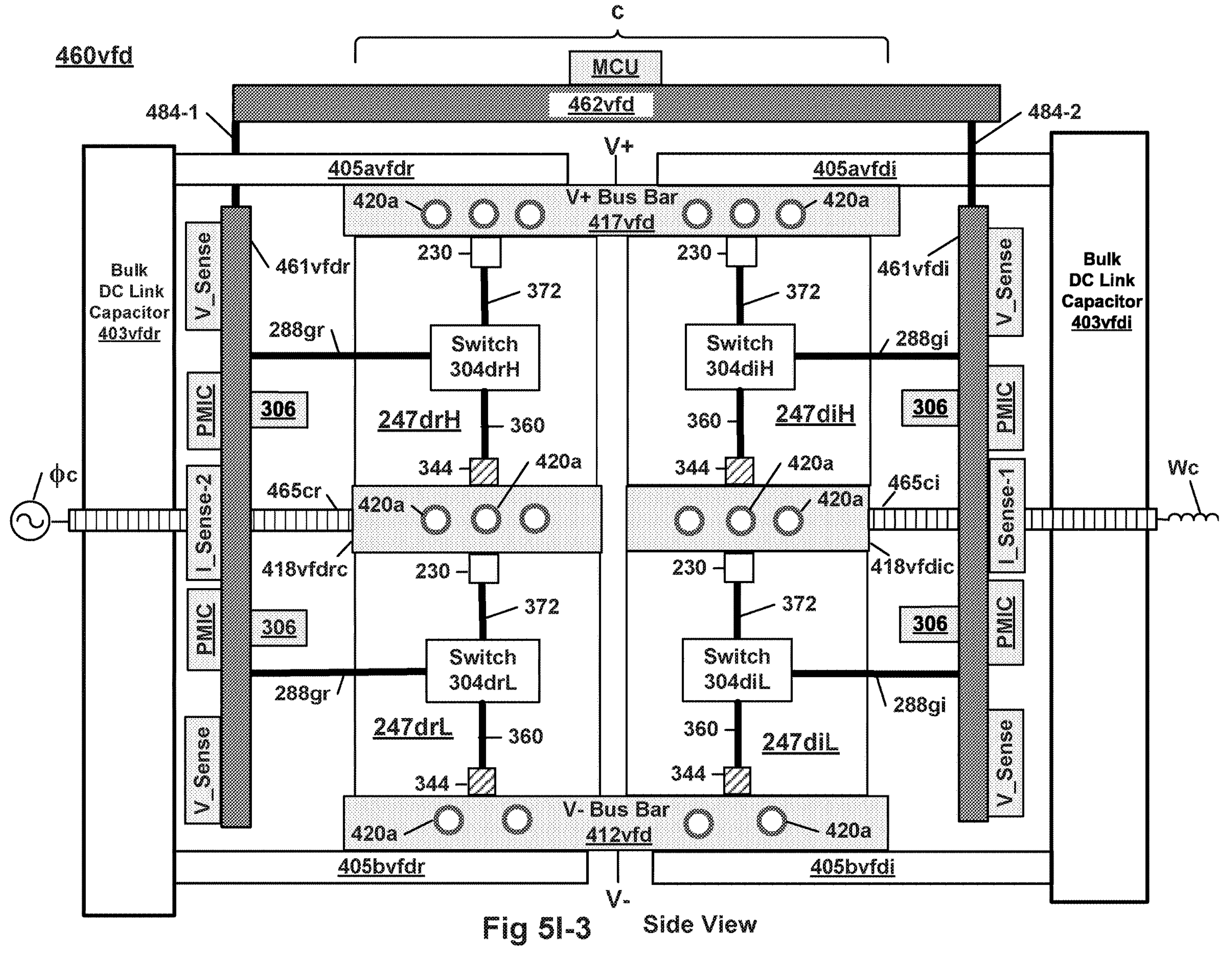
Figure 5J:
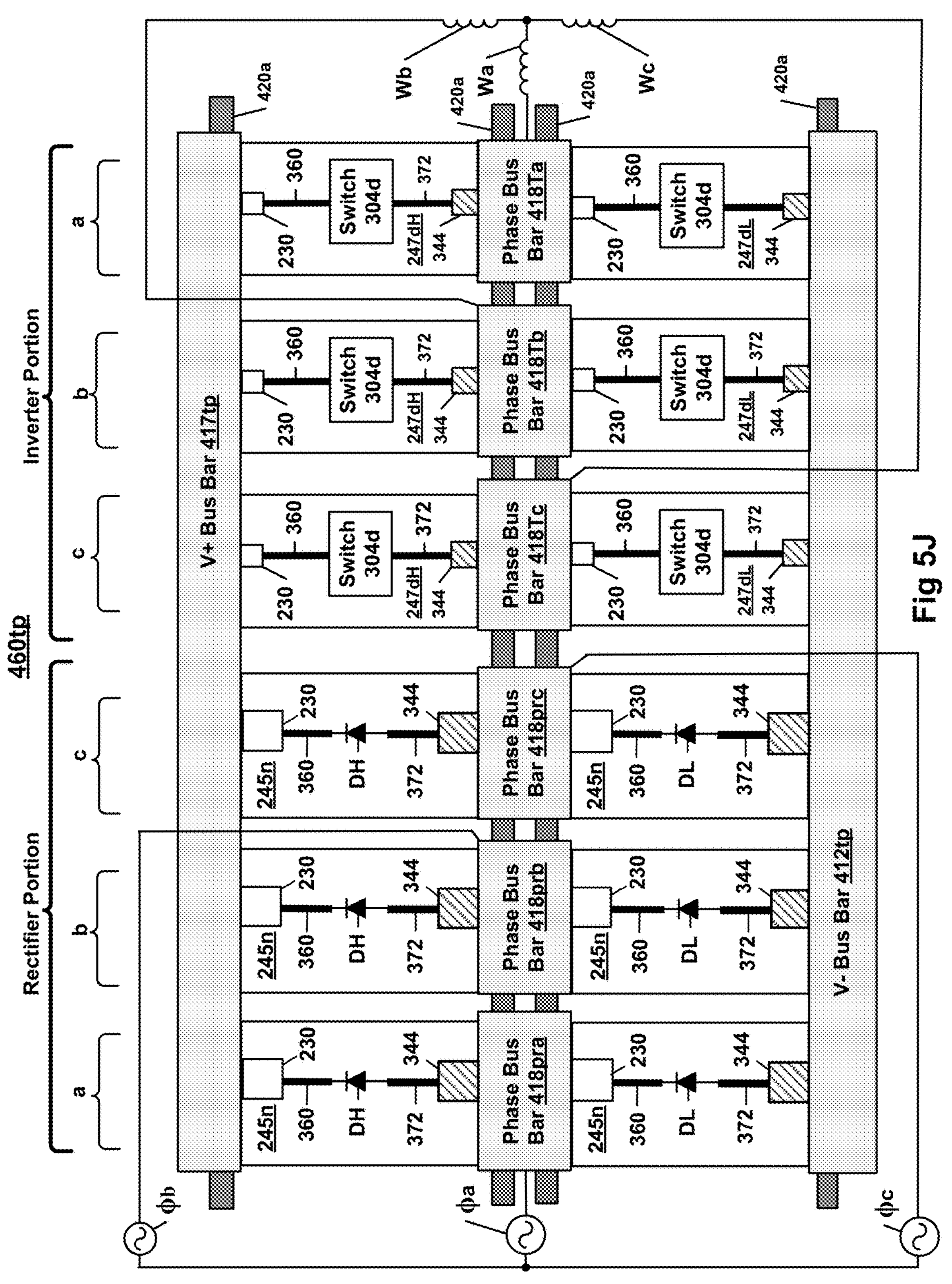
FIG. 5J is a front view of an example converter.
Figure 5K:
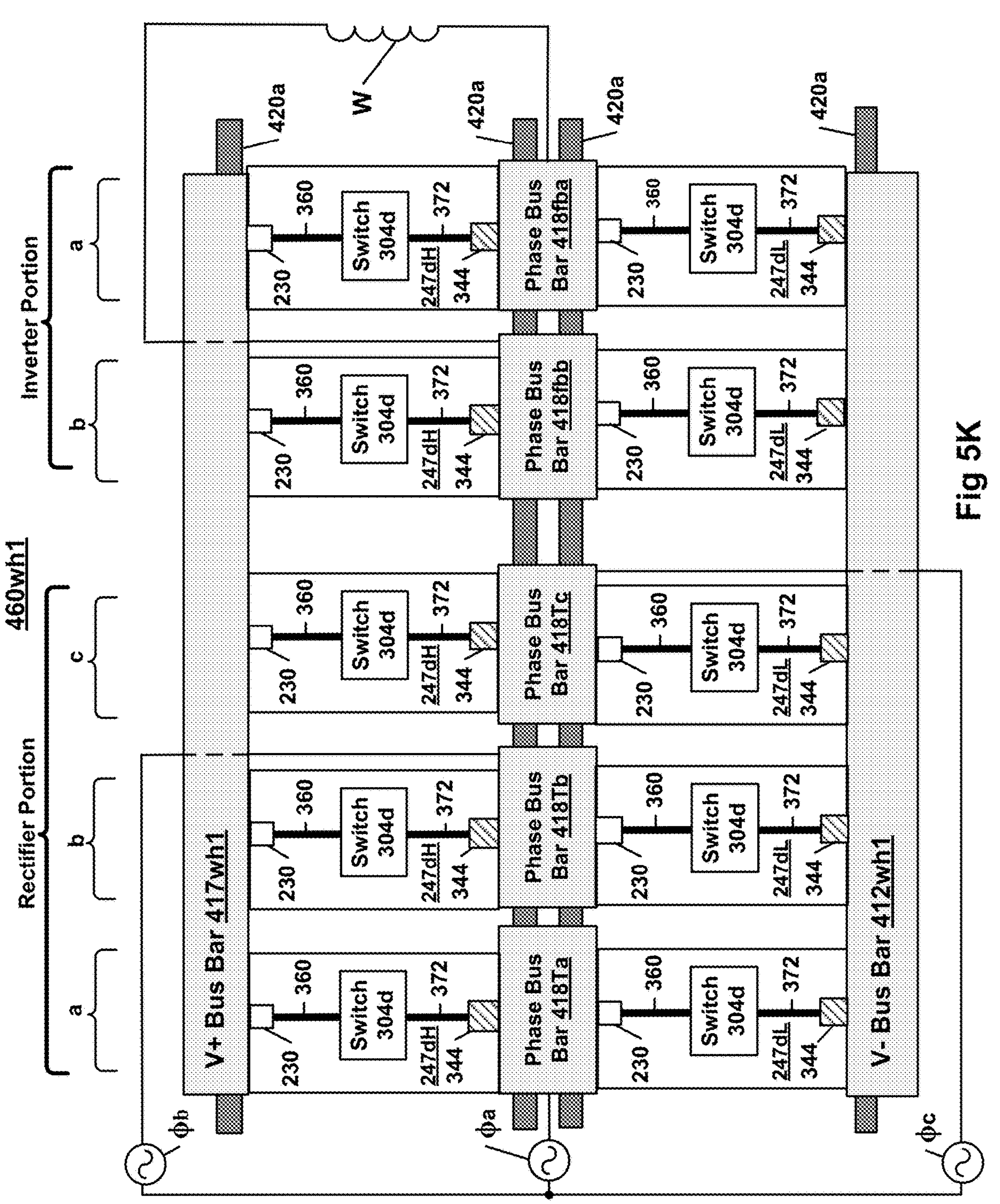
FIG. 5K is a front view of an example converter.
Figure 5L:
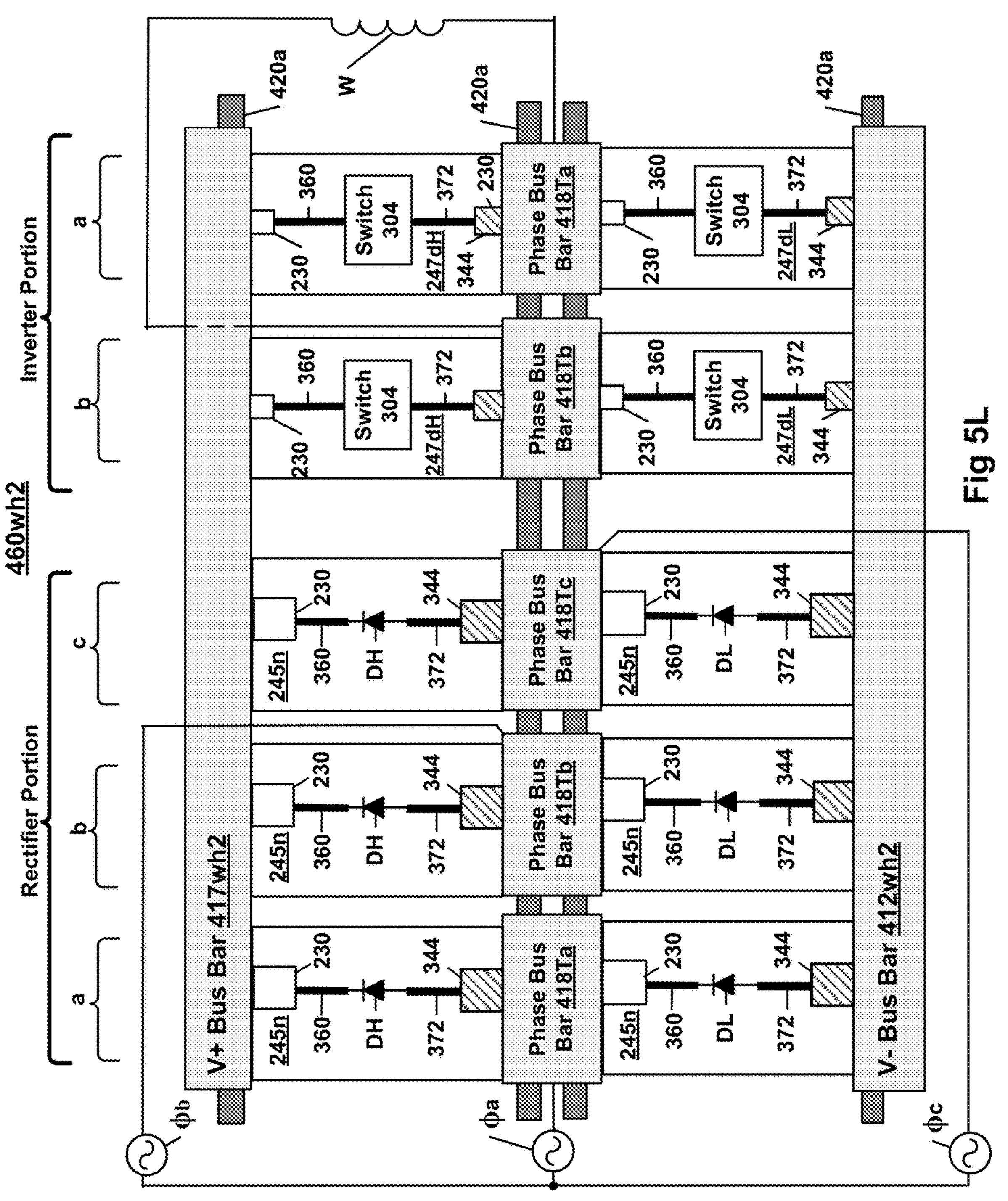
FIG. 5L is a front view of an example converter.
Figures 1, 2, 5N:
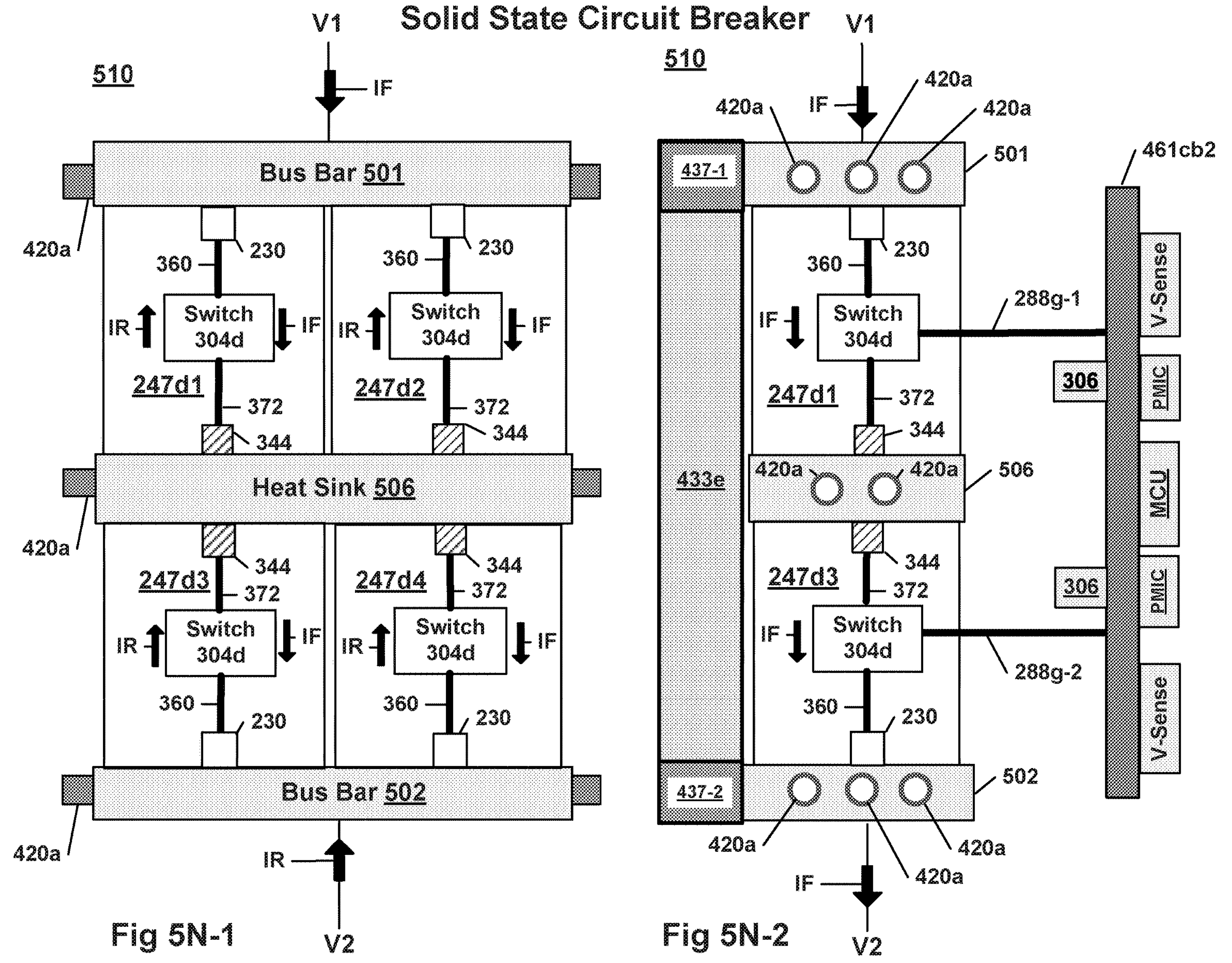
Figures 1, 5O:
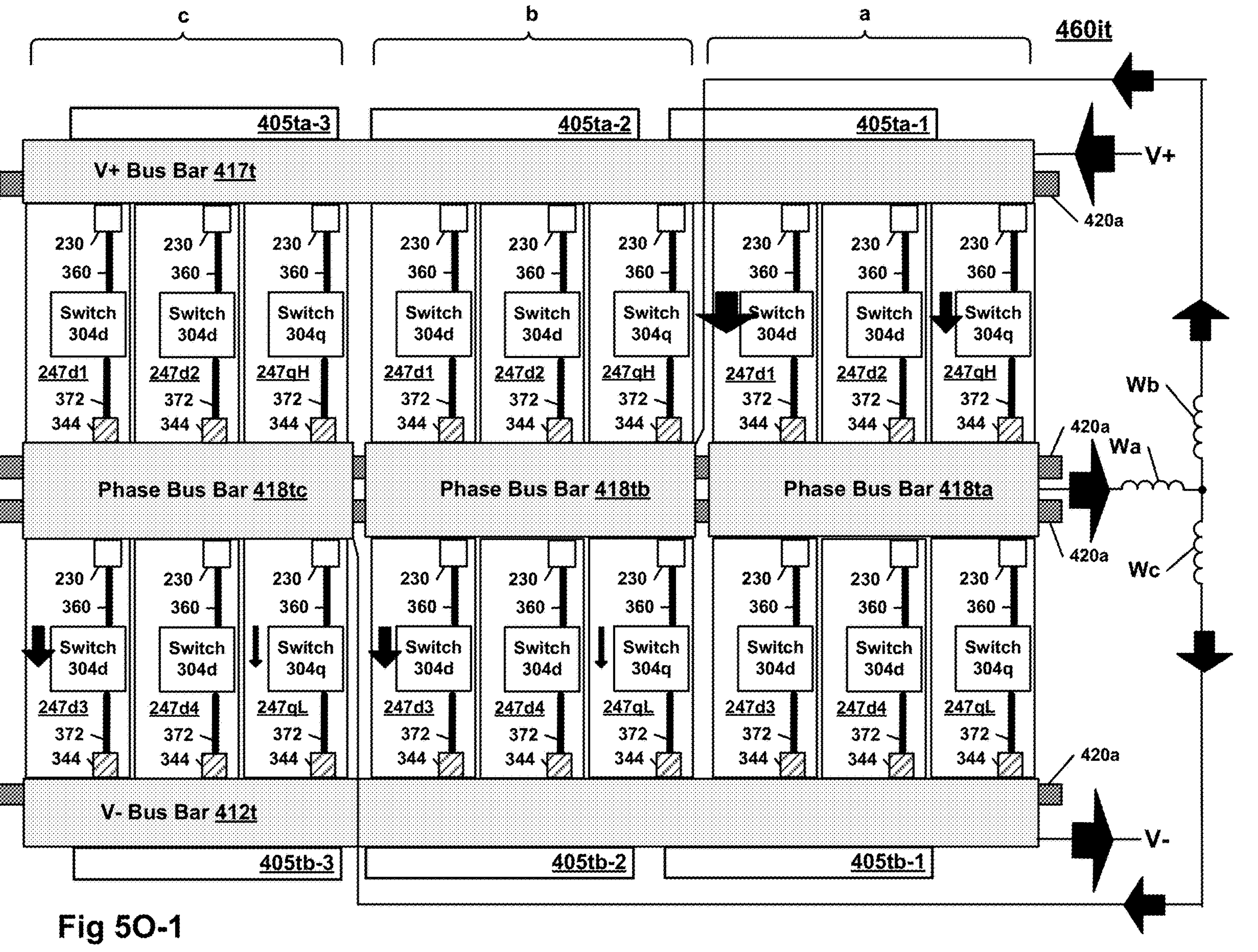
Figures 2, 5O:
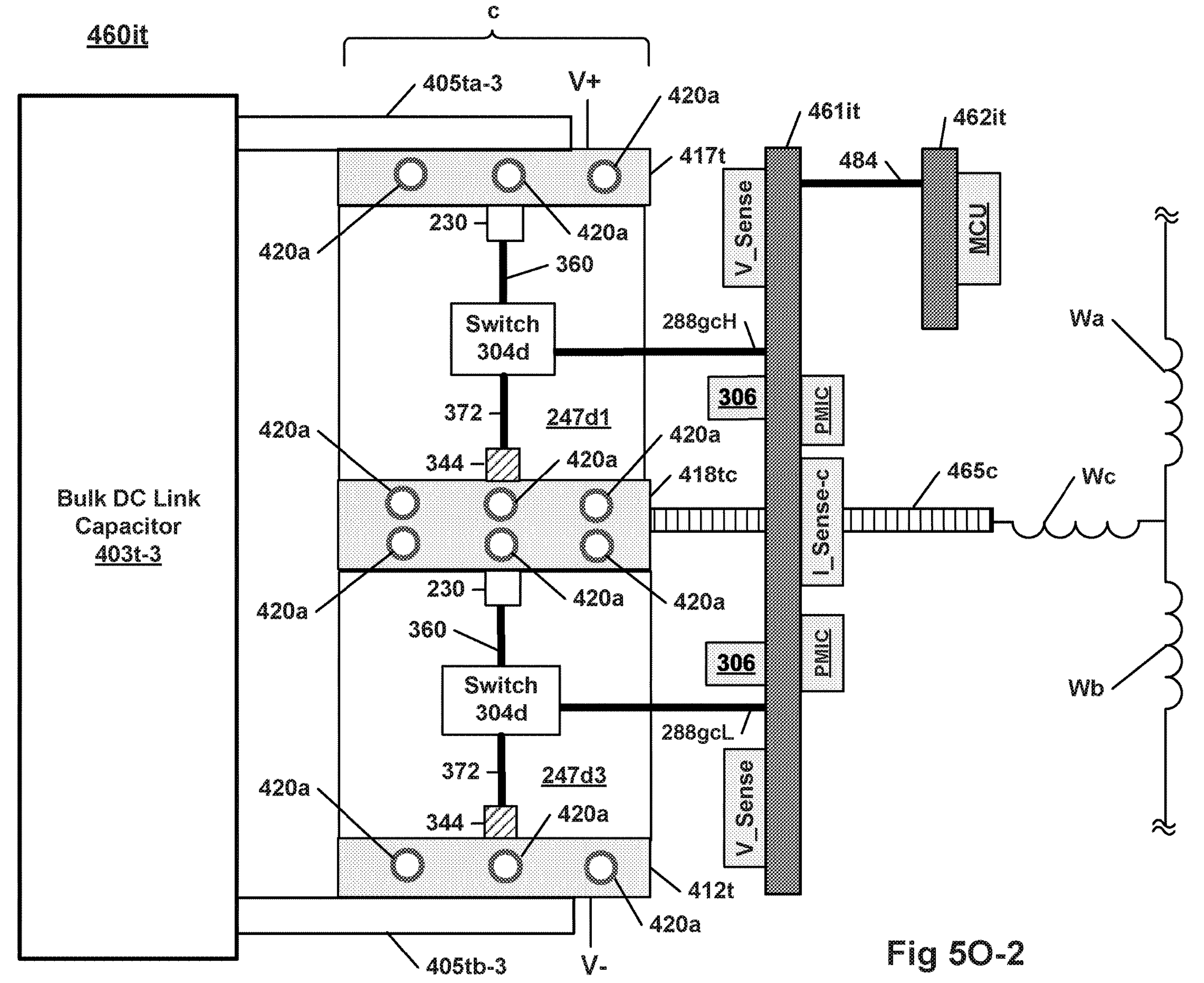
Figures 3, 5O:
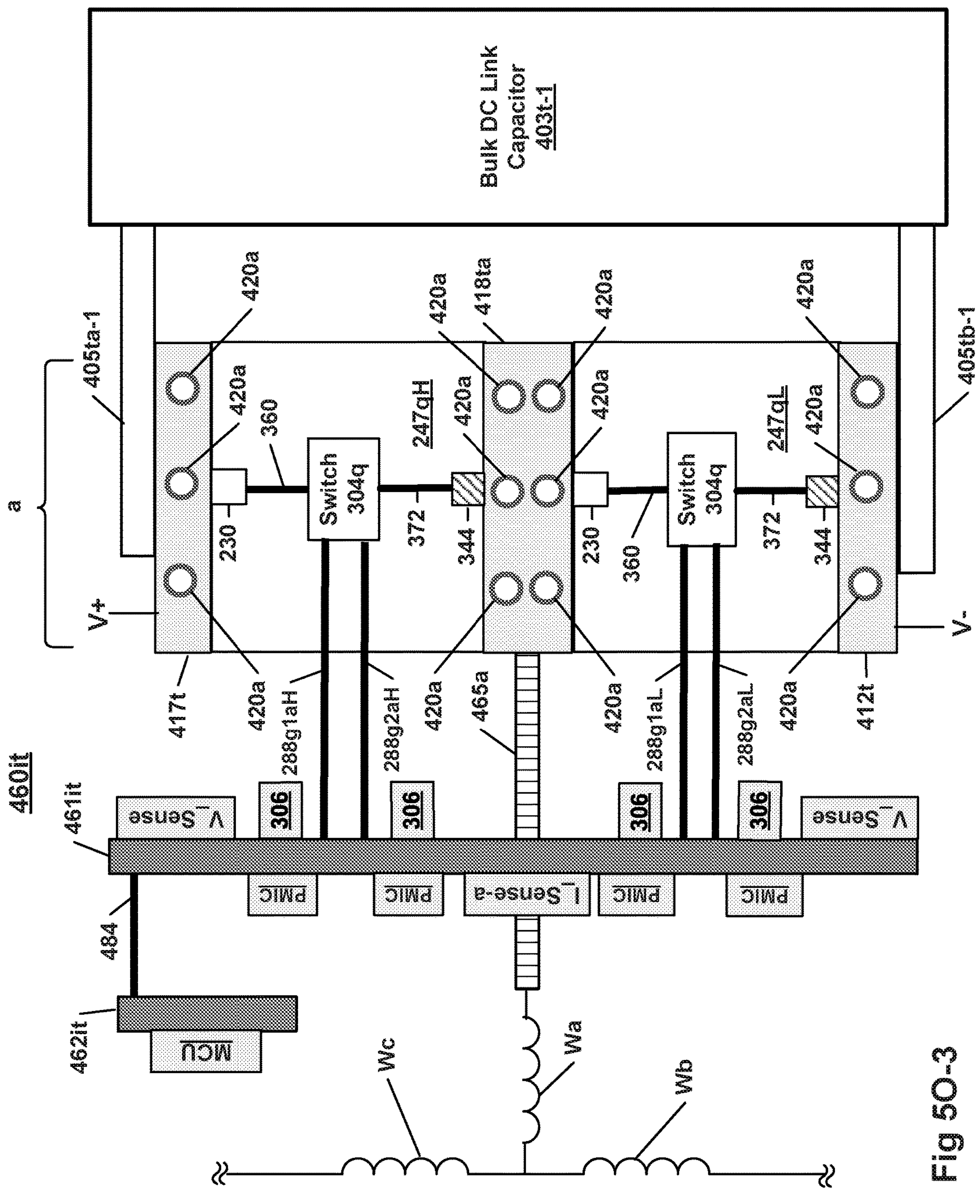

FIG. 5O-1 shows a front view of example inverter 460it, and FIGS. 5O-2 and 5O-3 show side views. Inverter 460it has three phases designated a-c, each of which includes six packaged switches 247.

Inverter 460it is shown with a mix of packaged switches 247d and 247q. As seen in FIG. 5O-1, each phase includes four packaged switches 247d1-247d4 and two packaged switches 247qH and 247qL. Alternatively, all packaged switches of inverter 460it may be a version of packaged switch 247p, 247q, or 247d. For example, all packaged switches 247 may be packaged switch 247qP of FIG. 3P, or all packaged switches 247 may be packaged switch 247qF of FIG. 3F. All switches 304 in packaged switches 247 of inverter 460it can be independently controlled by an MCU on control PCB 462it. Packaged switches 247d2, 247d4, and 247qH and 247qL in each phase of inverter 460it may take form in packaged switches that lack connector-lead 288dc and/or 288ds.

All packaged switches 247d1-247d4 may be the same, and all packaged switches 247qH and 247qL may be the same. Packaged switches 247d of inverter 460it may be packaged switch 247dA, 247dB, 247dC, 247dD or 247dO of FIGS. 3A, 3B, 3C, 3D, and 3O, respectively, and packaged switches 247q may be packaged switch 247qE, 247qF, 247qG, 247qI, 247qJ, 247ql, or 347qP of FIGS. 3E, 3F, 3G, 3I, 3J, 3L, and 3P, respectively.

Inverter 460it includes V+ bus bar 417t, V− bus bar 412q, and phase bus bars 418t. Bus bars, like V+ bus bar 417t, V− bus bar 412t, and phase bus bars 418t, may also act as heat sinks to cool switches 304 or diodes D.

Each phase a-c includes packaged switches 247d1-247d4, 247qH, and 247qL that are electrically and thermally connected to a respective phase bus bar 418t, which in combination is sandwiched between V+ bus bar 417t and V− bus bar 412t. Packaged switches 247d1, 247d2, and 247qH are electrically and thermally connected to V+ bus bar 417*t*, and packaged switches 247*d*3, 247*d*4, and 247*q*L are electrically and thermally connected to V− bus bar 412*t*.

FIGS. 5O-1 and 5O-2 illustrate the linear positioning of packaged switches 247, V+ bus bar 417*t*, phase bus bars 418*t*, and V− bus bar 412*t* with respect to each other. Packaged switches 247*d*1, 247*d*2 and 247*q*H in each phase may have die substrate terminals 230 that are electrically and thermally connected (e.g., sintered, press-fitted, etc.) directly to a flat surface or respective flat surfaces of V+ bus bar 417*t*, and die clip terminals 344 that are electrically and thermally connected (e.g., sintered, press-fitted, etc.) directly to a flat surface or respective flat surfaces of a corresponding phase bus bar 418*t*, which in turn have terminals that may be electrically connected to windings Wa-Wc, respectively. Packaged switches 247*d*3, 247*d*4 and 247*q*L in each phase may have die substrate terminals 230 that are electrically and thermally connected (e.g., sintered, press-fitted, etc.) directly to a flat surface or respective flat surfaces of a corresponding phase bus bar 418*t*, and die clip terminals 344 that are electrically and thermally connected (e.g., sintered, press-fitted, etc.) directly to a flat surface or respective flat surfaces of V− bus bar 412*t*.

V+ bus bar 417*t*, V− bus bar 412*t*, and phase bus bars 418*t* in FIGS. 5O-1-5O-3, may have a rectangular cross-section. Example phase bus bars 418*t* may have a height, width, and length around 8 mm, 60 mm, and 90 mm, respectively. Example V+ bus bar 417*t* and V− bus bar 412*t* may have a height, width, and length around 8 mm, 60 mm, and 290 mm, respectively.

FIGS. 5O-1-5O-3 show inverter 460*it* with dielectric tubes 420*a* received in respective channels (not shown). In alternative versions tubes other than 420*a*, such as tubes 420*b*, can be received in channels. Phase bus bars 418*ta*-418*tc* are thermally connected to each other and electrically isolated from each other by commonly received dielectric tubes 420*a*.

Inverter 460*it* may include packaged DC link capacitors 403*t*. FIG. 5O-1 shows leads 405*t* of DC link capacitors 403*t*. First and second metal capacitor-leads 405*ta* and 405*tb* may extend from one of the capacitor's dielectric wall. Example capacitor-leads 405*t* have a height hbc, length lbc, and width wbc around 6 mm, 30 mm, and 50 mm, respectively. Capacitor-leads, including capacitor-leads 405, may have substantially flat, rectangular-shaped opposite facing top and bottom surfaces. A substantial portion (e.g., 10, 20, 50, 75, 90% or more) of each capacitor-lead 405*ta*'s flat bottom surface area may be electrically and thermally connected (e.g., welded, soldered, press-fitted by screws or other fasteners, etc.) directly to a flat surface of V+ bus bar 417*t*, and a substantial portion (e.g., 10, 20, 50, 75, 90% or more) of each capacitor-lead 405*tb*'s flat top surface area may be electrically and thermally connected (e.g., welded, soldered, press-fitted by screws or other fasteners, etc.) directly to a flat surface of V− bus bar 412*t*.

Inverter 460*it* may include one or more packaged ceramic DC link capacitors (e.g., multilayer ceramic capacitors) with first and second metal terminals that are electrically and thermally connected directly or indirectly to flat surfaces V+ bus bar 417*t* and V− bus bar 412*t*, respectively.

FIG. 5O-1 includes electrical current symbols that represent electrical current flow through inverter 460*it* at an instant in time. More particularly, FIG. 5O-1 shows electrical current flow through activated transistors of switches 304 in packaged switches 247*d*1 and 247*q*H of phase-a, and electrical current flow through activated transistors of switches 304 in packages 247*d*3 and 247*q*L of phases b and c.

For purposes of explanation only; each of packaged switches 247*d*1 and 247*d*3 may be packaged switch 247*d*B of FIG. 3B, which includes four commonly controlled MOSFETs connected in parallel; each of packaged switches 247*d*2 and 247*d*4 may be packaged switch 247*d*O of FIG. 3O, which includes four commonly controlled IGBTs connected in parallel, and; each of packaged switches 247*q*H and 247*q*L may be packaged switch 247*q*P of FIG. 3P, which includes two IGBTs and two MOSFETS connected in parallel but separately controlled. In this configuration, two, four, six, eight, ten, or twelve transistors in a phase of inverter 460*it* can be activated at the same time. The current symbols in FIG. 5O-1 presume that six transistors in each phase are activated at the same time. Specifically, all four MOSFETs in switch 304*d* of packaged switch 247*d*1 in phase-a are activated, all four MOSFETs in switches 304*d* of packaged switches 247*d*3 in phases b and c are activated, only two (e.g., two MOSFETs or two IGBTs) transistors in switch 304*q* of packaged switch 247*q*H in phase-a are activated, and only two (e.g., two MOSFETs or two IGBTs) transistors in switch 304*q* of packaged switches 247*q*L in phases b and c are activated. All other transistors are deactivated. The current symbols are drawn with widths that represent their respective current magnitudes, and the widths are drawn to scale with respect to each other in FIG. 5O-1.

Inverter 460*it* may include driver PCBs 461*it* and 461*it* with drivers 306 that are electrically connected to and control respective switches 304 through respective connector-leads 288*g* or respective sets of connector-leads 288*g*1 and 288*g*2. Only connector-leads 288*gc* of phase c are shown in FIG. 5O-2, and only 288*g*1*a*, and 288*g*2*a* of phase-a are shown in FIG. 5O-3. Inverter 460*it* may include a control PCB 462*it* with an MCU that is in data communication with drivers 306, current sensor I_Sense, voltage sensors, and other components mounted on driver PCBs 461*it* and 461*it*. Data connection 484 may facilitate the data communication.

Driver PCB 461*it* in FIG. 5O-3 includes drivers 306 in data communication with respective packaged switches 247*q* of phase a through respective sets of connector-leads 288*g*1 and 288*g*2. Driver PCB 461*it*1 also includes drivers that are in similar data communication with respective packaged switches 247*q* in phases c and b. Driver PCB 461*it* in FIG. 5O-2 includes drivers 306 in data communication with respective packaged switches 247*d* of phase c through respective connector-leads 288. Driver PCB 462*it*1 also includes drivers that are in similar data communication with respective packaged switches 247*d* in phases a and b.

Driver PCB 461*it*2 includes voltage sensors V_Sense in data communication with respective packaged switches 247*d* or 247*q* via respective pairs or connector-leads 288*ds* and 288*dc* (not shown). Example phase bus bar-leads 465*a* and 465*c* extend laterally between first and second ends. The first end of phase bus bar-leads 465*a* and 465*c* are electrically connected to phase bus bars 418*ta* and 418*tc*, respectively, and the second ends are electrically connected to windings Wa and Wc, respectively. Phase bus bar-leads 465*a* and 465*c* extend through respective apertures in PCB 461*it*. Current sensors I_Sense-a and I_Sense-c measure electrical current flowing through phase bus bar-connectors 465*a* and 456*c*. I_Sense-a and I_Sense-c may include respective apertures through which phase bus bar-connectors 465*a* and 465*c* extend. FIG. 5O-2 shows voltage sensors V_Sense, PMICs, current sensor I_Sense-c, and a phase bus bar-lead

465 for phase c, and FIG. 5O-3 shows voltage sensors V_Sense, PMICs, current sensor I_Sense-a, and a phase bus bar-lead 465 for phase a. A similar group voltage sensor V_Sense, PMICs, current sensor I_Sense, and phase bus bar-lead 465 are mounted on or extending through PCB 461*it* for phase b.

All tubes 420*a* received in all bus bars of inverter 460*it* may be substantially equal in length. Each tube 420*a* has first and second ends. The first ends of all tubes 420*a* may be in fluid communication with a first manifold like manifold 466-1, while the second ends of all the tubes 420*a* may be in fluid communication with a second manifold like manifold 466-2.

Example Solid State Circuit Breakers

Solid State Circuit Breaker 500

FIGS. 5M-1 and 5M-2 illustrate relevant components of an example solid state circuit breaker (SSCB) 500 when seen from the front and side, respectively. Manifolds 512 are shown in FIG. 5M-1 but not in FIG. 5M-2. A snubber circuit and a PCB 461*cb* shown in FIG. 5M-2 are not shown in FIG. 5M-1 but are described below. An SSCB, like SSCB 500, may be electrically connected between a voltage terminal of a battery or other DC voltage supply and a system such as an inverter of this disclosure and/or an on-board EV battery charger.

SSCB 500 includes packaged switches 247*q*, it being understood packaged switches 247*q* may be replaced with packaged switches 247*p*K or 247*d*D in an alternative version. Example SSCB 500 includes bus bars 501 and 502, which may have a rectangular cross-section. Example bus bars 501 and 502 may have a height, width, and length around 12 mm, 35 mm, and 25 mm, respectively. Example SSCB 500 includes two packaged switches 247*q* connected in parallel. In an alternative version, three or more packaged switches 247*q* can be positioned between and electrically connected to width and/or length extended bus bars 501 and 502.

One or more voltage suppressors may be electrically connected between bus bars 501 and 502. For example, one or more snubber circuits or snubber capacitors may be electrically connected between bus bars 501 and 502. FIG. 5M-2 shows optional snubber circuit consisting of at least one packaged ceramic capacitor 433 electrically connected in series with resistor R, the combination of which is electrically connected between bus bars 501 and 502. A flat side wall surface of terminal 437-1 can be directly connected (e.g., welded) to a flat side wall of bus bar 501, and a terminal of resistor R may be electrically connected to a flat side all of bus bar 502. Alternatively, resistor R can be removed, and package ceramic capacitor 433 can be extended in length so that a flat side wall surface of terminal 437-2 can be directly connected (e.g., welded) to a flat side wall of bus bar 502. In yet another version, one or more packaged capacitors 433 can be electrically connected between bus bars 501 and 503 via a PCB like PCB 435 shown in FIG. 5A-20.

All packaged switches 247*q* of SSCB 500 may be the same. Each of the packaged switches 247*q* of SSCB 500 may be packaged switch 247*q*G, 247*q*I, 247*q*J, or 247*ql* of FIGS. 3G, 3I, 3J, and 3L, respectively.

FIG. 5M-1 illustrates the linear positioning of packaged switches 247*q* and bus bars 501 and 502 relative to each other. Packaged switches 247*q* in FIG. 5M-1 have die substrate terminals 230 that are electrically and thermally connected (e.g., sintered, press-fitted, etc.) directly to a flat surface or respective flat surfaces of bus bar 501, and die clip terminals 344 that are electrically and thermally connected (e.g., sintered, press-fitted, etc.) directly to a flat surface or respective flat surfaces of bus bar 502.

FIGS. 5M-1 and 5M-2 show SSCB 500 with dielectric tubes 420*a* received in respective bus bar channels (not shown). In alternative versions tubes other than 420*a*, such as tubes 420*b*, can be received in the channels.

SSCB 500 can operate in forward or reverse mode. When operating in the forward mode SSCB 500 can conduct current IF through one or both of switches 304*q*. FIG. 5M-2 shows SSCB 500 operating in the forward mode. When operating in a reverse mode SSCB 500 can conduct current IR through one or both of switches 304*q*. When SSCB 500 is off, all transistors in switches 304*q* are deactivated and no electrical current, other than perhaps leakage current, passes through switches 304*q*.

In the forward mode, one or more transistors in switches 304*q* controlled through respective connector-leads 288*g*1 may be activated, while all transistors in switches 304*q* controlled through connector-lead 288*g*2 may be deactivated. In the reverse mode, all transistors in switches 304*q* controlled through connector-lead 288*g*1 may be deactivated, while one or more transistors in switches 304*q* controlled through respective connector-lead 288*g*2 may be activated. If SSCB 500 uses packaged switches 247*q*G or 247*q*1 (e.g., switches containing BBJTs) SSCB 500 may operate in the forward mode when one or both connector-leads 288*g*1 in packaged switches 247*q*1 and 247*q*2, respectively, is/are driven with a transistor activation current (e.g., a base current for activating the BBJT(s)), and neither connector-lead 288*g*2 in packaged switches 247*q*1 and 247*q*2 is driven with a transistor activation current, and SSCB 500 may operate in the reverse mode when neither connector-lead 288*g*1 in packaged switches 247*q*1 and 247*q*2 is driven with a transistor activation current, and one or both connector-leads 288*g*2 in packaged switches 247*q*1 and 247*q*2 is/are driven with a transistor activation current.

SSCB 500 may include PCB 461*cb*1. Drivers on PCB 461*cb*1, may be electrically connected to respective switches 304*q* through respective sets of connector-leads 288*g*1 and 288*g*2. Only drivers 306 and connector-leads 288*g*1 and 288*g*2 for switch 247*q*1 are shown in FIG. 5M-2. PMICs provide supply voltages for respective drivers 306 and may be placed as close as possible. PCB 461*cb*1 in FIG. 5M-2 includes only one voltage sensor V_Sense in data communication with packaged switch 247*q*1 through connector-leads 288*ds* and 288*dc* (not shown). FIG. 5M-2 shows drivers 306 and PMICs for packaged switch 247*q*1. A similar group of drivers 306 and PMICs are mounted on PCB 461*cb*1 for packaged switch 247*q*2. FIG. 5M-2 shows an MCU mounted on PCB 462*cb*1. The MCU may be in data communication with drivers 306 and V_Sense.

All tubes 420, such as tubes 420*a* in FIG. 5M-1, received in all bus bars may be substantially equal in length. First and second manifolds 514-1 and 514-2, respectively, may be in fluid communication with first and second ends, respectively, of tubes 420*a*.

Solid State Circuit Breaker 510

FIGS. 5N-1 and 5N-2 illustrate relevant components of another SSCB 510 when seen from the front and side, respectively. A PCB 461*cb*2 and a snubber capacitor 433*e* are not shown in FIG. 5N-2 but are described below.

SSCB 510 includes packaged switches 247*d*, it being understood that in an alternative packaged switches 247*d* may be swapped for packaged switches 247*p* or packaged switches 247*q*. SSCB 510 includes bus bars 501 and 502, and metal heat sink 506. Heat sink 506, and bus bars 501 and 502 may have a rectangular cross-section. Example bus bars

501 and 502, and heat sink 506 may have a height, width, and length around 12 mm, 35 mm, and 25 mm, respectively.

One or more voltage suppressors may be electrically connected between bus bars 501 and 502. For example, one or more snubber circuits or snubber capacitors may be electrically connected in parallel and between bus bar 501 bus bar 502. FIG. 5N-2 shows optional packaged ceramic capacitor 433*e* electrically connected between bus bars 501 and 502. A flat side wall surface of terminal 437-1 can be directly connected (e.g., welded) to a flat side wall of bus bar 501, and side wall surface of terminal 437-2 can be directly connected (e.g., welded) to a flat side wall of bus bar 502.

All packaged switches 247*d* of SSCB 510 may be the same. Each of the packaged switches 247*d* of SSCB 510 may be packaged switch 247*d*A, or 247*d*B of FIGS. 3A, and 3B, respectively.

SSCB 510 includes four packaged switches 247*d*1-247*d*4 that are electrically and thermally connected bus bars 501 or 502, and metal heat sink 506. Metal heat sink 506 may be substantially like a phase bus bar 418*d* shown in FIG. 5C. A parallel combination of packaged switches 247*d*1 and 247*d*2 is connected back-to-back with a parallel combination of packaged switches 247*d*3 and 247*d*4.

FIG. 5N-1 illustrates the linear positioning of packaged switches 247*d*, heat sink 506, and bus bars 501 and 502 relative to each other. Packaged switches 247*d*1 and 247*d*2 may have die substrate terminals 230 that are electrically and thermally connected (e.g., sintered, press-fitted, etc.) directly to a flat surface or respective flat surfaces of bus bar 501, and die clip terminals 344 that are electrically and thermally connected (e.g., sintered, press-fitted, etc.) directly to a flat surface or respective flat surfaces of metal heat sink 506. Packaged switches 247*d*3 and 247*d*4 may have die clip terminals 344 that are electrically and thermally connected (e.g., sintered, press-fitted, etc.) directly to a flat surface or respective flat surfaces of metal heat sink 506, and die substrate terminals 230 that are electrically and thermally connected (e.g., sintered, press-fitted, etc.) directly to a flat surface or respective flat surfaces of bus bar 502.

FIGS. 5N-1 and 5N-2 show SSCB 510 with dielectric tubes 420*a* received in respective bus bar and heat sink channels (not shown). In alternative versions tubes other than 420*a*, such as tubes 420*b*, can be received in the channels.

SSCB 510 can operate in a forward or a reverse mode. When operating in the forward mode SSCB 510 can pass current IF through activated switches 304*d* of packaged switches 247*d*1 and/or 247*d*2 and deactivated packaged switches 247*d*3 and 247*d*4 via their diodes D (see, e.g., diode D of FIG. 3A) or MOSFET body diodes (e.g., body diodes inherent in the MOSFETs of FIG. 3B). FIG. 5N-2 shows SSCB 510 operating in forward mode. When operating in the reverse mode SSCB 510 can pass current IR through activated switches 304*d* of packaged switches 247*d*3 and/or 247*d*4 deactivated packaged switches 247*d*1 and 247*d*2 via their diodes D (see, e.g., diode D of FIG. 3A) or body diodes (e.g., body diodes inherent in the MOSFETs of FIG. 3B). When SSCB 510 is off, all transistors in switches 304*q* are deactivated and no current, other than perhaps leakage current, passes through switches 304*q*.

In the forward mode, one or more transistors in packaged switches 247*d*1 and 247*d*2 may be activated, while all transistors in packaged switches 247*d*3 and 247*d*4 are deactivated. In the reverse mode, one or more transistors in packaged switches 247*d*3 and 247*d*4 may be activated, while all transistors in packaged switches 247*d*1 and 247*d*2 are deactivated.

SSCB 510 may include PCB 461*cb*2. Drivers on PCB 461*cb*2, may be electrically connected to respective switches 304 through respective connector-leads 288*g*. Only drivers 306 and connector-leads 288*g* for switches 247*d*1 and 247*d*3 are shown in FIG. 5N-2. PMICs provide supply voltages for respective drivers 306 and may be placed as close as possible on the opposite side of PCB 460*cb*2 as shown. PCB 461*cb*2 in FIG. 5N-2 includes only two voltage sensors V_Sense in data communication with respective packaged switches 247*d*1 and 247*d*3 through respective sets of connector-leads 288*ds* and 288*dc* (not shown). FIG. 5N-2 shows drivers 306 and PMICs for packaged switches 247*d*1 and 247*d*3. A similar group of drivers 306 and PMICs are mounted on PCB 461*cb*2 for packaged switches 247*d*2 and 247*d*4. FIG. 5N-2 shows an MCU mounted on PCB 461*cb*2. The MCU may be in data communication with each driver 306 and voltage sensor V_Sense.

All tubes 420, such as tubes 420*a* in FIG. 5N-1, received in all bus bars may be substantially equal in length. First and second manifolds may be in fluid communication with first and second ends, respectively, of tubes 420*a*.

Example Integrated Power Converters

Variable Frequency Drive 460*vfd*

Power converters may be integrated through common bus bars. For example, AC/AC converters (e.g., variable frequency drives (VFDs)) may be created by integrating inverters and rectifiers through one or more common bus bars.

FIGS. 5I-1-5I-3 illustrate relevant components of an example VFD 460*vfd*. FIGS. 5I-1, 5I-2 and 5I-3 illustrate VFD 460*vfd* when seen from the front, back, and side, respectively. FIGS. 5I-1 and 5I-2 show inverter and rectifier portions of VFD 460*vfd*, respectively, which are integrated through common V+ and V− bus bars 417*vfd* and 412*vfd*, respectively. Several components (i.e., driver PCB 461*rvfd*, driver PCB 46*ivfd*, and DC link capacitors 403) are not shown in FIGS. 5I-1 and 5I-2 but are seen in FIG. 5I-3. VFD 460*vfd* has three phases designated a-c. FIG. 5I-3 shows phase c of the inverter and rectifier portions of VFD 460*vr*d.

VFD 460*vfd* employs packaged switches 247*d*, each of which may be packaged switch 247*d*A, 247*d*B, or 247*d*D of FIGS. 3A, 3B, and 3D respectively. Alternatively, all packaged switches of VFD 460*vfd* may be a version of packaged switch 247*p* or 247*q*. As seen in FIGS. 5I-1 and 5I-2, each phase of the inverter and rectifier portions include packaged switches 247*d*H and 247*d*L. All switches 304 in packaged switches 247*d* of VFD 460*vfd* can be independently controlled by an MCU on control PCB 462*vfd*.

VFD 460*vfd* includes V+ bus bar 417*vfd*, V− bus bar 412*vfd*, inverter phase bus bars 418*vfdi*, and rectifier phase bus bars 418*vfdr*. FIGS. 5I-1-5I-3 illustrate the linear and horizontal positioning of packaged switches 247*d*, V+ bus bar 417*vfd*, V− bus bar 412*vfd*, inverter phase bus bars 418*vfdi*, and rectifier phase bus bars 418*vfdr* with respect to each other. Inverter phase bus bars 418*vfdia*-418*vfdic* are electrically connected to windings Wa-Wc, respectively. Rectifier phase bus bars 418*vfdra*-418*vfdrc* are electrically connected to AC sources ϕa-ϕc, respectively.

V+ bus bar 417*vfd*, V− bus bar 412*vfd*, inverter phase bus bars 418*vfdi*, and rectifier phase bus bars 418*vfdr* may have a rectangular cross-section. Each of the example inverter and rectifier phase bus bars 418*vfdi* and 418*vfdr*, respectively, may have a height, width, and length around 8 mm, 28 mm, and 35 mm, respectively. Example V+ bus bar 417*vdr* and V− bus bar 412*dr* may have a height, width, and length around 8 mm, 60 mm, and 120 mm, respectively.

With continuing reference to FIGS. 5I-1 and 5I-2, packaged switches 247*di*H and 247*dr*H in each phase may have die substrate terminals 230 that are electrically and thermally connected (e.g., sintered, press-fitted, etc.) directly to a flat surface or respective flat surfaces of V+ bus bar 417*vfd*. Packaged switches 247*di*H in each phase of the inverter portion may have die clip terminals 344 that are electrically and thermally connected (e.g., sintered, press-fitted, etc.) directly to a flat surface of a respective inverter phase bus bar 418*vfdi*. Packaged switches 247*dr*H in each phase of the rectifier portion may have die clip terminals 344 that are electrically and thermally connected (e.g., sintered, press-fitted, etc.) directly to a flat surface of a respective rectifier phase bus bar 418*vfdr*. Packaged switches 247*di*L and 247*dr*L in each phase may have die clip terminals 344 that are electrically and thermally connected (e.g., sintered, press-fitted, etc.) directly to a flat surface or respective flat surfaces of V− bus bar 412*vfd*. Packaged switches 247*di*L in each phase of the inverter portion may have die substrate terminals 230 that are electrically and thermally connected (e.g., sintered, press-fitted, etc.) directly to a flat surface of a respective inverter phase bus bar 418*vfdi*. Packaged switches 247*dr*L in each phase of the rectifier portion may have die substrate terminals 230 that are electrically and thermally connected (e.g., sintered, press-fitted, etc.) directly to a flat surface of a respective rectifier phase bus bar 418*vfdr*.

FIG. 5I-1 includes electrical current symbols that represent electrical current flow through the inverter portion of 460*vfd* at an instant in time. More particularly, FIG. 5I-1 shows electrical current flow through activated switch 304*di*H in packaged switch 247*di*H of phase-a, while switches 304*di*L in packages 247*di*L of phases b and c are activated and conducting current to the V− terminal through the V− bus bar 412*vdr*. All other switches of the inverter portion are deactivated.

FIGS. 5I-1-5I-3 show VFD 460*vfd* with dielectric tubes 420*a* received in respective channels (not shown). In alternative versions tubes other than 420*a*, such as tubes 420*b*, can be received in channels. All phase bus bars are electrically isolated from each other. Phase bus bars 418*vfdia*-418*vfdic* are thermally connected to each other by commonly received dielectric tubes 420*a*. Phase bus bars 418*vfdra*-418*vfdre* are thermally connected to each by commonly received dielectric tubes 420*a*.

With continuing reference to FIG. 5I-3, VFD 460*vfd* may include packaged DC link capacitors 403*vfdi* and 403*vfdr*. First and second metal capacitor-leads 405*avfdr* and 405*bvfdr* may extend from one of packaged capacitor 403*vfdr*'s dielectric wall. First and second metal capacitor-leads 405*avfdi* and 405*bvfdi* may extend from one of packaged capacitor 403*vfdi*'s dielectric wall. Example capacitor-leads 405*avfdr*, 405*bvfdr*, 405*avfdi*, and 405*bvfdi* may have a height, length, and width around 6 mm, 20 mm, and 20 mm, respectively. A substantial portion of each of capacitor-lead 405*avfdi* and 405*avfdr*'s flat bottom surface area may be electrically and thermally connected (e.g., welded, soldered, press-fitted by screws or other fasteners, etc.) directly to a flat surface of V+ bus bar 417*vdr*, and a substantial portion of each capacitor-lead 405*bvfdi* and 405*bvfdr*'s flat top surface area may be electrically and thermally connected (e.g., welded, soldered, press-fitted by screws or other fasteners, etc.) directly to a flat surface of V− bus bar 412*vdr*.

VFD 460*vfd* may include one or more packaged ceramic DC link capacitors (e.g., multilayer ceramic capacitors) with first and second metal terminals that are electrically and thermally connected directly or indirectly to flat surfaces V+ bus bar 417*vdr* and V− bus bar 412*vdr*, respectively.

VFD 460*vfd* may include driver PCBs 461*vfdi* and 461*vfdr* with drivers 306 that control respective switches 304 through respective connector-leads 288. Only connector-leads 288 of phase c are shown in FIG. 5I-3. VFD 460*vfd* may include a control PCB 462*vfd* with an MCU that is in data communication with drivers 306, current sensors I_Sense, voltage sensors V_Sense, and other components mounted on driver PCBs 461*vfdi* and 461*vfdr*. Data connections 484-1 and 484-2 may facilitate data communication.

Driver PCB 461*vfdi* in FIG. 5I-3 includes drivers 306 in data communication with respective packaged switches 247*di* of phase c through respective connector-leads 288*g*. Driver PCB 461*vfdi* also includes drivers that are in data communication with respective packaged switches 247*di* in phases a and b.

Driver PCB 461*vfdi* includes voltage sensors V_Sense in data communication with respective packaged switches 247*di* via respective pairs or connector-leads 288*ds* and 288*dc* (not shown). Example phase bus bar-lead 465*ci* extends laterally between first and second ends. The first end of phase bus bar-lead 465*ci* is electrically connected to phase bus bar 418*vfdic*, and the second end is electrically connected to winding Wc. Phase bus bar-lead 465*ci* extends through an aperture in PCB 461*vfdi*. Current sensor I_Sense-1 measures electrical current flowing through phase bus bar-connector 465*ci*. I_Sense-1 may include an aperture through which phase bus bar-connector 465*ci* extends. FIG. 5I-3 shows voltage sensors V_Sense, PMICs, current sensor I_Sense, and a phase bus bar-lead 465*cr* for phase c. Similar groups voltage sensors V_Sense, PMICs, current sensor I_Sense, and phase bus bar-lead 465*ci* are mounted on or extending through PCB 461*vfdi* for phases a and b.

Driver PCB 461*vfdr* includes drivers 306 in data communication with respective packaged switches 247*dr* of phase c through respective connector-leads 288. Driver PCB 462*vfdr* also includes drivers that are in similar data communication with respective packaged switches 247*dr* in phases a and b.

Driver PCB 461*vfdr* includes voltage sensors V_Sense in data communication with respective packaged switches 247*dr* via respective pairs or connector-leads 288*ds* and 288*dc* (not shown). Example phase bus bar-lead 465*cr* extends laterally between first and second ends. The first end of phase bus bar-lead 465*cr* is electrically connected to phase bus bar 418*vfdre*, and the second end is electrically connected to AC source ϕc. Phase bus bar-lead 465*cr* extends through an aperture in PCB 461*vfdr*. Current sensor I_Sense-2 measures electrical current flowing through phase bus bar-connector 465*cr*. I_Sense-2 may include an aperture through which phase bus bar-connector 465*cr* extends. FIG. 5I-3 shows voltage sensors V_Sense, PMICs, current sensor I_Sense, and a phase bus bar-lead 465*cr* for phase c. Similar groups voltage sensors V_Sense, PMICs, current sensor I_Sense, and phase bus bar-lead 465*r* are mounted on or extending through PCB 461*vfdr* for phases a and b.

All tubes 420*a* received in all bus bars, such as bus bar 412*vdr*, may be substantially equal in length. Each tube 420*a* has first and second ends. The first ends of all tubes 420*a* may be in fluid communication with a first manifold, while the second ends of all the tubes 420*a* may be in fluid communication with a second manifold.

Other power converters of this disclosure may be integrated through common bus bars. For example, inverter 460*i*T and rectifier 460*pr* may be integrated to create a power converter with common V− and V+ bar bars. FIG. 5J illustrates an integration of inverter 460*i*T and passive rectifier 460*pr* through common V+ bus bar and V− bus bars 417*tp* and 412*tp*, respectively. FIG. 5K illustrates an integration of rectifier 460*r*T and inverter 460*fb* through common V+ bus bar and V− bus bar 417*wh*1 and 412*wh*1, respectively, to create power converter 460*wh*1, which is electrically connected to winding W of, for example, an isolation transformer. FIG. 5L illustrates an integration of the passive rectifier 460*pr* and inverter 460*fb* through common V+ bus bar and V− bus bar 417*wh*2 and 412*wh*2 to create power converter 460*wh*2, which is electrically connected to winding W of, for example, an isolation transformer.

Inverter 460*air*

Figures 1, 5P:
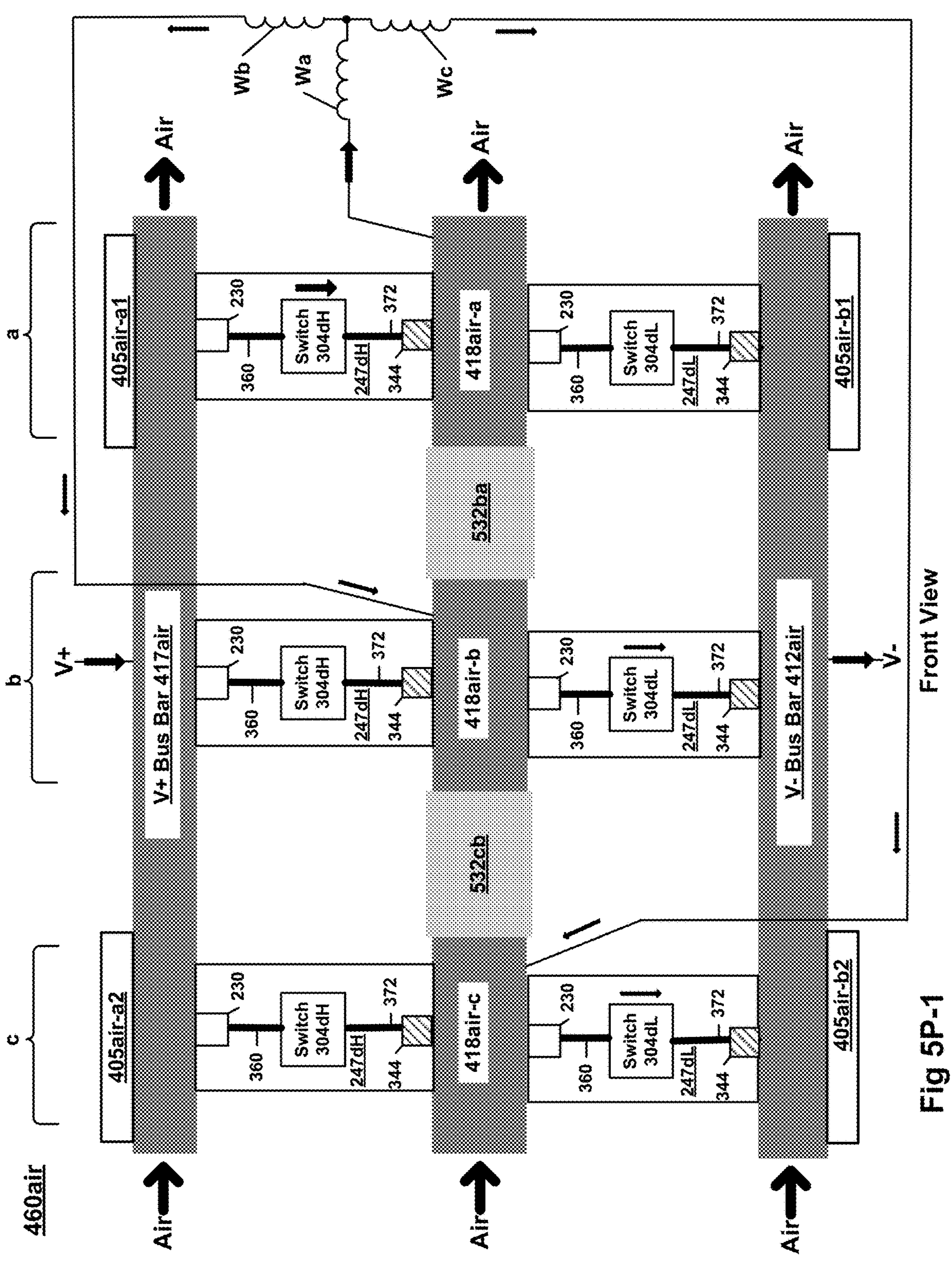
Figures 2, 5P:
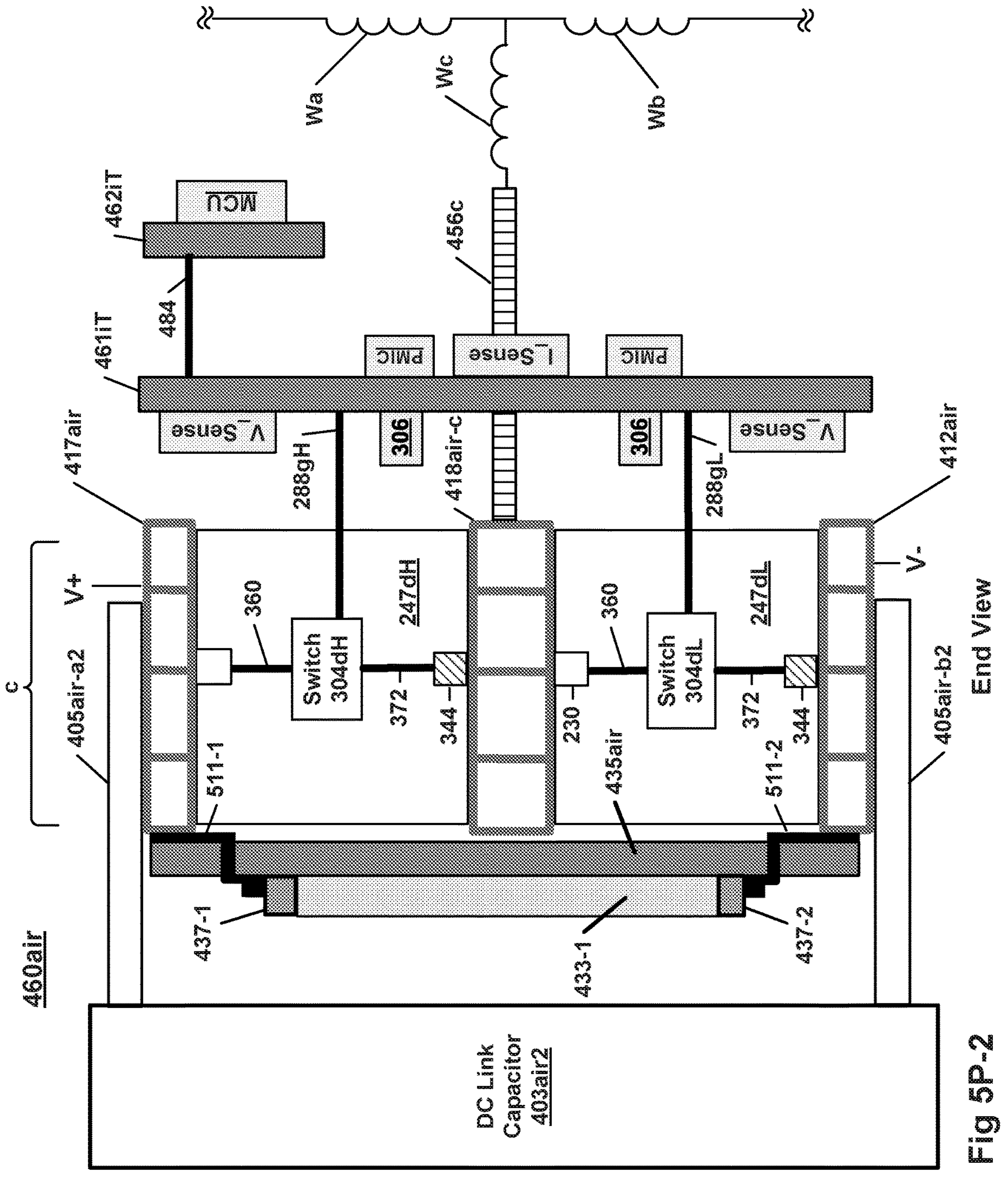
Figures 3, 4, 5, 5P, 6:
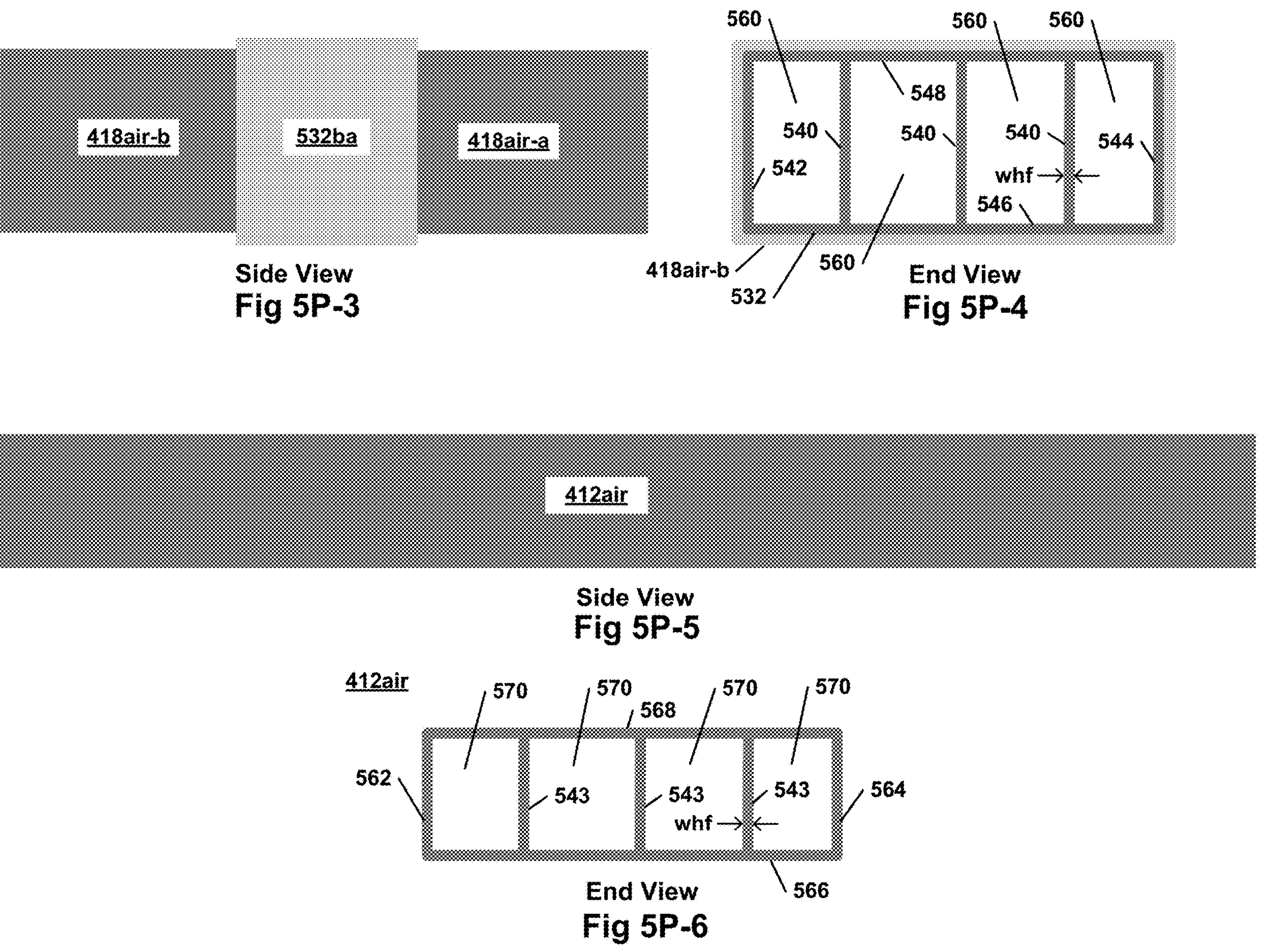

Most of the converters and solid-state circuit breakers described above use bus bars with tubes through which cooling fluid can flow. Those bus bars can be replaced with air-cooled bus bars. FIGS. 5P-1 and 5P-2 illustrate relevant components of an example inverter 460*air* when seen from the front and from a side. Several components (e.g., packaged DC link capacitors 403 and 433-1) shown in FIG. 5P-2 are not shown or fully shown in FIG. 5A-1 but are described below. Several components (e.g., power PCB 461*i*T and control PCB 462*i*T) shown in FIG. 5P-2 are not shown or fully shown in FIG. 5P-1 but are described below.

Inverter 460*air* is substantially like inverter 460*i*T, but with bus bars 412T, 417T, and 418T replaced by example air-cooled bus bars 412*air*, 417*air*, and 418*air*, respectively. Like inverter 460*i*T, inverter 460*air* is shown with packaged switches 247*d*, it being understood that in an alternative version packaged switches 247*d* may be swapped for packaged switches 247*p* or packaged switches 247*q*. All packaged switches 247 of inverter 460*air* may be the same. Packaged switches 247*d* of inverter 460*iair* may be packaged switch 247*d*A, 247*d*B, 247*d*D, or 247*d*O of FIGS. 3A, 3B, 3D, and 3O, respectively. Case surfaces of packaged switches 247*d* in FIG. 5P-1, may be thermally connected to flat surfaces of V+ bus bar 417*air*, V− bus bar 412*air*, or phase bus bars 418*air*.

Inverter 460*air* has three phases designated a-c. Each phase in FIG. 5P-1 includes two packaged switches 247*dh* and 247*d*L that are electrically and thermally connected to a phase bus bar 418*air*, which in combination is sandwiched between V+ bus bar 417*air* and V− bus bar 412*air*. Packaged switches 247*d*H and 247*d*L are also electrically and thermally connected to V+ bus bar 417*air* and V− bus bar 412*air*, respectively. Phase bus bars 418*air-c* and 418*air-b* are in fluid communication with each other through dielectric air coupling 532*cb*, and phase bus bars 418*air-b* and 418*air-a* are in fluid communication with each other through dielectric air coupling 532*ba*. Phase bus bars 418*air* are thermally connected to each other and electrically isolated from each other by air couplings 532. FIGS. 5P-1 and 5P-2 illustrate the linear positioning of packaged switches 247*d*, V+ bus bar 417*air*, phase bus bars 418*air*, and V− bus bar 412*air* with respect to each other.

Packaged switches 247*d*H in FIG. 5P-1 may have die substrate terminals 230 that are electrically and thermally connected (e.g., sintered, press-fitted, etc.) directly to a flat surface or respective flat surfaces of V+ bus bar 417*air*, and die clip terminals 344 that are electrically and thermally connected (e.g., sintered, press-fitted, etc.) directly to flat surfaces of respective phase bus bars 418*air-a*-418*air-c*, which in turn may be electrically connected to windings Wa-Wc, respectively. Packaged switches 247*d*L in FIG. 5P-1 may have die substrate terminals 230 that are electrically and thermally connected (e.g., sintered, press-fitted, etc.) directly to flat surfaces of respective phase bus bars 418*air-a*-418*air-c*, and die clip terminals 344 that are electrically and thermally connected (e.g., sintered, press-fitted, etc.) directly to a flat surface or respective flat surfaces of V− bus bar 412*air*.

Air-cooled bus bars, like V+ bus bar 417*air*, V-bus bar 412*air*, and phase bus bars 418*air* in FIGS. 5P-1 and 5P-2, may have a rectangular shape. FIG. 5P-1 shows the height and length of the air-cooled bus bars, and FIG. 5P-2 shows the height and width. Example phase bus bars 418*air* may have a height, width, and length around 40 mm, 25 mm, and 20 mm, respectively. Example V+ bus bar 417*air* and V− bus bar 412*air* may have a height, width, and length around 30 mm, 25 mm, and 70 mm, respectively. Dielectric air couplings 532 may be rectangular in shape and have a height, width, and length around 40 mm, 25 mm, and 5 mm, respectively. Air-cooled bus bars and dielectric couplings may have different shapes and dimensions to accommodate differences in converter design.

FIG. 5P-3 shows a side view of dielectric coupling 532*ba* in fluid communication between phase bus bar 418*air-a* and phase bus bar 418*air-b*. FIG. 5P-4 show the structure of FIG. 5P-3 when seen from an end. FIGS. 5P-5 and 5P-6 show side and end views of V− bus bar 412*air*. V+ bus bar 417*air* is substantially like V− bus bar 412*air*.

Air-cooled bus bars such as phase bus bars 412 air, 417*air*, and 418*air*, may be extruded from a metal such as aluminum or copper. Phase bus bar 418*air* includes thin (e.g., 25.0, 15.0, 10.0, 5.0 3.0, 2.0, 1.0 mm or less) four sidewalls 542-548 that are connected at right angles to each other. Each of the sidewalls 542-548 includes oppositely facing substantially flat surfaces. Heat-fins 540 extend between sidewalls 546 and 548. Heat-fins 540 are thermally and electrically connected to sidewalls 546 and 548. Heat-fins 540 have oppositely facing substantially flat surfaces. Heat fins 540 may have a width whf of 10.0, 6.0 4.0, 2.0, 1.0, 0.5 mm or less. The length and height of heat-fins 540 are substantially equal to the length and height of phase bus bar 418. Heat-fins 540 may be equally spaced in bus bar 418*air*. FIG. 5P-3 shows phase bus bar 412*air* with three heat-fins 540. In alternative versions fewer than three or more than three heat-fins 540 may be used in air-cooled bus bars like phase bus bar 418*air*. Heat-fins 540 and sidewalls define channels 560 through which air can flow through bus bar 418*air*. Heat-fins can extract substantial heat (e.g., 1.0, 5.0, 10.0, 20.0, 50.0, 100.0, 200.0, 300.0, 500.0 W or more) from one or more electrically and thermally connected switch 304 or diodes.

Dielectric air couplings 532 may be connected (e.g., glued) between air-cooled phase bus bars 418*air*. Couplings 532 enable airflow between adjacent air-cooled phase bus bars. Like example phase bus bar 418*air*, example dielectric air coupling 532 has four substantially flat sidewalls connected at right angles to each other. Example air coupling 532*ba* may have dimensions slightly larger than phase bus bars 418*air-b* and 418*air-a*. Inner flat surfaces of coupling 532*ba*'s sidewalls may be connected (e.g., glued) to outer flat surfaces of respective side walls of phase bus bars 418*air-b* and 418*air-a*. Dielectric couplings 532 do not include heat fins as shown in FIG. 5P-4.

V− bus bar 412*air* includes thin (e.g., 25.0, 15.0, 10.0, 5.0 3.0, 2.0, 1.0 mm or less) four sidewalls 562-568 that are connected at right angles to each other. Each of the sidewalls 562-568 includes oppositely facing substantially flat surfaces. Heat-fins 543 extend between sidewalls 566 and 568. Heat-fins 543 are thermally and electrically connected to sidewalls 566 and 568. Heat-fins 543 have oppositely facing substantially flat surfaces. Heat-fins 543 may have a width whf of 10.0, 6.0 4.0, 2.0, 1.0, 0.5 mm or less. The length and height of heat-fins 543 are substantially equal to the length and height of V− bus bar 412. Heat-fins 543 may be equally spaced in bus bar 412*air*. FIG. 5P-6 shows V− bus bar 412*air* with three heat-fins 540. In alternative versions fewer than three or more than three heat-fins 543 may be used. Heat fins 543 and sidewalls define channels 570 through which air can flow through bus bar 412*air*. Heat-fins can extract substantial heat (e.g., 1.0, 5.0, 10.0, 20.0, 50.0, 100.0, 200.0, 300.0, 500.0 W or more) from one or more electrically and thermally connected switch 304 or diodes.

Inverter 460*air* includes example bulk DC link capacitors 403*air*, each of which has first and second metal capacitor-leads 405*air-a* and 405*air-b*. Example capacitor-leads 405*air* have a height, length, and width around 6 mm, 30 mm, and 17 mm, respectively. Capacitor-leads 405*air* may have substantially flat, rectangular-shaped opposite facing top and bottom surfaces. The areas of the example top and bottom surfaces may be around 510 $mm^2$. A substantial portion (e.g., 10, 20, 50, 75, 90% or more) of a capacitor-lead's flat surface area may be electrically and thermally connected (e.g., soldered, press-fitted by screws or other fasteners, etc.) directly to a flat surface of an air-cooled V+ or V− bus bar. For example, a substantial portion of a capacitor-lead 405*air-a*'s flat bottom surface area may be electrically and thermally connected directly to a flat surface of V+ bus bar 417*air*, and a substantial portion of capacitor-lead 405Tair-b's flat top surface area may be electrically and thermally connected directly to a flat surface of V− bus bar 412*air*. V+ bus bar 417*air* and V− bus bar 412*air* can extract a substantial amount of heat (e.g., 1, 2, 5, 10, 20, 40, 80, 100, 200, 300 Watts or more) from bulk DC link capacitors 403*air* through flat surfaces of their capacitor-leads 405*air-a* and/or 405*air-b*, respectively.

Inverter 460*air* may include a row of packaged ceramic DC link capacitors 433 electrically connected in parallel. For ease of illustration, only one packaged ceramic DC link capacitor 433-1 of the row is shown. Each of the packaged ceramic DC link capacitors 433 may include first and second metal terminals 437-1 and 437-2, respectively, connected electrically to the air-cooled V+ and V− bus bars, respectively.

Example packaged ceramic DC link capacitors 433 are mounted on a PCB 435*air* and electrically connected in parallel. First and second metal terminals 437-1 and 437-2 may be electrically connected to first and second metal traces 511-1 and 511-2, respectively, on the side of PCB 435*air* opposite the side with capacitors 433. Metal vias can electrically connect traces 511-1 and 511-2 to respective terminals 437-1 and 437-2. The ends of first and second traces 511-1 and 511-2 may be widened to create large surface areas that can be electrically and thermally connected directly to respective side wall surfaces of the V+ and V− bus bars 418*air* and 412*air*, respectively.

Returning to FIG. 5P-1, electrical current symbols are shown that represent electrical current flow through inverter system 460*air* at an instant in time. More particularly, FIG. 5P-1 shows electrical current flow through activated high-side switch 304*d*H of phase-a, while low-side switches 304*d*L of phases b and c are activated and conducting current to the V− terminal through the V− bus bar 412*air.*

Inverter 460*air* may include control PCB 462*i*T. Inverter 460*air* may include power PCB 461*i*T. Power and control PCBs may be in data communication with each other. Power PCB 461*i*T may be electrically connected to switches 304 through respective sets of connector-leads 288. Only connector-leads 288*g*H and 288*g*L of phase-c is shown in FIG. 5P-2.

Power PCB 461*i*T in FIG. 5P-2 include drivers 306 in data communication with respective packaged switches 247*d* of phase-c through respective connector-leads 288*g*. PMICs provide supply voltages for respective drivers 306 and may be placed as close as possible on the opposite side of power PCB 460*i*T as shown. Power PCB 461*i*T in FIG. 5P-2 includes voltage sensors V_Sense in data communication with respective packaged switches 247*d*. Example phase bus bar-lead 465*c* extends laterally between first and second ends. The first end of phase bus bar-lead 465*c* is electrically connected to phase bus bar 418Tc, and the second end is electrically connected to winding Wc. Phase bus bar-lead 465*c* extends through an aperture in PCB 460*i*T. Current sensor I_Sense measures electrical current flowing through phase bus bar-lead 465*c*. I_Sense-c may include an aperture through which phase bus bar-connector 465*c* extends. FIG. 5P-2 shows drivers 306, voltage sensors V_Sense, PMICs, current sensors I_Sense, and a phase bus bar-leads 465 for phase-c. Similar groups of drivers 306, voltage sensors V_Sense, PMICs, current sensor I_Sense, and phase bus bar-lead 465 are mounted on or extending through PCB 461*i* for phases a and b.

FIG. 5P-2 shows an MCU mounted on control PCB 462*i*T. The MCU may be in data communication with each driver 306, V_Sense, and I_Sense mounted on power PCB 460*i*T through a flexible PCB 484.

Although the present disclosure has been described in connection with several versions, the disclosure is not intended to be limited to the versions set forth herein.

What is claimed is:

1. An apparatus comprising:

a first device comprising:

a $1^{st}$ case;

a $1^{st}$ metal structure comprising $1^{st}$ and $2^{nd}$ surfaces, wherein the $1^{st}$ and $2^{nd}$ Surfaces of the $1^{st}$ metal structure are electrically connected, substantially flat and oppositely facing;

a $1^{st}$ metal element comprising $1^{st}$ and $2^{nd}$ surfaces, wherein the $1^{st}$ and $2^{nd}$ surfaces of the $1^{st}$ metal element are electrically connected, substantially flat and oppositely facing;

a $1^{st}$ metal pedestal comprising $1^{st}$ and $2^{nd}$ surfaces, wherein the $1^{st}$ and $2^{nd}$ surfaces of the $1^{st}$ metal pedestal are electrically connected, substantially flat and oppositely facing, wherein the $1^{st}$ surface of the $1^{st}$ metal pedestal is sintered to the $2^{nd}$ surface of the $1^{st}$ metal element;

a $1^{st}$ transistor comprising $1^{st}$ and $2^{nd}$ terminals between which 1 ampere or more of electrical current is transmitted when the $1^{st}$ transistor is activated, wherein the $1^{st}$ and $2^{nd}$ terminals comprise $1^{st}$ and $2^{nd}$ surfaces, respectively, wherein the st and $2^{nd}$ surfaces of the $1^{st}$ and $2^{nd}$ terminals, respectively, are substantially flat and oppositely facing;

a $1^{st}$ opening through the $1^{st}$ case that exposes the $2^{nd}$ surface of the $1^{st}$ metal structure so that the $2^{nd}$ surface of the $1^{st}$ metal structure can be electrically and thermally connected to a bus bar;

wherein the $1^{st}$ and $2^{nd}$ surfaces of the $1^{st}$ and $2^{nd}$ terminals, respectively, are sintered to the $1^{st}$ and $2^{nd}$ surfaces, respectively, of the $1^{st}$ metal structure and the $1^{st}$ metal pedestal, respectively.

2. The apparatus of claim 1 further comprising a $1^{st}$ bus bar thermally and electrically connected to the $2^{nd}$ surface of the $1^{st}$ metal structure.

3. The apparatus of claim 2 wherein the $1^{st}$ bus bar comprises a $1^{st}$ channel through which fluid can flow through and cool the $1^{st}$ bus bar.

4. The apparatus of claim 3 further comprising a $1^{st}$ tube received in the $1^{st}$ channel.

5. The apparatus of claim 4 wherein the $1^{st}$ case comprises a $2^{nd}$ opening through which the $1^{st}$ surface of the $1^{st}$ metal element is exposed.

6. The apparatus of claim 5 further comprising a $2^{nd}$ bus bar thermally and electrically connected to the $1^{st}$ surface of the $1^{st}$ metal element, wherein the $2^{nd}$ bus bar comprises a $2^{nd}$ channel through which fluid can flow through and cool the $2^{nd}$ bus bar.

7. The apparatus of claim 6 further comprising:

a $3^{rd}$ bus bar, wherein the $3^{rd}$ bus bar comprises a $3^{rd}$ channel through which fluid can flow through and cool the $3^{rd}$ bus bar;

a second device comprising:

a $2^{nd}$ case;

a $2^{nd}$ metal structure comprising $1^{st}$ and $2^{nd}$ surfaces, wherein the $1^{st}$ and $2^{nd}$ surfaces of the $2^{nd}$ metal structure are electrically connected, substantially flat and oppositely facing;

a $2^{nd}$ metal element comprising $1^{st}$ and $2^{nd}$ surfaces, wherein the $1^{st}$ and $2^{nd}$ surfaces of the $2^{nd}$ metal element are electrically connected, substantially flat and oppositely facing;

a $2^{nd}$ metal pedestal comprising $1^{st}$ and $2^{nd}$ surfaces, wherein the $1^{st}$ and $2^{nd}$ surfaces of the $2^{nd}$ metal pedestal are electrically connected, substantially flat and oppositely facing, wherein the $1^{st}$ surface of the $2^{nd}$ metal pedestal is sintered to the $2^{nd}$ surface of the $2^{nd}$ metal element;

a $2^{nd}$ transistor comprising $3^{rd}$ and $4^{th}$ terminals between which 1 ampere or more of electrical current is transmitted when the $2^{nd}$ transistor is activated, wherein the $3^{rd}$ and $4^{th}$ terminals comprise $3^{rd}$ and $4^{th}$ surfaces, respectively, wherein the $3^{rd}$ and $4^{th}$ surfaces are substantially flat and oppositely facing;

a $1^{st}$ opening through the $2^{nd}$ case that exposes the $2^{nd}$ surface of the $2^{nd}$ metal structure;

a $2^{nd}$ opening through the $2^{nd}$ case that exposes the $1^{st}$ surface of the $2^{nd}$ metal element;

wherein the $3^{rd}$ and $4^{th}$ surfaces are sintered to the $1^{st}$ and $2^{nd}$ surfaces, respectively, of the $2^{nd}$ metal structure and the $2^{nd}$ metal pedestal, respectively;

wherein the $2^{nd}$ surface of the $2^{nd}$ metal structure is electrically and thermally connected to the $2^{nd}$ bus bar;

wherein the $1^{st}$ surface of the $2^{nd}$ metal element is thermally and electrically connected to the $3^{rd}$ bus bar.

8. The apparatus of claim 7 further comprising:

a capacitor with first and second electrodes;

wherein the first and second electrodes are thermally and electrically connected to respective flat surfaces of the $1^{st}$ and $3^{rd}$ bus bars.

9. The apparatus of claim 7 further comprising:

a $4^{th}$ bus bar comprising a $4^{th}$ channel through which a fluid can flow through and cool the $4^{th}$ bus bar;

a third device comprising:

a $3^{rd}$ case;

a $3^{rd}$ metal structure comprising $1^{st}$ and $2^{nd}$ surfaces, wherein the $1^{st}$ and $2^{nd}$ surfaces of the $3^{rd}$ metal structure are electrically connected, substantially flat and oppositely facing;

a $3^{rd}$ metal element comprising $1^{st}$ and $2^{nd}$ surfaces, wherein the $1^{st}$ and $2^{nd}$ surfaces of the $3^{rd}$ metal element are electrically connected, substantially flat and oppositely facing;

a $3^{rd}$ metal pedestal comprising $1^{st}$ and $2^{nd}$ surfaces, wherein the $1^{st}$ and $2^{nd}$ surfaces of the $3^{rd}$ metal pedestal are electrically connected, substantially flat and oppositely facing, wherein the $1^{st}$ surface of the $3^{rd}$ metal pedestal is sintered to the $2^{nd}$ surface of the $3^{rd}$ metal element;

a $3^{rd}$ transistor comprising $5^{th}$ and $6^{th}$ terminals between which 1 ampere or more of electrical current is transmitted when the $3^{rd}$ transistor is activated, wherein the $5^{th}$ and $6^{th}$ terminals comprise $5^{th}$ and $6^{th}$ surfaces, respectively, wherein the $5^{th}$ and $6^{th}$ surfaces are substantially flat and oppositely facing;

a $1^{st}$ opening through the $3^{rd}$ case that exposes the $2^{nd}$ surface of the $3^{rd}$ metal structure;

a $2^{nd}$ opening through the $3^{rd}$ case that exposes the $1^{st}$ surface of the $3^{rd}$ metal element;

wherein the $5^{th}$ and $6^{th}$ surfaces are sintered to the $1^{st}$ and $2^{nd}$ surfaces, respectively, of the $3^{rd}$ metal structure and the $3^{rd}$ metal pedestal, respectively;

wherein the $2^{nd}$ surface of the $3^{rd}$ metal structure is electrically and thermally connected to the $1^{st}$ bus bar;

wherein the $1^{st}$ surface of the $3^{rd}$ metal element is electrically and thermally connected to the $4^{th}$ bus bar;

wherein the $4^{th}$ bus bar is thermally connected to and electrically isolated from the $2^{nd}$ bus bar.

10. The apparatus of claim 9 further comprising:

a fourth device comprising:

a $4^{th}$ case;

a $4^{th}$ metal structure comprising $1^{st}$ and $2^{nd}$ surfaces, wherein the $1^{st}$ and $2^{nd}$ surfaces of the $4^{th}$ metal structure are electrically connected, substantially flat and oppositely facing;

a $4^{th}$ metal element comprising $1^{st}$ and $2^{nd}$ surfaces, wherein the $1^{st}$ and $2^{nd}$ surfaces of the $4^{th}$ metal element are electrically connected, substantially flat and oppositely facing;

a $4^{th}$ metal pedestal comprising $1^{st}$ and $2^{nd}$ surfaces, wherein the $1^{st}$ and $2^{nd}$ surfaces of the $4^{th}$ metal pedestal are electrically connected, substantially flat and oppositely facing, wherein the $1^{st}$ surface of the $4^{th}$ metal pedestal is sintered to the $2^{nd}$ surface of the $4^{th}$ metal pedestal;

a $4^{th}$ transistor comprising $7^{th}$ and $8^{th}$ terminals between which 1 ampere or more of electrical current is transmitted when the $4^{th}$ transistor is activated, wherein the $7^{th}$ and $8^{th}$ terminals comprise $7^{th}$ and $8^{th}$ surfaces, respectively, wherein the $7^{th}$ and $8^{th}$ surfaces are substantially flat and oppositely facing;

a $1^{st}$ opening through the $4^{th}$ case that exposes the $2^{nd}$ surface of the $4^{th}$ metal structure;

a $2^{nd}$ opening through the $4^{th}$ case that exposes the $1^{st}$ surface of the $4^{th}$ metal element;

wherein the $7^{th}$ and $8^{th}$ surfaces are sintered to the $1^{st}$ and $2^{nd}$ surfaces, respectively, of the $4^{th}$ metal structure and the $4^{th}$ metal pedestal, respectively;

wherein the $2^{nd}$ surface of the $4^{th}$ metal structure is electrically and thermally connected to the $4^{th}$ bus bar;

wherein the $1^{st}$ surface of the $4^{th}$ metal element is electrically and thermally connected to the $3^{rd}$ bus bar.

11. The apparatus of claim 10 further comprising:

a $5^{th}$ bus bar comprising a $5^{th}$ channel through which a fluid can flow through and cool the $5^{th}$ bus bar;

a fifth device comprising:

a $5^{th}$ case;

a $5^{th}$ metal structure comprising $1^{st}$ and $2^{nd}$ surfaces, wherein the $1^{st}$ and $2^{nd}$ surfaces of the $5^{th}$ metal structure are electrically connected, substantially flat and oppositely facing;

a $5^{th}$ metal element comprising $1^{st}$ and $2^{nd}$ surfaces, wherein the $1^{st}$ and $2^{nd}$ surfaces of the $5^{th}$ metal element are electrically connected, substantially flat and oppositely facing;

a $5^{th}$ metal pedestal comprising $1^{st}$ and $2^{nd}$ surfaces, wherein the $1^{st}$ and $2^{nd}$ surfaces of the $5^{th}$ metal pedestal are electrically connected, substantially flat and oppositely facing, wherein the $1^{st}$ surface of the $5^{th}$ metal pedestal is sintered to the $2^{nd}$ surface of the $5^{th}$ metal element;

a $5^{th}$ transistor comprising $9^{th}$ and $10^{th}$ terminals between which 1 ampere or more of electrical current is transmitted when the $5^{th}$ transistor is activated, wherein the $9^{th}$ and $10^{th}$ terminals comprise $9^{th}$ and $10^{th}$ surfaces, respectively, wherein the $9^{th}$ and $10^{th}$ surfaces are substantially flat and oppositely facing;

a $1^{st}$ opening through the $5^{th}$ case that exposes the $2^{nd}$ surface of the $5^{th}$ metal structure;

a $2^{nd}$ opening through the $5^{th}$ case that exposes the $1^{st}$ surface of the $5^{th}$ metal element;

wherein the $9^{th}$ and $10^{th}$ surfaces are sintered to the $1^{st}$ and $2^{nd}$ surfaces, respectively, of the $5^{th}$ metal structure and the $5^{th}$ metal pedestal, respectively;

wherein the $2^{nd}$ surface of the $5^{th}$ metal structure is electrically and thermally connected to the $1^{st}$ bus bar;

wherein the $1^{st}$ surface of the $5^{th}$ metal element is electrically and thermally connected to the $5^{th}$ bus bar;

wherein the $5^{th}$ bus bar is thermally connected to and electrically isolated from the $2^{nd}$ and $4^{th}$ bus bars.

12. The apparatus of claim 11 further comprising:

a sixth device comprising:

a $6^{th}$ case;

a $6^{th}$ metal structure comprising $1^{st}$ and $2^{nd}$ surfaces, wherein the $1^{st}$ and $2^{nd}$ surfaces of the $6^{th}$ metal structure are electrically connected, substantially flat and oppositely facing;

a $6^{th}$ metal element comprising $1^{st}$ and $2^{nd}$ surfaces, wherein the $1^{st}$ and $2^{nd}$ surfaces of the $6^{th}$ metal element are electrically connected, substantially flat and oppositely facing;

a $6^{th}$ metal pedestal comprising $1^{st}$ and $2^{nd}$ surfaces, wherein the $1^{st}$ and $2^{nd}$ surfaces of the $6^{th}$ metal pedestal are electrically connected, substantially flat and oppositely facing, wherein the $1^{st}$ surface of the $6^{th}$ metal pedestal is sintered to the $2^{nd}$ surface of the $6^{th}$ metal element;

a $6^{th}$ transistor comprising $11^{th}$ and $12^{th}$ terminals between which 1 ampere or more of electrical current is transmitted when the $6^{th}$ transistor is activated, wherein the $11^{th}$ and $12^{th}$ terminals comprise $11^{th}$ and $12^{th}$ surfaces, respectively, wherein the $11^{th}$ and $12^{th}$ surfaces are substantially flat and oppositely facing;

a $1^{st}$ opening through the $6^{th}$ case that exposes the $2^{nd}$ surface of the $6^{th}$ metal structure;

a $2^{nd}$ opening through the $6^{th}$ case that exposes the $1^{st}$ surface of the $6^{th}$ metal element;

wherein the $11^{th}$ and $12^{th}$ surfaces are sintered to the $1^{st}$ and $2^{nd}$ surfaces, respectively, of the $6^{th}$ metal structure and the $6^{th}$ metal pedestal, respectively;

wherein the $2^{nd}$ surface of the $6^{th}$ metal structure is electrically and thermally connected to the $5^{th}$ bus bar;

wherein the $1^{st}$ surface of the $6^{th}$ metal element is electrically and thermally connected to the $3^{rd}$ bus bar.

13. The apparatus of claim 3 further comprising a dielectric element that electrically isolates the $1^{st}$ bus bar from the fluid flowing through the $1^{st}$ channel of the $1^{st}$ bus bar.

14. The apparatus of claim 11 further comprising a $2^{nd}$ tube received in the $2^{nd}$, $4^{th}$ and $5^{th}$ channels of the $2^{nd}$, $4^{th}$, and $5^{th}$ bus bars, respectively.

15. An apparatus comprising:

a $1^{st}$ bus bar comprising a $1^{st}$ channel through which fluid can flow through and cool the $1^{st}$ bus bar;

a $2^{nd}$ bus bar comprising a $2^{nd}$ channel through which fluid can flow through and cool the $2^{nd}$ bus bar;

a first device comprising:

a $1^{st}$ metal structure;

a $1^{st}$ metal element;

a $1^{st}$ metal pedestal;

a $1^{st}$ transistor comprising $1^{st}$ and $2^{nd}$ terminals between which 1 ampere or more of electrical current is transmitted when the $1^{st}$ transistor is activated;

wherein $1^{st}$ metal pedestal is sintered to the $1^{st}$ metal element;

wherein the $1^{st}$ transistor is positioned between the $1^{st}$ metal structure and the $1^{st}$ metal pedestal;

wherein the $1^{st}$ and $2^{nd}$ terminals are sintered to the $1^{st}$ metal structure and the $1^{st}$ metal pedestal, respectively;

wherein the st metal structure is electrically and thermally connected to the st bus bar;

wherein the st metal element is electrically and thermally connected to the $2^{nd}$ bus bar.

16. The apparatus of claim 15 further comprising:

a $3^{rd}$ bus bar comprising a $3^{rd}$ channel through which fluid can flow through the $3^{rd}$ bus bar;

a second device comprising:

a $2^{nd}$ metal structure;

a $2^{nd}$ metal element;

a $2^{nd}$ metal pedestal;

a $2^{nd}$ transistor comprising $3^{rd}$ and $4^{th}$ terminals between which 1 ampere or more of electrical current is transmitted when the $2^{nd}$ transistor is activated;

wherein $2^{nd}$ metal pedestal is sintered to the $2^{nd}$ metal element;

wherein the $2^{nd}$ transistor is positioned between the $2^{nd}$ metal structure and the $2^{nd}$ metal pedestal;

wherein the $3^{rd}$ and $4^{th}$ terminals are sintered to the $2^{nd}$ metal structure and the $2^{nd}$ metal pedestal, respectively;

wherein the $2^{nd}$ metal structure is electrically and thermally connected to the $2^{nd}$ bus bar;

wherein the $2^{nd}$ metal element is electrically and thermally connected to the $3^{rd}$ bus bar.

17. The apparatus of claim 16 further comprising:

a $4^{th}$ bus bar comprising a $4^{th}$ channel through which fluid can flow through the $4^{th}$ bus bar;

a third device comprising:

a $3^{rd}$ metal structure;

a $3^{rd}$ metal element;

a $3^{rd}$ metal pedestal;

a $3^{rd}$ transistor comprising $5^{th}$ and $6^{th}$ terminals between which 1 ampere or more of electrical current is transmitted when the $3^{rd}$ transistor is activated;

a fourth device comprising:

a $4^{th}$ metal structure;

a $4^{th}$ metal element;

a $4^{th}$ metal pedestal;

a $4^{th}$ transistor comprising $8^{th}$ and $9^{th}$ terminals between which 1 ampere or more of electrical current is transmitted when the $4^{th}$ transistor is activated;

wherein the $3^{rd}$ metal pedestal is sintered to the $3^{rd}$ metal element;

wherein the $3^{rd}$ transistor is positioned between the $3^{rd}$ metal structure and the $3^{rd}$ metal pedestal;

wherein the $5^{th}$ and $6^{th}$ terminals are sintered to the $3^{rd}$ metal structure and the $3^{rd}$ metal pedestal, respectively;

wherein the $3^{rd}$ metal structure is electrically and thermally connected to the $1^{st}$ bus bar;

wherein the $3^{rd}$ metal element is electrically and thermally connected to the $4^{th}$ bus bar;

wherein the $4^{th}$ metal pedestal is sintered to the $4^{th}$ metal element;

wherein the $4^{th}$ transistor is positioned between the $4^{th}$ metal structure and the $4^{th}$ metal pedestal;

wherein the $8^{th}$ and $9^{th}$ terminals are sintered to the $4^{th}$ metal structure and the $4^{th}$ metal pedestal, respectively;

wherein the $4^{th}$ metal structure is electrically and thermally connected to the $4^{th}$ bus bar;

wherein the $4^{th}$ metal element is electrically and thermally connected to the $3^{rd}$ bus bar;

wherein the $2^{nd}$ and $4^{th}$ bus bars are thermally connected to each other and electrically isolated from each other.

18. The apparatus of claim 17 further comprising a tube that is received in the $2^{nd}$ and $4^{th}$ channels of the $2^{nd}$ and $4^{th}$ bus bars, respectively.

19. The apparatus of claim 18 further comprising a dielectric layer formed on an outer surface of the tube and configured to electrically insulate the $2^{nd}$ bus bar from the tube.

20. An apparatus comprising:

a first device comprising:

a $1^{st}$ case;

a $1^{st}$ metal structure comprising 151 and $2^{nd}$ surfaces, wherein the $1^{st}$ and $2^{nd}$ Surfaces of the $1^{st}$ metal structure are electrically connected, substantially flat and oppositely facing;

a $1^{st}$ metal element comprising $1^{st}$ and $2^{nd}$ surfaces, wherein the $1^{st}$ and $2^{nd}$ surfaces of the $1^{st}$ metal element are electrically connected, substantially flat and oppositely facing;

a $1^{st}$ metal pedestal comprising $1^{st}$ and $2^{nd}$ surfaces, wherein the $1^{st}$ and $2^{nd}$ surfaces of the $1^{st}$ metal pedestal are electrically connected, substantially flat and oppositely facing, wherein the $1^{st}$ surface of the $1^{st}$ metal pedestal is sintered to the $2^{nd}$ surface of the $1^{st}$ metal element;

a $1^{st}$ transistor comprising 11 and $2^{nd}$ terminals between which 1 ampere or more of electrical current is transmitted when the $1^{st}$ transistor is activated, wherein the $1^{st}$ and $2^{nd}$ terminals comprise $1^{st}$ and $2^{nd}$ surfaces, respectively, wherein the $1^{st}$ and $2^{nd}$ surfaces of the $1^{st}$ and $2^{nd}$ terminals, respectively, are substantially flat and oppositely facing;

a $1^{st}$ opening through the $1^{st}$ case that exposes the $2^{nd}$ surface of the $1^{st}$ metal structure so that the $2^{nd}$ surface of the $1^{st}$ metal structure can be electrically and thermally connected to a bus bar;

wherein $1^{st}$ metal pedestal is sintered to the $1^{st}$ metal element;

wherein the $1^{st}$ and $2^{nd}$ surfaces of the $1^{st}$ and $2^{nd}$ terminals, respectively, are electrically and thermally connected to the $1^{st}$ and $2^{nd}$ surfaces, respectively, of the $1^{st}$ metal structure and the $1^{st}$ metal pedestal, respectively.

* * * * *